United States Patent
Miller et al.

(10) Patent No.: US 8,990,651 B2
(45) Date of Patent: Mar. 24, 2015

(54) INTEGRATED CIRCUIT (IC) WITH PRIMARY AND SECONDARY NETWORKS AND DEVICE CONTAINING SUCH AN IC

(75) Inventors: Marc Miller, Palo Alto, CA (US); Steven Teig, Menlo Park, CA (US); Brad Hutchings, Provo, UT (US)

(73) Assignee: Tabula, Inc., Santa Clara, CA (US)

( * ) Notice: Subject to any disclaimer, the term of this patent is extended or adjusted under 35 U.S.C. 154(b) by 936 days.

(21) Appl. No.: 12/679,305

(22) PCT Filed: Sep. 19, 2008

(86) PCT No.: PCT/US2008/077141
§ 371 (c)(1),
(2), (4) Date: Oct. 26, 2010

(87) PCT Pub. No.: WO2009/039462
PCT Pub. Date: Mar. 26, 2009

(65) Prior Publication Data
US 2011/0029830 A1 Feb. 3, 2011

Related U.S. Application Data

(60) Provisional application No. 60/973,736, filed on Sep. 19, 2007, provisional application No. 61/042,695, filed on Apr. 4, 2008, provisional application No. 61/055,956, filed on May 23, 2008.

(51) Int. Cl.
*G01R 31/28* (2006.01)
*G06F 11/22* (2006.01)
*G11C 29/04* (2006.01)

(52) U.S. Cl.
CPC ...... *G06F 11/221* (2013.01); *G11C 2029/0409* (2013.01)
USPC .................................. 714/734; 714/E11.024

(58) Field of Classification Search
USPC ............................................ 714/734, E11.024
See application file for complete search history.

(56) References Cited

U.S. PATENT DOCUMENTS 5,291,489 A 3/1994 Morgan et al.
5,425,036 A 6/1995 Liu et al.
(Continued)

FOREIGN PATENT DOCUMENTS

EP 0748053 12/1996
EP 2174215 4/2010
(Continued)

OTHER PUBLICATIONS

Author: Jorg Henkel, Wayne Wolf and Srimat Chakradhar; Title, On Chip Networks: A scalable, communication-centric embedded system design paradigm; Publisher, Proceedings of the 17th International Conference on VLSI Design (VLSID'04) 1063-9667/04; Date 2004.*

(Continued)

*Primary Examiner* — April Y Blair
*Assistant Examiner* — Thien D Nguyen
(74) *Attorney, Agent, or Firm* — Adeli LLP

(57) ABSTRACT

Some embodiments provide an integrated circuit ("IC") with a primary circuit structure. The primary circuit structure is for performing multiple operations that implement a user design. The primary circuit structure includes multiple circuits. The IC also includes a secondary monitoring structure for monitoring multiple operations. The secondary monitoring structure includes a network communicatively coupled to multiple circuits of the primary circuit structure. The secondary monitoring circuit structure is for analyzing the monitored operations and reporting on the analysis to a circuit outside of the IC.

26 Claims, 73 Drawing Sheets

(56) References Cited

U.S. PATENT DOCUMENTS

| | | | |
|---|---|---|---|
| 5,426,378 A | 6/1995 | Ong | |
| 5,452,239 A | 9/1995 | Dai et al. | |
| 5,521,835 A | 5/1996 | Trimberger | |
| 5,578,946 A | 11/1996 | Carberry et al. | |
| 5,596,743 A | 1/1997 | Bhat et al. | |
| 5,600,263 A | 2/1997 | Trimberger et al. | |
| 5,610,829 A | 3/1997 | Trimberger | |
| 5,629,637 A | 5/1997 | Trimberger et al. | |
| 5,640,106 A | 6/1997 | Erickson et al. | |
| 5,640,107 A | 6/1997 | Kruse | |
| 5,646,545 A | 7/1997 | Trimberger et al. | |
| 5,650,734 A | 7/1997 | Chu et al. | |
| 5,654,650 A | 8/1997 | Gissel | |
| 5,701,441 A | 12/1997 | Trimberger | |
| 5,732,246 A | 3/1998 | Gould et al. | |
| 5,745,734 A | 4/1998 | Craft et al. | |
| 5,751,735 A | 5/1998 | Tobin et al. | |
| 5,760,602 A | 6/1998 | Tan | |
| 5,761,483 A | 6/1998 | Trimberger | |
| 5,796,268 A | 8/1998 | Kaplinsky | |
| 5,802,003 A | 9/1998 | Iadanza et al. | |
| 5,811,985 A | 9/1998 | Trimberger et al. | |
| 5,822,217 A | 10/1998 | Shenoy | |
| 5,825,662 A | 10/1998 | Trimberger | |
| 5,835,751 A | 11/1998 | Chen et al. | |
| 5,883,525 A | 3/1999 | Tavana et al. | |
| 5,889,677 A | 3/1999 | Yasuda et al. | |
| 5,920,712 A | 7/1999 | Kuijsten | |
| 5,944,813 A | 8/1999 | Trimberger | |
| 5,970,240 A | 10/1999 | Chen et al. | |
| 6,002,861 A | 12/1999 | Butts et al. | |
| 6,003,150 A | 12/1999 | Stroud et al. | |
| 6,018,559 A | 1/2000 | Azegami et al. | |
| 6,020,758 A | 2/2000 | Patel et al. | |
| 6,038,392 A | 3/2000 | Ashar et al. | |
| 6,049,222 A | 4/2000 | Lawman | |
| 6,069,489 A | 5/2000 | Iwanczuk et al. | |
| 6,084,429 A | 7/2000 | Trimberger | |
| 6,107,821 A | 8/2000 | Kelem et al. | |
| 6,152,612 A | 11/2000 | Liao et al. | |
| 6,169,416 B1 | 1/2001 | Eaton et al. | |
| 6,172,521 B1 | 1/2001 | Motomura | |
| 6,175,247 B1 | 1/2001 | Scalera et al. | |
| 6,182,247 B1 | 1/2001 | Herrmann et al. | |
| 6,204,687 B1 | 3/2001 | Schultz et al. | |
| 6,255,849 B1 | 7/2001 | Mohan | |
| 6,381,732 B1 | 4/2002 | Burnham et al. | |
| 6,389,558 B1 | 5/2002 | Herrmann et al. | |
| 6,404,224 B1 | 6/2002 | Azegami et al. | |
| 6,421,784 B1 | 7/2002 | Chu et al. | |
| 6,430,730 B1 | 8/2002 | Ghatate et al. | |
| 6,430,736 B1 | 8/2002 | Levi et al. | |
| 6,446,249 B1 | 9/2002 | Wang et al. | |
| 6,459,646 B1 | 10/2002 | Yee et al. | |
| 6,460,148 B2 | 10/2002 | Veenstra et al. | |
| 6,480,954 B2 | 11/2002 | Trimberger et al. | |
| 6,539,535 B2 | 3/2003 | Butts et al. | |
| 6,545,501 B1 | 4/2003 | Bailis et al. | |
| 6,546,464 B2 | 4/2003 | Fortuna et al. | |
| 6,593,771 B2 | 7/2003 | Bailis et al. | |
| 6,601,227 B1 | 7/2003 | Trimberger | |
| 6,611,153 B1 | 8/2003 | Lien et al. | |
| 6,614,703 B2 | 9/2003 | Pitts et al. | |
| 6,629,308 B1 | 9/2003 | Baxter | |
| 6,658,564 B1 | 12/2003 | Smith et al. | |
| 6,668,237 B1 | 12/2003 | Guccione et al. | |
| 6,681,353 B1 | 1/2004 | Barrow | |
| 6,684,348 B1 | 1/2004 | Edwards et al. | |
| 6,691,266 B1 * | 2/2004 | Winegarden et al. | 714/724 |
| 6,691,301 B2 | 2/2004 | Bowen | |
| 6,701,494 B2 | 3/2004 | Giddens et al. | |
| 6,704,889 B2 | 3/2004 | Veenstra et al. | |
| 6,711,729 B1 | 3/2004 | McElvain et al. | |
| 6,714,041 B1 | 3/2004 | Darling et al. | |
| 6,717,436 B2 | 4/2004 | Kress et al. | |
| 6,725,442 B1 | 4/2004 | Cote et al. | |
| 6,731,133 B1 | 5/2004 | Feng et al. | |
| 6,748,456 B1 | 6/2004 | Stanton et al. | |
| 6,750,675 B2 | 6/2004 | Venkata et al. | |
| 6,768,337 B2 | 7/2004 | Kohno et al. | |
| 6,791,352 B2 | 9/2004 | Verdoorn et al. | |
| 6,802,026 B1 | 10/2004 | Patterson et al. | |
| 6,810,442 B1 | 10/2004 | Lin et al. | |
| 6,810,513 B1 | 10/2004 | Vest | |
| 6,823,224 B2 | 11/2004 | Wood et al. | |
| 6,829,751 B1 | 12/2004 | Shen et al. | |
| 6,829,756 B1 | 12/2004 | Trimberger | |
| 6,831,479 B2 | 12/2004 | Lo | |
| 6,870,397 B1 * | 3/2005 | Fox et al. | 326/41 |
| 6,889,368 B1 | 5/2005 | Mark et al. | |
| 6,894,527 B1 | 5/2005 | Donlin et al. | |
| 6,897,678 B2 | 5/2005 | Zaveri et al. | |
| 6,898,776 B1 | 5/2005 | Jacobson et al. | |
| 6,924,663 B2 | 8/2005 | Masui et al. | |
| 6,937,681 B2 | 8/2005 | Watanabe | |
| 6,954,916 B2 | 10/2005 | Bernstein et al. | |
| 6,959,397 B2 | 10/2005 | Cafaro et al. | |
| 6,996,738 B2 | 2/2006 | Chiang | |
| 7,010,667 B2 | 3/2006 | Vorbach et al. | |
| 7,028,281 B1 | 4/2006 | Agrawal et al. | |
| 7,064,577 B1 | 6/2006 | Lee | |
| 7,073,158 B2 | 7/2006 | McCubbrey | |
| 7,085,858 B1 | 8/2006 | Fox et al. | |
| 7,088,132 B1 | 8/2006 | Tang et al. | |
| 7,095,247 B1 | 8/2006 | Tang et al. | |
| 7,112,992 B1 | 9/2006 | Guzman et al. | |
| 7,112,993 B2 | 9/2006 | Speers | |
| 7,120,883 B1 | 10/2006 | van Antwerpen et al. | |
| 7,126,373 B1 | 10/2006 | Schmit et al. | |
| 7,126,856 B2 | 10/2006 | Sun et al. | |
| 7,135,886 B2 | 11/2006 | Schlacter | |
| 7,138,827 B1 | 11/2006 | Trimberger | |
| 7,143,329 B1 | 11/2006 | Trimberger et al. | |
| 7,154,299 B2 | 12/2006 | Swami et al. | |
| 7,157,933 B1 | 1/2007 | Schmit et al. | |
| 7,171,548 B2 | 1/2007 | Smith et al. | |
| 7,191,372 B1 | 3/2007 | Jacobson et al. | |
| 7,193,440 B1 * | 3/2007 | Schmit et al. | 326/47 |
| 7,200,776 B2 * | 4/2007 | Harris | 714/45 |
| 7,203,842 B2 | 4/2007 | Kean | |
| 7,212,448 B1 | 5/2007 | Trimberger | |
| 7,218,137 B2 | 5/2007 | Vadi et al. | |
| 7,219,265 B2 | 5/2007 | Yee | |
| 7,224,182 B1 * | 5/2007 | Hutchings et al. | 326/38 |
| 7,230,869 B1 | 6/2007 | Redgrave et al. | |
| 7,231,339 B1 | 6/2007 | Nemecek et al. | |
| 7,233,169 B1 | 6/2007 | Vadi | |
| 7,260,218 B2 | 8/2007 | Reblewski et al. | |
| 7,274,213 B1 * | 9/2007 | Meyer et al. | 326/41 |
| 7,298,169 B2 | 11/2007 | Hutchings et al. | |
| 7,308,564 B1 | 12/2007 | Jenkins, IV | |
| 7,325,179 B2 | 1/2008 | Sasakura | |
| 7,330,912 B1 * | 2/2008 | Fox et al. | 710/8 |
| 7,353,489 B2 | 4/2008 | Dowling | |
| 7,375,550 B1 | 5/2008 | Redgrave et al. | |
| 7,409,652 B1 | 8/2008 | Fox et al. | |
| 7,412,343 B2 | 8/2008 | Stroud et al. | |
| 7,424,655 B1 | 9/2008 | Trimberger | |
| 7,443,196 B2 | 10/2008 | Redgrave et al. | |
| 7,454,658 B1 | 11/2008 | Baxter | |
| 7,467,335 B2 | 12/2008 | Otto et al. | |
| 7,492,186 B2 | 2/2009 | Hutchings et al. | |
| 7,496,879 B2 | 2/2009 | Rohe et al. | |
| 7,501,855 B2 | 3/2009 | Hutchings et al. | |
| 7,512,850 B2 | 3/2009 | Redgrave et al. | |
| 7,535,255 B2 * | 5/2009 | Aida et al. | 326/41 |
| 7,548,085 B2 | 6/2009 | Hutchings et al. | |
| 7,548,090 B2 | 6/2009 | Redgrave et al. | |
| 7,550,991 B2 | 6/2009 | Redgrave et al. | |
| 7,576,557 B1 * | 8/2009 | Tseng et al. | 326/9 |
| 7,576,558 B1 | 8/2009 | Lysaght et al. | |
| 7,579,867 B2 | 8/2009 | Hutchings et al. | |
| 7,589,557 B1 | 9/2009 | Bergendahl et al. | |
| 7,595,655 B2 | 9/2009 | Hutchings et al. | |

(56) References Cited

U.S. PATENT DOCUMENTS

| | | | |
|---|---|---|---|
| 7,620,883 B1 | 11/2009 | Carmichael et al. | |
| 7,650,248 B1 | 1/2010 | Baxter | |
| 7,652,498 B2 | 1/2010 | Hutchings et al. | |
| 7,696,780 B2 | 4/2010 | Hutchings et al. | |
| 7,702,978 B2* | 4/2010 | Lewis et al. | 714/725 |
| 7,728,617 B2 | 6/2010 | Redgrave et al. | |
| 7,737,740 B2 | 6/2010 | Millar et al. | |
| 7,743,296 B1 | 6/2010 | Pierce et al. | |
| 7,786,749 B1 | 8/2010 | Syu et al. | |
| 7,788,478 B2 | 8/2010 | Redgrave et al. | |
| 7,805,593 B1 | 9/2010 | Donlin | |
| 7,818,705 B1 | 10/2010 | Hutton et al. | |
| 7,839,162 B2 | 11/2010 | Hutchings | |
| 7,886,247 B2 | 2/2011 | Fatemi et al. | |
| 7,973,558 B2 | 7/2011 | Hutchings et al. | |
| 8,037,340 B2 | 10/2011 | Kim et al. | |
| 8,067,960 B2 | 11/2011 | Hutchings et al. | |
| 8,069,425 B2 | 11/2011 | Hutchings et al. | |
| 8,072,234 B2 | 12/2011 | Fox | |
| 8,115,510 B2 | 2/2012 | Redgrave et al. | |
| 8,143,915 B2 | 3/2012 | Hutchings | |
| 8,295,428 B2 | 10/2012 | Hutchings et al. | |
| 8,412,990 B2 | 4/2013 | Hutchings et al. | |
| 8,429,579 B2 | 4/2013 | Hutchings et al. | |
| 8,433,891 B2 | 4/2013 | Redgrave et al. | |
| 8,479,069 B2 | 7/2013 | Miller et al. | |
| 8,525,548 B2 | 9/2013 | Hutchings et al. | |
| 8,598,909 B2 | 12/2013 | Hutchings | |
| 8,755,484 B2 | 6/2014 | Hutchings et al. | |
| 8,760,194 B2 | 6/2014 | Hutchings et al. | |
| 2001/0033188 A1* | 10/2001 | Aung et al. | 327/141 |
| 2001/0037477 A1 | 11/2001 | Veenstra et al. | |
| 2002/0010853 A1 | 1/2002 | Trimberger et al. | |
| 2002/0089349 A1 | 7/2002 | Barbier et al. | |
| 2002/0093371 A1 | 7/2002 | Atkinson | |
| 2002/0194543 A1* | 12/2002 | Veenstra et al. | 714/39 |
| 2003/0033584 A1 | 2/2003 | Zaveri et al. | |
| 2003/0100133 A1 | 5/2003 | Eidson et al. | |
| 2003/0110430 A1 | 6/2003 | Bailis et al. | |
| 2003/0122578 A1 | 7/2003 | Masui et al. | |
| 2003/0141898 A1 | 7/2003 | Langhammer et al. | |
| 2003/0182638 A1 | 9/2003 | Gupta et al. | |
| 2003/0217345 A1* | 11/2003 | Rajsuman et al. | 716/6 |
| 2004/0041610 A1 | 3/2004 | Kundu | |
| 2004/0113655 A1* | 6/2004 | Curd et al. | 326/40 |
| 2004/0225970 A1 | 11/2004 | Oktem | |
| 2004/0236534 A1* | 11/2004 | Wheless et al. | 702/127 |
| 2005/0046458 A1 | 3/2005 | Schroeder et al. | |
| 2005/0110518 A1* | 5/2005 | Kanno et al. | 326/39 |
| 2005/0132316 A1 | 6/2005 | Suaris et al. | |
| 2005/0216671 A1 | 9/2005 | Rothman et al. | |
| 2005/0222696 A1* | 10/2005 | Ozaki et al. | 700/87 |
| 2005/0246520 A1* | 11/2005 | Vadi et al. | 713/100 |
| 2006/0125517 A1 | 6/2006 | van Wageningen et al. | |
| 2006/0176075 A1* | 8/2006 | Or-Bach | 326/38 |
| 2006/0220716 A1 | 10/2006 | Nicolaidis | |
| 2006/0251416 A1 | 11/2006 | Letner et al. | |
| 2007/0006053 A1 | 1/2007 | Otto et al. | |
| 2007/0007999 A1 | 1/2007 | Graham et al. | |
| 2007/0143577 A1 | 6/2007 | Smith | |
| 2007/0220367 A1* | 9/2007 | Smith et al. | 714/48 |
| 2007/0226541 A1 | 9/2007 | Brunot et al. | |
| 2008/0028347 A1 | 1/2008 | Hiraoglu et al. | |
| 2008/0046851 A1 | 2/2008 | Miczo | |
| 2008/0122484 A1 | 5/2008 | Zhu et al. | |
| 2008/0133866 A1* | 6/2008 | Dickenson | 711/170 |
| 2008/0276208 A1 | 11/2008 | Albrecht et al. | |
| 2008/0304425 A1* | 12/2008 | Karaoguz | 370/254 |
| 2009/0002016 A1* | 1/2009 | Hutchings et al. | 326/16 |
| 2009/0002020 A1 | 1/2009 | Hutchings et al. | |
| 2009/0007027 A1 | 1/2009 | Hutchings et al. | |
| 2009/0172351 A1 | 7/2009 | Vorbach et al. | |
| 2009/0213946 A1* | 8/2009 | Dick et al. | 375/260 |
| 2009/0237110 A1 | 9/2009 | Lunzer et al. | |
| 2010/0040177 A1* | 2/2010 | Dick et al. | 375/341 |
| 2010/0052780 A1* | 3/2010 | Summerfield et al. | 330/149 |
| 2010/0156456 A1 | 6/2010 | Hutchings et al. | |
| 2010/0289520 A1 | 11/2010 | Redgrave et al. | |
| 2010/0295574 A1 | 11/2010 | Hutchings et al. | |
| 2011/0060546 A1 | 3/2011 | Miller et al. | |
| 2011/0060896 A1 | 3/2011 | Redgrave et al. | |
| 2011/0068820 A1 | 3/2011 | Fox | |
| 2011/0089969 A1 | 4/2011 | Hutchings | |
| 2011/0199117 A1 | 8/2011 | Hutchings et al. | |
| 2012/0098567 A1 | 4/2012 | Hutchings et al. | |
| 2012/0112786 A1 | 5/2012 | Fox | |
| 2012/0117525 A1 | 5/2012 | Hutchings et al. | |
| 2012/0200314 A1 | 8/2012 | Hutchings | |
| 2013/0156146 A1 | 6/2013 | Hutchings et al. | |
| 2014/0109028 A1 | 4/2014 | Hutchings et al. | |

FOREIGN PATENT DOCUMENTS

| | | |
|---|---|---|
| EP | 2279560 | 2/2011 |
| WO | WO 2007/011203 | 1/2007 |
| WO | WO 2009/002600 | 12/2008 |
| WO | WO 2009/039462 | 3/2009 |
| WO | WO 2009/131569 | 10/2009 |
| WO | WO 2010/016857 | 2/2010 |
| WO | PCT/US2010/049198 | 9/2010 |
| WO | WO 2011/035076 | 3/2011 |

OTHER PUBLICATIONS

Portions of prosecution history of U.S. Appl. No. 11/375,562, Jun. 24, 2010, Redgrave, Jason, et al.

Portions of prosecution history of U.S. Appl. No. 12/870,779, Nov. 16, 2010, Redgrave, Jason, et al.

Portions of prosecution history of U.S. Appl. No. 11/375,362, Feb. 14, 2008, Redgrave, Jason, et al.

Portions of prosecution history of U.S. Appl. No. 12/050,897, Feb. 4, 2009, Redgrave, Jason, et al.

Portions of prosecution history of U.S. Appl. No. 11/375,363, Sep. 26, 2008, Redgrave, Jason, et al.

Portions of prosecution history of U.S. Appl. No. 12/235,581, Apr. 2, 2010, Redgrave, Jason, et al.

Portions of prosecution history of U.S. Appl. No. 12/754,603, May 17, 2011, Redgrave, Jason, et al.

Portions of prosecution history of U.S. Appl. No. 11/375,370, Feb. 13, 2009, Redgrave, Jason, et al.

Portions of prosecution history of U.S. Appl. No. 11/375,369, Jan. 27, 2009, Redgrave, Jason, et al.

Portions of prosecution history of U.S. Appl. No. 11/375,364, Jan. 15, 2009, Hutchings, Brad, et al.

Portions of prosecution history of U.S. Appl. No. 12/106,257, Nov. 16, 2009, Hutchings, Brad, et al.

Portions of prosecution history of U.S. Appl. No. 12/754,604, Mar. 8, 2011, Hutchings, Brad, et al.

Portions of prosecution history of U.S. Appl. No. 11/375,561, Jan. 30, 2009, Hutchings, Brad, et al.

Portions of prosecution history of U.S. Appl. No. 11/769,680, Feb. 9, 2011, Hutchings, Brad, et al.

Portions of prosecution history of U.S. Appl. No. 11/769,683, Apr. 13, 2011, Hutchings, Brad, et al.

Portions of prosecution history of U.S. Appl. No. 11/769,686, May 15, 2009, Hutchings, Brad, et al.

Portions of prosecution history of U.S. Appl. No. 11/769,706, May 21, 2009, Hutchings, Brad, et al.

Portions of prosecution history of U.S. Appl. No. 11/769,703, Dec. 17, 2008, Hutchings, Brad, et al.

Portions of prosecution history of U.S. Appl. No. 11/769,702, Oct. 8, 2010, Hutchings, Brad.

Portions of prosecution history of U.S. Appl. No. 12/952,177, Mar. 1, 2011, Hutchings, Brad, et al.

Portions of prosecution history of U.S. Appl. No. 11/769,701, Sep. 4, 2009, Hutchings, Brad, et al.

Portions of prosecution history of U.S. Appl. No. 12/637,745, May 2, 2011, Hutchings, Brad, et al.

Portions of prosecution history of U.S. Appl. No. 12/785,484, Apr. 25, 2011, Fox, Brian.

(56) References Cited

OTHER PUBLICATIONS

International Search Report for PCT/US2008/061074, Oct. 23, 2008 (mailing date), Tabula, Inc.
Written Opinion for PCT/US2008/061074, Oct. 23, 2008 (mailing date), Tabula, Inc.
International Preliminary Report on Patentability for PCT/US2008/061074, Oct. 26, 2010 (issuance date), Tabula, Inc.
International Search Report for PCT/US2008/061072, Sep. 15, 2008 (mailing date), Tabula, Inc.
International Preliminary Report on Patentability for PCT/US2008/061072, Jan. 14, 2010 (mailing date), Tabula, Inc.
Written Opinion for PCT/US2008/061072, Sep. 15, 2008 (mailing date), Tabula, Inc.
International Search Report for PCT/US2008/077141, Dec. 18, 2008 (mailing date), Tabula, Inc.
International Preliminary Report on Patentability for PCT/US2008/077141, Mar. 24, 2010 (issuance date), Tabula, Inc.
Written Opinion for PCT/US2008/077141, Dec. 18, 2008 (mailing date), Tabula, Inc.
International Search Report for PCT/US2008/088492, Mar. 20, 2009 (mailing date), Tabula, Inc.
Written Opinion for PCT/US2008/088492, Mar. 20, 2009 (mailing date), Tabula, Inc.
International Search Report and Written Opinion for PCT/US2010/049198, Nov. 15, 2010 (mailing date), Tabula, Inc.
Altera Corp., "Section V. In-System Design Debugging," *Quartus II Handbook*, May 2007, pp. 1-150.
Amerson, R., et al., "Teramac—Configurable Custom Computing," *Proceedings of the IEEE Symposium on FPGA's for Custom Computing Machines*, Apr. 19-21, 1995, pp. 32-38.
Arnold, J., et al, "Splash 2," *Proceedings of the Fourth Annual ACM Symposium on Parallel Algorithms and Architectures*, Jun. 29-Jul. 1, 1992, pp. 316-322, San Diego, California.
Arnold, J., "The Splash 2 Software Environment," *Proceedings of IEEE Workshop on FPGAs for Custom Computing Machines*, Apr. 5-7, 1993, pp. 88-93, Napa, California.
Butts, M., "Future Directions of Dynamically Reprogrammable Systems," *IEEE 1995 Custom Integrated Circuits Conference*, May 1995, pp. 487-494.
Compton, K., et al., "Reconfigurable Computing: A Survey of Systems and Software," *ACM Computing Surveys*, Jun. 2002, pp. 171-210, vol. 34, No. 2, ACM, New York, NY.
Graham, P., "Instrumenting Bitstreams for Debugging FPGA Circuits", *Proceedings of the 9th Annual IEEE Symposium on Field-Programmable Custom Computing Machines*, Apr. 29-May 2, 2001, pp. 41-50, Washington DC.
Graham, P., "Logical Hardware Debuggers for FPGA-Based Systems," *A Dissertation Submitted to the Faculty of Brigham Young University in Partial Fulfillment of the Requirements for the Degree of Doctor of Philosophy in Brigham Young University*, Dec. 2001, pp. i-246.
Hanono, S., "InnerView Hardware Debugger: A Logic Analysis Tool for the Virtual Wires Emulation System," *Submitted to the Department of Electrical Engineering and Computer science in Partial Fulfillment of the Requirements for the Degree of Master of Science at the Massachusetts Institute of Technology*, Feb. 1995, pp. 1-59.
Hauser, J., et al., "Garp: A MIPS Processor with a Reconfigurable Coprocessor", *FPGAs for Custom Computing Machines, 1997. Proceedings., The 5th Annual IEEE Symposium on FPGA-Based Custom Computing Machines*, Apr. 16-18, 1997, pp. 12-21.
Hutchings, B., et al., "A CAD Suite for High-Performance FPGA Design," *Proceedings of the Seventh Annual IEEE Symposium on Field-Programmable Custom Computing Machines*, Apr. 1999, pp. 1-16.
Hutchings, B., et al., "Designing and Debugging Custom Computing Applications," *IEEE Design & Test of Computers*, Jan. 2000, pp. 20-28.
Hutchings, B., et al., "Unifying Simulation and Execution in a Design Environment for FPGA Systems," *IEEE Transactions on Very Large Scale Integration (VLSI) Systems*, Feb. 2001, pp. 201-205, vol. 9, No. 1.
Luk, W., et al., "Compilation Tools for Run-Time Reconfigurable Designs," *FPGAs for Custom Computing Machines, 1997. Proceedings., The 5th Annual IEEE Symposium on FPGA-Based Custom Computing Machines*, Apr. 16-18, 1997, pp. 56-65.
Scalera, S., et al., "The Design and Implementation of a Context Switching FPGA", *FPGAs for Custom Computing Machines, 1998. Proceedings. IEEE Symposium on FPGAs for Custom Computing Machines*, Apr. 15-17, 1998, pp. 78-85.
Trimberger, S., "Effects of FPGA Architecture on FPGA Routing," *32nd ACM/IEEE Design Automation Conference*, Jun. 1995, ACM.
Vuillemin, J., et al., "Programmable Active Memories: Reconfigurable Systems Come of Age," *Very Large Scale Integration (VLSI) Systems, IEEE Transactions on vol. 4, Issue 1*, Mar. 1996, pp. 56-69.
Xilinx, Inc., "ChipScope ProSoftware and Cores User Guide," Jan. 10, 2007, pp. 1-206, Xilinx Inc.
Xilinx, Inc., "Virtex-5 FPGA," Configuration User Guide, Feb. 2007, pp. 1-154, Xilinx, Inc.
Updated portions of prosecution history of U.S. Appl. No. 12/870,779, Dec. 28, 2012, Redgrave, Jason, et al.
Updated portions of prosecution history of U.S. Appl. No. 12/754,603, Nov. 9, 2011, Redgrave, Jason, et al.
Updated portions of prosecution history of U.S. Appl. No. 12/754,604, Jun. 27, 2011, Hutchings, Brad, et al.
Portions of prosecution history of U.S. Appl. No. 13/281,425, Jan. 15, 2013, Hutchings, Brad, et al.
Updated portions of prosecution history of U.S. Appl. No. 11/769,680, Nov. 4, 2011, Hutchings, Brad, et al.
Portions of prosecution history of U.S. Appl. No. 13/291,087, Dec. 12, 2012, Hutchings, Brad, et al.
Updated portions of prosecution history of U.S. Appl. No. 11/769,683, Nov. 30, 2012, Hutchings, Brad, et al.
Updated portions of prosecution history of U.S. Appl. No. 12/952,177, Feb. 1, 2012, Hutchings, Brad, et al.
Updated portions of prosecution history of U.S. Appl. No. 12/637,745, Jun. 1, 2011, Hutchings, Brad, et al.
Portions of prosecution history of U.S. Appl. No. 12/728,194, Feb. 1, 2013, Miller, Marc, et al.
Updated portions of prosecution history of U.S. Appl. No. 12/785,484, Oct. 28, 2011, Fox, Brian.
Portions of prosecution history of U.S. Appl. No. 13/291,095, Jan. 17, 2013, Fox, Brian.
Portions of prosecution history of U.S. Appl. No. 13/057,477, Nov. 27, 2012, Hutchings, Brad, et al.
Portions of prosecution history of U.S. Appl. No. 13/021,702, Jun. 12, 2012, Hutchings, Brad, et al.
Portions of prosecution history of EP 08746484.8, Feb. 16, 2012, Tabula, Inc.
Portions of prosecution history of EP 08746482.2, Mar. 12, 2012, Tabula, Inc.
International Preliminary Report on Patentability for PCT/US2008/088492, Feb. 8, 2011 (issuance date), Tabula, Inc.
International Preliminary Report on Patentability for PCT/US2010/049198, Mar. 27, 2012 (issuance date), Tabula, Inc.
U.S. Appl. No. 13/864,507, filed Apr. 17, 2013, Tabula, Inc.
Updated portions of prosecution history of U.S. Appl. No. 12/870,779, Apr. 4, 2013, Redgrave, Jason, et al.
Updated portions of prosecution history of U.S. Appl. No. 13/281,425, Dec. 23, 2013, Hutchings, Brad, et al.
Updated portions of prosecution history of U.S. Appl. No. 13/291,087, Mar. 22, 2013, Hutchings, Brad, et al.
Portions of prosecution history of U.S. Appl. No. 13/864,507, Dec. 27, 2013, Tabula, Inc.
Portions of prosecution history of U.S. Appl. No. 13/367,351, Nov. 7, 2013, Hutchings, Brad.
Updated portions of prosecution history of U.S. Appl. No. 12/728,194, Feb. 26, 2013, Miller, Marc, et al.
Updated portions of prosecution history of U.S. Appl. No. 13/291,095, Nov. 5, 2013, Fox, Brian.

(56) References Cited

OTHER PUBLICATIONS

Updated portions of prosecution history of U.S. Appl. No. 13/057,477, Aug. 2, 2013, Hutchings, Brad, et al.
Portions of prosecution history of U.S. Appl. No. 13/645,314, Jan. 2, 2014, Tabula, Inc.
Updated portions of prosecution history of EP 08746484.8, Nov. 20, 2013 (mailing date), Tabula, Inc.
Updated portions of prosecution history of EP 08746482.2, Nov. 27, 2013 (mailing date), Tabula, Inc.
Barker, Robert, "QuickSilver ACM SilverStream Design Methodology with the Inspire SDK Tool Set," A Technology Application Whitepaper, Jan. 26, 2004, pp. 1-8, QuickSilver Technology, Inc., San Jose, California.
Caspi, Eylon, et al., "Stream Computations Organized for Reconfigurable Execution (SCORE): Introduction and Tutorial," Aug. 25, 2000, pp. 1-31, Version 1.0.
Deokar, R.B., et al., "A Graph-theoretic Approach to Clock Skew Optimization," Month Unknown, 2004, 4 pages.
Huang, Andrew S., "Tao: An Architecturally Balanced Reconfigurable Hardware Processor," Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology, May 23, 1997, pp. 1-86, 107-109.
Morris, Kevin, "Lattice Launches XP: Non-Volatility at the Forefront of FPGA," FPGA and Programmable Logic Journal, Mar. 1, 2005, pp. 1-5, Techfocus Media, Inc.
Nelson, Brent E., "Reconfigurable Computing: An Introduction and Overview," Sep. 23, 1998, pp. 1-43.
Niedzielski, David, "An Overview of Reconfigurable Computing," Date Unknown, 26 pages.
Quicksilver Technology, Inc., "Adapt2000 ACM System Platform," Apr. 2004, pp. 1-39, QuickSilver Technology, Inc., San Jose, California, USA.
Quicksilver Technology, Inc., "InSpire SDK Tool Set," Product Brief, 2004 Month N/A, 4 pages, QuickSilver Technology, Inc., San Jose, California, USA.
Schaumont, Patrick, et al., "A Quick Safari Through the Reconfiguration Jungle," 38$^{th}$ Design Automation Conference, Jun. 2001, 7 pages, Las Vegas, Nevada, USA.
Schmit, Herman, et al., "Queue Machines: Hardware Compilation in Hardware," Proceedings of the 10$^{th}$ Annual IEEE Symposium on Field-Programmable Custom Computing Machines, Apr. 22-24, 2002, 9 pages.
Schmit, Herman, "Incremental Reconfiguration for Pipelined Applications," Proceedings of the 5$^{th}$ IEEE Symposium on FPGA-Based Custom Computing Machines, Apr. 16-18, 1997, 9 pages.
Schmit, Herman, et al., "FPGA Switch Block Layout and Evaluation," FPGA '02, Feb. 24-26, 2002, 8 pages, ACM, Monterey, California, USA.
Slade, Anthony L., et al., "Reconfigurable Computing Application Frameworks," 11$^{th}$ Annual IEEE Symposium on Field-Programmable Custom Computer Machines, Apr. 9-11, 2003, 10 pages.
Updated portions of prosecution history of U.S. Appl. No. 13/864,507, Aug. 4, 2014, Tabula, Inc.
Updated portions of prosecution history of U.S. Appl. No. 13/291,095, May 27, 2014, Fox, Brian.
Updated portions of prosecution history of U.S. Appl. No. 13/645,314, Feb. 14, 2014, Tabula, Inc.
Updated portions of prosecution history of U.S. Appl. No. 13/281,425, May 12, 2014, Hutchings, Brad, et al.
Updated portions of prosecution history of U.S. Appl. No. 13/864,507, Aug. 28, 2014, Tabula, Inc.
Updated portions of prosecution history of U.S. Appl. No. 13/291,095, Sep. 4, 2014, Fox, Brian.

* cited by examiner

| 17 | 16 | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|---|
| Opcode | | | | | | Data | | | | | | | | | | | | |
| 0 | 0 | 0 | 0 | 0 | 0 | Reserved | | | | | | | | | | | | Read |
| 0 | 0 | 0 | 0 | 0 | 1 | Reserved | | | | | | | | | | | | Read Increment |
| 0 | 0 | 0 | 0 | 1 | 0 | Write Data | | | | | | | | | | | | Write |
| 0 | 0 | 0 | 0 | 1 | 1 | Write Data | | | | | | | | | | | | Write Increment |
| 0 | 0 | 0 | 1 | 0 | 0 | Type | | X Coordinate | | | | | | | | | | Tile X |
| 0 | 0 | 0 | 1 | 0 | 0 | Type | | Y Coordinate | | | | | | | | | | Tile Y |
| 0 | 0 | 1 | 1 | 0 | 0 | Reserved | | Address | | | | | | | | | | Load Address |
| 0 | 0 | 1 | 1 | 1 | 0 | Reserved | | | | | | | | | | | | Stream |

| 127 | 126 | 125 | 124 | ● ● ● | 3 | 2 | 1 | 0 | Row 0 |
| 127 | 126 | 125 | 124 | ● ● ● | 3 | 2 | 1 | 0 | Row 1 |
| | | | | ⋮ | | | | | ⋮ |
| 127 | 126 | 125 | 124 | ● ● ● | 3 | 2 | 1 | 0 | Row 34 |
| 127 | 126 | 125 | 124 | ● ● ● | 3 | 2 | 1 | 0 | Row 35 |

*Figure 22*

INTEGRATED CIRCUIT (IC) WITH PRIMARY AND SECONDARY NETWORKS AND DEVICE CONTAINING SUCH AN IC

CLAIM OF BENEFIT TO PRIOR APPLICATIONS

This application is a national stage application of PCT Patent Application PCT/US2008/077141, entitled "METHOD AND SYSTEM FOR REPORTING ON A PRIMARY CIRCUIT STRUCTURE OF AN INTEGRATED CIRCUIT (IC) USING A SECONDARY CIRCUIT STRUCTURE OF THE IC," filed on Sep. 19, 2008. PCT Patent Application PCT/US2008/077141 claims the benefit of U.S. Provisional Application 60/973,736, entitled "Overlay Applications for a Second Network of a Configurable IC," filed Sep. 19, 2007; U.S. Provisional Application 61/042,695, entitled "Overlay Applications for a Secondary Network of a Configurable IC," filed Apr. 4, 2008; and U.S. Provisional Application 61/055,956, entitled "Overlay Applications for a Secondary Network of a Configurable IC," filed May 23, 2008 . All of the above mentioned applications, namely 60/973,736, 61/042,695, 61/055,956, and PCT/US2008/077141 are incorporated herein by reference.

FIELD OF THE INVENTION

The field of invention relates generally to configurable integrated circuits. More particularly, this invention relates to methods and systems for extending the use of a secondary circuit structure of an IC to provide overlay applications for a primary circuit structure of the IC.

BACKGROUND OF THE INVENTION

Configurable integrated circuits ("ICs") are programmable and can be used to implement multiple circuit designs created by users ("user designs") without having to fabricate a new IC for each design. However, many such user designs include various design bugs, design defects, or unexpected runtime behavior that pass unseen through design and testing. Therefore, it is common for ICs to include debug functionality to aid designers and other users in identifying and correcting such bugs, defects, and behavior. Debug functionality typically includes software and hardware components that collectively or separately are referred to as the debug network of the IC.

In some cases, the debug network is implemented by sharing the configurable circuits of the IC with a primary network of the IC. The primary network uses the same circuits to implement the logic functionality specified within a user design. In such cases, a more complicated debug network consumes greater resources of the IC, leaving fewer resources for implementing the user design. As a result, user designs become less sophisticated. Additionally, a change to either the core logic functionality of the primary network or the functionality of the debug network could cause the entire IC design to have to be recompiled, downloaded, and loaded onto the IC. This is due to the fact that changes to a design, even when made on a small scale to localized circuits, could have a design-wide impact affecting the overall circuit routing or timing of the design. These changes also create the risk that the circuit logic, including seemingly unrelated logic, may be "broken" due to errors in implementing the new functional change. Because of this risk, extensive regression testing and verification of the logic of the primary network and debug network is required.

In other cases, the debug network is fixed-function circuitry that exists exclusively for debugging purposes. However, implementing the debugging circuitry as fixed-function circuitry also has several drawbacks. For instance, resources are dedicated to performing debug functionality whether or not the user has a need for such debug functionality. A user design that has undergone extensive regression testing and verification before implementation may require only a minimal set of debug functionality. Similarly, a user design that is only an incremental upgrade to an already existing and verified design would have little use for the debug network. Therefore, the dedicated resources of the debug network go unused and are effectively wasted as these resources cannot be modified to complement the functionality of the primary network that implements the user design.

The fixed-function implementation of the debug network required system designers to predict what functionality had to be included within the debug network. System designers had to anticipate what statistical monitoring or debug functionality was needed in advance of designing the debug network and deploying the IC. Unanticipated usage, behavior, or operating conditions in the field could pose issues beyond the debugging scope of the programmed debug network, forcing users to have to employ third party tools or other means to perform the additional debug functionality needed to handle the unanticipated usage, behavior, or operating conditions.

Therefore, there is a need in the art to provide an IC that includes a configurable primary network and a mutually non-interfering configurable secondary/debug network. There is a need to adapt the resources of the secondary network to provide various overlay applications that operate independent of the primary network or operate to complement the functionality of the primary network.

SUMMARY OF THE INVENTION

Some embodiments provide a single integrated circuit ("IC") that includes (1) a primary circuit structure that implements a user design and (2) a secondary circuit structure that monitors the primary circuit structure by using a network and that performs one or more overlay applications based on the monitoring of the primary circuit structure. In some embodiments, the overlay functionality provided by the secondary circuit structure includes (1) monitoring the primary circuit structure in real-time, (2) monitoring raw data in the primary circuit structure to analyze performance of the primary circuit structure and to report performance results generated from the raw data, (3) monitoring raw data in the primary circuit structure to analyze behavior occurring within the primary circuit and identifying behavioral conditions determined from the raw data, (4) monitoring the primary circuit structure with the secondary circuit structure and modifying the primary circuit structure using the secondary circuit structure, (5) monitoring the primary circuit structure with the secondary circuit structure and modifying the secondary circuit structure based on the monitoring, and (6) various other self-modifying functionality.

The single IC of some embodiments includes a single substrate (e.g., semiconducting substrate) on which the primary circuit structure and the secondary circuit structure are built. In some embodiments, the single IC includes the primary circuit structure on a different wafer than the secondary circuit structure but within the same IC. Some such ICs include a System-On-Chip (SoC) or System-In-Package (SiP) solution.

In some embodiments, the primary circuit structure of the IC includes numerous configurable logic circuits and configurable interconnect circuits that are connected through a configurable routing fabric of wires, vias, buffers, etc. Together, the configurable circuits and routing fabric are configured to perform the functionality specified within the user design.

In some embodiments, the primary circuit structure of the IC is implemented using compiled instructions from the user design. For example, the primary circuit structure can be designed using Hardware Definition Language (HDL) design, such as VHDL or Verilog. The VHDL is then compiled to generate a set of Register Transfer Level (RTL) instructions for implementing the user design. The RTL instructions are then used to synthesis the user design by mapping the user design to circuits in the primary circuit structure. In some embodiments, the secondary circuit structure of the IC is invariant with respect to the compilation of the user design. Instead, the secondary circuit structure is configured using a user interface that allows a user to specify what resources of the primary circuit structure to monitor, analyze, report, and modify based on a post-RTL mapping of the user design to the primary circuit structure.

The secondary circuit structure of some embodiments is configurable to monitor raw data passing between inputs and outputs of any circuit within the primary circuit structure. The raw data represents the signal flow through the primary circuit structure that generates the user desired output of the user design. In some embodiments, the raw data includes user design data that is stored in user design storage elements (such as latches, registers, block memories, etc.). The secondary circuit structure analyzes the monitored raw data against one or more user specified conditions.

In some embodiments, the secondary circuit structure analyzes the raw data to detect line conditions, anomalous behavior, error conditions, etc. in the primary circuit structure. The secondary circuit structure then produces output data that is based on the analysis of the raw data. In some embodiments, the secondary circuit structure produces statistics (e.g., counts of the user specified event), metadata, performance measurements, and behavioral analysis data. The secondary circuit structure also generates alarms assertions based on the detected line conditions, anomalous behavior, detected error conditions, etc. The secondary circuit structure of some embodiments also performs various operational logic functions based on user specifiable events occurring within one or more resources of the primary circuit structure. In other words, the secondary circuit structure of some embodiments receives raw data but outputs processed data that is descriptive of what was monitored in the primary circuit structure.

In some embodiments, the secondary circuit structure analyzes the monitored data to modify one or more resources of the primary circuit structure. The secondary circuit structure of some embodiments analyzes the monitored data to modify one or more resources of the secondary circuit structure based on this monitoring. In some such embodiments, the secondary circuit structure monitors and/or modifies user data, control data (e.g., configuration data), or both when modifying the primary circuit structure and/or the secondary circuit structure.

The secondary circuit structure of some embodiments monitors one or more resources (e.g., circuits) of the primary circuit structure in real-time. Real-time monitoring ensures that the operations of the secondary circuit structure do not impede or delay operations of the primary circuit structure. In other words, the secondary circuit structure operates non-invasively to the primary circuit structure such that the throughput for circuits in the primary circuit structure remains unchanged irrespective of the operations performed by the secondary circuit structure on the primary circuit structure. In some embodiments, the real-time functionality of the secondary circuit structure ensures that the monitoring of events in the primary circuit structure occurs within a bounded latency, or within a latency that is commensurate with the performance of the primary circuit structure operations. In some embodiments, the bounded latency is on some order N user clock cycles where the maximum latency is known or predictable value that is not arbitrary. For instance, in some embodiments, the bounded latency is determined by the size of the IC or the size of the primary circuit structure.

In some embodiments, the secondary circuit structure is structurally different than the primary circuit structure. Specifically, the secondary circuit structure has various structural attributes that distinguishes its circuit structure from the primary circuit structure. For example, in some embodiments, the secondary circuit structure includes a pipelined, packet-switched network formed by bitlines that are separate from an interconnect network of the primary circuit structure (e.g., that are separate from a configurable routing fabric of the primary circuit structure). In some embodiments, the bitlines form a synchronized bus that passes through and is shared amongst a tiled arrangement of sets of configurable circuits that form the primary circuit structure. In this manner, the secondary circuit structure is able to globally access (e.g., read or write) raw inputs, raw outputs, stored values, configuration data, etc. of any one or more resources in the primary circuit structure. In some embodiments, the secondary circuit structure is also referred to as a secondary monitoring network.

In some embodiments, the functionality of the secondary circuit structure extends to sending signals from the secondary circuit structure into the primary circuit structure using the bitlines. In some such embodiments, the secondary circuit structure is able to change user configuration bits of the primary circuit structure, change values within user data storage elements of the primary circuit structure, or change states of the primary circuit structure, as some examples. As noted above, the secondary circuit structure of some embodiments is able to perform such writing while operating in a transparent manner that does not interfere with the user design operations of the primary circuit structure.

In some embodiments, the secondary circuit structure includes various monitoring circuits, such as trigger circuitry, event counters, mask and merge logic, deskew circuitry, memory trace buffer, and other circuitry that allows for reading from and writing to resources of the primary circuit structure using the communication bitlines. Other embodiments utilize other monitoring circuits.

The secondary circuit structure also stores raw and processed data related to operations of the primary circuit structure. In some embodiments, the circuits of the secondary circuit structure are configurable to specify and adjust which resources of the primary circuit structure are to be read from or written to during runtime operation of the IC.

In order to analyze the data monitored from the primary circuit structure, the secondary circuit structure may be configured to filter data that is read from the primary circuit structure based on one or more specified conditions (e.g., triggers, events, etc.) such that only desired data is recorded and presented for analysis. In some embodiments, the secondary circuit structure may be configured with trigger driven counters that record occurrences of user-specified events. Further still, the secondary circuit structure may be configured with trigger driven conditions that control the values that the secondary circuit structure writes back into the primary circuit structure and when such writes occur.

The configurable nature of the secondary circuit structure in some embodiments facilitates various overlay applications that operate in conjunction with the operation of the primary circuit structure in order to provide users with sophisticated debugging, diagnosing, and testing functionality that extend beyond traditional debug functionality of other ICs. One such overlay application of the secondary circuit structure is to monitor various tiles or circuits of the primary circuit structure in order to provide bandwidth measurements for these tiles or circuits. In this manner, the secondary circuit structure identifies bottlenecks within the primary logic functionality during runtime of the primary circuit structure without interfering with the runtime operation of the primary circuit structure.

Another example of an overlay application of the secondary circuit structure determines the usage of various resources within the primary circuit structure. For example, by monitoring buffers, memories, or queues (e.g., first in first out (FIFO) queue) of the primary circuit structure, some embodiments are able to determine a real-time state of the resources. Such functionality facilitates the detection of data overflows, data overwrites, or data corruption occurring within resources of the primary circuit structure.

Yet another example of the overlay application of the secondary circuit structure monitors and modifies the performance of one or more circuits of the primary circuit structure. For instance, the secondary circuit structure can monitor and modify logical adaptive filters operating within circuits of the primary circuit structure. Adaptive filters include coefficients that adjust based on the operation of one or more inputs into the filter or other signals entering the filter. Using the secondary circuit structure, some embodiments monitor the operation of the adaptive filter and adapt the functionality of the adaptive filter as needed by modifying the coefficients of the adaptive filter.

In some embodiments, the secondary circuit structure modifies the operations of circuits of the primary circuit structures during operation of the primary circuit structure and without usurping resources of the primary circuit structure. For instance, in this manner, some embodiments allow designers the ability to test modifications to an adaptive filter or modify the operation of an adaptive filter using the secondary circuit structure based on perceived patterns. Moreover, the modifications may be made without modification to the configuration of the primary circuit structure, allowing the user design implemented by the primary logic to continue operating unhindered and unknowing of the changes occurring to the coefficients of the adaptive filter. Additionally, in some embodiments, the operations of the filter are modified by altering the configuration data used to configure the circuits implementing the filter.

In some embodiments, an overlay application of the secondary circuit structure secures the functionality of a system operating in conjunction with the primary circuit structure of the IC. In some such embodiments, the primary circuit structure of the IC provides various logic functionalities for the system and the secondary circuit structure secures the system by intercepting anomalous behavior that could otherwise cause the primary circuit structure or other system components to malfunction and thus halt operation of the system. The secondary circuit structure triggers an assertion upon detecting the anomalous behavior within the primary circuit structure. The assertion generates an interrupt that is detected by one or more components of the system with logic for modifying the operation of the system to correct or avoid processing the anomalous behavior.

Another example of an overlay application of the secondary circuit structure provides automatic test functionality for the IC by automatically modifying the I/O buffers. Specifically, the secondary circuit structure modifies I/O settings for a primary circuit structure configured to provide test vectors to a device under test such that different sets of test vectors are passed to the device under test with a different set of I/O settings.

Additionally, in some embodiments, an overlay application of the secondary circuit structure directly complements the functionality of the primary circuit structure by allowing user logic to extend beyond resources of the primary circuit structure and seamlessly integrate with the resources of the secondary circuit structure. In some embodiments, the secondary circuit structure contains various logic resources such as one or more processors, memories, or configurable logic circuits that are usable for extending the functionality of the primary circuit structure. The secondary circuit structure extends the functionality of the primary circuit structure by reconfiguring sections of the primary circuit structure in a modular fashion during the operation of the IC. For instance, the secondary circuit structure reconfigures a first section in the primary circuit structure to implement the functionality of a second section of the primary circuit structure such that the second section reconfigures while the operations continue to be processed within the first section. Once the second section of the primary circuit structure is reconfigured, the processing reverts from the first section to the second section in a seamless fashion that does not interfere with the operation of the other sections of the IC or with the operation of the IC as a whole. Alternatively, the secondary circuit structure of some embodiments extends the functionality of a particular section of the primary circuit structure by leveraging some of the resources of the secondary circuit structure such that some of the resources needed for implementing the functionality of the section are located in the secondary circuit structure. Also, in some embodiments, the first set of circuits is selected from circuits of the secondary circuit structure instead of the circuits of the primary circuit structure.

In some embodiments, the secondary circuit structure is utilized to transmit configuration data for configuring circuits in the primary circuit structure. As such, the secondary circuit structure is able to read and write to any such configurable circuit within the primary circuit structure.

The primary circuit structure of the IC in some embodiments is formed by numerous configurable circuits that are arranged in the IC according to a particular arrangement. However, it should be apparent to one of ordinary skill in the art that the secondary circuit structure functionality is not limited to such a primary circuit structure of an IC. The secondary circuit structure may be used as a single chip solution with any primary circuit structure of a single IC. Accordingly, the secondary circuit structure of some embodiments can monitor a primary circuit structure that is an Field Programmable Gate Arrays ("FPGAs"), an ASIC, a microprocessor, a microcontroller, a memory, or any other such type of circuit found in an IC. Moreover, it should be apparent that such a monitored primary circuit structure may include different combinations of such circuits (e.g., a combination of configurable circuits and microprocessor, or microprocessor and an ASIC).

BRIEF DESCRIPTION OF THE DRAWINGS

The novel features of the invention are set forth in the appended claims. However, for purpose of explanation, several embodiments of the invention are set forth in the following figures.

FIG. 12 illustrates examples of types of frames that may be used in packets of some embodiments.

FIG. 22 illustrates a conceptual diagram of a trace buffer of some embodiments.

DETAILED DESCRIPTION OF THE INVENTION

Figure 1:
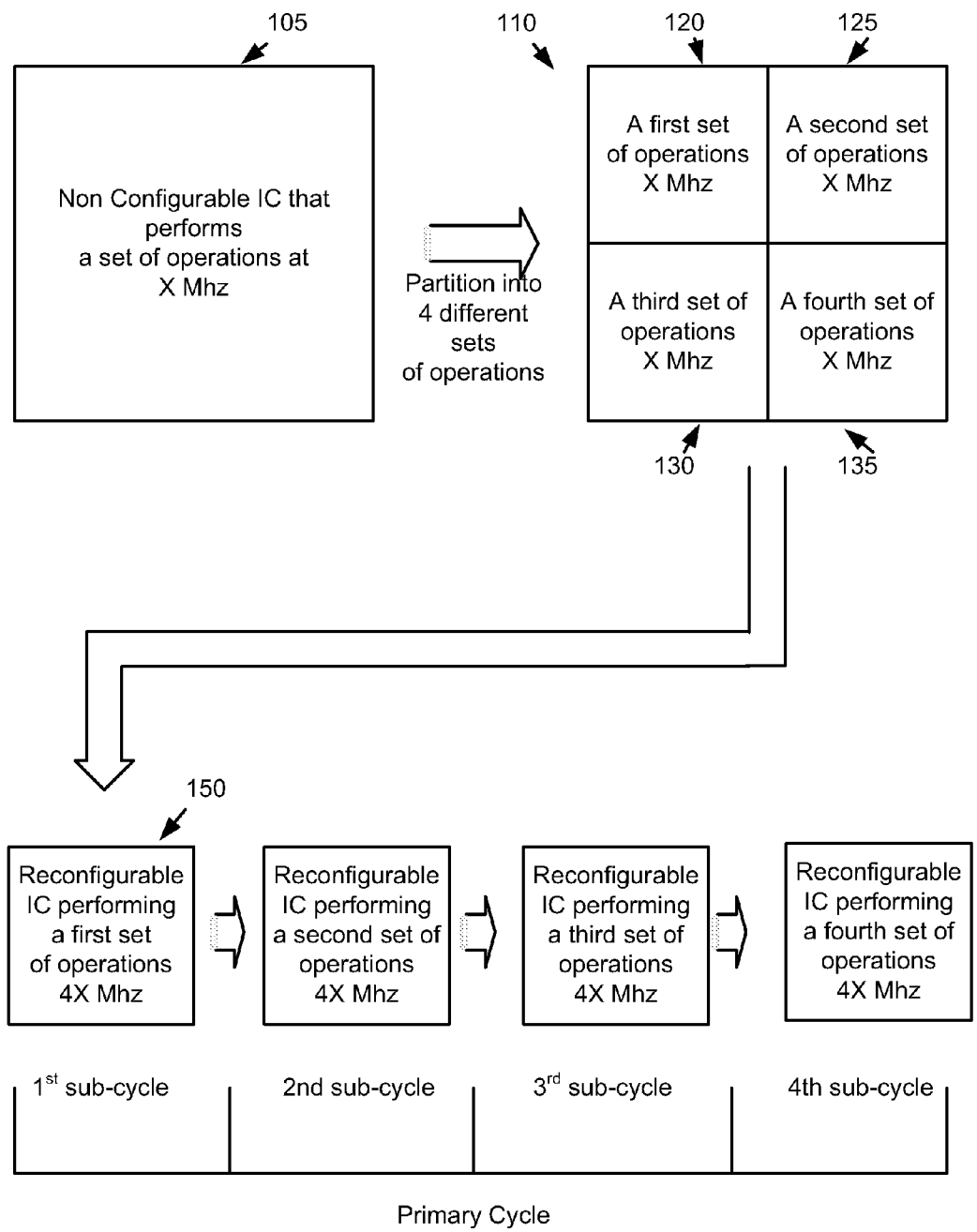
FIG. 1 illustrates an example of a sub-cycle reconfigurable IC.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. Overview

Some embodiments provide a single integrated circuit ("IC") that includes (1) a primary circuit structure that implements a user design and (2) a secondary circuit structure that monitors the primary circuit structure by using a network and that performs one or more overlay applications based on the monitoring of the primary circuit structure. In some embodiments, the overlay functionality provided by the secondary circuit structure includes (1) monitoring the primary circuit structure in real-time, (2) monitoring raw data in the primary circuit structure to analyze performance of the primary circuit structure and to report performance results generated from the raw data, (3) monitoring raw data in the primary circuit structure to analyze behavior occurring within the primary circuit and identifying behavioral conditions determined from the raw data, (4) monitoring the primary circuit structure with the secondary circuit structure and modifying the primary circuit structure using the secondary circuit structure, (5) monitoring the primary circuit structure with the secondary circuit structure and modifying the secondary circuit structure based on the monitoring, and (6) various other self-modifying functionality.

The single IC of some embodiments includes a single substrate (e.g., semiconducting substrate) on which the primary circuit structure and the secondary circuit structure are built. In some embodiments, the single IC includes the primary circuit structure on a different wafer than the secondary circuit structure but within the same IC. Some such ICs include a System-On-Chip (SoC) or System-In-Package (SiP) solution.

In some embodiments, the primary circuit structure of the IC includes numerous configurable logic circuits and configurable interconnect circuits that are connected through a configurable routing fabric of wires, vias, buffers, etc. Together, the configurable circuits and routing fabric are configured to perform the functionality specified within the user design.

In some embodiments, the primary circuit structure of the IC is implemented using compiled instructions from the user design. For example, the primary circuit structure can be designed using Hardware Definition Language (HDL) design, such as VHDL or Verilog. The VHDL is then compiled to generate a set of Register Transfer Level (RTL) instructions for implementing the user design. The RTL instructions are then used to synthesis the user design by mapping the user design to circuits in the primary circuit structure. In some embodiments, the secondary circuit structure of the IC is invariant with respect to the compilation of the user design. Instead, the secondary circuit structure is configured using a user interface that allows a user to specify what resources of the primary circuit structure to monitor, analyze, report, and modify based on a post-RTL mapping of the user design to the primary circuit structure.

The secondary circuit structure of some embodiments is configurable to monitor raw data passing between inputs and outputs of any circuit within the primary circuit structure. The raw data represents the signal flow through the primary circuit structure that generates the user desired output of the user design. In some embodiments, the raw data includes user design data that is stored in user design storage elements (such as latches, registers, block memories, etc.). The secondary circuit structure analyzes the monitored raw data against one or more user specified conditions.

In some embodiments, the secondary circuit structure analyzes the raw data to detect line conditions, anomalous behavior, error conditions, etc. in the primary circuit structure. The secondary circuit structure then produces output data that is based on the analysis of the raw data. In some embodiments, the secondary circuit structure produces statistics (e.g., counts of the user specified event), metadata, performance measurements, and behavioral analysis data. The secondary circuit structure also generates alarms assertions based on the detected line conditions, anomalous behavior, detected error conditions, etc. The secondary circuit structure of some embodiments also performs various operational logic functions based on user specifiable events occurring within one or more resources of the primary circuit structure. In other words, the secondary circuit structure of some embodiments receives raw data but outputs processed data that is descriptive of what was monitored in the primary circuit structure.

In some embodiments, the secondary circuit structure analyzes the monitored data to modify one or more resources of the primary circuit structure. The secondary circuit structure of some embodiments analyzes the monitored data to modify one or more resources of the secondary circuit structure based on this monitoring. In some such embodiments, the secondary circuit structure monitors and/or modifies user data, control data (e.g., configuration data), or both when modifying the primary circuit structure and/or the secondary circuit structure.

The secondary circuit structure of some embodiments monitors one or more resources (e.g., circuits) of the primary circuit structure in real-time. Real-time monitoring ensures that the operations of the secondary circuit structure do not impede or delay operations of the primary circuit structure. In other words, the secondary circuit structure operates non-invasively to the primary circuit structure such that the throughput for circuits in the primary circuit structure remains unchanged irrespective of the operations performed by the secondary circuit structure on the primary circuit structure. In some embodiments, the real-time functionality of the secondary circuit structure ensures that the monitoring of events in the primary circuit structure occurs within a bounded latency, or within a latency that is commensurate with the performance of the primary circuit structure operations. In some embodiments, the bounded latency is on some order N user clock cycles where the maximum latency is known or predictable value that is not arbitrary. For instance, in some embodiments, the bounded latency is determined by the size of the IC or the size of the primary circuit structure.

In some embodiments, the secondary circuit structure is structurally different than the primary circuit structure. Specifically, the secondary circuit structure has various structural attributes that distinguishes its circuit structure from the primary circuit structure. For example, in some embodiments, the secondary circuit structure includes a pipelined, packet-switched network formed by bitlines that are separate from an interconnect network of the primary circuit structure (e.g., that are separate from a configurable routing fabric of the primary circuit structure). In some embodiments, the bitlines form a synchronized bus that passes through and is shared amongst a tiled arrangement of sets of configurable circuits that form the primary circuit structure. In this manner, the secondary circuit structure is able to globally access (e.g., read or write) raw inputs, raw outputs, stored values, configuration data, etc. of any one or more resources in the primary circuit structure. In some embodiments, the secondary circuit structure is also referred to as a secondary monitoring network.

In some embodiments, the functionality of the secondary circuit structure extends to sending signals from the secondary circuit structure into the primary circuit structure using the bitlines. In some such embodiments, the secondary circuit structure is able to change user configuration bits of the primary circuit structure, change values within user data storage elements of the primary circuit structure, or change states of the primary circuit structure, as some examples. As noted above, the secondary circuit structure of some embodiments is able to perform such writing while operating in a transparent manner that does not interfere with the user design operations of the primary circuit structure.

In some embodiments, the secondary circuit structure includes various monitoring circuits, such as trigger circuitry, event counters, mask and merge logic, deskew circuitry, memory trace buffer, and other circuitry that allows for reading from and writing to resources of the primary circuit structure using the communication bitlines. Other embodiments utilize other monitoring circuits.

The secondary circuit structure also stores raw and processed data related to operations of the primary circuit structure. In some embodiments, the circuits of the secondary circuit structure are configurable to specify and adjust which resources of the primary circuit structure are to be read from or written to during runtime operation of the IC.

In order to analyze the data monitored from the primary circuit structure, the secondary circuit structure may be configured to filter data that is read from the primary circuit structure based on one or more specified conditions (e.g., triggers, events, etc.) such that only desired data is recorded and presented for analysis. In some embodiments, the secondary circuit structure may be configured with trigger driven counters that record occurrences of user-specified events. Further still, the secondary circuit structure may be configured with trigger driven conditions that control the values that the secondary circuit structure writes back into the primary circuit structure and when such writes occur.

The configurable nature of the secondary circuit structure in some embodiments facilitates various overlay applications that operate in conjunction with the operation of the primary circuit structure in order to provide users with sophisticated debugging, diagnosing, and testing functionality that extend beyond traditional debug functionality of other ICs. One such overlay application of the secondary circuit structure is to monitor various tiles or circuits of the primary circuit structure in order to provide bandwidth measurements for these tiles or circuits. In this manner, the secondary circuit structure identifies bottlenecks within the primary logic functionality during runtime of the primary circuit structure without interfering with the runtime operation of the primary circuit structure.

Another example of an overlay application of the secondary circuit structure determines the usage of various resources within the primary circuit structure. For example, by monitoring buffers, memories, or queues (e.g., first in first out (FIFO) queue) of the primary circuit structure, some embodiments are able to determine a real-time state of the resources. Such functionality facilitates the detection of data overflows, data overwrites, or data corruption occurring within resources of the primary circuit structure.

Yet another example of the overlay application of the secondary circuit structure monitors and modifies the performance of one or more circuits of the primary circuit structure. For instance, the secondary circuit structure can monitor and modify logical adaptive filters operating within circuits of the primary circuit structure. Adaptive filters include coefficients that adjust based on the operation of one or more inputs into the filter or other signals entering the filter. Using the secondary circuit structure, some embodiments monitor the operation of the adaptive filter and adapt the functionality of the adaptive filter as needed by modifying the coefficients of the adaptive filter.

In some embodiments, the secondary circuit structure modifies the operations of circuits of the primary circuit structures during operation of the primary circuit structure and without usurping resources of the primary circuit structure. For instance, in this manner, some embodiments allow designers the ability to test modifications to an adaptive filter or modify the operation of an adaptive filter using the secondary circuit structure based on perceived patterns. Moreover, the modifications may be made without modification to the configuration of the primary circuit structure, allowing the user design implemented by the primary logic to continue operating unhindered and unknowing of the changes occurring to the coefficients of the adaptive filter. Additionally, in some embodiments, the operations of the filter are modified by altering the configuration data used to configure the circuits implementing the filter.

In some embodiments, an overlay application of the secondary circuit structure secures the functionality of a system operating in conjunction with the primary circuit structure of the IC. In some such embodiments, the primary circuit structure of the IC provides various logic functionalities for the system and the secondary circuit structure secures the system by intercepting anomalous behavior that could otherwise cause the primary circuit structure or other system components to malfunction and thus halt operation of the system. The secondary circuit structure triggers an assertion upon detecting the anomalous behavior within the primary circuit structure. The assertion generates an interrupt that is detected by one or more components of the system with logic for modifying the operation of the system to correct or avoid processing the anomalous behavior.

Another example of an overlay application of the secondary circuit structure provides automatic test functionality for the IC by automatically modifying the I/O buffers. Specifically, the secondary circuit structure modifies I/O settings for a primary circuit structure configured to provide test vectors to a device under test such that different sets of test vectors are passed to the device under test with a different set of I/O settings.

Additionally, in some embodiments, an overlay application of the secondary circuit structure directly complements the functionality of the primary circuit structure by allowing user logic to extend beyond resources of the primary circuit structure and seamlessly integrate with the resources of the secondary circuit structure. In some embodiments, the secondary circuit structure contains various logic resources such as one or more processors, memories, or configurable logic circuits that are usable for extending the functionality of the primary circuit structure. The secondary circuit structure extends the functionality of the primary circuit structure by reconfiguring sections of the primary circuit structure in a modular fashion during the operation of the IC. For instance, the secondary circuit structure reconfigures a first section in the primary circuit structure to implement the functionality of a second section of the primary circuit structure such that the second section reconfigures while the operations continue to be processed within the first section. Once the second section of the primary circuit structure is reconfigured, the processing reverts from the first section to the second section in a seamless fashion that does not interfere with the operation of the other sections of the IC or with the operation of the IC as a whole. Alternatively, the secondary circuit structure of some embodiments extends the functionality of a particular section of the primary circuit structure by leveraging some of the resources of the secondary circuit structure such that some of the resources needed for implementing the functionality of the section are located in the secondary circuit structure. Also, in some embodiments, the first set of circuits is selected from circuits of the secondary circuit structure instead of the circuits of the primary circuit structure.

In some embodiments, the secondary circuit structure is utilized to transmit configuration data for configuring circuits in the primary circuit structure. As such, the secondary circuit structure is able to read and write to any such configurable circuit within the primary circuit structure.

The primary circuit structure of the IC in some embodiments is formed by numerous configurable circuits that are arranged in the IC according to a particular arrangement. However, it should be apparent to one of ordinary skill in the art that the secondary circuit structure functionality is not limited to such a primary circuit structure of an IC. The secondary circuit structure may be used as a single chip solution with any primary circuit structure of a single IC. Accordingly, the secondary circuit structure of some embodiments can monitor a primary circuit structure that is an Field Programmable Gate Arrays ("FPGAs"), an ASIC, a microprocessor, a microcontroller, a memory, or any other such type of circuit found in an IC. Moreover, it should be apparent that such a monitored primary circuit structure may include different combinations of such circuits (e.g., a combination of configurable circuits and microprocessor, or microprocessor and an ASIC).

Several more detailed embodiments of the invention are described in the sections below. Section II describes an IC architecture for the primary and secondary circuit structures of some embodiments. Next, Section III provides a discussion of the overlay applications of a secondary circuit structure for use in conjunction with or independent of the functionality of a primary circuit structure of the IC. Section IV describes an electronics system that has an IC which implements some of the embodiments of the invention. Lastly, Section V describes the tools to configure the primary and secondary circuit structures.

II. Integrated Circuit (IC) with Configurable Elements

An integrated circuit ("IC") is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an IC that has configurable circuits. A configurable circuit is a circuit that can "configurably" perform a set of operations. Specifically, a configurable circuit receives a configuration data set that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable ICs configurable circuits) to implement the IC design, also referred to as the user design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set. In some embodiments, the IC includes many such circuits. For example, such an IC includes hundreds, thousands, or hundreds of thousands, more of such circuits.

A configurable interconnect circuit is a circuit that can configurably connect an input set to an output set in a variety of manners. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). It should be apparent to one of ordinary skill in the art that in addition to configurable circuits, a configurable IC also typically includes non-configurable circuits (e.g., non-configurable logic circuits, interconnect circuits, memories, etc.).

The configurable interconnect circuit passes signals through a routing fabric of the configurable IC. The routing fabric provides a communication pathway for routing signals to and from source and destination circuits or components. In some embodiments, the routing fabric includes storage elements in addition to the various routing circuits, the wire segments (e.g., the metal or polysilicon segments) that connect to the routing circuits, and vias that connect to these wire segments and to the terminals of the routing circuits. These storage elements include latches and registers distributed across the routing fabric that provide one or more different means for storing signals in the routing fabric.

In some of these embodiments, the routing fabric also includes buffers for achieving one or more objectives (e.g., maintaining the signal strength, reducing noise, altering signal delay, etc.) vis-a-vis the signals passing along the wire segments. In conjunction with or instead of these buffer circuits, the routing fabric of some embodiments might also include one or more non-configurable circuits (e.g., non-configurable interconnect circuits).

In some embodiments, the IC resources (e.g., logic circuits and interconnect circuits) are grouped in conceptually tiles that are arranged in several rows and columns. In some embodiments, these resources include configurable logic resources and configurable routing resources (i.e., configurable interconnect circuits). In some embodiments, one or more tiles include dedicated non-configurable resources in addition to or instead of the above described configurable resources. Together, this arrangement forms a primary circuit structure of the IC that implements the user design logic. In the following example, several examples are given using ICs with configurable resources. However, one of ordinary skill in the art will realize that the teachings are not limited to a configurable IC and is applicable to any integrated circuits, such as application-specific integrated circuits (ASICs), structured ASICs, field-programmable gate arrays (FPGAs), programmable logic devices (PLDs), complex programmable logic devices (CPLDs), system on chips (SOCs), system-in-packages (SIPs), reconfigurable ICs (e.g., space-time machines), etc.

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

For instance, a reconfigurable circuit of some embodiments that operates on four sets of configuration data receives its four configuration data sets sequentially in an order that loops from the first configuration data set to the last configuration data set. Such a sequential reconfiguration scheme is referred to as a four "loopered" scheme where a single user clock cycle is partitioned into four separate sub-cycle. Each reconfigurable circuit performs a set of operations on each sub-cycle based on the configuration data set it receives for that sub-cycle. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

FIG. 1 conceptually illustrates an example of a sub-cycle reconfigurable IC (i.e., an IC that is reconfigurable on a sub-cycle basis). In this example, the sub-cycle reconfigurable IC implements an IC design 105 that operates at a clock speed of X MHz. The operations performed by the components in the IC design 105 can be partitioned into four sets of operations 120-135, with each set of operations being performed at a clock speed of X MHz.

FIG. 1 then illustrates that these four sets of operations 120-135 can be performed by one sub-cycle reconfigurable IC 110 that operates at 4X MHz. In some embodiments, four cycles of the 4X MHz clock correspond to four sub-cycles within a cycle of the X MHz clock. Accordingly, this figure illustrates the reconfigurable IC 110 reconfiguring four times during four cycles of the 4X MHz clock (i.e., during four sub-cycles of the X MHz clock). During each of these reconfigurations (i.e., during each sub-cycle), the reconfigurable IC 110 performs one of the identified four sets of operations. In other words, the faster operational speed of the reconfigurable IC 110 allows this IC to reconfigure four times during each cycle of the X MHz clock, in order to perform the four sets of operations sequentially at a 4X MHz rate instead of performing the four sets of operations in parallel at an X MHz rate.

In addition to this primary circuit structure of the IC, some embodiments further provide a secondary IC circuit structure that is "on-chip". In some embodiments, the on-chip secondary circuit structure is a circuit structure of resources that is located on the same physical wafer as the resources of the primary circuit structure. In some embodiments, the on-chip secondary circuit structure is a circuit structure of resources that is located on a different physical wafer or layer than the primary circuit structure, but wherein the wafers or layers for both the primary and secondary circuit structure are included within the same physical package enclosing the IC as a single chip. Accordingly, the below described functionality of the secondary circuit structure is implemented and performed on the same physical chip as the primary circuit structure. In some embodiments, the secondary circuit structure is an optical circuit structure, while the primary circuit structure is an electrical circuit structure The secondary circuit structure is a different circuit structure than the primary circuit structure implementing the user design. Specifically, in some embodiments, the user design is not mapped to the secondary circuit structure. Rather, the secondary circuit structure of some embodiments is used to monitor any resource within the primary circuit structure and analyze the monitored results. Additionally, the secondary circuit structure of some embodiments is a configuration circuit structure through which configuration data that is streamed into the IC is routed to the appropriate tiles and ultimately to the appropriate configurable circuits of the primary circuit structure that configure to perform operations in accordance with the user design. In some embodiments, the secondary circuit structure is also a debug circuit structure that provides functionality extended beyond traditional debug functionality. Such functionality may operate independent of, and/or complement the functionality of, the user design implemented by the primary circuit structure. In each instance, the secondary circuit structure operates in a non-interfering manner with the operations of the primary circuit structure.

The secondary circuit structure interfaces with the primary circuit structure through a set of bitlines that pass through and are shared amongst various tiles of configurable circuits of the primary circuit structure. In some embodiments, relevant user signals are dynamically routed over the bitlines from the primary circuit structure to the secondary circuit structure and from the secondary circuit structure to the primary circuit structure such that there is no impact to the user circuits (e.g., the configurable circuits implementing the user design) configured in the primary circuit structure. Accordingly, there is no impact to the functionality configured within the primary circuit structure (i.e., the user design).

In some embodiments, the secondary circuit structure is initially configured via an external interface into the IC. In some embodiments, the external interface includes Joint Test Action Group ("JTAG") interface, flash, slave peripheral port, or through other means of communications with the IC, such as the I/O buffers of the IC. Also, in some embodiments, these various external interfaces may be used to perform read-back from the secondary circuit structure to the external interfaces. In addition to providing access to the secondary circuit structure from outside of the IC, some embodiments of the IC include a "fabric port," through which a user circuit, or user logic, of the primary circuit structure accesses the secondary circuit structure. Such a fabric port is explained further below with reference to FIG. 21. In some embodiments, the user circuit includes logic that is not implemented on either the primary or secondary circuit structure, but may include logic in the same package or IC of a System-On-Chip ("SoC") implementation defined with reference to FIG. 70 below.

Figure 2:
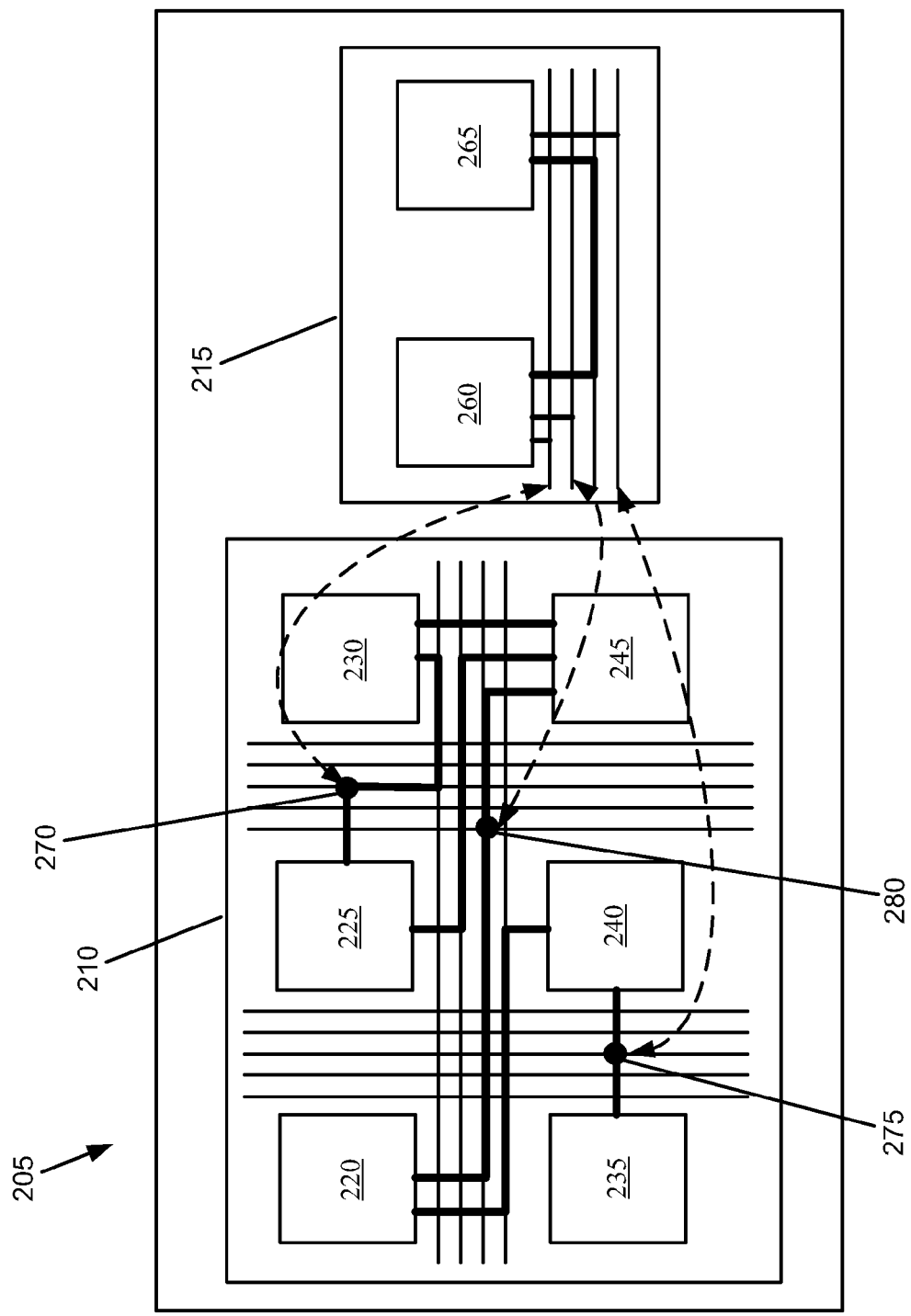
FIG. 2 conceptually illustrates the dynamic routing of user signals from the primary circuit structure to the secondary circuit structure through a set of shared resources.

FIG. 2 conceptually illustrates the dynamic routing of user signals from the primary circuit structure to the secondary circuit structure through a set of shared resources in some embodiments. As shown, an integrated circuit ("IC") 205 includes the primary circuit structure 210 and the secondary circuit structure 215 with various interconnects 270-280 that allow for intercommunications between the two circuit structures.

The primary circuit structure 210 includes blocks of configurable circuits 220-245 that represents tiles of the IC. The various interconnects within the primary circuit structure 210 connect the block 220-245 to one another. Additionally, these interconnects also include bitlines for passing signals to the secondary circuit structure. For instance, a communication pathway between the primary circuit structure 210 and secondary circuit structure 215 exists at locations 270-280. These locations may include unused storage elements within the routing fabric or routing circuits from which signals passing through the primary circuit structure 210 reach the circuits of the secondary circuit structure 215.

As such, signals may pass from the primary circuit structure to the secondary circuit structure in a manner that does not interfere with the operation of the primary circuit structure. As shown, the secondary circuit structure 215 includes circuits 260-265 with a separate set of interconnects over which signals from the communication bitlines with the primary circuit structure pass into the circuits 260-265 of the secondary circuit structure.

In order to illustrate the conceptual difference between the primary and secondary circuit structures, the primary circuit structure 210 and the secondary circuit structure 215 are shown as being separate in this figure. However, in some embodiments, the circuits and bitlines of the secondary circuit structure are physically interspersed with the circuits and bitlines of the primary circuit structure. In other words, the secondary circuit structure may be thought of as an "overlay" circuit structure with regard to the primary circuit structure.

Figure 3:
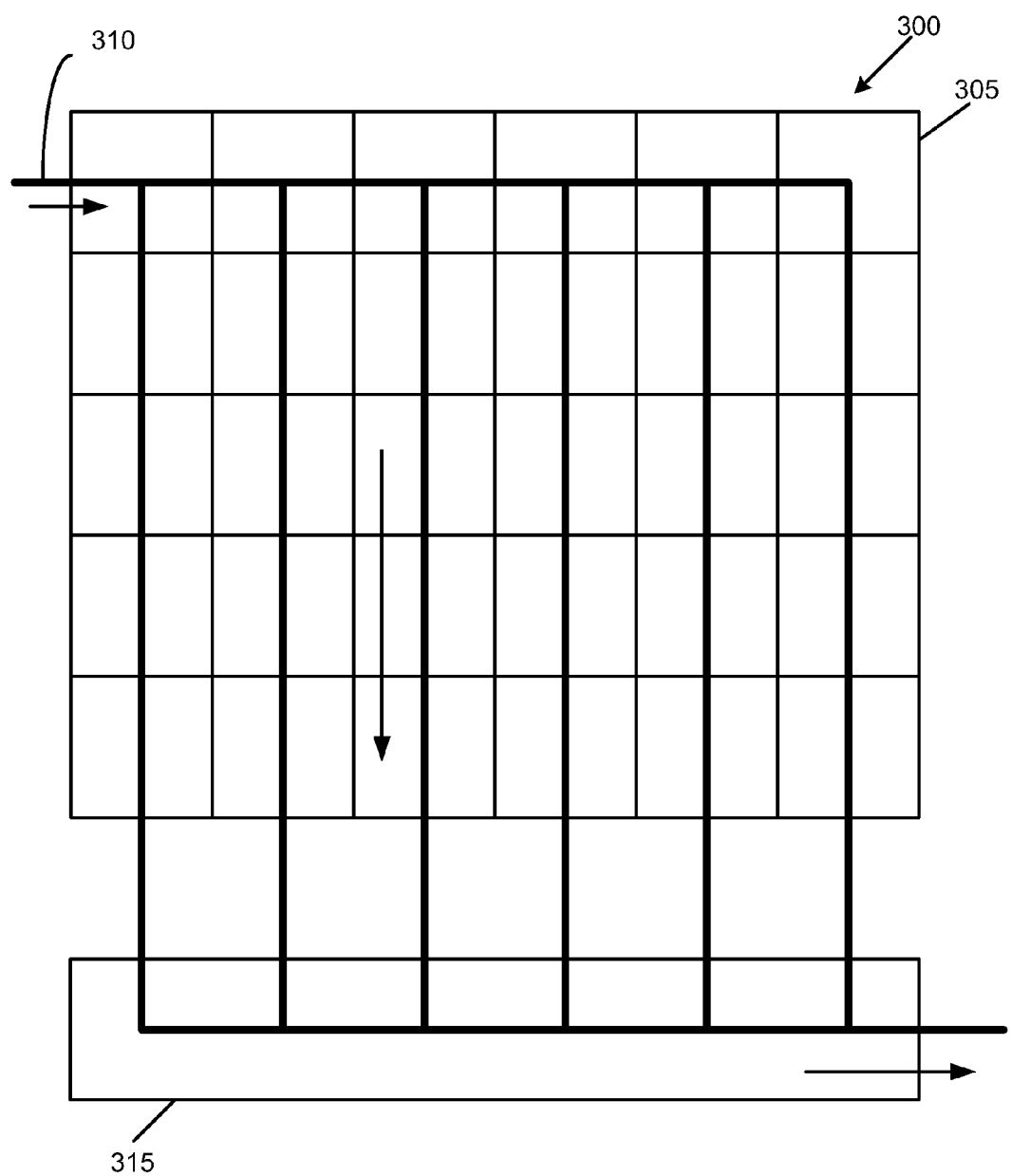
FIG. 3 illustrates an example of an IC that includes numerous configurable tiles of a primary circuit structure and a communication pathway for facilitating the interactions between the primary circuit structure and the secondary circuit structure.

FIG. 3 conceptually illustrates an example of a configurable IC 300 that includes numerous configurable tiles 305 of a primary circuit structure and a communication pathway for facilitating the interactions between the primary circuit structure and the secondary circuit structure. Each configurable tile 305 of the primary circuit structure receives a set of lines 310 that are part of the secondary circuit structure. The lines 310 pass debug data, configuration data, or other data (e.g., resource state data, assertions, logic computations, etc.) on to transport circuit structure 315 of the secondary circuit structure, which in turn passes the data on to other components of the secondary circuit structure (not shown). In some embodiments, the lines 310 also pass data from the secondary circuit structure to the primary circuit structure.

In some embodiments, the set of lines 310 are a uniform set of lines distributed throughout the primary circuit structure, through every set of tiles. The set of lines 310 may include 18 lines, 6 of which are used to provide control signals and twelve of which are used to provide data signals. The 6 control signals serve as an opcode (operation code), while the twelve signals serve as the operand (i.e., data argument) associated with the opcode. Some examples of the opcodes and operands are further discussed below.

In some embodiments, there is an unused area of the IC between the configurable tiles 305 and the transport circuit structure 315. Having the transport circuit structure 315 be separate from the main set of configurable circuits allows multiple generations of the configurable IC to use different designs for the transport circuit structure 315 without disrupting the design of the fabric of the primary circuit structure. Some embodiments use a packet switching technology to route data to and from the resources in the configurable tiles. Hence, over the lines 310, these embodiments can route variable length data packets to each configurable tile in a sequential or random access manner. Additionally, the packet switching allows the lines 310 to be shared by all tiles and circuits of the primary circuit structure in communications with the secondary circuit structure. Several embodiments of the packet switched secondary circuit structure operating in conjunction with the primary circuit structure of the IC will now be given.

Data packets routed according to the packet switching functionality of some embodiments include one or more data frames. In some embodiments, an initial set of frames (e.g., first one or two frames) of the packet identifies configurable tiles for routing the remaining frames of the data packet. In other words, the initial set of frames specifies one or more destinations for receiving the data packet. Some embodiments allow tiles to be individually addressed, globally addressed, or addressed based on their tile types. The remaining frames can then contain configuration, debug, or other data for performing one or more overlay applications of the secondary circuit structure. A more detailed description of the data packet structure is provided below with reference to FIG. 12 below.

Figure 4:
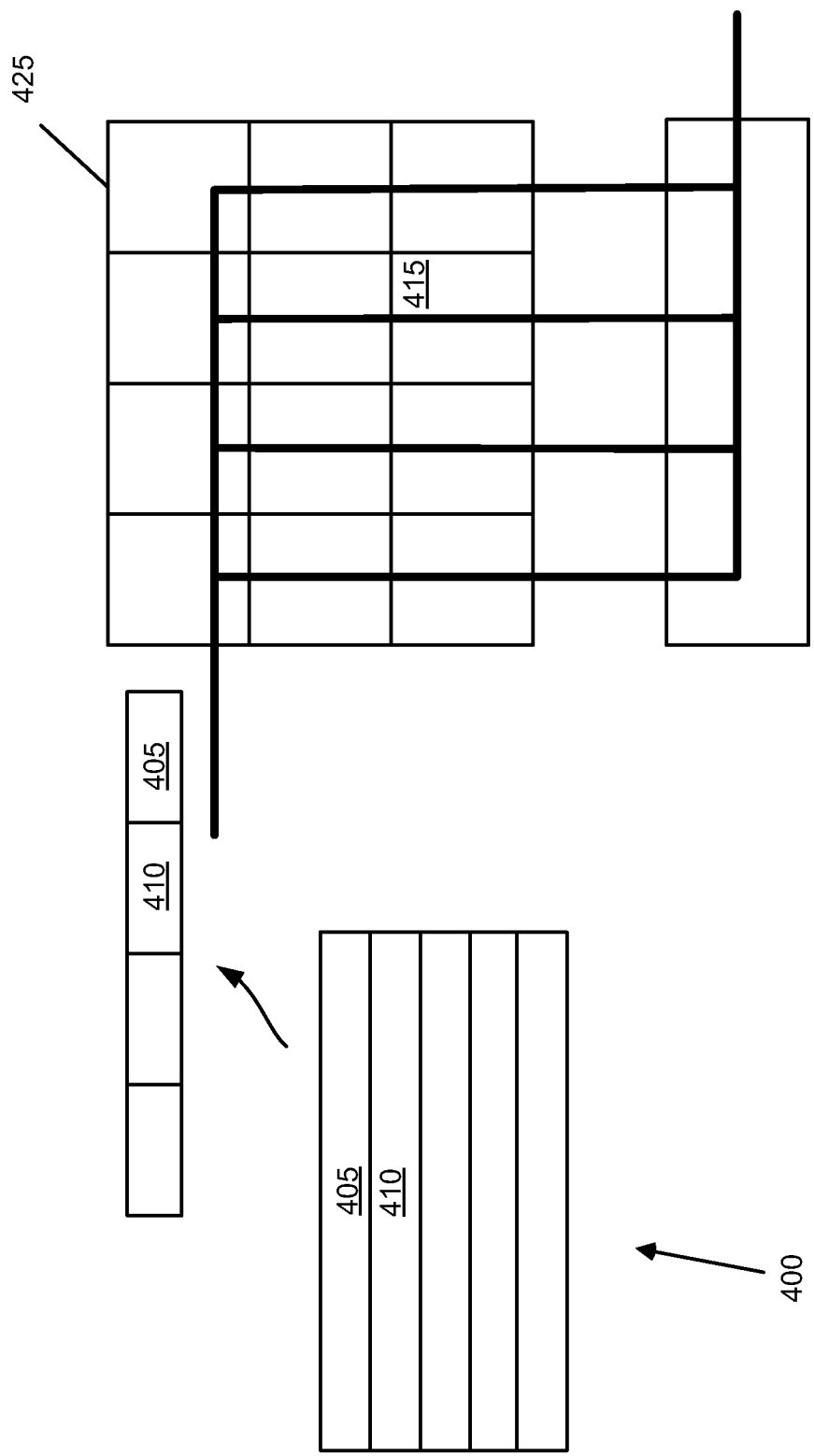
FIGS. 4-6 illustrate an example of how an initial set of frames in a packet might specify the routing of a packet to a configurable tile.
Figure 5:
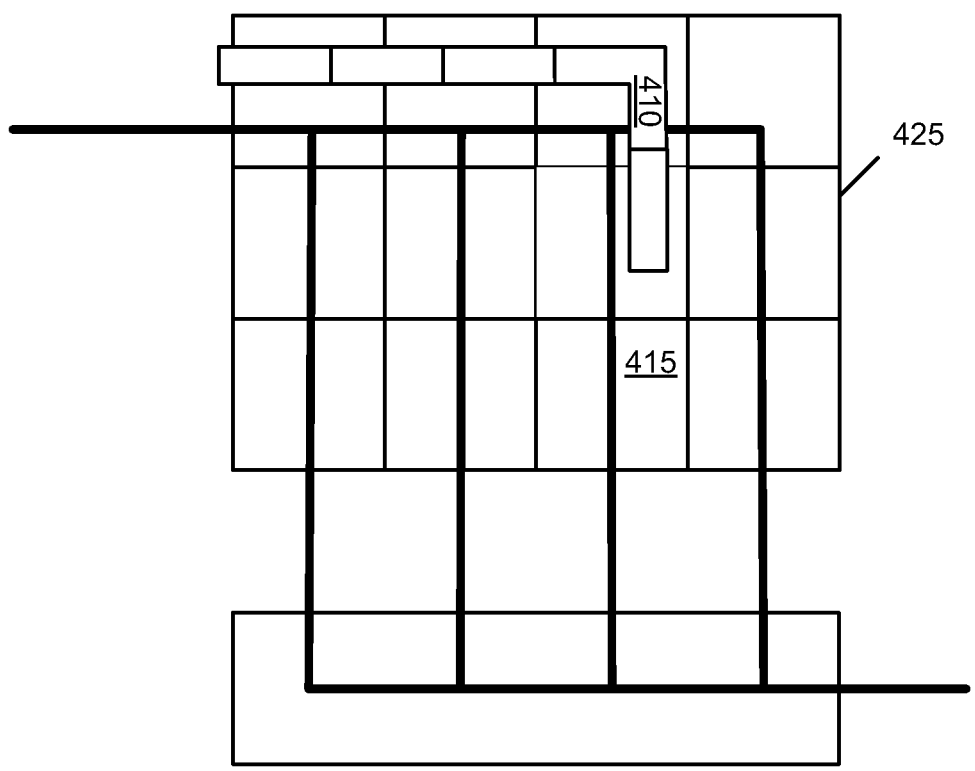
Figure 6:
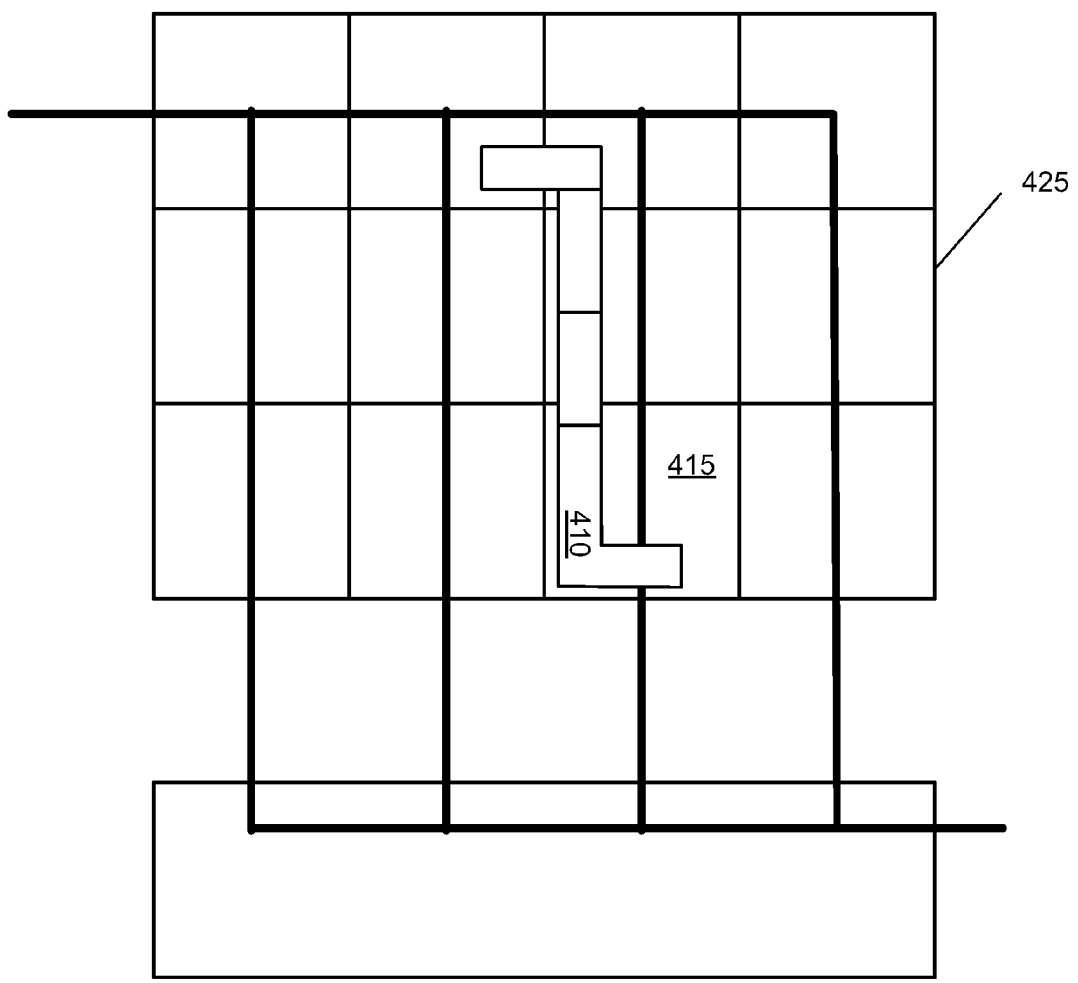

FIGS. 4, 5, and 6 illustrate an example of how an initial set of frames in a packet might specify the routing of a packet to a configurable tile 415. In this example, the first two frames 405 and 410 of the packet 400 respectively identify the column and then the row of the configurable tile 415 to be configured. As shown in FIG. 5, the column-identifying frame 405 is used by a column selector (described below with respect to FIG. 13) at the top of the configurable tile array 425 to route a packet down the column of the addressed configurable tile 415. The tile-identifying frame 410 then allows a tile selector (described below with respect to FIG. 13) in the configurable tile 415 to determine that the packet of data being routed down its column is addressed to its tile 415. Hence, as shown in FIG. 6, the tile selector of tile 415 extracts the remaining data frames in the packet 400.

Figure 7:
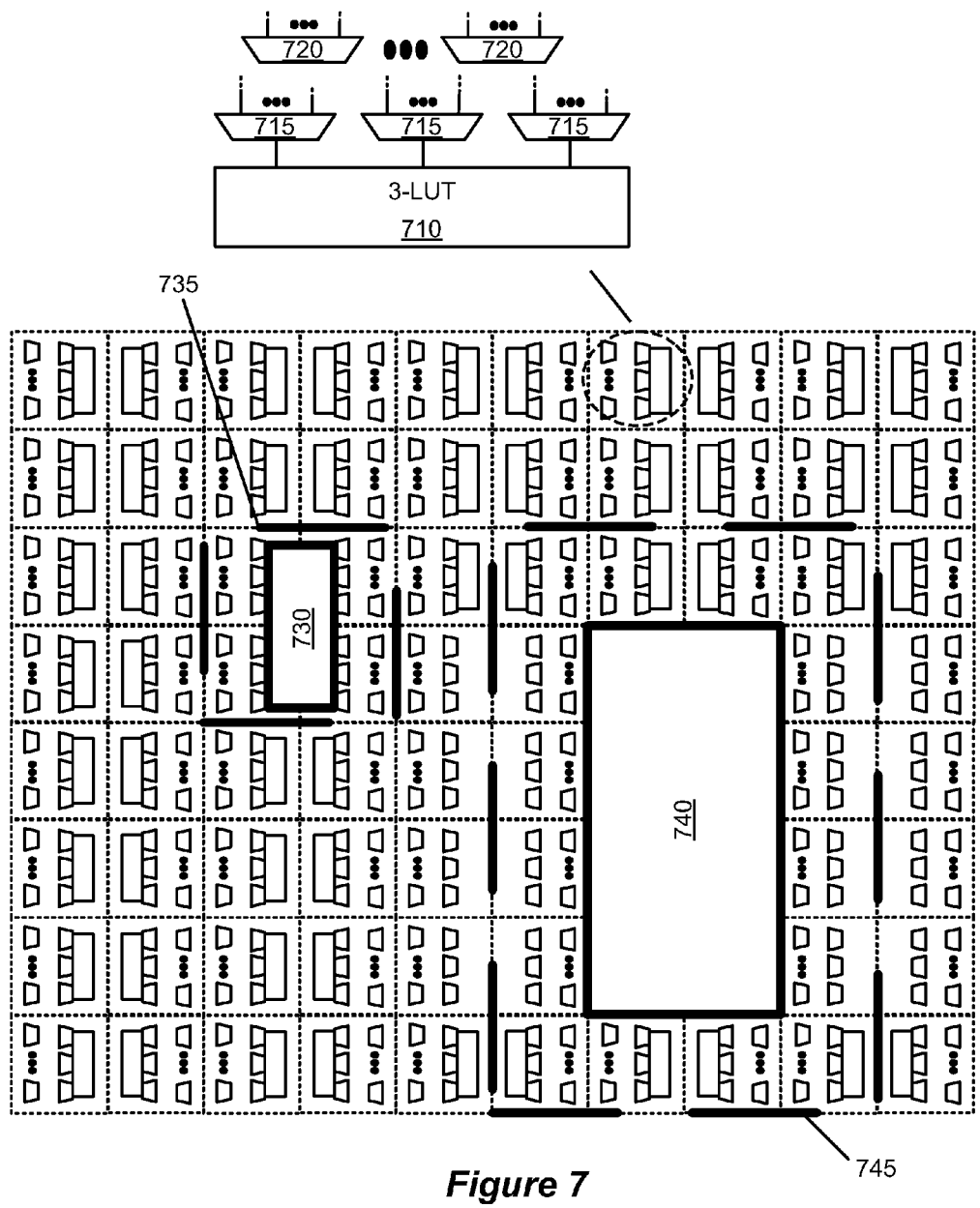
FIG. 7 illustrates an example of an IC of some embodiments with an array of configurable tiles with memory embedded within the array.

FIG. 7 illustrates the configurable circuit architecture of some embodiments of the invention. As shown in FIG. 7, this architecture is formed by numerous configurable conceptual tiles that are arranged in an array with multiple rows and columns. It should be noted that in some embodiments a "conceptual tile" (or "tile" for short) does not denote any physically distinct object, but is rather a way of referring to groups of circuitry in a repeated or nearly repeated pattern. In such embodiments, the lines around individual tiles represent conceptual boundaries, not physical ones.

In FIG. 7, each configurable tile is a configurable logic tile, which, in this example, includes one configurable three-input logic circuit 710, three configurable input-select interconnect circuits 715, and eight configurable routing interconnect circuits 720. For each configurable circuit, the configurable IC 700 includes a set of storage elements for storing a set of configuration data. In some embodiments, the logic circuits are look-up tables (LUTs) while the interconnect circuits are multiplexers. In this specification, many embodiments are described as using multiplexers. It will be clear to one of ordinary skill in the art that other embodiments can be implemented with input selection circuits other than multiplexers. Therefore, any use of "multiplexer" in this specification should be taken to also disclose the use of any other type of input selection circuits.

In FIG. 7, an input-select multiplexer ("IMUX") 715 is an interconnect circuit associated with the LUT 710 that is in the same tile as the input select multiplexer. One such input select multiplexer (1) receives several input signals for its associated LUT, and (2) based on its configuration, passes one of these input signals to its associated LUT.

In FIG. 7, a routing multiplexer ("RMUX") 720 is an interconnect circuit that connects other logic and/or interconnect circuits. The interconnect circuits of some embodiments route signals between logic circuits, to and from I/O circuits, and between other interconnect circuits. Unlike an input select multiplexer of some embodiments (which provides its output to only a single logic circuit, i.e., which has a fan-out of only 1), a routing multiplexer of some embodiments is a multiplexer that (1) can provide its output to several logic and/or interconnect circuits (i.e., has a fan-out greater than 1), or (2) can provide its output to other interconnect circuits. The RMUX receives several inputs and based on its configuration, selects the input to pass along the output.

Some of the configurable logic tiles of FIG. 7 together conceptually form configurable memory tiles, which are (1) tiles with blocks of memory, or (2) tiles that are adjacent to blocks of memory. FIG. 7 illustrates two examples of configurable memory tiles. The first example is a memory tile 735 that is formed by a set of four aligned tiles that have a memory block 730 in place of their four LUTs. In the second example, a memory tile 745 is formed by 16 tiles that neighbor a memory block 740. In the configurable logic tiles of the memory tiles 735 and 745, the input select and routing interconnects serve as configurable ports of the memory blocks.

In some embodiments, the examples illustrated in FIG. 7 represent the actual physical architecture of a configurable IC. However, in other embodiments, the examples presented in FIG. 7 topologically illustrate the architecture of a configurable IC (i.e., they show arrangement of tiles, without specifying a particular physical position of the circuits). In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture.

In some embodiments, the secondary circuit structure shares one or more resources with the primary circuit structure to facilitate one or more of the interfaces with the primary circuit structure. These resources include user-design state ("UDS") elements. UDS elements are elements that store values. At any particular time, the values stored by the UDS elements define the overall user-design state of the primary circuit structure at that particular time. In some embodiments, a UDS element is capable of continuously outputting the value it stores. Examples of such elements include traditional latches, registers, user flip-flops, and memory structures. U.S. Pat. No. 7,224,181, U.S. patent application Ser. No. 11/754,300, now issued as U.S. Pat. No. 7,521,959, and U.S. Provisional Patent Application 61/097,798 describe other user-design state elements that include routing multiplexers ("RMUXs") that can serve as storage elements, RMUXs that have storage elements in feedback paths between their outputs and inputs, and storage elements at other locations in the routing fabric (e.g., between RMUXs).

More specifically, some embodiments have RMUXs where at least some of the RMUXs have state elements integrated at the output stage of the RMUX itself. Such RMUXs are referred to as routing circuit latches or RCLs. For instance, some RMUXs use complementary passgate logic ("CPL") to implement a routing multiplexer. Some of these embodiments then implement a routing multiplexer that can act as a latch by placing cross-coupled transistors at the output stage of the routing multiplexer. Such an approach is further described in U.S. Pat. No. 7,342,415. In the discussion below, routing multiplexers that can serve as latches are referred to as routing-circuit latches ("RCLs").

In conjunction or instead of such RCLs, other embodiments utilize other storage elements for storing UDS data at other locations in the configurable routing fabric of a configurable IC. For instance, in addition to or instead of having a storage element in the input and/or output stage of an RMUX, some embodiments place a storage element (e.g., latch or register) in a feedback path between the output and input of the RMUX.

Some such UDS elements operate as transparent latches referred to as "time vias" ("TVs") or clock driven latches referred to as "conduits." When a TV is "open," the TV's output value immediately assumes the TV's current input value. In other words, the TV acts as a wire (with some additional delay). When the TV closes, it captures and holds the current output value (i.e., the output no longer follows the input).

Some or all of these TVs can be accessed via the secondary circuit structure in one of two modes: active mode and passive (or trace) mode. Active mode allows users to read and write stored values in any circuit of the IC, including closed TVs (open TVs do not store values) while the circuit is stopped. Passive mode continuously transmits TV values to the secondary circuit structure in real-time. In some embodiments, this transmission of TV values occurs at the maximum user clock rate. Once received by the secondary circuit structure, these signal values can be stored in a trace buffer for later display and analysis.

Conduits, unlike TVs, introduce delay when performing a storage operation. In some embodiments, conduits are implemented as single edge-triggered flip-flops. In some embodiments, multiple conduits are chained together to provide longer delays, as necessary. In some embodiments, conduits are accessed in the same manner as TVs. In some embodiments, conduits are readable, writeable, and/or stream-able from the secondary circuit structure.

In some embodiments, some or all of the latches, registers, TVs, or conduits are separate from the RMUXs of the routing fabric and are instead at other locations in the routing fabric (e.g., between the wire segments connecting to the outputs and/or inputs of the RMUXs). For instance, in some embodiments, the routing fabric includes a parallel distributed path for an output of a source routing circuit to a destination circuit. A first path of the parallel distributed path, directly routes the output of the source routing circuit to a first input of the destination circuit. A second path running in parallel with the first path passes the output of the source routing circuit through a UDS element before reaching a second input of the destination circuit. The storage element stores the output value of the routing circuit when enabled. In some embodiments, the second path connects to a different destination component than the first path. When the routing fabric includes buffers, some of these embodiments utilize these buffers as well to build such latches, registers, TVs, or conduits.

In some embodiments, the secondary circuit structure connects to some or all of the UDS elements (e.g., latches, registers, memories, etc.) of the primary circuit structure to establish the communication pathway between the two circuit structures. In some embodiments, the secondary circuit structure has a streaming mode that can direct various circuits in one or more configurable tiles of the primary circuit structure to stream out their data during the operation of the configurable IC. In some embodiments, the determination of which circuits are to stream out their data is made before runtime of the IC. As discussed below, in some such embodiments, configuration data is loaded into the IC that identifies these circuits that are identified for streaming. Accordingly, in some embodiments where the secondary circuit structure connects to some or all of the UDS elements, the secondary circuit structure can be used in a streaming mode to stream out data from the UDS elements of the tiles, in order to identify any errors in the operation of the IC. In other words, the streaming of the data from the UDS elements can be used to debug the operation of the configurable IC.

In some embodiments, the signals from circuits or tiles of the primary circuit structure are conveyed in real-time to various circuit elements or circuit blocks of the secondary circuit structure such that the secondary circuit structure is able to always observe the primary circuit structure during operation of the primary circuit structure. For instance, a secondary circuit structure that collects statistics regarding the performance of the primary circuit structure will receive the signals at one or more counters of the secondary circuit structure that measure the activity of the routed signals in the primary circuit structure.

Figure 8:
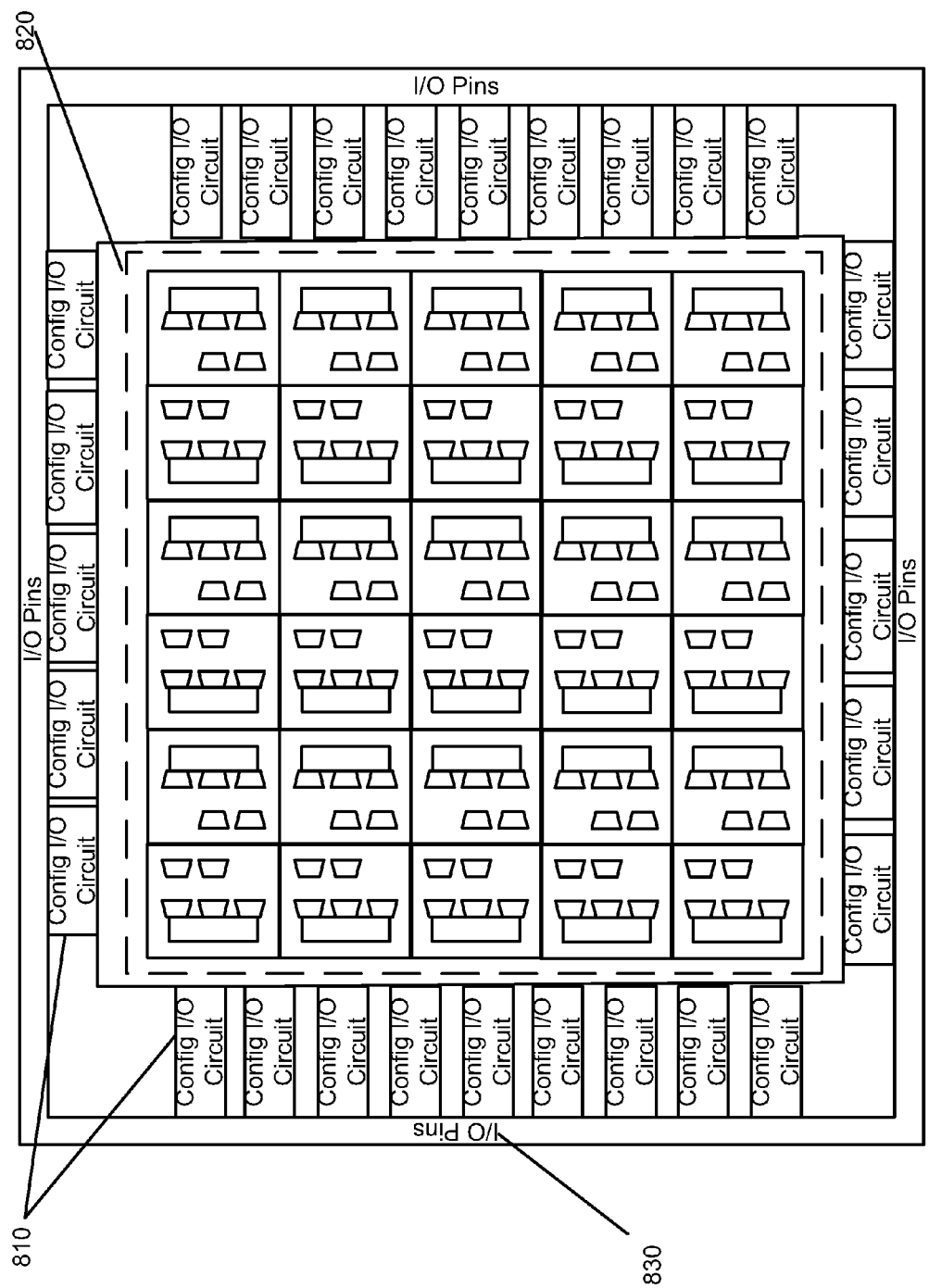
FIG. 8 illustrates an architecture that includes sets of configurable I/O circuits located between the IC core and I/O pins.

In some embodiments, sets of configurable input/output (I/O) circuits provide the communication pathway between the IC core (e.g., primary circuit structure and secondary circuit structure) and the external components outside the IC with which the IC communicates. The architecture of FIG. 8 illustrates sets of configurable I/O circuits 810 located between the IC core 820 and I/O pins 830. In FIG. 8, one or more I/O pins 830 may be connected to one or more configurable I/O circuits 810 of the primary circuit structure or circuit of the secondary circuit structure (not shown). Moreover, the connections between the I/O pins 830 and the configurable I/O circuits 810 are configurable connections in some embodiments. Accordingly, the assignment of I/O pins 830 to I/O circuits 810 is determined based on configuration data. U.S. patent application Ser. No. 12/032,638, filed on Feb. 15, 2008, now issued as U.S. Pat. No. 7,969,184, further describes the configurable I/O circuits.

In some embodiments, the secondary circuit structure streams data off-chip through interfaces (e.g., I/O buffers) shared with or independent of the primary circuit structure. Accordingly, some embodiments of the secondary circuit structure inform a system operating with the secondary circuit structure IC of conditions that the secondary circuit structure has observed, allowing the system to respond and take appropriate action if need be. The system has access to both the primary and secondary circuit structures.

The above described interworking between the primary and secondary circuit structures is useful for both legacy systems and systems that are under development. Therefore, the secondary circuit structure can be used to help designers measure circuit performance and bandwidth, access FIFO state, detect assertion violations, detect anomalous data inputs, and aid in automated testing (i.e., provide an Automatic Test Equipment solution) by controlling I/O settings of the IC. In some embodiments, the secondary circuit structure can also be used to access user parameters without affecting the user circuit, or by occupying programmable resources that could be used by the circuit.

A legacy system includes systems that either cannot be modified or incur extensive costs to modify after they have been fielded. For legacy systems, the secondary circuit structure provides debug functionality. For example, a deployed circuit structure switch that was fielded before video became widespread throughout the internet is now operating improperly. Users need to be able to see inside the switch to understand the problematic behavior but they cannot modify the user circuit to insert debugging circuitry. Through the use of the secondary circuit structure and the dynamic routing provided by some embodiments, users will be able to see any signal they wish without modifying the circuitry in any way. Several detailed overlay applications of the secondary circuit structure are provided in Section III below.

A. Secondary Circuit Structure Transport

1. Overview

In some embodiments, the secondary circuit structure is a configuration/debug circuit structure. In some such embodiments, the secondary circuit structure operates in non-invasive manner to the operations of the primary circuit structure. Specifically, a non-invasive secondary circuit structure operation is one which does not need to use circuits that would otherwise be used to implement the user's design. In some embodiments, the secondary circuit structure does not change any values of resources of the primary circuit structure while the secondary circuit structure monitors the primary circuit structure. Some advantages of a non-invasive secondary circuit structure of some embodiments are that the non-invasive debug circuit structure: 1) has the advantage of not requiring a spread out implementation of the user design in the primary circuit structure and 2) does not require restructuring the physical implementation of the user design in the primary circuit structure in order to retrieve data from different parts of the circuit.

In some embodiments, non-invasive secondary circuit structures are not allowed to use circuits that are assigned to implement the user design in the primary circuit structure, but the non-invasive secondary circuit structures of some embodiments are allowed to use "leftover" circuits, for example, configurable interconnect circuits. Therefore, once a user design circuit has been implemented on the primary circuit structure, such configurable circuit elements of the primary circuit structure that are not used to implement the user design circuit may be put to use to support the secondary circuit structure and transport circuit structure.

Figure 9:
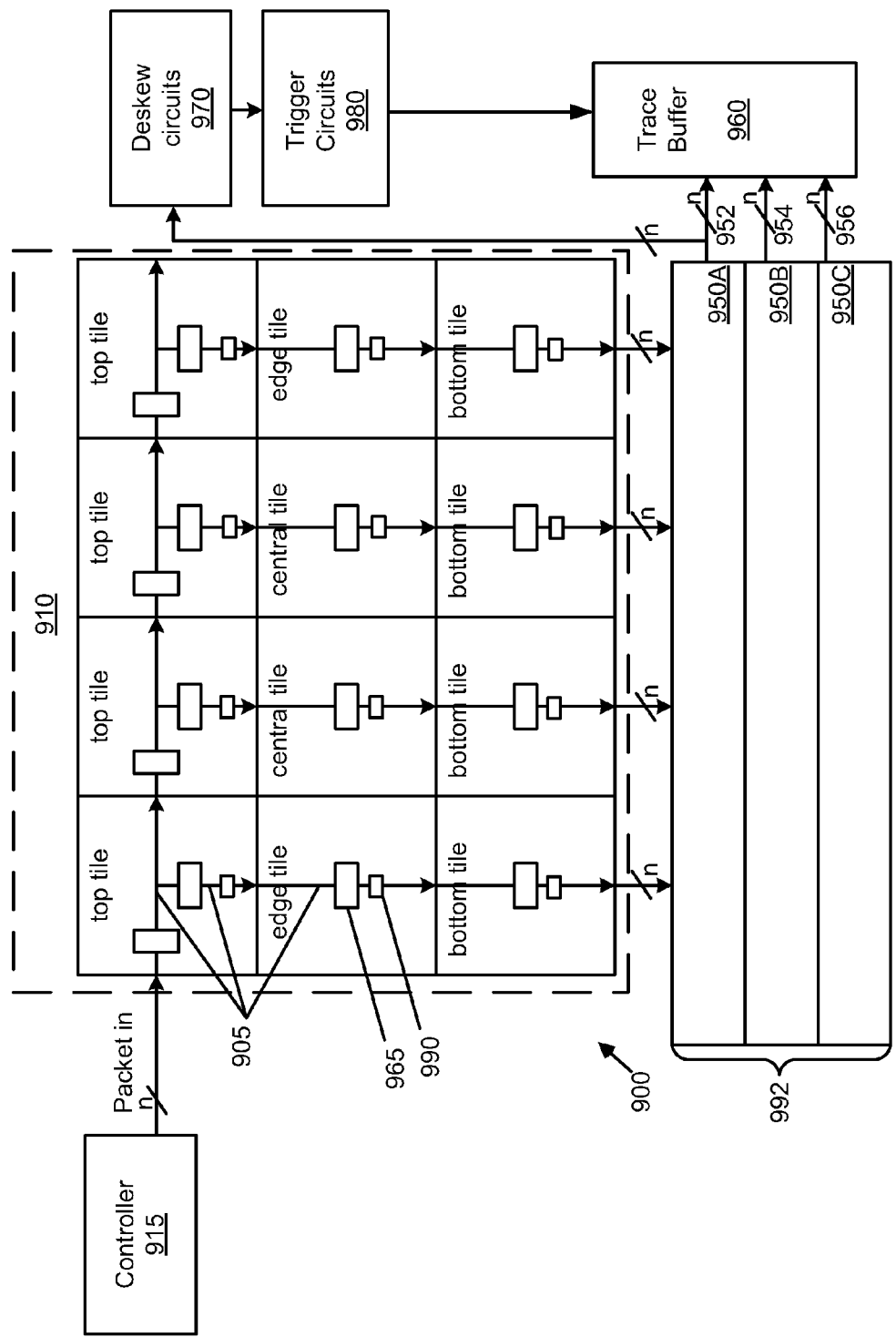
FIG. 9 illustrates circuitry of the secondary circuit structure of some embodiments.

FIG. 9 provides an overview of a secondary circuit structure of some embodiments interfacing with a primary circuit structure. As shown in this figure, this secondary circuit structure includes a bus 905 and a controller 915. FIG. 9 also shows a tile array 910 that includes multiple tiles. Each tile includes one or more sets of decoders 990 and a pipeline register 965. This figure also shows three layers 950A-C of a transport circuit structure 992, bitlines 952, 954, and 956, a trace buffer 960, deskew circuitry 970, and trigger circuitry 980.

The bus 905 passes through each tile of the tile array 910 of the primary circuit structure, so that the controller 915 can route packets to the tiles of the tile array 910. In some embodiments, the controller 915 is a microprocessor or some other circuit (e.g., a set of configurable circuits of the IC configured as a controller that is capable of performing the operations described below). In some embodiments, the controller 915 includes an interface (e.g., JTAG, or some other interface) to an external set of resources (e.g., memory, a workstation that runs software, etc.). In some embodiments, as further described below, the controller 915 receives data from outside of the IC, formulates the abovementioned data packets based on the received data, and routes the data packets to the tiles of the tile array 910 over the bus 905. In some embodiments, also as further described below with respect to FIG. 21, the controller 915 receives data from within the IC, formulates the abovementioned data packets based on the received data, and routes the data packets to the tiles of the tile array 910 over the bus 905.

The data packet is routed through multiple tiles, and passes out of the bottom tiles into the transport circuit structure 992. In some embodiments, the transport circuit structure 992 is an example of the transport circuit structure 315 described above with respect to FIG. 3. In some embodiments, one or more of the transport circuit structure layers 950A-C are implemented as partial crossbars. The partial crossbars of some embodiments are described with reference to FIG. 11, below. In other embodiments, other types of circuits may be used for routing data. As shown in FIG. 9, the secondary circuit structure circuitry of the configurable IC includes a trace buffer 960, deskew circuitry 970, and trigger circuitry 980.

Additionally, each of the configurable tiles includes one or more pipeline registers 965 that buffer the signals passing through the bus 905 of the secondary circuit structure. Specifically, these pipeline registers 965 act to isolate the lines such that data passing over the bus 905 from a first configurable tile does not interfere with data passing over the bus 905 from a second configurable tile. The tiles at the top of the tile array 910 of FIG. 9 each have two pipeline registers 965, one of which is for passing signals "down" a column, while another is for passing signals "across" a column Because of these pipeline registers 965, the secondary circuit structure is said to be fully "pipelined." In other words, more than one set of data can be present within the secondary circuit structure at any given time by virtue of these pipeline registers 965.

In this figure, the tile array includes four types of tiles: top, edge, central, and bottom. Central and edge tiles have a similar circuit structure, except that in some embodiments edge tiles store more configuration bits as they control the configurable I/Os of the configurable IC and may contain different programmable resources (e.g., the east/west tiles might contain LUTs, while the north/south tiles might not).

Each tile also includes a set of decoders 990. The set of decoders 990 includes a tile selector that evaluates each packet received through the data bus of the secondary circuit structure and determines, based on the contents of the packet (i.e., the opcode and operand) whether that packet was addressed for that tile. The set of decoders 990 also includes first and second decoders that determine, based on the contents of the packet, which resources within the tile are addressed, and the operation specified by the packet to perform at the addressed resources (e.g., read, write, etc.). The set of decoders 990 is further described below with respect to FIG. 13.

The top tiles have a circuit structure circuit structure that allows packets to pass along the top tile row through the pipeline registers 965. The top tiles also include a column selector (shown below) that can route a particular packet down a particular column that is addressed by the packet. This column selector routes frames of a packet down each column that identify which tiles are addressed by the packet. These frames include tile X and tile Y frames, which are described below.

The tile X frame is routed down each column, as it serves as (1) a column enable signal for each column that contains an addressed tile, and (2) a column disable signal for each column that included a previously addressed tile. As mentioned above, the circuit structure circuit structure of each tile also includes a set of decoders 990 that allows a tile to detect that a packet is addressed to it. A properly addressed packet that is received by a tile can then be used by the tile to populate the packet with various data residing within the tile. The tile can then forward the populated packet back to the secondary circuit structure in real-time. Additionally, a properly addressed packet that is received by a tile can contain data from the secondary circuit structure for use by the primary circuit structure. In some instances, the data within the packets sent from the secondary circuit structure can be used to change user state values, change the configuration bits of tiles or circuits, or change values of one or more other storage elements in the primary circuit structure.

The bus lines exit the bottom tiles and enter the transport circuit structure 992. In some embodiments, the transport circuit structure 992 of FIG. 9 includes a set of transport circuit structure layers 950A-C. The transport circuit structure layers 950A-C route the data to and from the primary circuit structure 900 along data buses 952, 954 and 956 to the trace buffer 960 and the deskew circuits 970. As further described below, the deskew circuits 970 pass deskewed data to the trigger circuits 980.

In some embodiments, data sent from the configurable circuits via the primary circuit structure is passed to each transport circuit structure layer 950A-C. In such embodiments, each transport circuit structure layer 950A-C has the same incoming data. The configuration of the circuits in each transport circuit structure layer 950A-C determine which bits of that data will be passed along by that layer to the secondary circuit structure. In some embodiments, the configuration of circuits in each transport layer 950 may also determine when to pass along the received data. In some embodiments, the number of transport circuit structure layers 950 is higher or lower than the number shown in FIG. 9.

As mentioned above, some embodiments may use different types of transport circuit structures 992. In some embodiments, the transport circuit structure 992 has multiple layers (such circuit structures may be called "multi-layer transport circuit structures"), with each layer capable of receiving and passing along data from the tile array 910. In some such embodiments (described below), one or more of these layers may send data to a trigger circuit (e.g., trigger circuit 980) that triggers a trace buffer (e.g., trace buffer 960) to stop recording new data.

In FIG. 9, and in some other figures of this specification, data lines are represented with a slash through them and the letter "n" (or a number) next to the slash. These symbols indicate that the line represents multiple data lines, but is represented as one line rather than render the figure difficult to understand by having a separate line for each bit of width of the line. It will be clear to those of ordinary skill in the art that: 1) other values of n can be used in other embodiments, and 2) multiple instances of "slash n" in a particular figure do not necessarily represent the same width as each other even within that particular figure.

For instance, in some embodiments illustrated by FIG. 9, data buses 952, 954, and 956 do have the same widths (n bits wide) as the data bus 905. Other embodiments may use different widths of data buses 952, 954, and 956. In some embodiments, the widths of the data buses are the same as each other but different from the widths described here. In other embodiments, the widths of the data buses 952, 954, 956 may be different from each other. Furthermore, when the text or context indicates that a line without a "slash n" is a multiple line bus, the absence of the "slash n" should not be taken to mean that a line is a single bit data line.

In some embodiments, the primary circuit structure 900 has a known latency through each of the tiles of the tile array 910. Two implications of this known latency in each tile are that: 1) two signals that pass through different numbers of tiles may take different amounts of time to arrive at the transport circuit structure 992; and 2) the amount of time it takes for a signal to pass through a set of tiles can be predicted from the path through the tiles. More specifically, the amount of time necessary for a read message to reach an intended tile from the controller 915, and for the data from that tile to reach the transport circuit structure layers 950A-C depends on the location of the tile in the array 910.

This raises the issue of how to compare data that comes from different parts of the configurable IC (e.g., different tiles in the tile array 910). The deskew circuitry 970 compensates for the variance in delays caused by bits arriving from different physical locations. In some embodiments, the deskew circuitry 970 also compensates for other delays. Other delays may include those incurred in compensating for congestion of the secondary circuit structure and those caused by retiming of the configured circuit. The deskewing operation of the deskew circuitry 970 allows the trigger circuits 980 to operate on data that is adjusted to appear properly simultaneous. In some embodiments, circuitry of the secondary circuit structure thus performs a mask and merge operation, as further described below, such that the data passing through the secondary circuit structure is not disjointed.

In some embodiments, the bandwidth (i.e., the amount of data during a given time) that the bus 905 can carry to the transport circuit structure 992 is limited by the width of the bus 905. In some circumstances, it is desirable to collect more data bits from a given column than the width of the bus in that column would allow. In some embodiments, this problem is solved by using the routing fabric of the tiles to send the additional data bits to tiles in one or more other columns. In other words, if the demand from a particular column is higher than the capacity in that column, then the routing fabric can redirect the signal to another column with excess capacity (i.e., a set of configurable circuits that are not assigned to the user design). Examples of routing fabric, such as wiring and interconnects that connect the configurable logic circuits are disclosed in U.S. Pat. No. 7,295,037. Moreover, a more detailed discussion for the various components illustrated in FIG. 9 and for other components of the primary and secondary circuit structures described herein is provided for in U.S. patent application Ser. No. 11/769,680 and U.S. Pat. No. 7,375,550. These Applications, namely U.S. patent application Ser. No. 11/769,680 and U.S. Pat. No. 7,375,550, are incorporated herein by reference.

Because each circuit structure column of some embodiments is shared with all of the tiles in that column, tiles will often not be able to drive a given output signal directly onto the secondary circuit structure. In this case, the signal may be routed to a different circuit structure column wire in the same column, or a different column altogether. In other words, the signal may be routed to other unused resources (e.g., unused routing resources and unused TVs) that were not allocated when the user design was placed and routed onto the IC. Routing user signals in this way dramatically increases the number of signals that can be traced.

Figure 10:
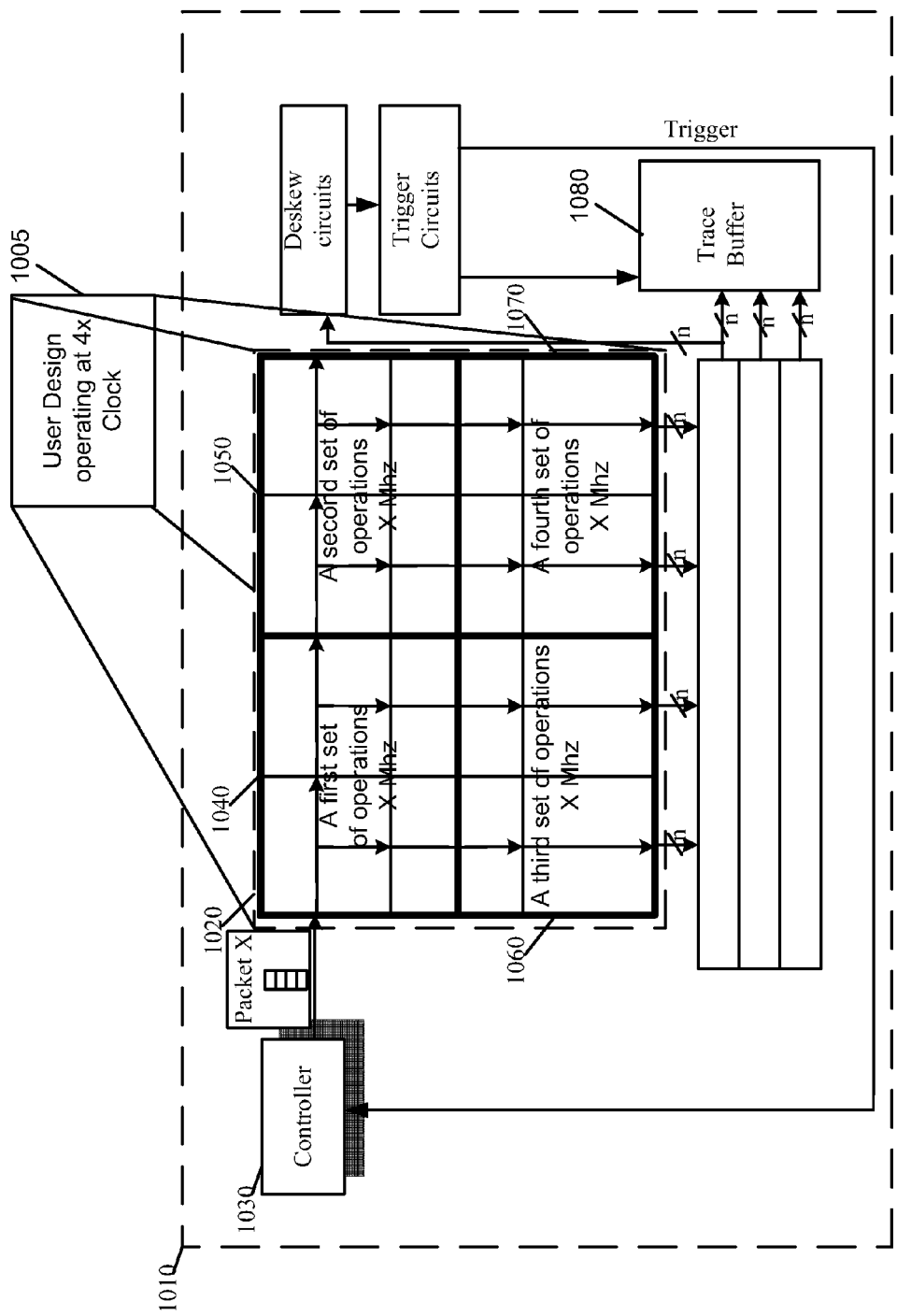
FIG. 10 conceptually illustrates an IC with sub-cycle reconfigurable circuits of a primary circuit structure interfacing with a secondary circuit structure of the IC.

FIG. 10 conceptually illustrates an IC 1010 with sub-cycle reconfigurable circuits of a primary circuit structure 1020 interfacing with a secondary circuit structure of the IC 1010. As shown, the primary circuit structure includes sets of reconfigurable circuits 1040-1070 that collectively implement the user design 1005 in a four loopered reconfigurable basis. For example, the first set of circuits 1040 perform a first subset of operations of the user design 1005 while the second set of circuits 1050 reconfigures to perform a second subset of the operations. The sets of circuits 1040-1070 are shown as different sets of circuits, however it should be apparent to one of ordinary skill in the art that this is a conceptual representation. For such reconfigurable circuits, the same set of physical circuits may be used to implement different operations at different sub-cycles. In this figure, each of the sets of circuits 1040-1070 performs a different sub-cycle of operations.

Additionally, the bitlines of the secondary circuit structure pass through each set of reconfigurable circuits. This allows the secondary circuit structure to monitor the primary circuit structure at the sub-cycle basis even though the user debugs the design according to the user clock.

2. Transport Circuit Structure

Figure 11:
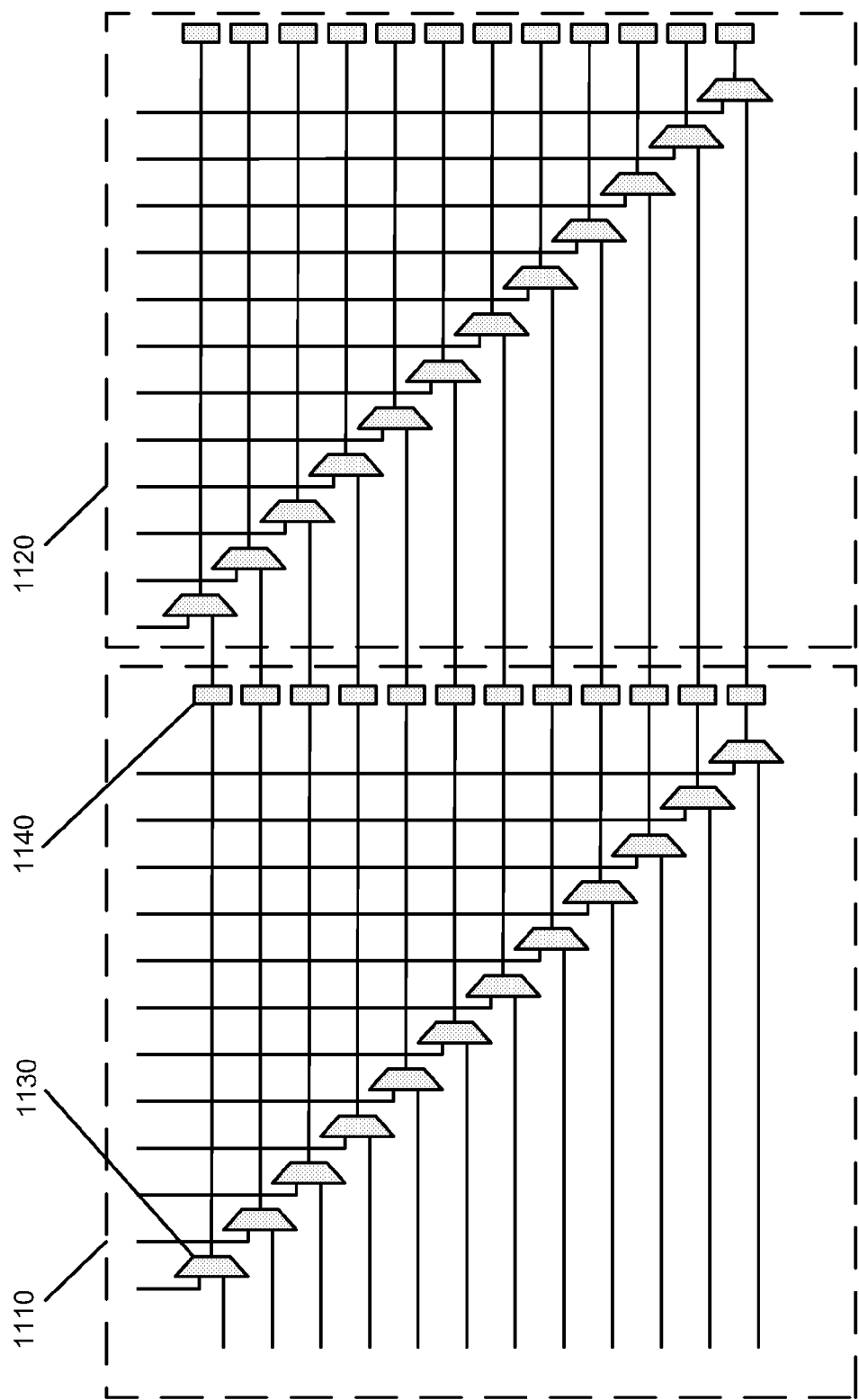
FIG. 11 illustrates partial crossbars of some embodiments.

The secondary circuit structure of some embodiments passes out of the main tile array 910 and enters into the transport circuit structure layers 950A-C of the transport circuit structure 992. In some embodiments, one or more of the transport layers 950A-C include a set of multiplexers implemented as a partial crossbar, as shown in FIG. 11. FIG. 11 illustrates two partial crossbars 1110 and 1120 that each include multiple multiplexers 1130 and storage elements 1140.

Each multiplexer 1130 can be set, during the operation of the secondary circuit structure, to pass on data from the column above it, or from the immediately previous section of the partial crossbar (i.e., the output of the storage element 1140 that provides one of the inputs of the multiplexer 1130). It will be clear to one of ordinary skill in the art that, in some embodiments, the "first" column (e.g., the leftmost column) in the chain does not receive inputs from a "preceding" column, as the first column has no preceding column Additionally, in some embodiments, the storage elements 1140 provide a delay. In some such embodiments, these storage elements 1140 hold and transmit a value once every sub-cycle. In some embodiments, these storage elements 1140 hold signals that arrive from the tile array at a congested sub-cycle until a free sub-cycle is available. While FIG. 11 illustrates an exemplary partial crossbar structures of a transport layer of some embodiments, other embodiments implement crossbars of transport layers differently. In other words, one layer of the transport circuit structure 992 (e.g., layer 950A) may be physically different from another layer (e.g., layer 950B) of the transport circuit structure 992.

3. Accessing the Primary Circuit Structure Through the Secondary Circuit Structure In some embodiments, some or all of the elements within the primary circuit structure of the IC are available to the secondary circuit structure. As noted above, examples of such elements include UDS elements (such as RCLs and other storage elements in the routing fabric, memory cells, register cells, etc.), LUTs, configuration memory elements, and/or other circuit elements that connect to the secondary circuit structure. As the elements are accessible through the secondary circuit structure, this circuit structure can be used to access (i.e., read from or write to) the elements in any sequential or random access manner. Random access in this context means that the elements can be accessed through the secondary circuit structure and the data packets as desired by a user or debugger, rather than in a particular set sequence.

Moreover, as the elements are accessible through the secondary circuit structure, this circuit structure can read out the state (e.g., the value of UDS elements) of the configurable IC while the IC is operating. The secondary circuit structure can also write values to these elements. The ability to read and write to the elements of the primary circuit structure is highly advantageous for performing various operations, including debugging, during the operation of the configurable IC.

4. Packet-Switch Secondary Circuit Structure

In some embodiments, the accessing of memory elements of the primary circuit structure is performed through packet switching. In some embodiments, data used to read and/or write to the primary circuit structure is received by the controller 915, which formulates packets to transmit through the secondary circuit structure. A data packet may include one or more frames. In some embodiments, each frame is 18 bits wide. These frames have a six-bit opcode and a 12-bit operand in some embodiments. Other embodiments include different widths of frames, opcodes, and/or operands. In some embodiments, each frame is as wide as the data bus of the secondary circuit structure. In some embodiments, different data packets have a different number of frames. In other words, some embodiments allow the controller of the secondary circuit structure to transmit variable-width packets.

FIG. 12 conceptually illustrates examples of types of frames with different opcodes that are used in some embodiments. These frames include:

(1) Tile X, which has its lower eight bits identify the column associated with a tile and its higher four bits identify a tile type (i.e., top, bottom, edge, or central), (2) Tile Y, which has its lower eight bits identify the row associated with a tile and its higher four bits identify a tile type, (3) Load Address, which provides an address of a resource within a tile that was previously addressed by a Tile X and/or a Tile Y frame, thus causing the tile to store the address in an address register of the tile, (4) Read, which directs the addressed tile to provide the output of a particular resource (e.g., a UDS element that was identified by a Load Address frame), (5) Read Increment, which directs the addressed tile to provide the output of a particular resource and to increment the address stored in the address register, (6) Write, which directs the addressed tile to write to a particular resource that is identified by the address in the address register, (7) Write Increment, which directs the addressed tile to write to a particular resource that is identified by the address in the address register and to increment the address stored in the address register, and (8) Stream, which directs the addressed tile to provide the output of a resource, where the resource was previously identified by configuration data.

5. Circuit Structure of Tiles

Figure 13:
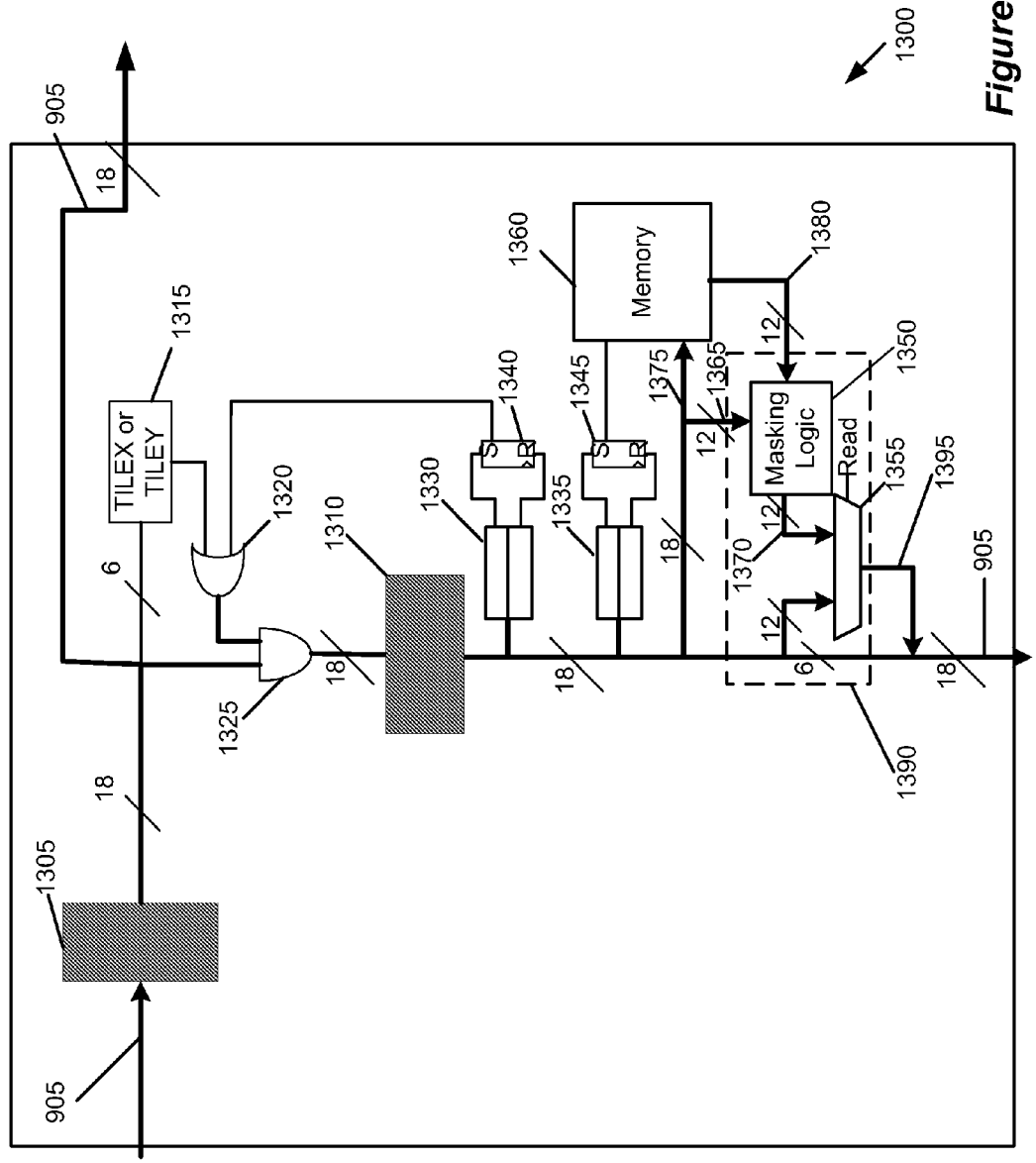
FIG. 13 illustrates a top tile of some embodiments.

Each of the abovementioned packets are received by several tiles. In some embodiments, the tiles at the top of the tile array 910 (i.e., "top tiles," as mentioned above) of FIG. 9 receive each packet transmitted by the controller 915. FIG. 13 illustrates secondary circuit structure circuitry of such a top tile 1300 of some embodiments. This secondary circuit structure circuitry allows the top tile to perform the top tile functionality discussed above (i.e., column selection), as well as the functionality that other types of tiles perform (e.g., reading/writing data based on received packets). As shown in this figure, these circuits include two 18-bit wide sets of storage elements (e.g., latches) 1305 and 1310, one tile X/tile Y decoder 1315, an OR gate 1320, an AND gate 1325, a column selector 1330, a row selector 1335, two set and reset registers 1340 and 1345, a conceptual memory block 1360, and a masking circuit 1390, which includes masking logic 1350 and multiplexer 1355. Several bitlines (e.g., bitlines 1365, 1370, 1375, and 1380) communicatively couple several of these circuits together, as described below.

In FIG. 13, the sets of storage elements 1305 and 1310 connect to the 18-bit wide bus 905 (i.e., the bus shown in FIG. 9, in some embodiments) to receive 18-bit frames. In some embodiments, each of the set of storage elements 1305 and 1310 is an example of a pipeline register 965 shown in FIG. 9. In some embodiments, on each edge of the clock of the IC, the set of storage elements 1305 stores 18 bits of data (i.e., a frame) that appears on the bus 905 and outputs the 18 bits of data (i.e., the frame) that it latched on the prior clock edge. Each set of 18 bits (i.e., each frame) that the storage element set 1305 outputs is routed to the next top tile along the 18-bit wide bus 905. The 18 bits output from the last top tile (i.e., the tile to which there is not an adjacent tile to which the frame can be routed) are discarded in some embodiments.

The tile X/tile Y decoder 1315 receives six bits (e.g., the highest six bits) of each 18 bits (i.e., each frame) that is output from the storage element set 1305. This decoder examines these six bits to determine whether these six bits represent a tile X or tile Y opcode. If not, the decoder 1315 outputs a "0" in some embodiments.

Alternatively, when the six-bit opcode is a "Tile X" or "Tile Y" opcode, the decoder 1310 outputs a "1" in some embodiments, which causes the OR gate 1320 to output a "1" along its 18 output lines. These outputs of the OR gate 1320, in turn, allow the 18 bits that are output from the storage element set 1305 to pass through the 18 bit-wide AND gate 1325 (i.e., cause the AND gate to output 18 bits that are identical to the 18 bits that it receives from the storage element set 1305).

The storage element set 1310 receives the 18-bit wide output of the AND gate 1325. On the next clock edge, the storage element set 1310 outputs the 18 bits. The column selector 1330 receives the output of the storage element set 1310. The column selector 1330 determines whether the frame is a tile X frame (i.e., whether the received six bits represent a tile X opcode). If so, the column selector 1330 determines whether the operand of the received tile X frame matches the type or the x-address of the tile 1300. As mentioned above, in some embodiments, the lower eight bits of a tile X frame provide the x-address (i.e., the column address) of a tile, while its next four bits provide the type of the tile.

The column selector 1330 directs the register 1340 to assert a reset signal (i.e., a "0" in this case) when the column selector 1330 receives a tile X frame (i.e., the 18 bits output from the storage element set 1310) that has an operand that matches neither the type nor the x-address of the tile 1300. On the other hand, when the received frame is a tile X frame with an operand that matches the type or x-address of the tile 1300, the column selector 1330 directs the register 1340 to assert a set signal (i.e., a "1" in this case). A set signal causes the OR gate's 1320 outputs to remain high even after the decoder 1315 pulls its output low when this decoder 1315 no longer detects a tile X or tile Y opcode (i.e., no longer receives a tile X or tile Y frame). By keeping the OR gate outputs high, the AND gate 1325 continues to route frames down the column of tile 1300, until the time that the column selector 1330 receives a tile X frame whose operand does not match the type or the x-address of the tile 1300. Once the column selector 1330 receives such a tile X frame, it directs the register 1340 to reset its output (i.e., to output a "0"). At this point, when the tile X/tile Y decoder 1315 does not output a "1," the OR gate 1320 will output a "0" (i.e., will prevent the AND gate 1325 from routing any more frames down the column of tile 1300) until the tile X/tile Y decoder 1315 detects another tile X or Y frame.

The row selector 1335 also receives the output of the storage element set 1310. The row selector 1335 determines whether the received frame is a tile Y frame (i.e., whether the higher six bits output from the storage element set 1310 indicate a tile Y opcode), and if so, whether the operand (i.e., the lower 12 bits output from the storage element set 1310) of the received tile Y frame matches the type or the y-address of the tile 1300. As mentioned above, in some embodiments, the lower eight bits of a tile Y frame provide the y-address (i.e., the row address) of a tile, while its next four bits provide the type of the tile.

The row selector 1335 directs the register 1345 to assert a reset signal (i.e., a "0" in this case) when it receives a tile Y frame with an operand that matches neither the type nor the y-address of the tile 1300. On the other hand, when the received frame is a tile Y frame with an operand that matches the type or the y-address of the tile 1300, the row selector 1335 directs the register 1345 to assert a set signal (i.e., a "1" in this case). A set signal from the register 1345 activates the decoder logic associated with the conceptual memory block 1360 of the tile 1300, while the reset signal from the register 1345 deactivates this decoder logic. This decoder logic is further described below with respect to FIG. 14.

The conceptual memory block 1360 conceptually represents tile 1300's (1) storage elements that store configuration data, (2) RCLs (i.e., routing multiplexers that can serve as latches), (3) storage elements (e.g., latches and/or registers) that store mode bits that define one or more operational modes of the resources within the tile 1300, (4) storage elements (e.g., memory cells) in a memory array, (5) UDS elements, and/or (6) any other memory structure.

The storage elements of the conceptual memory block 1360 are not actually physically organized in a contiguous block in some embodiments. However, in some embodiments, groups of storage elements (e.g., configuration cells), RCLs, UDS elements, and/or registers can be enabled at one logical "row" time for a read or write operation. In some embodiments, groups of such storage elements can be enabled individually. For instance, in some embodiments, groups of twelve configuration storage elements, groups of twelve or four RCLs, and groups of twelve one-bit registers can be enabled at one time. The decoder logic for addressing these groups of storage elements and RCLs will be further described below with respect to FIG. 14.

Through a set of bitlines 1375, the conceptual memory block 1360 also receives the 18-bit output of the storage element set 1310 (i.e., connects to the 18 bit-wide bus 905 and receives the frame output from the storage element set 1310). Through this connection, data can be written to any storage element of the tile. These storage elements include RCLs, UDS elements, configuration storage elements, registers, memory cells, and/or any other storage elements in the block 1360, as further discussed below with respect to FIG. 14.

Figure 14:
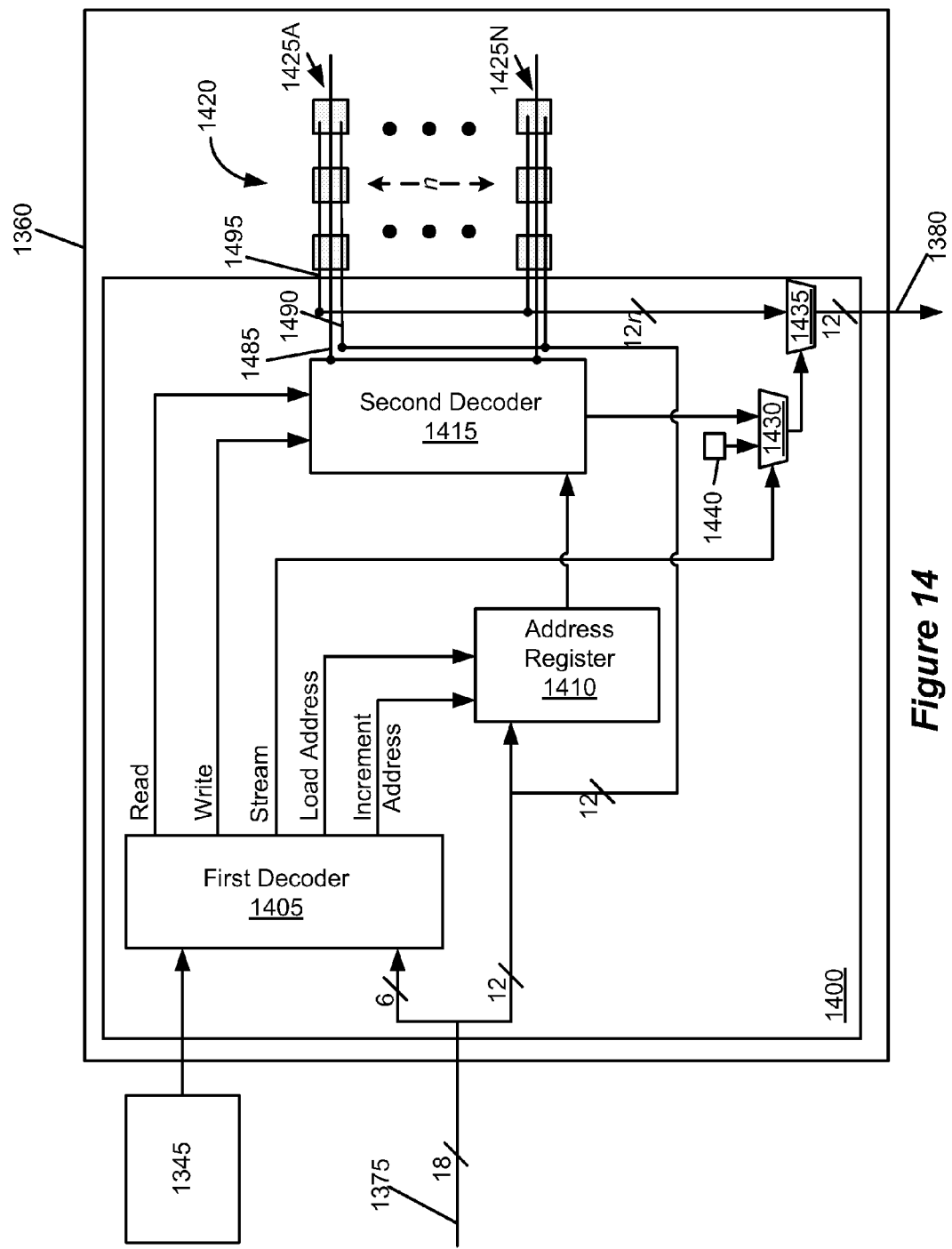
FIG. 14 illustrates decoder logic of a conceptual memory block of some embodiments.

FIG. 14 illustrates a conceptual memory block 1360 of some embodiments. The memory block 1360 includes a set 1420 of storage elements (e.g., UDS elements, configuration memory cells, etc., or some combination thereof). The set 1420 of storage cells includes n logical rows 1425A-N of storage elements. In some embodiments, each logical row 1425 of storage elements includes 12 one-bit storage elements. The conceptual memory block 1360 also includes decoder logic 1400 that is used to read from and write to the set 1420 of storage elements (e.g., UDS elements, configuration storage elements, etc.). In some embodiments, this decoder logic 1400 is included in the conceptual set of decoders 990 mentioned above. As shown in FIG. 14, the decoder logic 1400 includes first and second decoders 1405 and 1415, an address register 1410, multiplexers 1430 and 1435, and a set of storage elements for storing configuration data 1440.

The conceptual memory block 1360 receives 18 bits (i.e., a six-bit opcode and a twelve-bit operand) of input over a set of lines 1375 from the storage element set 1310. The first decoder 1405 receives the six-bit opcode of the received 18 bits. The first decoder 1405 also receives the output of the set/reset register 1345. When the output of the register 1345 is active (i.e., is set), the decoder 1405 decodes the opcode that it receives to determine whether to assert a Read signal, a Write signal, a Stream signal, a Load Address signal, and/or an Increment Address signal on its output.

The first decoder 1405 asserts a Read signal when the opcode specifies a Read, Read Increment, or Stream. It asserts a Write signal when the opcode specifies a Write or Write Increment. It asserts a Load Address signal when it receives a Load Address opcode. It asserts an Increment Address signal when it receives a Read Increment or Write Increment opcode, and it causes a read or write operation to be performed, based on the opcode. The Load Address and Increment address signals are supplied to the address register 1410. The address register 1410 also receives the 12-bit operand of the frame output (i.e., within the 18-bit output) of the storage element set 1310. When the Load Address signal is active (i.e., is asserted by the decoder), the address register 1410 loads in the address specified by the 12-bit operand. The Stream signal directs the operation of the multiplexer 1430, which is described below. When the Increment Address signal is active, the address register 1410 increments the address that is currently stored in the address register 1410. In some embodiments, the first decoder 1405 does not output an Increment Address signal. In some of these embodiments, the address increment functionality is performed by the controller of the secondary circuit structure.

The address register 1410 outputs the address that it stores to the second decoder 1415, which is responsible for enabling a set of blocks 1420 that represent storage elements (e.g., the configuration cells, register cells, memory cells, UDS elements, RCLS, etc.) of the tile 1300. In some embodiments, each address that the second decoder 1415 receives can identify a conceptual "row" 1425 of up to 12 storage elements (e.g., configuration cells, register cells, memory cells, UDS elements, etc.). In some embodiments, this maximum number (i.e., 12 in this case) is dependent on the number of bits of the operand of the data packet.

When the Write signal output by the first decoder 1405 is active, the second decoder enables (through the enable line 1485) the addressed row 1425. The 12-bit operand data is written to the blocks enabled by the second decoder 1415 over a write data line 1490. During a read operation, the data from an addressed row 1425 (e.g., a row 1425 specified by configuration data 1440 or an address output by the second decoder 1415) is read over the set of read data lines 1495. In some embodiments, a row 1425 that is addressed for a read or write operation also receives an enable signal over the enable line 1485. The data that is read out from the addressed row 1425 is output onto the output lines 1380 of the memory block 1360.

In some embodiments, a write operation writes data to an entire logical row 1425 of storage elements. In some embodiments, a portion of a row may be written by first (1) reading the row, (2) storing these read values (e.g., in another set of storage elements that are addressable by the secondary circuit structure, in a memory of the controller of the secondary circuit structure, etc.), and (3) writing back the read values with the new portion. For instance, a row 1425 may contain the following 12 bits: 0 1 1 0 1 1 1 0 1 0 1 1. In order to write a value of 0 0 0 0 to the least significant four bits (i.e., the rightmost bits), a Read packet would cause the 12 bits to be read. These 12 bits would then be stored (e.g., in another set of storage elements, in a memory of the controller, etc.). A new Write packet would then be generated by the controller for that row 1425 that includes the following 12 bits (with the new four least significant bits): 0 1 1 0 1 1 1 0 0 0 0 0.

In some embodiments, some or all of the rows 1425 of storage elements, including storage elements that are not addressed (e.g., by a Read frame) continuously output their stored values over read lines 1495. In some embodiments, these values output by the addressed and non-addressed storage elements are received by a multiplexer 1435. The multiplexer 1435 conceptually illustrates the concept of selecting between various outputs of the set 1420 of storage elements. In some embodiments, the multiplexer 1435 outputs the values stored by one row 1425 of storage elements over bitline 1380. In some embodiments, this bitlines 1380 is received by the masking logic 1350, as shown in FIG. 13.

One of ordinary skill will realize that other embodiments might not utilize an actual multiplexer structure for the multiplexer 1435, but instead use a tri-state approach. For instance, several different conceptual rows 1425 of storage elements might share a particular set of twelve-bit lines to provide their output. To do this, each conceptual row 1425 of storage elements has a set of tri-state drivers (not shown) that output their stored values onto the particular shared set of 12-bit read lines (not shown). When a particular conceptual row 1425 of storage elements is not being read, its associated set of drivers are tri-stated. On the other hand, when the conceptual row 1425 is read, its associated set of drivers is used to drive the stored values of the conceptual row 1425 onto the particular shared set of 12-bit lines. In some such embodiments, the tri-state drivers for the set of storage elements being read are activated by the output of the multiplexer 1430.

The multiplexer 1430, whose output is received as the selection bit of the conceptual multiplexer 1435, receives a set of configuration data 1440 as one input. The other input of the multiplexer 1430 is an address signal from the second decoder 1415. In some embodiments, this address signal corresponds to one of the rows 1425 of storage elements. In some embodiments, the set of configuration data 1440 also corresponds to (i.e., addresses) one of the rows 1425 of storage elements. In some embodiments, the configuration data 1440 is loaded during configuration time of the IC. The configuration data 1440 is illustrated as being separate from the other storage elements 1420 of the memory block 1360. However, in some embodiments, the configuration data 1440 is stored in one of the storage elements 1420.

The multiplexer 1430 selects between the configuration data 1440 and the address signal based on a Stream signal received from the first decoder 1405. As mentioned above, when the first decoder 1405 receives a Stream opcode (thus indicating that the secondary circuit structure is in streaming mode in some embodiments), the first decoder 1405 outputs a true Stream signal. When receiving a true Stream signal at its select bit, the multiplexer 1430 outputs the configuration data 1440 to the select line of the multiplexer 1435, thus causing the multiplexer 1435 to output, over the bitlines 1380, the values of a row 1425 of storage cells addressed by the configuration data 1440. Otherwise, the multiplexer 1430 outputs the address from the second decoder 1415 to the select line of the multiplexer 1435, thus causing the values of a row 1425 of storage cells addressed by a packet (e.g., a previous packet with a Load Address frame) to be output over the bitlines 1380. Thus, as made apparent by the discussion of the multiplexer 1430, when in streaming mode, the reading out of storage elements 1425 over the secondary circuit structure is controlled by configuration data 1440. When not in streaming mode, the reading out of storage elements 1425 over the secondary circuit structure is controlled by addresses specified by frames of packets sent through the secondary circuit structure (e.g., by the controller 915 of FIG. 9). Reading and writing to addressed rows 1425 of storage elements, as mentioned above, is described in more detail with respect to FIG. 15.

Figure 15:
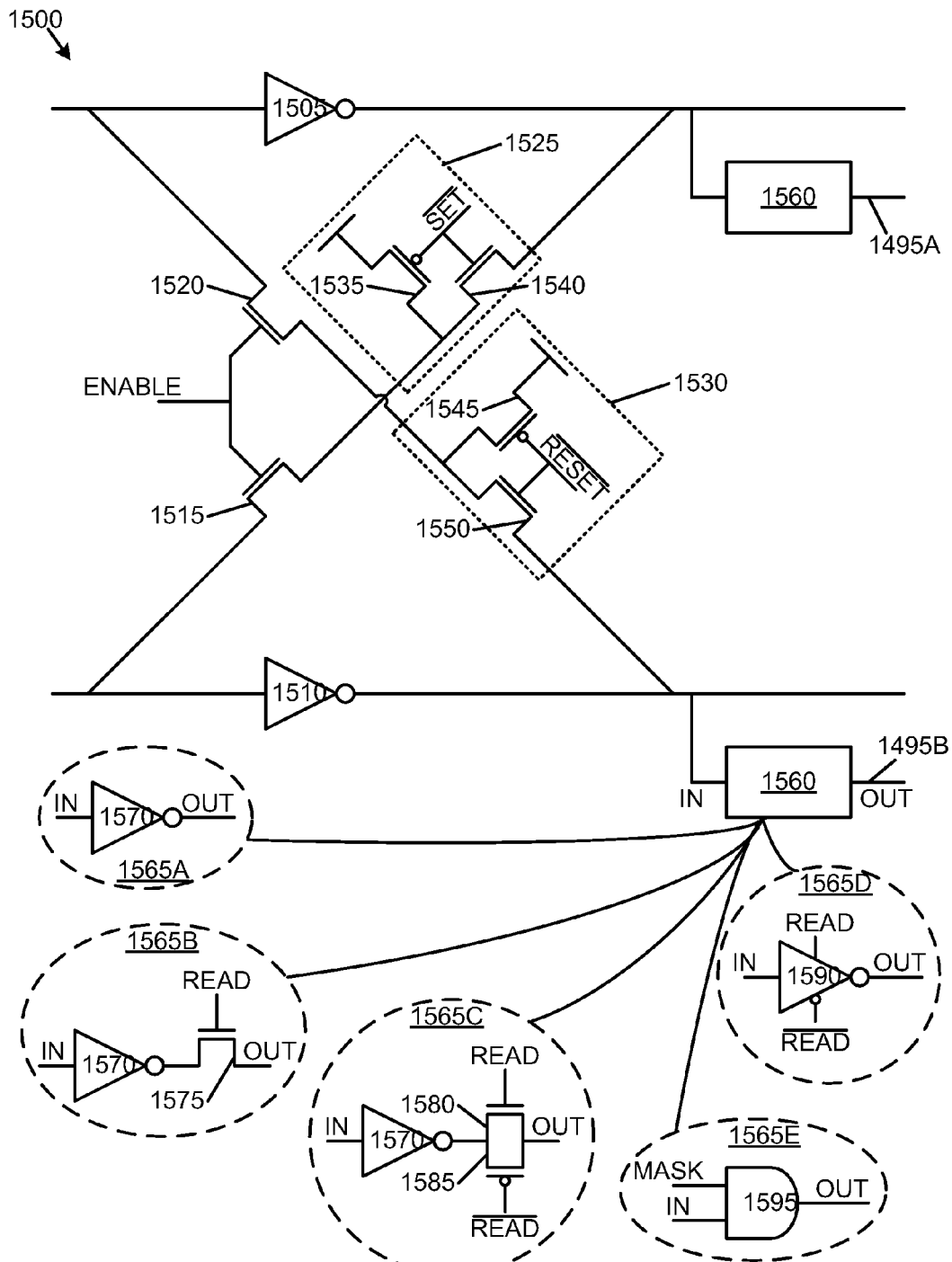
FIG. 15 illustrates a storage element of some embodiments which can be read and written to in the manner described above.

FIG. 15 illustrates a storage element of some embodiments which can be read and written to in the manner described above. In some embodiments, the storage elements of the rows 1425 have a complementary pass logic design. In other words, a logical bit is represented as two complementary bits. In some embodiments, this storage element is located at the input of a configurable circuit (e.g., a configurable RMUX).

Reading and writing to addressed rows 1425 of storage elements, as mentioned above, is described in more detail with respect to FIG. 15. In some embodiments, the storage elements of the rows 1425 have a complementary pass logic design. In other words, a logical bit is represented as two complementary bits. FIG. 15 illustrates a storage element of some embodiments. In some embodiments, this storage element is located at the input of a configurable circuit (e.g., a configurable RMUX). In some embodiments, this storage element is located at the output of a configurable circuit. In this example, this storage element is a transparent latch 1500. The transparent latch 1500 includes two output buffers 1505 and 1510 that are cross-coupled by two transistors 1515 and 1520 (i.e., one transistor connects the input of the first buffer to the output of the second buffer, while the other transistor connects the input of the second buffer to the output of the first buffer). These two transistors 1515 and 1520, when enabled, cause the transparent latch 1500 to latch (i.e., continuously output its stored value).

To write to the transparent latch 1500 through the secondary circuit structure, some embodiments insert a set-enable circuit 1525 and a reset-enable circuit 1530 in series with each of the cross-coupling transistors 1515 and 1520, as shown in FIG. 15. This figure illustrates that in some embodiments, the set-enable circuit 1525 includes one NMOS pass transistor 1540 and one PMOS pull-up transistor 1535. The NMOS pass transistor 1540 is connected in series with one cross-coupling transistor 1515. The PMOS pull-up transistor 1535 connects, at its drain, to the node between the two transistors 1515 and 1540, and connects, at its source, to the supply voltage.

The gates of transistors 1535 and 1540 are both tied to the complement of the SET signal, which is high when a logic high value has to be written into the latch. When the ENABLE and SET signals are high (and RESET is low), the transistor 1540 is off, and the transistor 1535 is on, thus driving the node between the two transistors 1515 and 1540 to a logical high. Since transistor 1515 is on, the value at the output of inverter 1510 is driven to a logical low. The value at the output of inverter 1510 is then passed through transistors 1550 and 1520 to the input of inverter 1505, thus driving the output of inverter 1505 to a logical high. When SET's complement is brought back to a logical high, transistor 1540 is turned on and transistor 1535 is turned off, connecting the output of inverter 1505 to the input of inverter 1510, so that the cross-coupled inverters reinforce each other's value.

FIG. 15 further illustrates that in some embodiments the reset-enable circuit 15305 includes one NMOS pass transistor 1550 and one PMOS pull-up transistor 1545. The NMOS pass transistor 1550 is connected in series with one cross-coupling transistor 1520. The PMOS pull-up transistor 1545 connects, at its drain, to the node between the two transistors 1520 and 1540, and connects at its source to the supply voltage. The gates of transistors 1545 and 1550 are both tied to the complement of the RESET signal, which is high when a logic low value has to be written into the latch.

When the ENABLE and RESET signals are high (and SET is low), the transistor 1550 is off, and the transistor 1545 is on, thus driving the node between the two transistors 1520 and 1550 to a logic high. Since transistor 1520 is on, the value at the output of inverter 1505 is driven to a logic low. The value at the output of inverter 1505 is then passed through transistors 1540 and 155 to the input of inverter 1510, thus driving the output of inverter 1510 to a logic high. When RESET's complement is brought back to a logic high, transistor 1550 is turned on and transistor 1545 is turned off, connecting the output of inverter 1510 to the input of inverter 1505, so that the cross-coupled inverters reinforce each other's value. Note that during normal operation, either SET or RESET (or both) must be logic low at all times. Note also, that if ENABLE is logic low, both SET and RESET must be at logic low.

To read from such a storage cell through the secondary circuit structure, some embodiments insert read-enable circuits 1560 at the outputs of the inverters 1505 and 1510. Exploded views 1565A-1565E illustrate several possible embodiments of the read-enable circuit 1560. As shown in exploded view 1565A, some embodiments of the read-enable circuit contain a single output buffer 1570, which takes the value at the input of the read-enable circuit (IN) and provides IN's complement at the output of the read-enable circuit (OUT). In some embodiments, as shown in exploded view 1565*b*, the output buffer 1570 is placed in series with an NMOS pass transistor 1575. In these embodiments, when the READ signal is high, the pass transistor 1575 is turned on, and the value at the output of the buffer 1570 is passed to the output of the read-enable circuit (OUT). In some embodiments, as shown in exploded view 1565*c*, the output buffer 1570 is placed in series with a CMOS transmission gate made up of an NMOS transistor 1580 and a PMOS transistor 1585 connected in parallel. In these embodiments, when READ is high (and its complement is low), the transmission gate is turned on, and the value at the output of the buffer 1570 is passed to the output of the read-enable circuit (OUT). In some embodiments, as shown in exploded view 1565*d*, an output buffer 1590 is placed between the input (IN) and output (OUT) of the read-enable circuit 1560. In these embodiments, the output buffer 1590 may be enabled by bringing READ to a logic high and READ's complement to a logic low. In some of these embodiments, the output buffer 1590 may receive a single enable signal (not shown). In other embodiments, as shown in exploded view 1565*e*, the data at the input (IN) of the read-enable circuit 1560 is ANDed with a MASK input. In these embodiments, if MASK is high, the output (OUT) will be at the same logic level as the input (IN). In these embodiments, if MASK is low, the output (OUT) will be at a logic lo regardless of the value at the input (IN).

In some embodiments, although not shown, the ENABLE signal may be connected to the enable line 1485 of FIG. 14. Also, although not shown, in some embodiments, the SET and RESET signals may be generated externally by some logical combination of ENABLE, a WRITE ENABLE signal, and the write signal 1490 of FIG. 14 (illustrated in FIG. 14 as true and complement signals 1490A and 1490B, respectively). For instance, SET may be the logical AND of ENABLE, WRITE ENABLE, and 1490A, while RESET may be the logical AND of ENABLE, WRITE ENABLE, and 1490B. As shown in FIG. 15, in some embodiments, the outputs of the read-enable circuits 1560 are connected to the read lines 1495 of FIG. 14 (illustrated in FIG. 15 as true and complement lines 1495A and 1495B, respectively). As mentioned above, the data read out of the storage element is supplied to masking logic in some embodiments.

Figure 16:
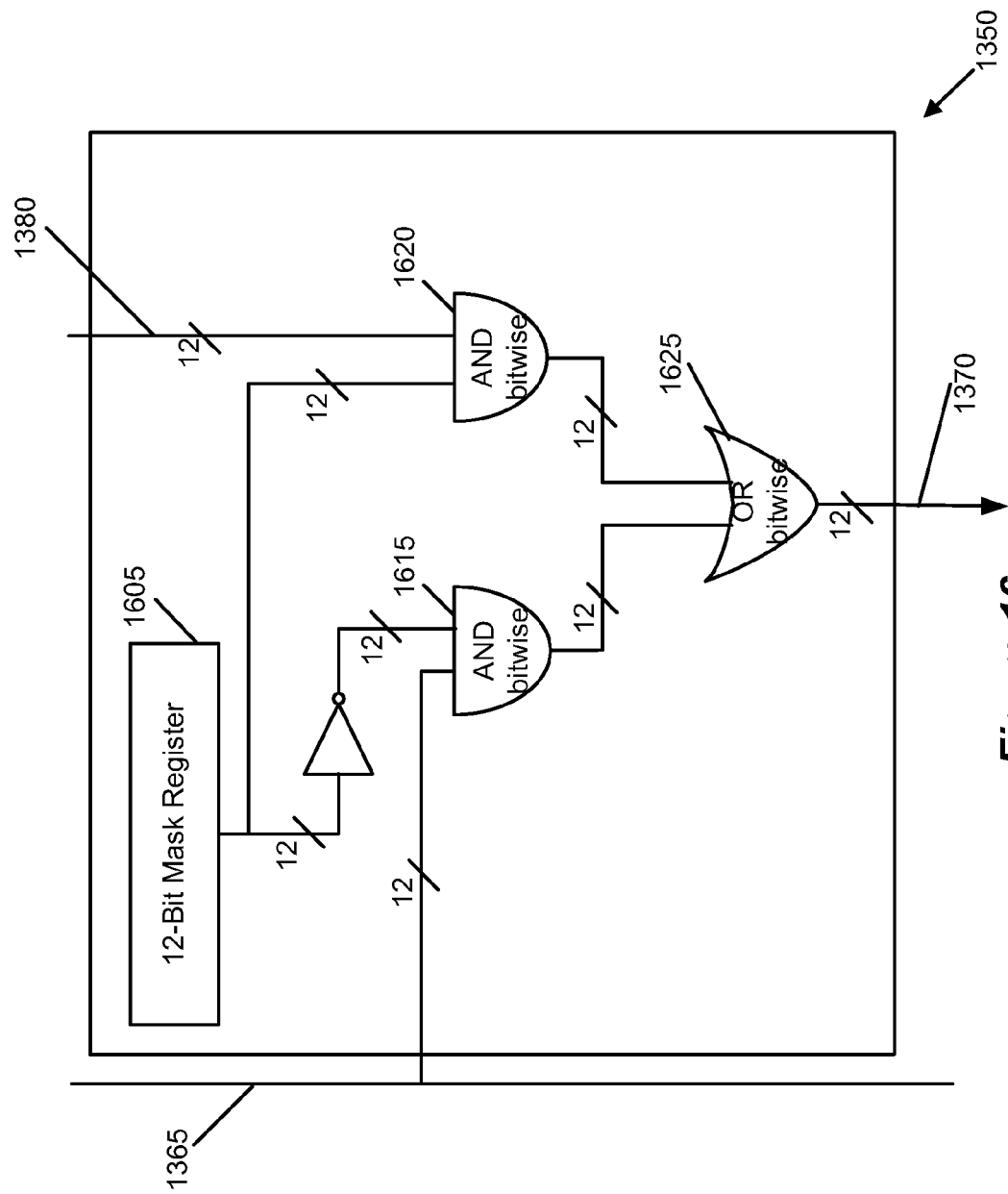
FIGS. 16 and 17 illustrate different embodiments of masking logic.

FIG. 16 conceptually illustrates some embodiments of the masking logic 1350 of the top tile 1300. As shown in this figure, the masking logic 1350 includes a mask register 1605, two bitwise AND gates 1615 and 1620, and a bitwise OR gate 1625. The bitwise AND gates 1615 and 1620 and the bitwise OR gate 1625 are twelve bits wide each in some embodiments.

The masking logic 1350 receives twelve bits of input over a set of bitlines 1380. In some embodiments, these twelve bits are the output of twelve storage elements (e.g., a row 1325 of storage elements, as shown in FIG. 14). The mask register 1605 contains the masking data, which can mask (eliminate) certain data bits received on the bitlines 1380 while letting other data bits through. In some embodiments, the masking data is written into the mask register before the operation of the masking logic (e.g., during configuration of the IC). The output of the mask register 1605 is supplied to a bitwise AND gate 1620. The output of the mask register 1605 is also inverted and then supplied to the bitwise AND gate 1615. The bitwise AND gate 1615 also receives the operand of the received frame (e.g., for tile 1300, the lower twelve bits output from the storage element set 1310 over the lines 1365). The twelve-bit wide outputs of the two bitwise AND gates 1615 and 1620 are supplied to the bitwise OR gate 1625, which performs an OR function on these two outputs and supplies its output over a set of bitlines 1370.

In some embodiments, this set of bitlines 1370 is provided as input to the multiplexer 1355 (shown in FIG. 13) that also receives the twelve bits of the operand of the packet as input (i.e., the lower twelve bits output by the storage element set 1310). The select line of the multiplexer 1355 is tied to the Read output of the first decoder 1405 of the decoder logic 1400. When the first decoder outputs a Read signal, the multiplexer 1355 outputs the output of the memory masking logic 1350 (i.e., the values output on the set of bitlines 1370).

Otherwise, the multiplexer 1355 outputs the original twelve bits of the operand of the packet stored by storage element 1310.

When the output of the memory block is not to be masked, the masking register contains all "1s," which results in the AND gate 1620 passing through all the signals output by the multiplexer 1610 and the AND gate 1615 not passing through any of the signals on the bus 1405. On the other hand, when the output of the memory block is to be masked, the mask register 1605 contains a particular pattern of "1s" and "0s" that results in the bitwise AND gates 1615 and 1620 passing through a desired combination of bits from the bus 1365 and the memory block 1360.

Essentially, the two 12-bit wide bitwise AND gates 1615 and 1620 and the 12-bit wide bitwise OR gate 1625 form a 12-bit wide two-to-one multiplexer. This multiplexer receives for its two 12-bit inputs the 12-bit output of the multiplexer 1610 and the 12-bit output of the storage element set 1310. The 12-bit select lines of this multiplexer receives the output of the 12-bit mask register. Each mask bit value then selects between the corresponding bit value from the output of the multiplexer 1610 and the corresponding bit value from the output of the storage element set 1310.

Also, as mentioned above, the secondary circuit structure of some embodiments is used in a reconfigurable IC (e.g., a sub-cycle reconfigurable IC). In some such embodiments, the mask register 1605 stores different mask values (e.g., different 12-bit mask values) for different reconfiguration cycles (e.g., different sub-cycles) of the reconfigurable IC. In this manner, different masking operations can be performed in different reconfiguration cycles (e.g., different sub-cycles) to maximize the number of bits that are read from different tiles.

Figure 17:
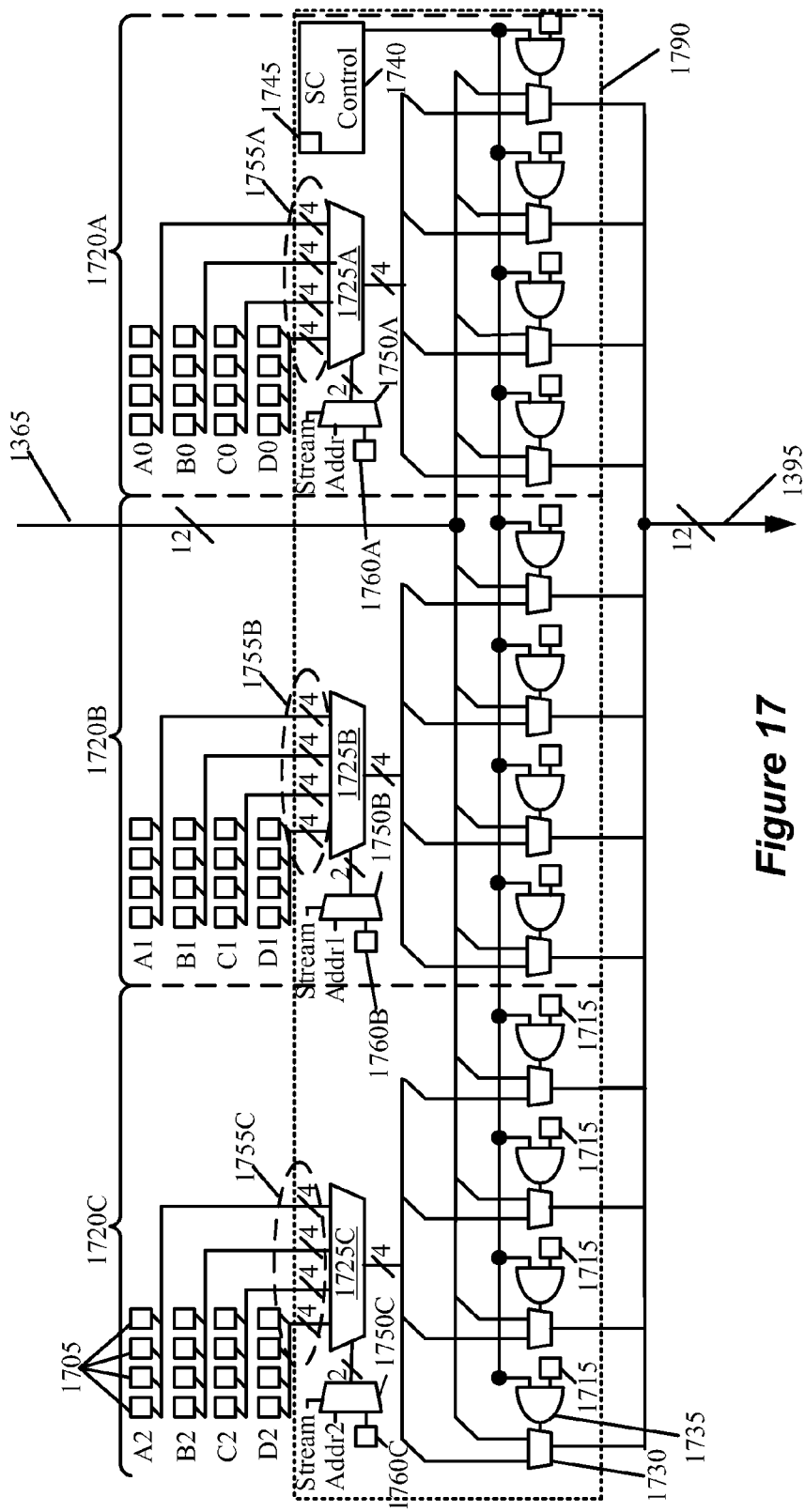

FIG. 17 conceptually illustrates alternate masking circuitry 1790 of some embodiments that replaces the masking circuitry 1390 (i.e., the masking logic 1350 and the multiplexer 1355) of FIG. 13. FIG. 17 illustrates several one-bit storage elements 1705 (e.g., UDS elements, configuration cells, RCLs, etc.) of a tile (e.g., the top tile 1300 described above), and masking circuitry 1790. The storage elements 1705 are grouped in three different conceptual "slices" 1720A, 1720B, and 1720C. In some embodiments, the tile includes a different number of slices (e.g., more or less than three). Each slice 1720 includes four conceptual rows of four storage elements 1705, a row select multiplexer 1725 with input lines 1755, mask multiplexers 1730, AND gates 1735, and multiple configuration data storage elements 1710 and 1715. In some embodiments, each conceptual row of 12 storage elements 1705 (e.g., row A formed by A0, A1, and A2 in slices 1720A, 1720B, and 1720C, respectively) represents a conceptual row 1425 of FIG. 14. The tile further includes a sub-cycle control circuit 1740, which is controlled by configuration data 1745. Together, the sets of input lines 1755A-C form the input lines 1380 shown in FIG. 13 that are provided to the masking circuitry 1790.

The masking operation performed by the masking circuitry 1790 of FIG. 17 is similar to that of the masking operation performed by the masking circuitry 1390 of FIG. 13 with two main differences. First, because each conceptual row of storage elements 1705 is conceptually broken into three slices 1720A-C, more flexibility is provided in the reading of storage elements. In other words, different four-bit portions (or "nibbles") of different rows may be read using the masking logic shown in FIG. 17. For instance, in one slice 1720A, four storage elements 1705 of row A (i.e., four-bit nibble A0) may be read, while in another slice 1720B, four storage elements 1705 of row B may be read (i.e., four-bit nibble B1), while in the other slice 1720C, four storage elements 1705 of row C may be read (i.e., four-nibble C2). Thus, the 12 bits that are read (A0 B1 C2) include data from three different rows. One of ordinary skill in the art would recognize that other examples are possible using the same or similar circuitry (e.g., A0 A1 A2, B0 A1 B2, C0 B1 A2, etc.).

Second, through the configurable sub-cycle control 1740, the masking can be turned on and off on a sub-cycle basis. The sub-cycle control 1740 stores a configuration data set 1745 that enables or disables the masking operation on different sub-cycles, thus providing further flexibility in the IC design (i.e., the use of this sub-cycle control 1740 may eliminate the need for other sub-cycle reconfiguration operations in some embodiments).

As mentioned above, FIG. 17 shows each slice 1720 containing 16 storage elements 1705, arranged in four conceptual rows of four. In some embodiments, any number of storage elements can be arranged in any number of conceptual rows (e.g., four conceptual rows of eight storage elements, eight conceptual rows of eight storage elements, eight conceptual rows of eight storage elements, etc.). Each conceptual row of storage elements provides an input to a sixteen-to-four row select multiplexer 1725, which is controlled by a multiplexer 1750. The multiplexer 1750 is similar to the multiplexer 1430 of FIG. 14 in that the multiplexer 1750 selects between a (1) portion of an address provided by an address decoder (e.g., the second address decoder 1415 of FIG. 14) and (2) configuration data 1760.

6. Reading from and Writing to Block Memory

In some embodiments, the secondary circuit structure accesses (i.e., reads and/or writes) user block memory. In some embodiments, this block memory is a block memory within a tile arrangement, such as block memories 730 and 740 shown in FIG. 7. In some embodiments, sets of storage elements (e.g., UDS elements, transparent latches, etc.) are present at the input and/or the output pins (e.g., address, data, etc.) of a block memory. In some embodiments, some or all of these storage elements are addressable resources of a tile, such as the storage elements 1425 of described above with respect to FIG. 14. For instance, through (1) a frame with a "Read" opcode and (2) a frame with a "Load Address" opcode, the controller 915 can effectively read the values written into and read out of a block memory.

Figure 18:
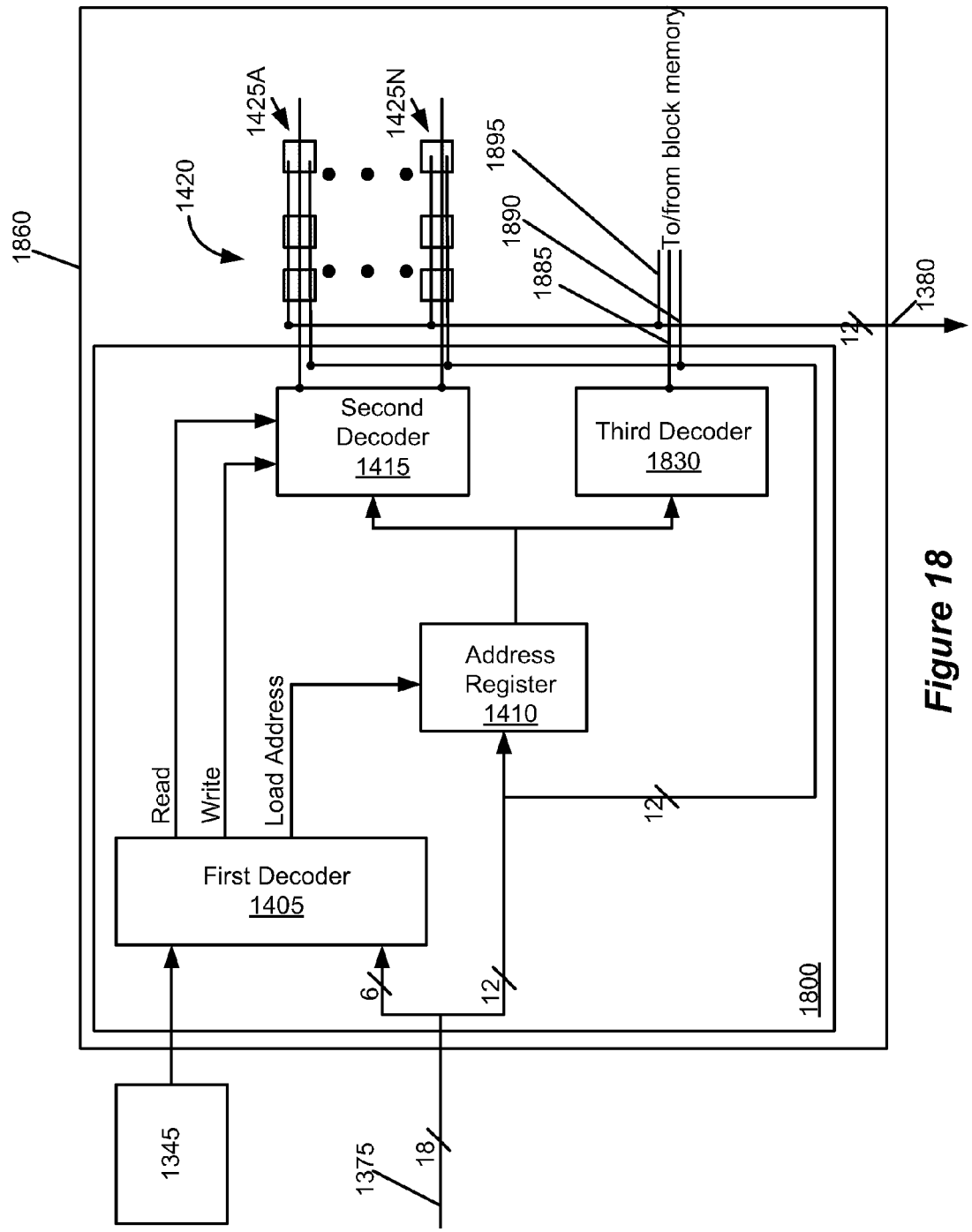
FIG. 18 illustrates a conceptual memory block that is an example of such a conceptual memory block of some embodiments.

In some embodiments, a tile that includes a block memory is a memory tile, such as memory tile 735 or 740, as shown in FIG. 7. In some embodiments, the memory tile may have similar structure as other tiles (e.g., a top tile 1300 as discussed above with respect to FIG. 13), which include conceptual memory blocks 1360. FIG. 18 illustrates a conceptual memory block 1860 that is an example of such a conceptual memory block 1360 of some embodiments. The conceptual memory block 1860 is similar to the conceptual memory block 1360 described with respect to FIG. 14. The conceptual memory block 1860 includes decoder logic 1800, conceptual rows 1425A-N of storage elements, and one or more storage cells of a block memory (not shown).

The decoder logic 1800 includes some of the elements of the decoder logic 1400, including a first decoder 1405 (the Stream and Increment Address signals are not shown), a second decoder 1415, and an address register 1410. The decoder logic 1800 also includes a third decoder 1830.

The third decoder 1830 has a functionality that is similar to that of the second decoder 1415. The third decoder 1830 receives an address from the address register 1410 that was identified by a frame. The third decoder 1830 outputs the address along a set of address lines 1885 to the block memory (not shown). The block memory receives a set of bitlines 1890 on which write data is supplied to the block memory when the memory is to be written. The block memory outputs data along bitlines 1895 when data is to be read from the memory.

While not shown in this figure, the decoder logic 1800 of some embodiments further includes multiplexers similar to those shown in FIG. 14 (i.e., multiplexers 1435 and 1430) that select a logical row of memory to output from the decoder logic 1800 on the output lines 1380. In some embodiments, as discussed above, several of the rows 1425 and/or the block memory share read lines. The output lines of each row 1425 and/or memory has an associated set of tri-state drivers that are enabled when reading from the row 1425 or the memory.

Figure 19:
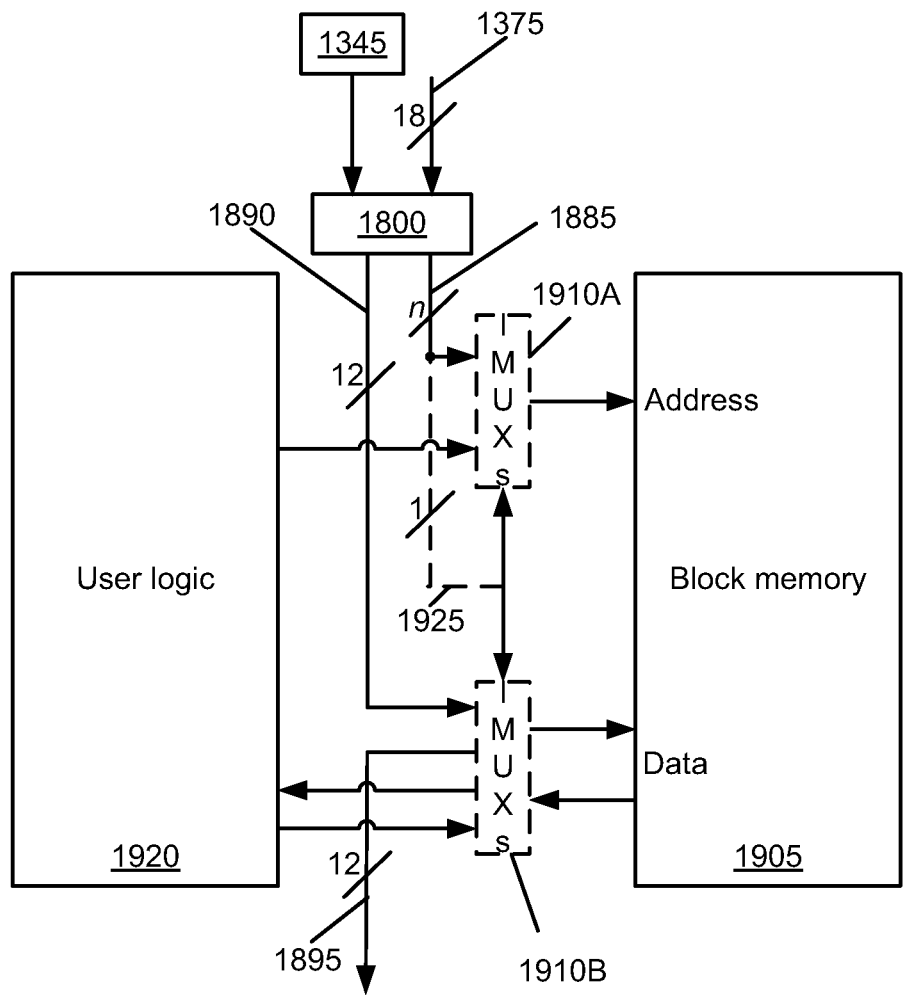
FIG. 19 illustrates reading and writing to a block memory in accordance with some embodiments.

FIG. 19 conceptually illustrates the methodology of some embodiments of reading and writing to a block memory in greater detail. FIG. 19 shows bitlines 1375 and 1895 of the secondary circuit structure. This figure also shows the block memory 1905, two sets of configurable IMUXs 1910A and 1910B, a user logic block 1920, and decoder logic 1800. In some embodiments, the decoder logic 1800 of this figure is the decoder logic 1800 described above with respect to FIG. 18. In some embodiments, the user logic block 1920 includes configurable circuits described above (e.g., configurable logic circuits, such as configurable LUTs and their associated configurable IMUXs, etc.).

The decoder logic 1800 outputs (1) an address of block memory 1905 to be read or written to the set of IMUXs 1910A over the bitlines 1885, as well as (2) the 12-bit operand of a received 18-bit frame. In some embodiments, the bitlines 1885 also carry a switch signal (described below) from the decoder logic 1800. This switch signal is supplied, over a bitline 1925, to the select terminals of the sets of IMUXs 1910A and 1910B.

The decoder logic 1800 outputs (1) an address of block memory 1905 to be read or written to the set of IMUXs 1910A over the bitlines 1885, as well as (2) the 12-bit operand of a received 18-bit frame. In some embodiments, the bitlines 1885 also carry a switch signal (described below) from the decoder logic 1800. This switch signal is supplied, over a bitline 1925, to the select terminals of the sets of IMUXs 1910A and 1910B. The operand is supplied to the set of IMUXs 1910B. In some embodiments, the 12-bit operand is also supplied over the set of bitlines 1380 to masking circuitry (e.g., masking logic 1350 of FIG. 13) that selects between (1) either the value read out of the block memory 1905, the (2) 12-bit operand itself, or (3) some combination thereof.

In order for the secondary circuit structure to have access to the block memory 1905, the sets of IMUXs 1910A and 1910B must allow the secondary circuit structure to do so. In some embodiments, the switch signal may be asserted at the select lines of the sets of IMUXs 1910A and 1910B that select the secondary circuit structure as having access to the block memory 1905, as opposed to the user logic 1920 having access to the block memory 1905. In some embodiments, this switch signal is supplied by the decoder logic 1800. In some embodiments, the switch signal is a bit (e.g., the most significant bit) of the address stored by the address register 1410 of the decoder logic 1800.

In some embodiments, the switch signal is the output of a memory element (e.g., a UDS element, not shown) that can be addressed and written by the controller of the secondary circuit structure, as described above. In some embodiments, this memory element is a memory element of the secondary circuit structure. In some embodiments, this memory element is not a memory element of the primary circuit structure (i.e., the primary circuit structure is not able to access this memory element). In some embodiments, the switch signal is hardwired to a controller of the secondary circuit structure (e.g., controller 915 of FIG. 9).

In some embodiments, the switch signal is a user signal. In other words, the switch signal is a signal that is generated within the IC. In some embodiments, the switch signal is the output of a configurable circuit of the IC. In some embodiments, the switch signal is asserted by some other mechanism that is neither through the primary circuit structure nor the secondary circuit structure. In some embodiments, the switch signal is a global enable signal that signifies the start of operation of the IC.

In some embodiments, the secondary circuit structure accesses the block memory 1905 while the primary circuit structure does not require access to the block memory. In some embodiments, the secondary circuit structure accesses the block memory while the IC is stopped (e.g., during active mode, as further described below).

In some embodiments, this methodology of reading block memories may be used in conjunction with the circuitry described above with respect to FIGS. 13-17 in order to read and/or write both (1) a block memory and (2) a set of other types of storage elements (e.g., UDS elements, RCLs, configuration data storage elements, etc.) within the same tile. In other words, one skilled in the art would recognize that these two methodologies of reading and writing different types of memories of a tile are not mutually exclusive. Moreover, one tile (e.g., a memory tile 735 or 745, as shown in FIG. 7) of an IC may include the circuitry described with respect to FIG. 19, while another tile of the same IC does not include the same circuitry.

Even though the top tile 1300 structure was described above by reference to several conceptual examples illustrated in FIGS. 13-17, one of ordinary skill will realize that other embodiments might use different circuits in the top tile 1300. For instance, instead of using the bitwise AND gates 1615 and 1620 and the bitwise OR gate 1625, some embodiments use an alternative circuit structure to form a two-to-one multiplexer.

Figure 20:
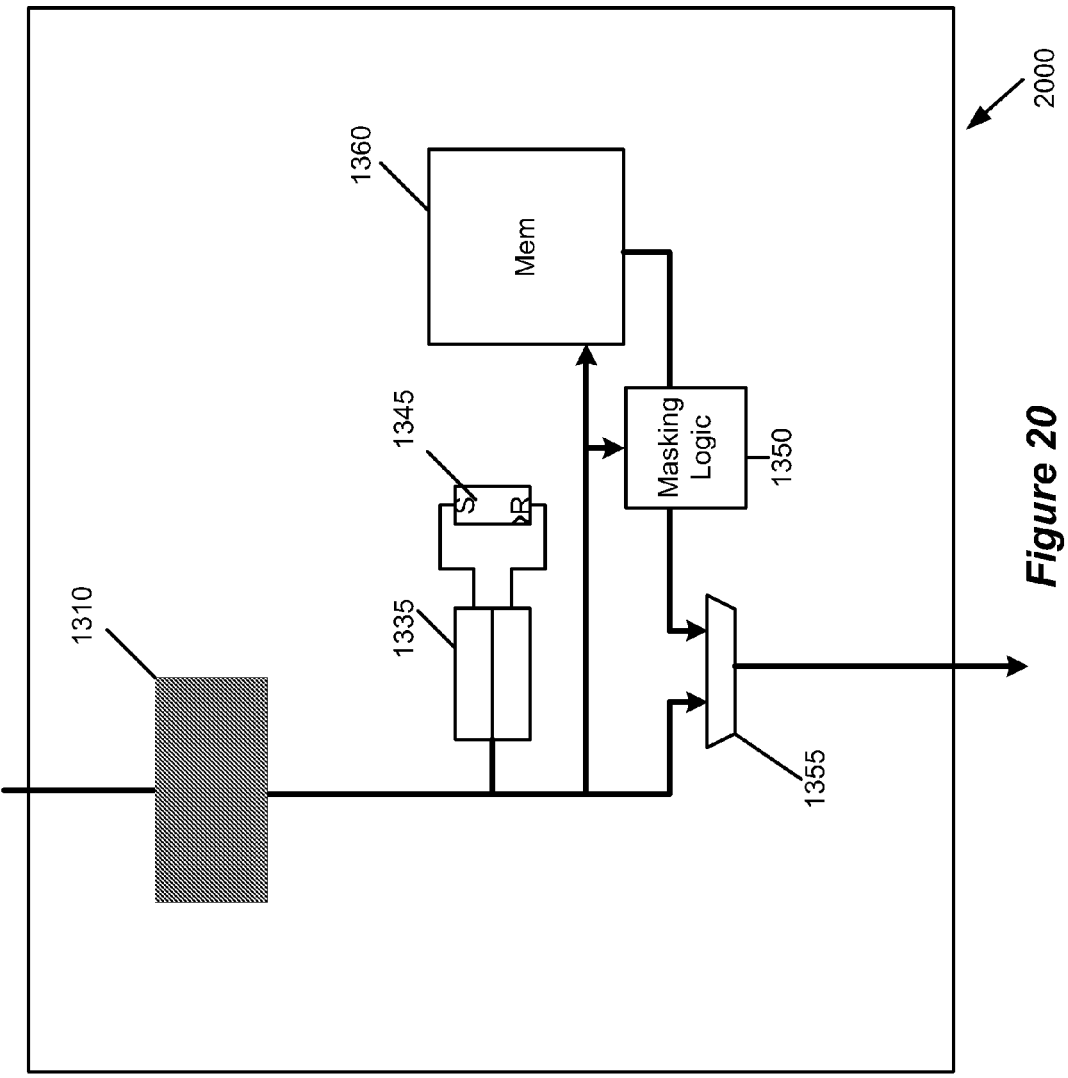
FIG. 20 illustrates a center tile of some embodiments.

The above discussion of FIGS. 13-17 describe secondary circuit structure within tiles as it relates to a top tile. However, in some embodiments, the secondary circuit structure of other types of tiles is similar to that of the top tile. For instance, FIG. 20 illustrates the circuit structure of a center tile 2000. As shown in this figure, the circuit structure of the center tile is identical to the top tile 1300, except that it does not include the storage 1305, the tile X/tile Y decoder 1315, the OR gate 1320, the AND gate 1325, the column selector 1330, or the set/reset register 1340. The center tile basically includes all of the circuitry necessary for determining whether a packet is intended for it, and if so, to perform the appropriate read, write, and mask operations. In some embodiments, the circuit structure for a bottom tile is identical to that of a center tile, with its output being passed to the transport layers 950 described above.

The circuit structure for an edge tile is similar to the circuit structure for a center tile. The one difference between edge and center tiles is that, in some embodiments, the edge tiles have more storage elements (e.g., configuration or register cells) to deal with the configurable I/O functionalities of the tile arrangement 900.

7. Accessing the Secondary Circuit Structure from the Primary Circuit Structure

In some embodiments, an interface, referred to as the "fabric port," is provided through which the primary circuit structure accesses resources within the secondary circuit structure. In some embodiments, a fabric port provides an interface between the controller (refer to 915 of FIG. 9) of the secondary circuit structure and the primary circuit structure (also referred to as the "user design"). Thus, the fabric port provides a mechanism for the user design to access and control resources of the secondary circuit structure (e.g., configuration bits within the secondary circuit structure). Through the fabric port, the primary circuit structure is able to interact with the secondary circuit structure in an internal manner that is similar to external mechanisms (e.g., external software communicating with the secondary circuit structure through a JTAG or some other interface).

Figure 21:
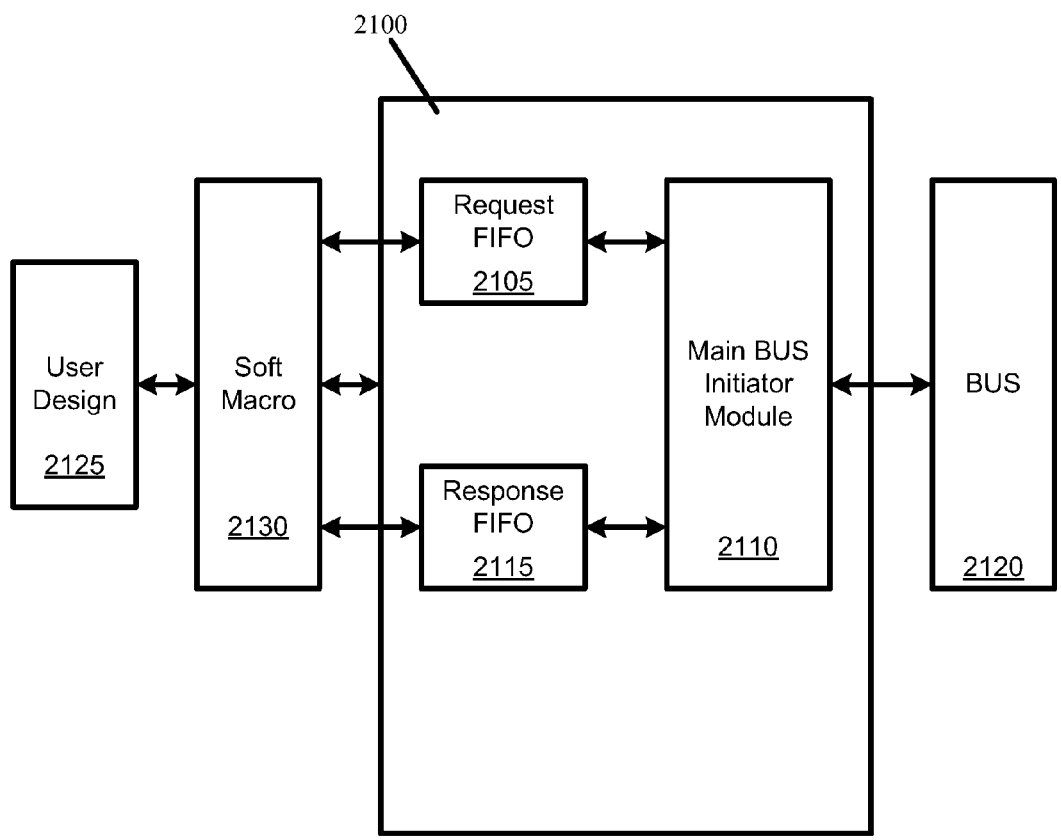
FIG. 21 illustrates such a fabric port of some embodiments.

FIG. 21 illustrates such a fabric port 2100 of some embodiments. As shown, the fabric port 2100 includes a request FIFO 2105, a main bus initiator module 2110, and a response FIFO 2115. The main bus initiator module 2110 is communicatively coupled to the request FIFO 2105, the response FIFO 2115, and the main bus 2120 of the secondary circuit structure. In some embodiments, this main bus is the bus 905 of FIG. 9. In some embodiments, the request FIFO 2105 and the response FIFO 2115 are communicatively coupled to the user design 2125 through a soft macro 2130. The soft macro 2130 provides a layer of abstraction between the user design 2125 and the FIFOs 2105 and 2115. In some embodiments, the soft macro 2130 is instantiated in the routing fabric of the primary circuit structure. In some embodiments, this instantiation occurs by configuring a portion of the primary circuit structure to implement the soft macro 2130.

The fabric port 2100 composes user logic requests (e.g. control, data, etc.) from the user design 2125 by accumulating data from the request FIFO 2105. Similarly, in some embodiments, the fabric port 2100 decomposes user logic request completions into one-byte chunks and pushes them into the user design 2125 through the response FIFO 2115.

In some embodiments, the fabric port 2100 is used to partially reconfigure the configurable circuits of the IC by sending packets based on data from the user design 2125 through the fabric port into the main bus 2120 and direct the packets to the secondary circuit structure. In some of these embodiments, the fabric port 2100 allows the user design 2125 to check the results of the reconfiguration through the fabric port 2100. In other words, the primary circuit structure is able to receive (i.e., read) data from the secondary circuit structure through the fabric port 2100. In some embodiments, the primary circuit structure is able to receive data pertaining to the data of the secondary circuit structure itself through the fabric port 2100. In some embodiments, this data includes event count values, trigger event signals, etc., as further described below.

In some embodiments, the fabric port 2100 is at a fixed physical location within the IC. Therefore, one or more interconnect circuits may need to be configured to route signals from circuits of the primary circuit structure to the fabric port 2100. Through the interconnect circuits, any circuit within the primary circuit structure is able to access the fabric port 2100 and thus access the functionality, data, and resources of the secondary circuit structure.

B. Secondary Circuit Structure Circuitry

1. Overview

In some embodiments, the secondary circuit structure includes programmable logic (i.e., configurable logic circuits, configurable interconnect circuits, etc.). As such, the functionality provided by the secondary circuit structure is configurable. In some embodiments, the functionality provided by the secondary circuit structure is reconfigurable in the sense that during operation of the primary circuit structure, the secondary circuit structure can switch between different configurations with each configuration performing different functionality. In this manner, the secondary circuit structure of some embodiments is customizable to provide debug functionality that is tailored to specifications of the user designs.

As noted above, the secondary circuit structure is initially configured via an external interface into the IC such as Joint Test Action Group ("JTAG") interface, flash, slave peripheral port, or through other means of communications with the IC, such as the I/O buffers of the IC. Additionally, some embodiments of the IC include a fabric port via which a user circuit or user logic of the primary circuit structure accesses the various circuits of the secondary circuit structure described herein (e.g., trace buffer, trigger circuit, etc.).

In some embodiments, the configurable resources of the secondary circuit structure are configurable to implement various "logic analyzer" circuitry such as comparators, state machines, trigger circuits, etc. In addition, the secondary circuit structure includes processing units, trace buffers, and memory to further compliment the functional set of operations customizable and executable within the secondary circuit structure.

In this manner, the secondary circuit structure can be used to implement an "on-chip" logic analyzer in conjunction with the streaming mode operation of the primary circuit structure of the IC. Accordingly, some embodiments of the IC provide internal means (i.e., the secondary circuit structure) by which to diagnose and debug user designs implemented in a primary circuit structure of the IC that is in development or that has already been deployed in the field. For example, the secondary circuit structure of some embodiments is able to store and make available for read-back input signals from the primary circuit structure, data resulting from processing the received input signals, or data received from external sources over I/O buffers or other external interfaces connected to the secondary circuit structure.

2. Trace Buffer

In some embodiments, the on-chip "logic-analyzer" functionality includes one or more trace buffers that function as the capture components of the on-chip logic-analyzer. In some embodiments, the trace buffer is on the same configurable IC die or wafer as the tile array of the primary circuit structure. In other embodiments, the trace buffer is on a separate die or wafer than the primary circuit structure, both of which are enclosed within a single chip package.

With reference to FIG. 9, the trace buffer 960 receives the sets of connections 952, 954, and 956 of the transport circuit structure layers 950A-C of the transport circuit structure 992. The connections 952, 954, and 956 in some embodiments are (together) 36 bits wide, which allows the trace buffer to receive 36 bits of streamed-out data (e.g., UDS data) from the tile arrangement 910 on each clock cycle. In the embodiments where the tile arrangement is part of a sub-cycle reconfigurable IC, the trace buffer can receive 36 bits on each sub-cycle of the user design cycle.

FIG. 22 illustrates a conceptual diagram of a trace buffer 2200 of some embodiments. In some embodiments, the trace buffer 2200 is an example of the above-mentioned trace buffer 960. The trace buffer 2200 is a memory with a conceptual "length" and "width," which are both measured in bits. The longer the trace buffer is (in bits) the more IC area the trace buffer occupies. In some embodiments, as shown in FIG. 22, the trace buffer 2200 is 128 bits long. In some embodiments, the trace buffer 2200 can be represented by a grid of slots 36 bits wide by 128 bits long. Data can be written on one "row" of this grid in each sub-cycle. In some embodiments, there are eight sub-cycles per user cycle. In such embodiments, a 128-bit long buffer would store data for 16 user cycles (128/8).

In some embodiments, the trace buffer 2200 is a circular buffer that continuously stores the data that it receives until instructed otherwise. When a circular trace buffer runs out of rows, it starts rewriting the rows, overwriting the oldest rows first. This goes on until the trigger signals a stop, at which point the trace buffer stops overwriting. The trace buffer 2200 then waits to offload the data from the IC to software that interfaces with the IC. In some embodiments, the trace buffer 2200 has extra width to accommodate bits to keep track of the sub-cycle in which the data arrived and/or to keep track of which row is being written. In other embodiments, tracking data is maintained separately from the circular memory of the trace buffer 2200, either within other circuitry that is part of the trace buffer 2200 or elsewhere.

3. Deskew Circuits

In some embodiments, the bitlines passing into the secondary circuit structure arrive with different timings Accordingly, some embodiments provide deskew circuits 970 to align the data, providing it to the trigger circuit 980 or trace buffer 960 in the order it was generated so that simultaneously generated signals reach the trigger circuits at the same time.

Figure 23A:
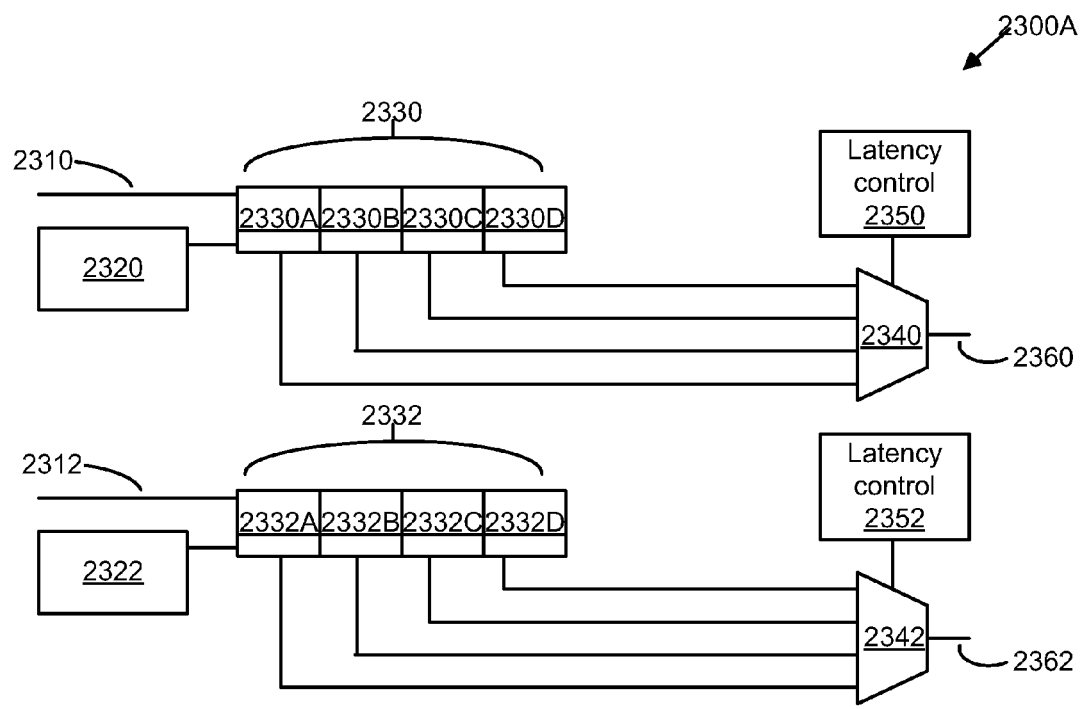
FIG. 23A illustrates deskew circuitry of some embodiments.

The deskew circuitry of some embodiments is shown in FIG. 23A. The deskew circuitry 2300A, includes data entry lines 2310 and 2312, load controls 2320 and 2322, one-bit wide shift registers 2330 and 2332, four-to-one MUXs 2340 and 2342 with inputs from the individual bit-registers 2330A-2330D and 2332A-2332D, latency controls 2350 and 2352, and outputs 2360 and 2362 from the deskew circuitry to the trigger circuitry. It should be apparent to one of ordinary skill in the art that FIG. 23A illustrates deskew circuitry for two bits but that some embodiments contain deskew circuits for deskewing any arbitrary number of bits.

The following descriptions of the operation of shift register 2330 also apply to shift register 2332. In FIG. 23A, shift register 2330 operates by successively loading one bit at a time into bit-register 2330A. As each new bit is loaded, the previously loaded bits are shifted to the right. Over the duration of a user cycle, the data bits are shifted from 2330A through 2330D. Shifting previous bits over as each bit arrives at the shift register 2330 is similar to the operation of a typical shift register, but the time or circumstance in which new bits arrive is configurable in some embodiments. In some embodiments, a bit is loaded into bit-register 2330A when load control 2320 prompts the register to receive it (e.g., through a write enable line, not shown). Load control 2320 prompts the shift register 2330 to receive a bit on one particular sub-cycle per user cycle. Therefore, in such embodiments, the shift registers 2330 and 2332 shift (i.e., iteratively pass a particular bit from the first shift register 2330A or 2332A to the last shift register 2330D or 2332D) once per user cycle. The received bit is read into shift register 2330A, the bit that had been in shift register 2330A shifts to shift register 2330B, and so on, until the bit in the fourth shift register 2330D is simply overwritten, not shifting anywhere.

The latency control 2350 determines which input of MUX 2340 is active. Thus, the latency control 2350 determines how many user cycles to delay. As described above, the load control 2320 of some embodiments activates the shift register 2330 once per user cycle. Because the shift register 2330 shifts once per user cycle, a data bit reaches each input of the multiplexer 2340 one full user cycle after the previous input.

The shift register 2330 and the multiplexer 2340 determine how many full user cycles to delay a data bit, and the load control 2320 determines which of the multiple possible sub-cycles within each user cycle will provide the data bits that go into the shift register 2330. Therefore, by selecting appropriate values for the load controls 2320 and 2322 and the latency controls 2350 and 2352, the deskew circuits can cause delays of an arbitrary number of sub-cycles within a certain range. In some embodiments, this range is between one and n. In some embodiments, n is the number of shift registers 2330 in the deskew circuit 2310. Additional description for deskew circuits is provided for within U.S. patent application Ser. No. 11/769,680, filed on Jun. 27, 2007, now issued as U.S. Pat. No. 8,069,425, which is incorporated herein by reference. As would be apparent to one skilled in the art, in order to perform an n-sub-cycle deskew operation using the circuitry described above with respect to FIG. 23A, the deskew circuit 2300A of some embodiments would require at least n shift registers 2330 and an n-to-one multiplexer 2340.

Figure 23B:
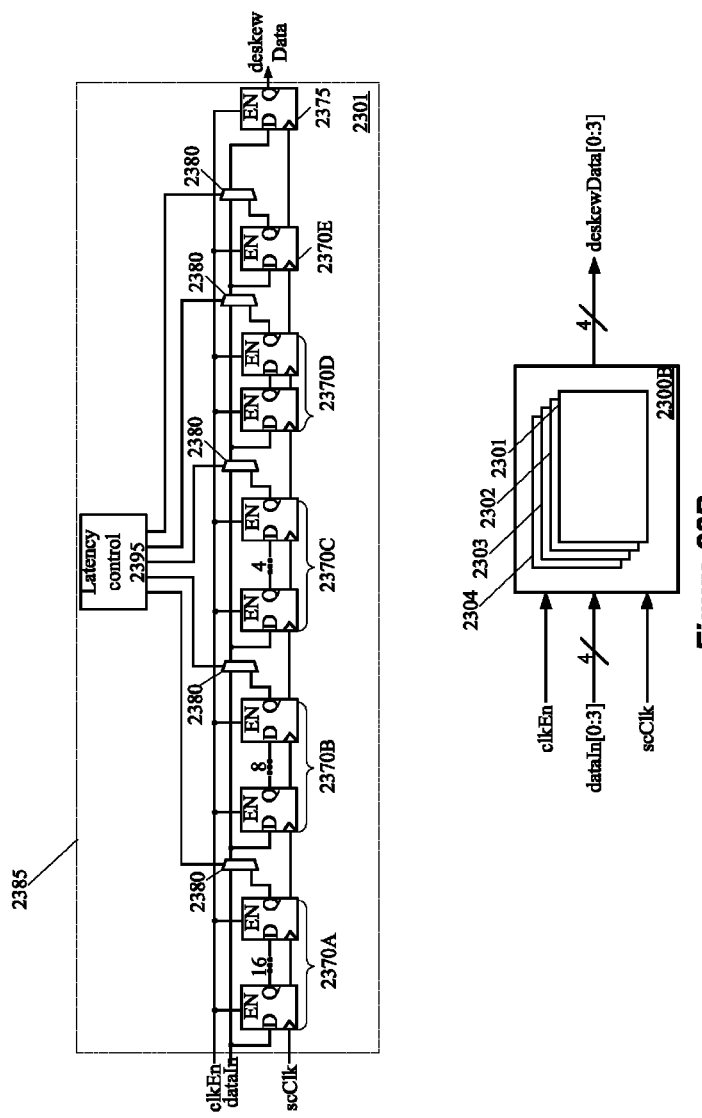
FIG. 23B illustrates another deskew circuit of some embodiments that does not require an n-to-one multiplexer to perform an n-bit deskew operation.

FIG. 23B illustrates another deskew circuit 2300B of some embodiments that does not have the requirement of such an n-to-one multiplexer in order to perform an n-bit deskew operation. The deskew circuit 2300B in FIG. 23B is a four-bit deskew circuit that receives four bits of data and outputs four bits of deskewed data. The four-bit deskew circuit 2300B includes four one-bit deskew circuits 2301-2304. The exploded view 2385 illustrates one of the one-bit deskew circuits 2301 in more detail.

The one-bit deskew circuit 2301 includes sets of flip-flops 2310A-E, an output flip-flop 2375, multiplexers 2380, and a latency control circuit 2395. The one-bit deskew circuit 2301 receives three signals: clkEn, dataIn, and scClk. The one-bit deskew circuit 2301 outputs a deskewData signal.

Each of the sets of flip-flops 2370A-2370E includes different numbers of flip-flops. The first flip-flop set 2370A includes 16 flip-flops, the second flip-flop set 2370B includes eight flip-flops, the third flip-flop set 2370C includes four flip-flops, the fourth flip-flop set 2370D includes two flip-flops, and the fifth flip-flop set 2370E includes a single flip-flop. Each flip-flop stores a data value for one sub-cycle and then shifts the data value to the flip-flop at its output).

The dataIn signal received by the one-bit deskew circuit 2301 is received on a sub-cycle basis, and is delayed (i.e., held by the flip-flops 2370A-E and 2375) for a number of sub-cycles. The number of sub-cycles to hold the data is determined by the latency control circuit 2395. In some embodiments, the latency control circuit 2395 includes configurable logic that controls the multiplexers 2380. These multiplexers 2380 receive 1) the output of a flip-flop set 2370A-E and 2) the dataIn signal itself. When a multiplexer 2380 selects the input it receives from a preceding flip-flop set 2370A-E, the multiplexer outputs a signal that was held for a number of sub-cycles that that is equal to the number of flip-flops in the flip-flop set 2370A-E. When a multiplexer 2380 selects the dataIn signal itself as its output, this means that the multiplexer does not output a signal that was held for the number of sub-cycles equal to the number of flip-flops in the preceding flip-flop set 2370A-E. However, the data may have been previously delayed by a different preceding flip-flop set that supplied its output to a different multiplexer 2380.

As mentioned above, the latency control circuit 2395, which controls each of the multiplexers' 2380 select lines, includes configurable logic in some embodiments. This configurable logic includes a configurable logic circuit (e.g., a configurable LUT) in some embodiments. Because of this configurable logic, one skilled in the art would recognize that the data signal can be delayed by any number of sub-cycles between one and 32. For instance, in order to delay a signal by a single sub-cycle, the latency control circuit 2395 would cause each of the multiplexers 2380 to output the dataIn signal itself. Thus, the dataIn signal would be delayed a single sub-cycle by the output flip-flop 2375. As another example, in order to delay a signal by 11 sub-cycles, the latency control circuit 2395 would cause the multiplexers 2380 at the outputs of the eight-flip-flop set 2370B and the two-flip-flop set 2370D to output the delayed value, while the latency control circuit 2395 would cause the other multiplexers 2380 to output the dataIn signal. Thus, the deskewData signal would be delayed by 11 sub-cycles (i.e., 8+2+1, including the output flip-flop 2375).

While the one-bit deskew circuit 2301 has been described above as having a specific number of sets of flip-flops, each with a specific number of flip-flops, one skilled in the art would recognize that different combinations are possible in order to achieve different deskew results (e.g., longer or shorter maximum delays). Additionally, the one-bit deskew circuit 2301 only performs its deskew operation and provides an output when the clkEn signal is true. In some embodiments, the clkEn signal is disabled when the deskew circuit is not required to provide an output or perform any operation. For instance, such a scenario may occur during active mode, which is further described below. However, in some embodiments, the one-bit deskew circuit 2301 does not receive a clkEn signal, and therefore always performs its deskew operations based on the latency control circuit 2395 and always outputs its deskewData output signal.

In some embodiments, each of the one-bit deskew circuits 2301-2304 is the same as the one-bit deskew circuit 2301 illustrated in exploded view 2385. In some embodiments, a single latency control circuit 2395 controls more than one one-bit deskew circuit. While some embodiments of the multi-bit deskew circuit 2300B include four one-bit deskew circuits, other embodiments include a different number of one-bit deskew circuits (e.g., two, eight, etc.).

4. Trigger a. Overview

The trigger component of the on-chip logic-analyzer is performed by a trigger circuit 980 that communicates with the trace buffer 960. This trigger circuit 980 analyzes control data and user data (e.g., UDS data) passed over the bitlines from the primary circuit structure and determines what data is to be stored in the trace buffer for subsequent analysis. In some embodiments, the one or more determinations performed by the trigger circuit 980 are configurable based on user specification.

Accordingly, some embodiments permit users to configure the trigger circuit 980 with one or more such conditions. A trigger signal of the trigger circuit 980 "fires" when the trigger circuit 980 identifies a data value, a particular set of values, or sequence of values coming in on connections that satisfy one or more of the user specified conditions set for the incoming values. Firing of the trigger signal causes the trace buffer to store and record data that is being streamed out from the tile arrangement for some specified duration. The duration for recording data within the trace buffer may include data from before the firing of the trigger or data from after the firing of the trigger. These user specified conditions may be used to specify a single triggering event or multiple triggering events.

b. Triggering Events

In some embodiments, the triggering conditions for a triggering event include: (1) arithmetic comparisons between first and second data values in the primary circuit structure where the first and second data values may be of variable bit lengths, (2) arithmetic comparisons between data values in the primary circuit structure and a user specified constant, (3) state transitions for data values, or (4) counting of conditions. In some embodiments, the triggering condition may include different combinations of the above enumerated conditions.

In this manner, users may configure multiple synchronous or nested conditions to describe when a triggering event should "fire".

In some embodiments, the trigger circuit detects state transitions such as rising or falling edges of user signals. Some embodiments configure triggers that "fire" upon detection of a signal transitioning from a first state to a second state irrespective of the current or final state of the signal. In some embodiments, three such triggering events may be configured: 1) a transition from "1" to "0" or a high state to a low state (i.e., falling edge), 2) a transition from "0" to "1" or a low state to a high state (i.e., rising edge), and 3) other signal transitions.

As noted above, a triggering event may be specified as a single state triggering event or as a multiple state triggering event. In some embodiments, a single state triggering event is a combinational trigger that becomes true when the inputs to the trigger circuit satisfy the user specified triggering event condition.

Additionally, in some embodiments, a triggering event may be specified with multiple conditions that should be satisfied at a single instance or clock cycle of the runtime operation of the IC. For example, such a triggering event fires when data at a particular memory address of a first memory block has a first particular value and when data at a different memory address of a second memory block has a second particular value. In some such embodiments, each such condition specifies a state of a multi-state state machine where all states occur synchronously. Such a triggering event is referred to as a sequential trigger in some embodiments. In other embodiments, the sequential trigger is defined such that the different sets of values arrive at different times during the runtime operation of the IC. For example, the sequential trigger is a user-defined state machine that receives a first set of inputs at a first clock cycle that advance the state machine to a next state, reset the state machine, or hold the state machine at its current state. Then a second set of inputs arriving at a second clock cycle are used to advance, reset, hold, or complete the state machine.

In both the synchronous and multi-cycle instances, the trigger signal is only fired when all states of the sequential trigger have been satisfied. Other sequential triggers of some embodiments operate according to an "if this then that else other" sequence of operations that implement branching. In some embodiments, the trigger circuit of some embodiments supports state machines with a number of states, including an idle state, where each such state may be dependent on data values of different resources of the primary circuit structure.

In some embodiments, combinational triggers can be functions of up to 6 inputs, while sequential triggers can be functions of up to 4 inputs. As shown in further detail below, each input to the trigger can be: 1) a comparator output, 2) the output of an event counter, or 3) a one-bit user signal.

In some embodiments, the trigger circuit is also configurable so as to specify different trigger conditions for variable bit data that is streamed off the chip into the logic analyzer. Accordingly, the trigger circuit can be configured to adapt to the user design that is implemented in the primary circuit structure of the IC. For example, a first user design implemented with 16 bit memories and logic circuits (i.e., LUTs) may be monitored and debugged using the trigger circuit by configuring the trigger circuit with 16 bit triggering events. Similarly, a second user design implemented with 64 bit memories and logic circuits (i.e., LUTs) may be monitored and debugged using the trigger circuit by configuring the trigger circuit with 64 bit triggering events. Additionally, it should be apparent to one of ordinary skill in the art that the trigger circuit of some embodiments is further configurable with multiple variable sized triggers that operate simultaneously. In some such embodiments, the trigger circuit is able to monitor and debug 8 bit, 16 bit, and 24 bit data simultaneously as described below in further detail below.

In some embodiments, the trigger circuit is reconfigurable. The configuration of the reconfigurable trigger circuit changes throughout the operation of the IC such that at different intervals or instances in the operation of the IC, different triggering events are specified and monitored for by the trigger circuit. To define the various triggers, some embodiments provide users with a graphical user interface by which triggering events may be specified for the user design based on a graphical representation of the user design.

c. Trigger Modes

In addition to configuring the triggering events for the trigger circuit, some embodiments also configure the mode in which the trigger circuit controls how values are to be stored in the trace buffer. In some embodiments, the trigger circuit and trace buffer includes three configurable modes: 1) pre-trigger mode, 2) post-trigger mode, and 3) multiple capture mode.

In pre-trigger mode, the user specifies the start of capture as a number of user-cycles before the triggering event. In this manner, if a triggering event is met, a set of data signals that arrived prior to the particular data signal satisfying the triggering event will be stored in the trace buffer in addition to or instead of the particular data signal satisfying the triggering event. As part of specifying which triggering mode to use in conjunction with the triggering event, some embodiments allow the user to configurably specify a desired size for the pre-trigger capture window. The capture window ranges from the full capacity of the trace buffer to 1 bit of data. The pre-trigger mode therefore allows a user to monitor conditions and states that occur immediately before a specified triggering event.

Figure 24:
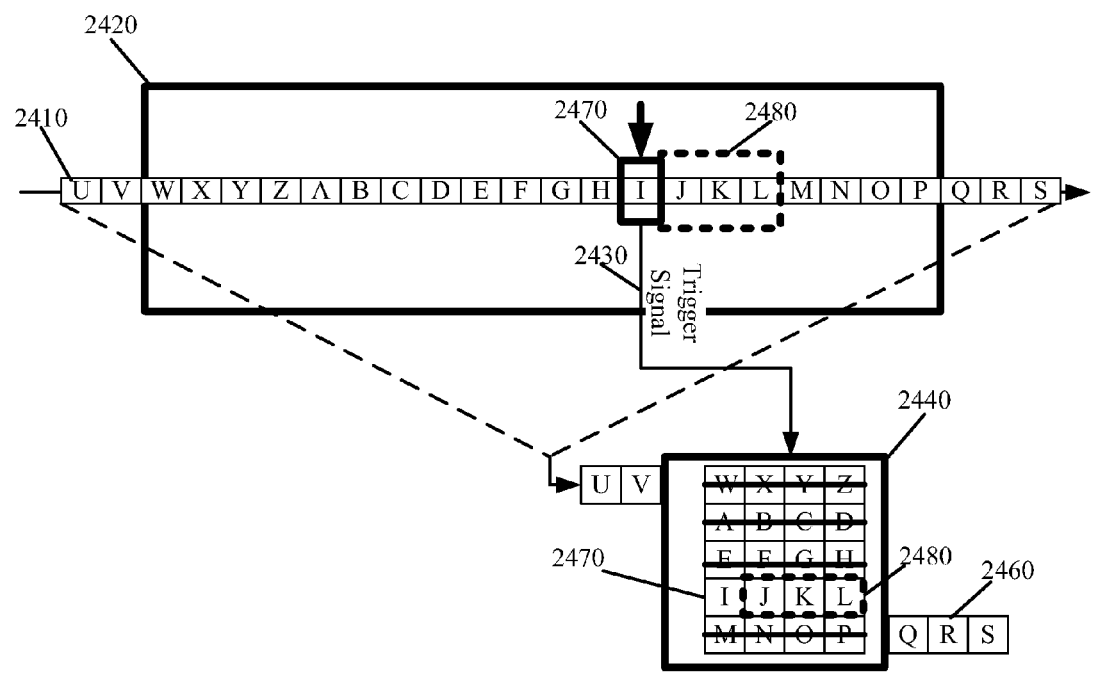
FIGS. 24-26 illustrate different trigger modes in accordance with some embodiments of the invention.

FIG. 24 conceptually illustrates the pre-trigger mode of operation in accordance with some embodiments of the invention. As shown, the pre-trigger mode of operation of some embodiments involves a data stream 2410, a trigger circuit 2420, a trigger signal 2430 of the trigger circuit 2420, and a trace buffer 2440.

The data stream 2410 is continually streamed into the trigger circuit 2420 and trace buffer 2440. In some embodiments, the data stream 2410 includes control and/or user data. Specifically, the data stream may stream data from the configuration controller, transport circuit structure, or the deskew circuits of some embodiments.

The trigger circuit 2420 monitors the data stream 2410 in real-time. In some embodiments, real-time monitoring occurs when the trigger circuit 2420 simultaneously monitors the data values in the data stream as the same data values are received, sent, and/or stored by the circuits in the primary circuit structure being monitored. The trigger circuit 2420 is configured with a triggering event 2470 that fires when a particular value is identified in the data stream 2410.

The trace buffer 2450 is configured to do a pre-trigger capture of data. Therefore, the trace buffer 2450 buffers some number of data values of the data stream that arrived prior to the firing of the triggering signal 2430. To do so, the trace buffer 2440 continually writes the data stream 2410 as it is being monitored by the trigger circuit 2420. The trace buffer 2440 continually writes to its memory until the memory is full or until a triggering event fires. If the memory is full, the trace buffer 2440 begins overwriting older data 2460.

Once the trigger circuit 2420 identifies the triggering event 2470, the trigger circuit 2420 asserts the trigger signal 2430.

In response, the trace buffer 2440 captures the data associated with the triggering event and the specified pre-trigger window of data 2480. Other data within the trace buffer 2440 can then be discarded. In some embodiments, the discarding of data occurs via software that streams out data from the trace buffer for debugging.

In some embodiments, the size of the pre-trigger window of data 2480 is user configurable. Therefore, when the triggering event 2470 is detected by the trigger circuit 2420, the trace buffer 2440 receives the firing of the trigger signal 2430 from the trigger circuit 2420 which causes the trace buffer 2450 to store the data value of the triggering event 2470 and also the specified values within the pre-trigger window 2430. These values can then be subsequently viewed or processed.

In post-trigger mode, the user specifies the start of capture as a number of user-cycles after the triggering event. In this manner, the user is able to specify and control what data is stored after the trigger fires. As for the pre-trigger mode, the post-trigger mode allows users to view what occurs within the primary circuit structure immediately or some time after a specified condition occurs. To do so, the trace buffer can be set to allow some delay (sometimes called a "programmable delay") between the triggering event and the stopping of the buffer. Such a trigger delay allows data to be collected from beyond the time of the triggering event itself. In this manner, the trace buffer may store a relevant subset of data that it received for a certain time interval after the triggering event that the trigger circuit detected. In some embodiments, the programmable delay can optionally be set to delay for: 1) half the depth of the trace buffer, so that approximately the same amount of data will be buffered before the triggering event as after, 2) the depth of the trace buffer, so that most or all of the collected data will be from after the trigger, or 3) short or no delay, so that most or all of the data in the trace buffer is from before the triggering event.

Figure 25:
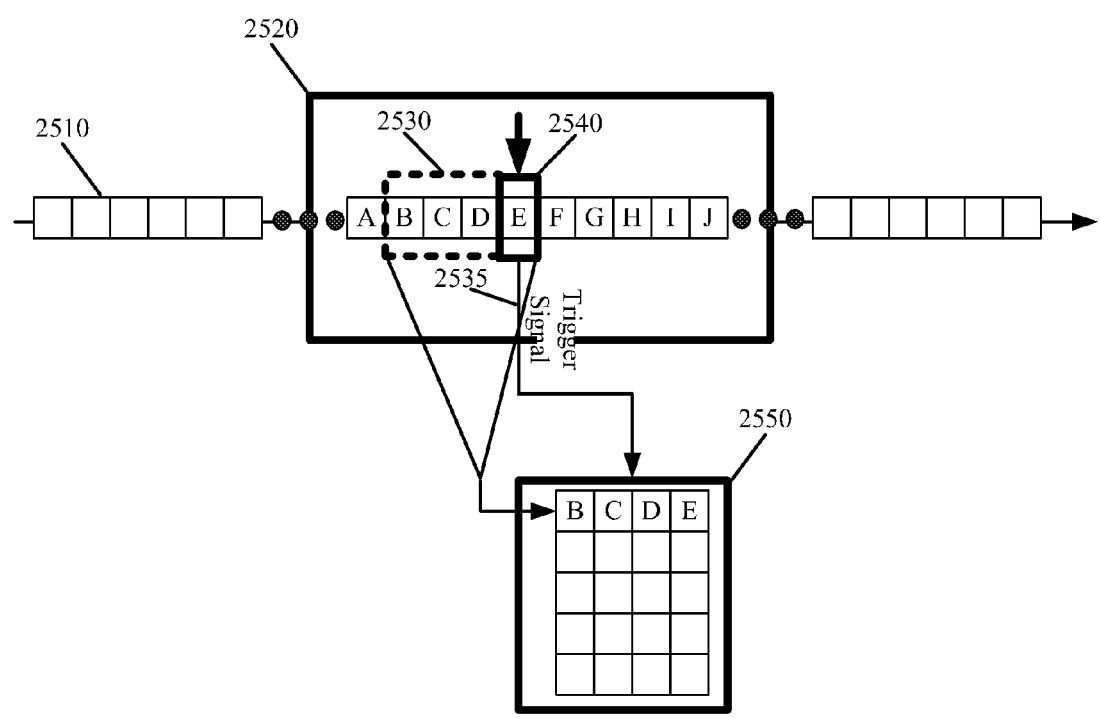

FIG. 25 conceptually illustrates a post-trigger mode of operation for a triggering event in accordance with some embodiments of the invention. As shown, the post-trigger mode of operation of some embodiments involves a data stream 2510, a trigger circuit 2520, a trigger signal 2535 of the trigger circuit 2520, and a trace buffer 2550.

As in FIG. 24 above, the data stream 2510 is continually streamed into the trigger circuit 2520 and trace buffer 2550 of some embodiments. The trigger circuit 2520 monitors the data stream in real-time as it passes into trigger circuit 2520. Therefore, when a trigger occurs as a result of the particular data value 2540 being monitored, the trigger circuit fires the trigger signal 2535 that causes the trace buffer 2550 to begin writing. The writes will capture the triggering event and subsequently arriving data over a post-trigger defined window 2530.

In some embodiments, multiple capture mode allows a user to capture multiple windows of data. In this mode, the trigger can fire multiple times. Each time the trigger fires, the trace buffer stores n (a number specified by the user) samples of data, and then waits for another trigger to fire. This process continues automatically until the trace buffer is filled. In other words, multiple capture mode operates without user or software intervention. In some embodiments, multiple capture mode works in conjunction with the post-trigger mode.

Figure 26:
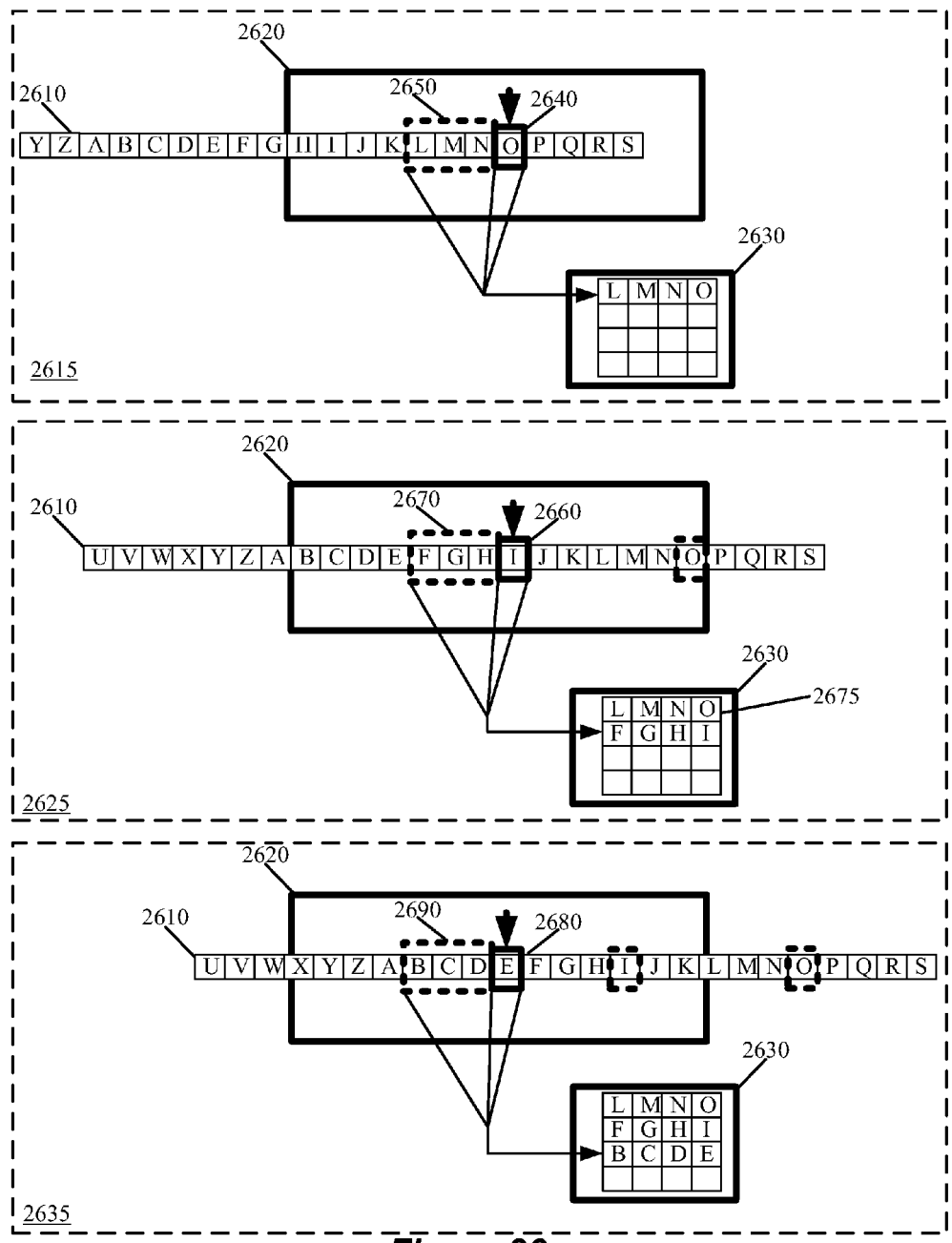

FIG. 26 conceptually illustrates the multiple capture mode of operation for a triggering event in accordance with some embodiments of the invention. As shown, the multiple capture mode of operation of some embodiments involves a data stream 2610, a trigger circuit 2620, a trigger signal of the trigger circuit 2620 that fires at multiple instances 2640, 2660, and 2680, and a trace buffer 2630.

In this figure, the data stream 2610 is continually streamed into the trigger circuit 2620 and trace buffer 2630 of some embodiments. The streaming is shown at three separate time slices 2615, 2625, and 2635 when the trigger circuit fires. During each time slice, the trigger circuit 2620 monitors in real-time the data values as they are streamed.

In the first time slice 2615, the particular data value 2640 being monitored has a value that causes the trigger circuit 2620 to fire. In response, a first window of data 2650 arriving after the particular data value 2640 is captured and stored into the trace buffer 2630. Capturing in the trace buffer is then halted after the first window of data 2650 is recorded. The trigger circuit 2620 then resets the triggering event and monitors for the next occurrence in the data stream 2610.

In this figure, the next triggering event occurs during the second time slice 2625 when the data value 2660 is monitored. Again, the trigger signal fires causing the trace buffer 2630 to store the data value 2660 along with the specified window 2670 of data values arriving after the data value 2660. However, the trace buffer 2630 does not overwrite the previously captured data values 2675. Once again, when the specified window 2670 is written to the trace buffer 2630, the trace buffer 2630 halts any further writes and the trigger circuit 2620 resets to monitor for the next triggering event.

Time slice 2635 presents another example of the firing of the trigger when the trigger circuit 2620 and trace buffer 2630 of some embodiments operate in multiple capture mode.

Accordingly, these triggering modes (e.g., pre, post, multiple) enhance debugging capabilities such that the data that is collected as part of each trigger is associated with the trigger. Therefore, not only can users view the data that caused a triggering event to occur, but also relevant data that is associated with the triggering event. Unlike traditional debugging tools where a series of arbitrary consecutive data is logged from one or more resources with no particular arrangement, the data resulting from these data modes not only identifies the particular data value or set of data values that caused the trigger, but also pre or post trigger data that a user specified to monitor in association with the firing of the trigger.

d. Qualification

In some embodiments, the trigger circuit performs clock qualification. Clock qualification provides additional control over how data is written to the trace buffer after the trigger fires. In some such embodiments, the user configures the trigger circuit with one or more qualifiers that control how data is written to the trace buffer on a clock-by-clock basis.

Figure 27:
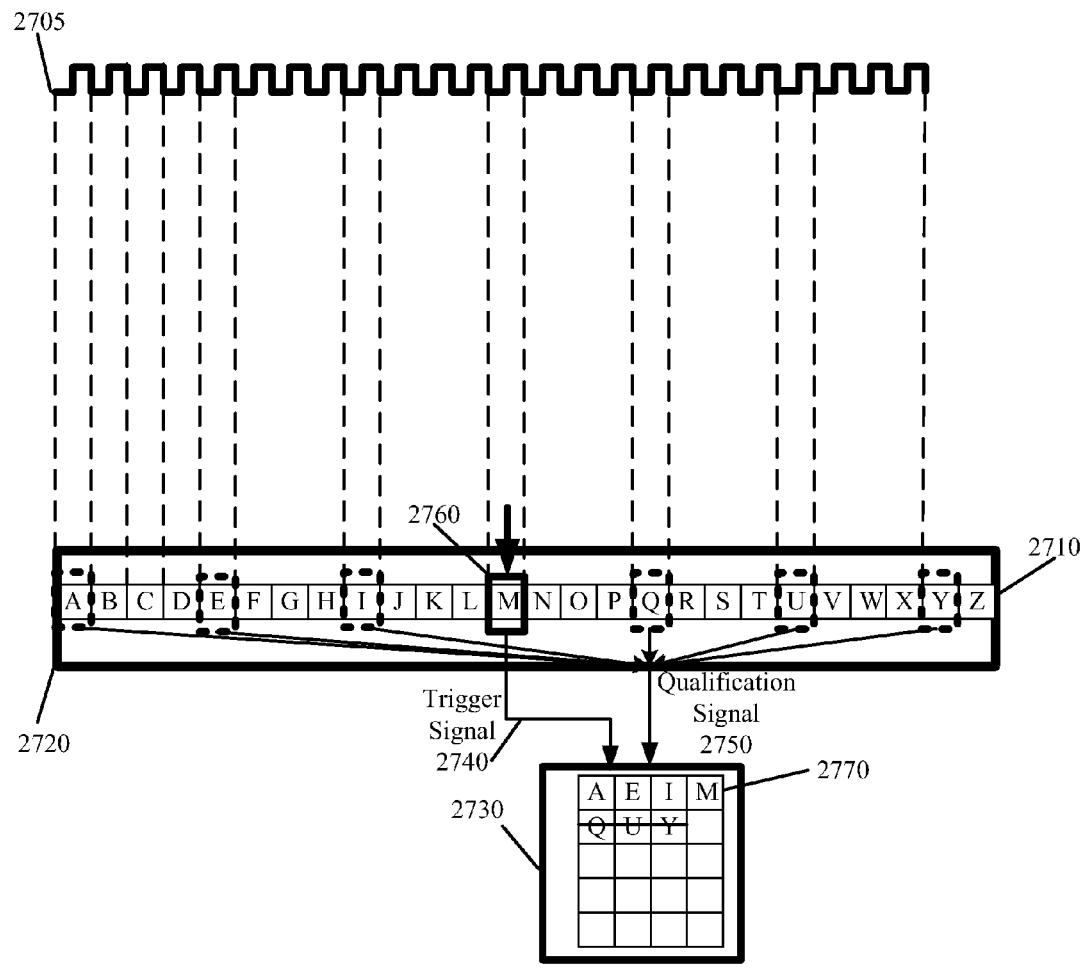
FIG. 27 illustrates clock qualification in accordance with some embodiments.

FIG. 27 conceptually illustrates clock qualification in accordance with some embodiments. As shown, clock qualification of some embodiments involves a user design clock 2705, a data stream 2710, a trigger circuit 2720, a trigger signal 2740 of the trigger circuit 2720, a qualification signal 2750 of the trigger circuit 2720, and a trace buffer 2730 receiving both the trigger signal 2740 and the qualification signal 2750.

In this figure, a data stream 2710 is continually streamed into the trigger circuit 2720 and the trace buffer 2730 in real-time as the monitored circuits of the primary circuit structure receive the data stream according to the user design clock 2705. The trigger circuit 2720 is configured with a user specified triggering event and also with a clock qualifier. In some embodiments, the clock qualifier is a counter that counts on which clock cycles the trace buffer 2730 should perform a write operation. In this figure, the clock qualifier causes the trace buffer 2730 to perform a write operation every fourth user cycle. In some embodiments, the clock qualifier is conveyed from the trigger circuit 2720 to the trace buffer 2730 via a qualification signal 2750 that further controls when the trace buffer 2730 writes.

Similar to the pre-trigger mode of operation described above, the trace buffer receives the data stream and writes the data stream in a continuous manner, overwriting previously written data when the buffer is full. However, the clock qualification signal 2750 controls the trace buffer 2730 such that only data values at the desired clock are written into the buffer. Then when the trigger circuit 2720 identifies a data value 2760 that satisfies the triggering event, the trigger circuit 2720 fires the trigger signal 2740.

If the circuits are configured to operate in pre-triggering mode, then a window of values already within the trace buffer are stored and those values are prevented from being overwritten. If the circuits are configured to operate in post-triggering mode, as shown in FIG. 27, then subsequent writes are performed into the trace buffer 2730 in accordance with the clock qualification signal 2750 until a specified post-trigger window 2770 is recorded.

Adaptations of the clock qualification functionality allow users to capture signals only during writes of a particular logic memory in the user circuit or address within the logic memory. Without clock qualification, the trace buffer captures up to some number X of data once the trigger fires. However, if the user is only interested in writes and writes only happen once every 10 clock cycles, then 90% of the data in the trace buffer is not interesting to the user. By configuring clock qualification, some embodiments perform the data capture only when the user desired writes occur at every tenth clock cycle. In this manner, the trace buffer stores only relevant user data. Qualification thus provides the additional control to make more economic use of the trace buffer and further filters the data that passes from the primary circuit structure into the trace buffer based on the firing of the trigger circuit.

Figure 28:
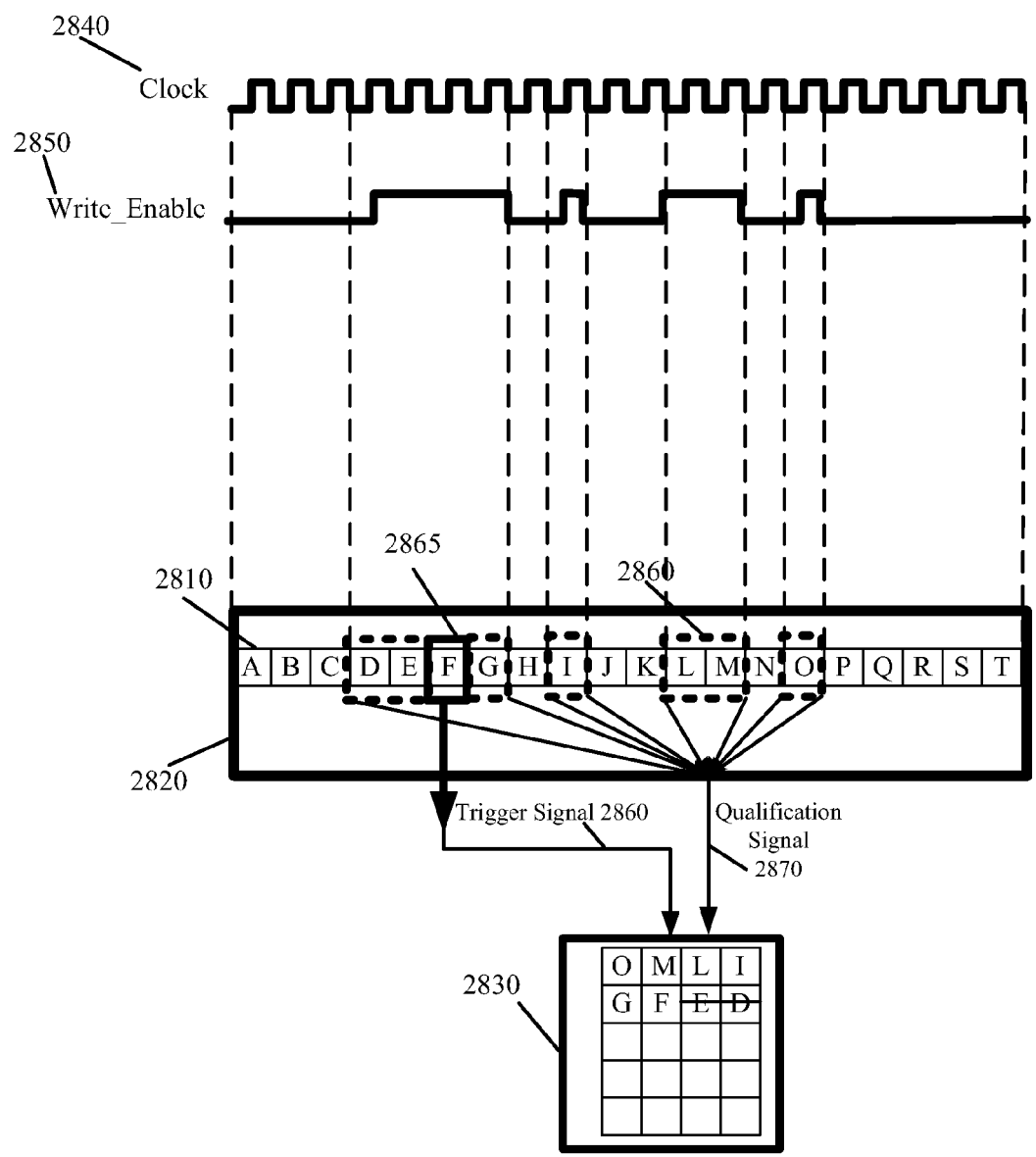
FIG. 28 conceptually illustrates clock qualification with a qualifier based on memory writes.

FIG. 28 conceptually illustrates clock qualification with a qualifier based on memory writes. As shown, clock qualification of some embodiments involves a user design clock 2840, a Write_Enable signal 2850, a data stream 2810, a trigger circuit 2820, a trigger signal 2860 of the trigger circuit 2820, a qualification signal 2870 of the trigger circuit 2820, and a trace buffer 2830 receiving both the trigger signal 2860 and the qualification signal 2870.

In this figure, a data stream 2810 from the primary circuit structure is streamed into the trigger circuit 2820 and trace buffer 2830 of the secondary circuit structure at the user clock 2840. However, qualifying the writes of the data stream 2810 to the trace buffer 2830 is the clock qualification signal from the trigger circuit 2820 that is based on a Write_Enable signal 2850. The Write_Enable signal 2850 represents when a particular memory address of a memory in the primary circuit structure is written to.

As shown, the trace buffer 2830 only writes values of the data stream 2810 when the Write_Enable 2850 signal has a value of "1". Accordingly, when the trigger circuit 2820 fires the trigger signal 2860 upon detecting the triggering event 2865, the trace buffer stores only value from the data stream 2810 that arrive when the qualification signal 2870 corresponding to the Write_Enable signal 2850 is set.

In some embodiments, clock qualification is performed by streaming the Write_Enable signal as a one-bit value into the trigger circuit further described below with reference to FIG. 29. The trigger circuit can then be configured using either the edge-detection circuits or ALU of the trigger circuit to determine whether the Write_Enable signal has a value of "1". If so, the trigger circuit will then set the qualification signal to a "1".

e. Trigger Circuit

Figure 29:
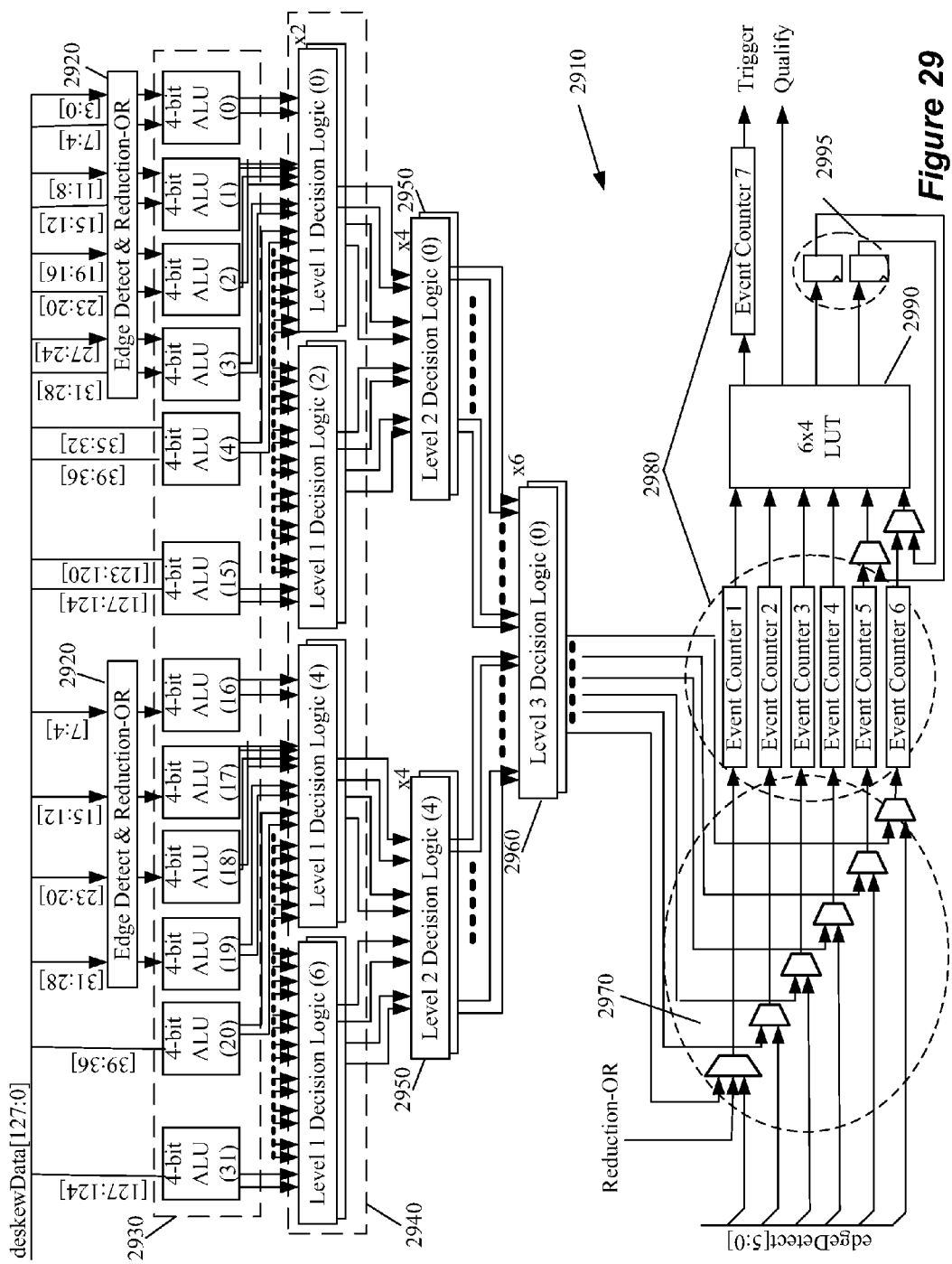
FIGS. 29-32 illustrate a trigger circuit and various components of the trigger circuit in accordance with some embodiments of the invention.

FIG. 29 presents a circuit diagram for a trigger circuit 2910 in accordance with some embodiments of the invention. In some embodiments, the trigger circuit 2910 includes edge-detection circuits 2920, a set of arithmetic logic units (ALUs) 2930, a first level hierarchical decision logic 2940, a second level hierarchical decision logic 2950, and a third level hierarchical design logic 2960, matchers 2970, event-counters 2980, a LUT 2990 for generating the final trigger, and a set of storage elements 2995. As shown, the trigger circuit receives 128 bits of data. However, it should be apparent to one of ordinary skill in the art that some embodiments of the trigger circuit may be adapted to operate using any arbitrary number of bits (e.g., 1024, 256, 7). Accordingly, the trigger circuit need not be implemented using all of the above enumerated circuit modules. Similarly, some embodiments of the trigger circuit may be implemented using other circuit modules in conjunction with or instead of some of the above enumerated circuit modules.

In some embodiments, the trigger circuit 2910 operates at a user defined clock rate where the user defined clock rate is synchronous to a sub-cycle clock running at 1/n of the sub-cycle frequency where n is the number of reconfigurable sub-cycles in one clock cycle, also referred to as "looperness". In some such embodiments, deskewed data arrives at every user-clock edge, synchronous to the sub-cycle clock. A sub-cycle control module generates a proper clock enable signal based on the looperness configured and all pipeline registers will be clocked only when the clock enable signal is asserted. It should be apparent to one of ordinary skill in the art that in some other embodiments the trigger circuit 2910 operates at the sub-cycle frequency.

i. Configurable Edge-Detection Circuits

The edge-detection circuits 2920 are configurable to detect one of several signals transitions. In some embodiments, the edge-detection circuits 2920 detect a rising edge, a falling edge, a state change irrespective of the actual transition, or perform a no operation pass through of the signal received on its input to its output. Each of the edge-detection circuits 2920 in FIG. 29 perform up to 16 bits of edge detection. However, it should be apparent to one of ordinary skill in the art that the edge-detection circuits 2920 may be implemented using several one-bit edge-detection circuits.

Figure 30:
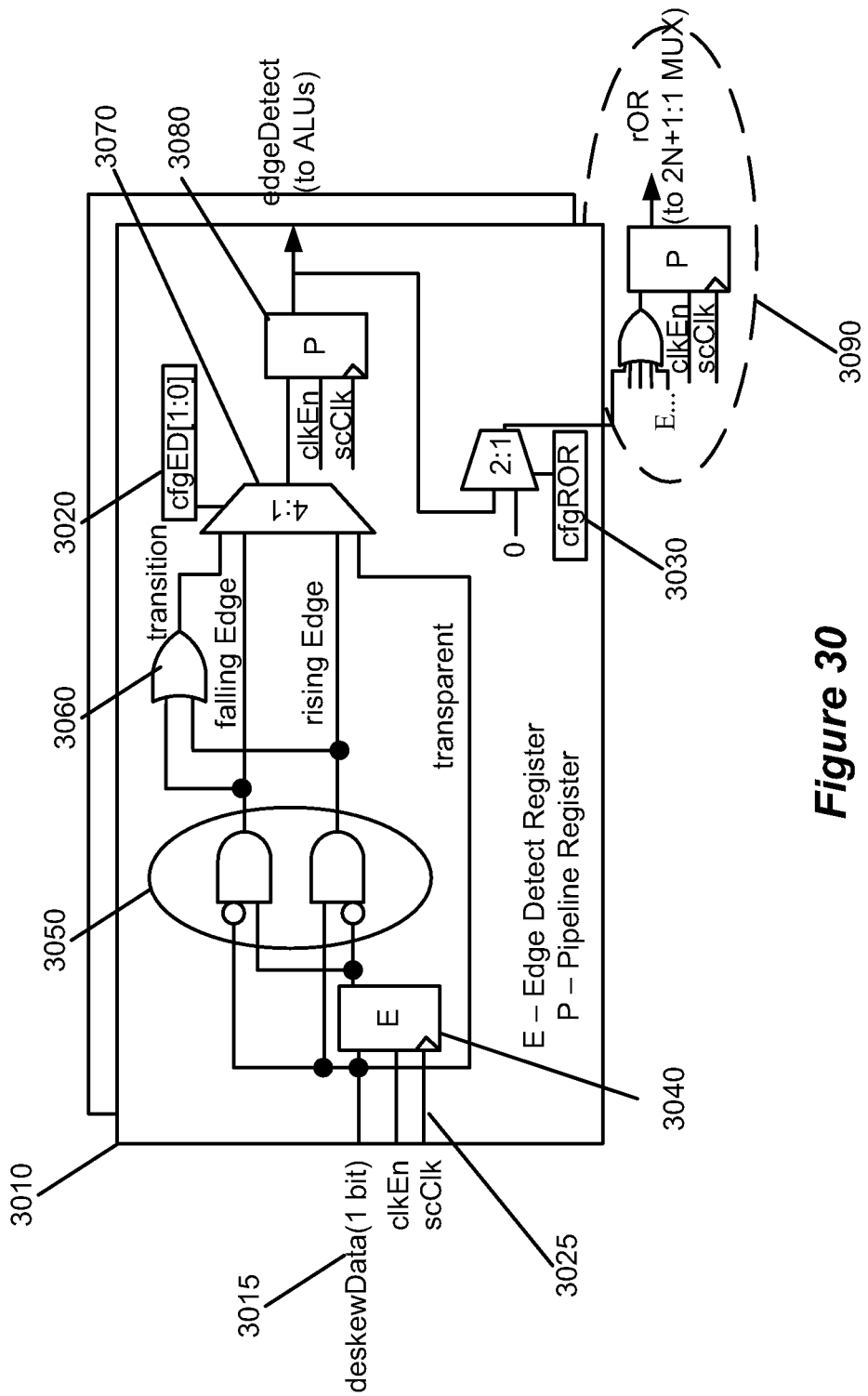

FIG. 30 illustrates a one-bit edge-detection circuit 3010 in accordance with some embodiments of the invention. As shown, the edge-detection circuit 3010 includes a one-bit input 3015, a clocking signal 3025, configuration bits 3020 and 3030, a delay register 3040, a pair of edge detecting AND gates 3050, a signal transition OR gate 3060, a configuration select multiplexer 3070, a timing register 3080, and reduction-OR circuitry 3090. Several such one-bit edge-detection circuits 3010 are necessary to perform the reduction-OR functionality as is described below.

To perform the edge detection functionality, the delay register 3040 creates a delayed-version of the input signal 3015. To create the delayed-version of the input signal 3015, the register 3040 includes a flip-flop through which the input signal 3015 passes. Both the delayed-version of the input signal 3015 and the non-delayed version of the input signal 3015 are passed to the edge detecting AND gates 3050.

One AND gate in the pair of AND gates 3050 inverts the non-delayed version of the input signal 3015 before performing the logical AND operation. Then, by ANDing the inverted non-delayed version of the input signal 3015 with the non-inverted delayed-version of the input signal 3015, this AND gate is able to detect a falling edge in the input signal 3015.

The second AND gate in the pair of AND gates 3050 inverts the delayed version of the input signal 3015 before performing the logical AND operation. Then, by ANDing the inverted delayed version of the input signal 3015 with the non-inverted non-delayed version of the input signal 3015, this AND gate is able to detect a rising edge in the input signal 3015.

By logically ORing the outputs of the edge detecting AND gates 3050 using the signal transition OR gate 3060, the edge detection circuit 3010 is further able to determine a signal transition irrespective of whether it is a falling edge or rising edge. Specifically, if either a falling edge or rising edge is detected, the signal transition output of the OR gate will be a value of "1".

In this manner, the edge-detection circuit 3010 can synchronously detect rising edges or falling edges. All such values are then passed to the configuration select multiplexer 3070 which selects the edge detection operation that the edge-detection circuit 3010 performs at a given moment in time based on the configuration bits 3020. The edge-detection circuit 3010 is configurable to output a "1" value when a rising edge occurs, when a falling edge occurs, or when either condition occurs on its respective input. The circuit 3010 may also be configured to operate transparently by simply passing through its inputs to its outputs. Configuration tables for the configuration bits 3020 of the edge detection circuit 3010 are provided in the subsection below "Configuring the Trigger Circuit." A retiming register 3080 is then placed to buffer the output of the edge detection circuit so that a stable signal passed to the ALU or other components of the trigger circuit.

Additionally, the edge detection circuit 3010 when coupled with other edge detection circuits 3010 provide a reduction-OR functionality whereby a single edge transition may be detected from amongst several input bits. Specifically, each edge detection circuit 3010 determines a transition for a single input bit. Each such output is passed to a shared reduction-OR circuit 3090 that performs a logical OR operation for the values in order to determine if any one of multiple bits has transitioned states. The reduction-OR configuration of the edge detection circuit 3010 is controlled by the configuration bit 3030 which is described further below in the subsection "Configuring the Trigger Circuit."

The outputs from the edge-detection circuitry 2920 and those inputs of the trigger circuit 2910 that do not pass through the edge-detection circuitry 2920 are then passed to the ALUs 2930. In some embodiments, the ALUs 2930 are configurable to perform one or more of a set of operations.

ii. ALUs

In some embodiments, the bank of ALUs 2930 is created using several "short-bit" ALUs (e.g., four-bit ALUs). In some embodiments, the ALUs 2930 are configured to compliment the functionality of the edge-detection circuitry 2920 by detecting specific signal transitions. For instance, the ALU can select a data value or a constant to determine whether a detected signal transition involves transitioning from a "0" to "1" or vice versa.

In some embodiments, the ALUs 2930 support comparisons of variable width by spanning a "long-bit" operation over multiple ALUs with each ALU performing a subset of the long-bit operation. For instance, by spanning the full width of the trigger circuit 2910, some embodiments are able to implement 128-bit operations (e.g., 32 four-bit operations). As the trigger circuit 2910 is constructed with multiple n-bit combinational ALUs, the trigger circuit 2910 can therefore support comparisons of variable widths, in steps of n bits. Additionally, different sets of the ALUs 2930 may be grouped together to form multiple discrete comparators. For example, three of the ALUs 2930 may be configured to perform a first 12-bit operation while a eight of the ALUs 2930 may be configured to perform a second 32-bit operation simultaneously with the first 12-bit operation.

In some embodiments, each ALU of the ALUs 2930 is configurable to compute several operations for operands A and B, where operand A is a user signal and operand B is either a user signal or a user-specified constant. It should be apparent to one of ordinary skill in the art that the separable configurable attribute of each ALU allows each ALU to be configured differently such that different ALUs can perform different operations relative to other ALUs at any instance during the runtime operation of the IC. In some embodiments, the operations performed by each of the ALUs 2930 include comparator operations such as A<B, A>B, A<=B, A>=B, A==B, A !=B, and transitions from "1" to "0" or from "0" to "1" for operands A and B. Additionally, each ALU includes carry logic, sign logic, overflow detection, equality logic, and masking.

Figure 31:
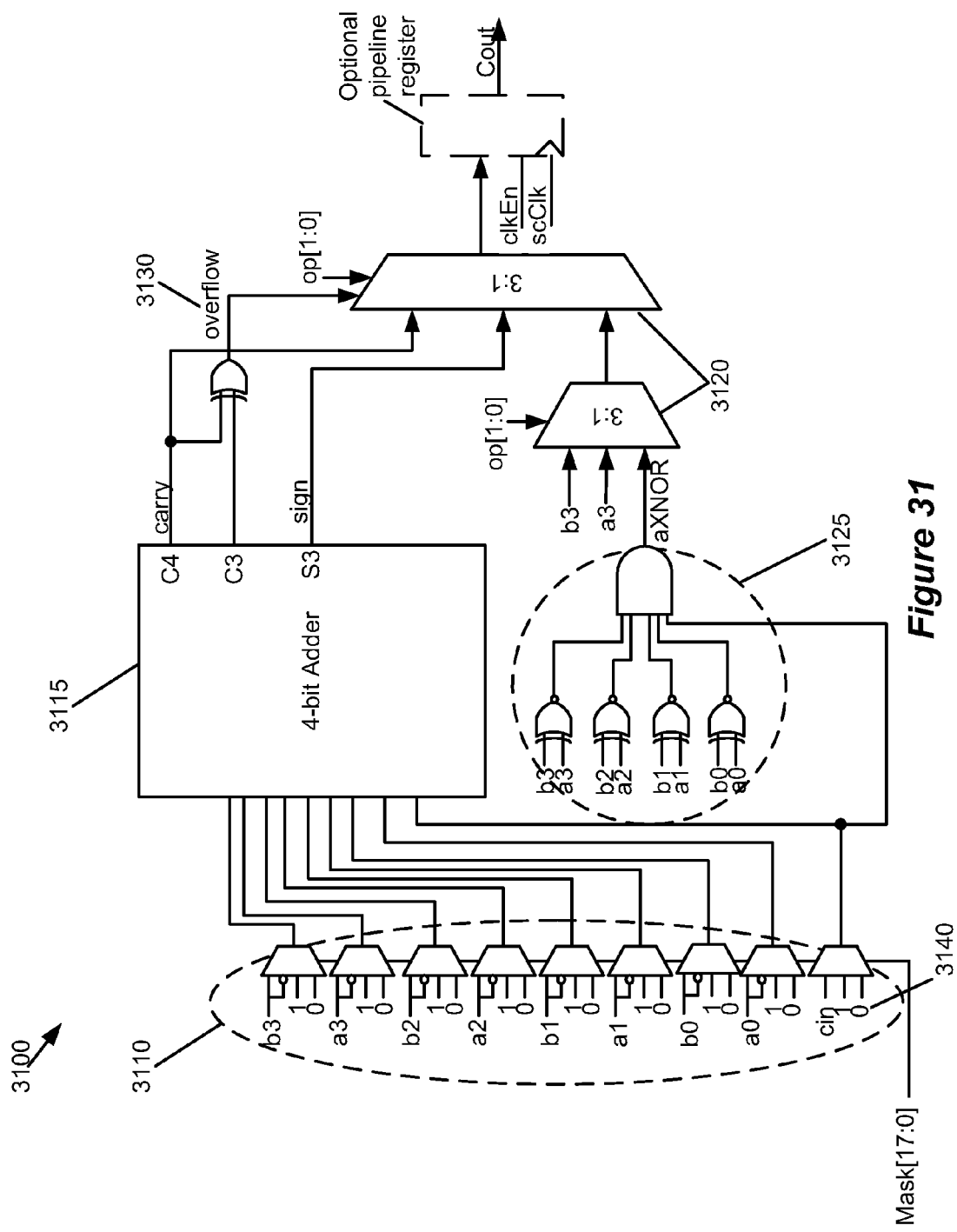

FIG. 31 illustrates an ALU 4500 in accordance with some embodiments of the invention that implements the various ALU functionality described herein. The ALU 3100 includes a set of input select multiplexers 3110, a four-bit adder 3115, equivalence comparison circuits 3125, and function select multiplexers 3120.

The set of input select multiplexers 3110 control masking of four different possible inputs. These inputs include a pass through value of an input bit from the deskew lines passing into the trigger circuit of a first operand or a second operand (e.g., A or B), an inverted pass through value of the first operand or second operand, a constant "0" value, and a constant "1" value. The selection of the inputs is based on configuration data received at the select lines of each multiplexer.

The four-bit adder 3115 then receives the selected inputs and performs a four-bit signed add operation on the input values. However, it should be apparent to one of ordinary skill in the art that by selecting inverted input values and/or constant values, the four-bit adder 3115 can be made to also perform a subtraction operation. The outputs of the adder 3115 include a sign value, a carry value, and a result value for the four-bit operation. These values are then used to perform one of several arithmetic comparison operations. For example, to perform an A<B operation, the "cin" input 3140 is masked to be a constant value of "1". The addition of this "1" constant and the inverted B-input values computes the 2's complement of B. The result added with the A input is necessary to perform the subtraction of B from A. The resulting sign value of the four-bit adder determines if operand A is less than operand B. Similarly, to compute if A>B, the constant value of "1" is selected for the cin input 3140 which is added to the B input and the inverted A input.

For operations employing multiple ALUs to perform larger than four-bit comparisons. Inputs A and B must be sign-extended to four-bits. For example, a 10-bit number must be sign-extended to 12-bits. This simplifies the design of the ALUs because the result of the comparison operation is represented by the most-significant sum bit of the ALU.

The equivalence comparison circuits 3125 perform a XNOR operation between each A bit and B bit value. The results of all four XNOR bits are then ANDed together to produce a value of "1" if A equals B.

The function select multiplexers 3120 then receive outputs from the four-bit adder 3115 and the equivalence comparison circuits 3125 and select an output to determine the function produced by the ALU. Configuration tables describing some of the various operations performed by the ALU 3100 are further described below in the subsection "Configuring the Trigger Circuit."

As shown in FIG. 29, some ALUs 2930 directly receive deskewed data and other ALUs 2930 indirectly receive deskewed data (e.g., from the edge-detection circuitry 2920 described above). Specifically, it is not necessary for every ALU to receive inputs from the edge-detection circuits 2920, but rather only some ALUs 2930 receive inputs from the edge-detection circuits 2920. In some embodiments, the alternating of inputs received from the edge-detection circuits is because it is rare that a user would compare an edge detection result with another edge detection result. Instead, the comparison is often made against a constant or some previous value.

iii. Decision Logic Modules

In some embodiments, the decision-logic modules 2940-2960 accept the outputs from the individual ALU modules and programmably chain the outputs together to form wider comparators. Specifically, the decision logic 2940-2960 examines the outputs from all ALU outputs used to implement a given operation of a given width and computes the total operation across all of the involved ALUs.

In some embodiments, the decision logic 2940-2960 is organized in tree-like fashion. Such a hierarchical ordering increases parallelism with a reasonable implementation cost. As shown, the decision logic includes a first level hierarchical decision logic 2940, a second level hierarchical decision logic 2950, and a third level hierarchical design logic 2960. At each level, there are multiple decision logic blocks.

Each decision logic block of the first level 2940 accepts outputs from eight of the four-bit ALUs 2930. In some embodiments, the outputs include the sign signal ("S") and equality signal ("E") from each ALU described above. The sign value "S" indicates if a first four-bit value is greater than a four-bit value and the equality value "E" indicates whether the values are equal. In turn, each decision logic block generates a pair of sign "S" and equality "E" signals.

The second level decision logic blocks 2950 are implemented with four-bit decision blocks, each block accepting four pairs of signals from the first level. The blocks in the second level, as in the first level, are replicated to enable a flexible grouping of ALUs to create comparators of varying width.

Lastly, the third level decision logic blocks 2960 accept the inputs from the second level in order to generate the final outputs of the decision logic hierarchy. Each decision logic block in the third level accepts an input pair for every block at the second level to generate the final output. However, the third level blocks are replicated so that there are six identical block, each accepting all of the pairs from the second level in order to provide outputs for the matchers 2970. In this manner, the trigger circuit of FIG. 29 supports six simultaneous operations.

Figure 32:
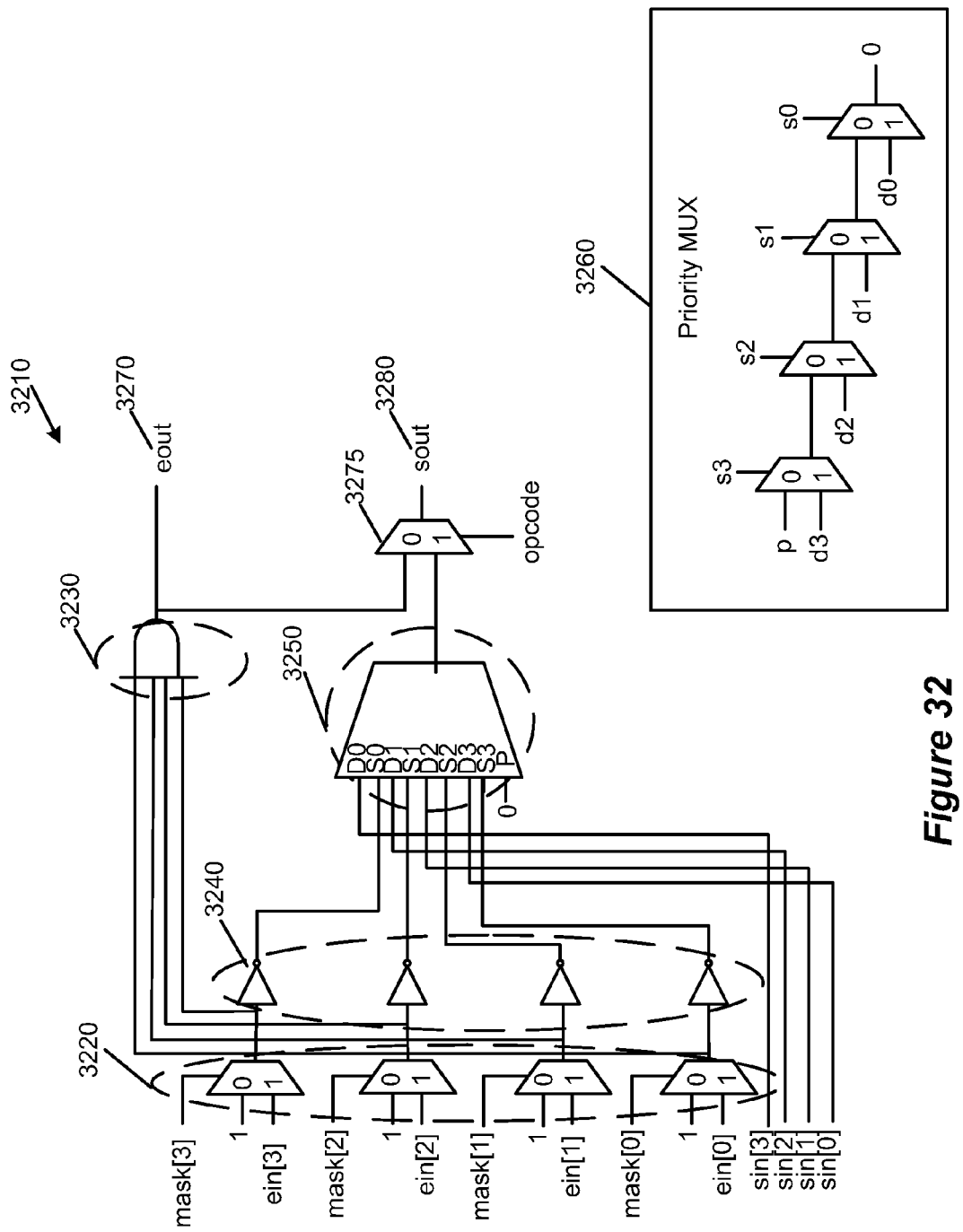

FIG. 32 illustrates a decision logic block 3210 in accordance with some embodiments. In this figure, the decision logic block 3210 includes several 2:1 multiplexers 3220, AND gate 3230, inverters 3240, and a priority multiplexer 3250.

The multiplexers 3220 select the inputs for the decision logic block 3210. Specifically, the decision logic block 3210 can be configured to evaluate a constant "1" or the equality output from the ALU if in the first level of the hierarchy or the equality output from a previous decision logic block in a previous level of the hierarchy. The equality output has a value of "1" if the input represents equality and a value of "0" if the input represents inequality.

The outputs from the input multiplexers 3220 are ANDed together to create the eout signal 3270. The eout signal 3270 represents equality only if all sub-values are also equal. The outputs of the input multiplexers 3220 are also passed through inverters 3240 and passed to the priority multiplexer 3250.

The priority multiplexer 3250 determines if one value is larger than another based on the equality signals and sign signals 3280 from the ALUs. Specifically, the priority multiplexer compares the sign and equality bit resulting from the most significant part of a comparison resulting from the ALUs or the decision logic to determine if one is greater than the other and proceeds to the next most significant part if the determination cannot be made using the earlier set of values. This is accomplished using the equality and sign values as shown in the detailed circuit structure 3260 where a chain of 2:1 multiplexers received the inverted equality values and the sign values to perform the comparison.

Finally, the output from the priority multiplexer 3250 and the eout signal 3270 are passed to a final multiplexer 3275 that chooses between the two inputs, based upon an opcode value.

The following presents two examples for the operation of the decision logic of some embodiments when determining the equality between two 12-bit values A and B (A=B) and determining which value is greater (A>B). Therefore, assuming only a single level of decision logic that receives the sign "S" signals and equality "E" signals from the four four-bit ALUs, the single level of decision is sufficient to produce the final result of either operation.

Specifically, the 12-bit values A and B are assigned to three ALUs with the first ALU, ALU[0], comparing bits 0-3 of values A and B and generating a first "E" signal, ein[0], and a first "S" signal, sin [0]. For this example, assume the following values for A and B (where the left-most bit is the most significant bit and the right-most bit is the least significant bit).

A: 0010 0100 1111 (Decimal 591)
B: 0011 0011 1111 (Decimal 831)

The second ALU, ALU1[1], compares bits 4-7 of A, B, generating second "E" value, ein[1], and second "S" value, sin [1], and a third ALU, ALU[2], comparing bits 8-11 of A, B, and generating third "E" value, ein[2], and third "S" value, sin [2]. ALU[3] does not contribute to the comparison and the ALUs and decision logic will be configured to ignore output values from ALU[3].

To perform the equality operation A=B, the priority multiplexer of the decision logic circuits are ignored. Instead, the signal opcode that selects the output of the decision logic block is set to a "0" so that the block selects the output from the AND-gate driven by the four outputs from the input multiplexers. The ein[3] output from ALU[3] is masked by setting mask[3] to a "0". This forces a "1" from its associated multiplexer that is AND-ed with the remaining outputs from the ALUs (ein[2], ein[1], ein[0]). The output from the four-input AND gate will be a "1" if ALU[2], ALU[1] and ALU[0] determine that the four-bit values they are comparing are equal, and will be a "0" otherwise. In some embodiments, the decision logic is configured to ignore the output of ALU[3], as the output of ALU[3] does not contribute to the comparison.

To perform the comparison operation A>B, the opcode signal to the decision logic block is set to a "1" to select the output from the priority multiplexer for its output. In this example, the four-input AND gate is ignored.

As shown, B is greater than A. The trigger circuit is configured to detect if A is greater than B by setting mask[3] is set to a "0" value. This places a "1" on its associated inverter. The other mask bits are set to a "1". The sin [3] output from ALU can be ignored for this example. The remaining ein and sin signals from ALU[2], ALU[1] and ALU[0] generate the following values from the exemplary A and B values above:

ein[0]: 1 (A and B are equal, for bits 0-3)
ein[1]: 0 (A and B are not equal, for bits 4-7)
ein[2]: 0 (A and B are not equal, for bits 8-11)
ein[3]: 1 (mask[3] is set to a '0')
sin [0]: 0 (A is not greater than B, for bits 0-3)
sin [1]: 1 (A is greater than B, for bits 4-7)
sin [2]: 0 (A is not greater than B, for bits 8-11)

These values are then passed to the priority multiplexer. Starting at the far right of the priority multiplexer and moving back through the chain, s0 selects the output of the closest previous multiplexer in the chain. s1 selects d1(sin [2]) as its output. d1 is the final output for the priority multiplexer. d1 (sin [2]) is a 0, which indicates that A is not greater than B which is the final result for this example.

The following generalizes the operations performed by the decision logic to detect equality or inequality of two values A and B. For example, if the trigger circuit 2910 is configured to determine whether A is greater than B, for a 16-bit comparison using four four-bit ALUs, the outputs from these four ALUs are compared using the following algorithm:
  (1) Start with the most-significant nibbles of A and B
  (2) Compare A and B nibble-wise (using the outputs from the ALUs), until either:
    i. There are no more nibbles, the numbers are equal OR
    ii. One of the nibbles is larger than the other, the number with the larger nibble is the larger number Although the algorithm is presented serially, some embodiments of the trigger circuit 2910 (e.g., ALUs 2930 and decision logic hierarchy 2940-2960) implement the algorithm in parallel to achieve maximum performance. In this manner, some embodiments are able to avoid having the nibble-wise operations performed by each ALU propagate from a first n-bit ALU to a last n-bit ALU for an m-bit operation.

iv. Selection Circuitry

In some embodiments, the matchers 2970 are multiplexers that receive inputs directly from outputs of the edge-detection circuitry 2920 or directly from the outputs of the decision logic 2960. In this manner, the matchers 2970 make it possible to bypass and therefore avoid configuring and consuming an ALU in order to pass a one-bit signal value to the later stages of the trigger circuit. This frees up the trigger circuit to perform additional or more complex operations for a specified triggering event.

In some embodiments, the matchers 2970 in conjunction with the decision logic select the relevant data to pass to the later stages of the trigger circuit when the triggering event includes multiple user specified conditions. For instance, if only a single four-bit condition is specified for a particular triggering event, then only the inputs to the matchers 2970 for that triggering event need to be passed. However, if multiple conditions are specified for one or more triggering events, then the output of each such triggering event is separated by the matchers logic such that each multiplexer in the set of multiplexers 2970 is responsible for passing a result of a specified condition to the event counters 2980 and LUT 2990. In some embodiments, the LUT 2990 is configurable such that its operation is driven by one or more sets of configuration data.

v. Event Counters

An event counter 2980 is able to track the number of occurrences of an event (e.g., one or more of the events described above, including a user-defined event, a signal transition, etc.) during operation of an IC in some embodiments. As shown in FIG. 29, multiple event counters 2980 may be present in the trigger circuit, where each event counter tracks the number of occurrences of different events. In some embodiments, an event counter may be configured to count the number of consecutive times an event occurs. In some embodiments, an event counter may be configured to count the overall number of times an event occurs (including non-consecutive occurrences of an event). In some embodiments, an event counter that is configured to count consecutive occurrences may be reconfigured to count overall occurrences during the operation of the IC, and vice versa.

In some embodiments, an event counter continuously outputs an event signal which is true once a preconfigured count value is reached and is false when a preconfigured count value is not reached. Like other components of the IC, these event counters are accessible over the secondary circuit structure (i.e., some or all of the values stored in the event counters may be read or written through the secondary circuit structure). As further described below, event counters have a variety of uses. For instance, event counters may be used in the definition of trigger events, or to monitor performance of particular resources of the IC.

1. Event Counter Circuitry

Figure 33:
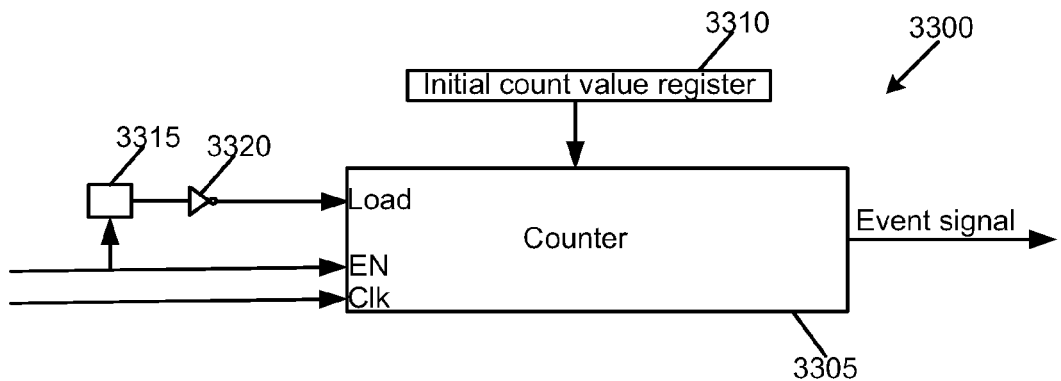
FIG. 33 illustrates different embodiments of an event counter.

FIG. 33 illustrates an event counter 3300 of some embodiments. As shown, the event counter 3300 includes counter circuitry 3305, an initial count value register 3310, a count mode selector 3315, and an inverter 3320. The counter 3305 stores a count value that indicates the number of times an event has occurred. The event counter 3300 receives, as input, an "EN" signal that indicates when the event that the event counter is counting (referred to as the "counted event") has occurred. In some embodiments, the EN signal is the output of one of the matchers described above. In some embodiments, the EN signal is the output of the LUT 2990 of the trigger circuit 2910. In some embodiments, this signal is periodically supplied to the event counter 3300 (e.g., once every user cycle). The EN signal is provided to counter 3305 and the count mode selector 3315.

When the EN signal is true (i.e., when the counted event has occurred), the counter 3305 increments (i.e., increases by 1) the count value. While the word "increment" is used throughout this description, the counter 3305 of some embodiments is able to increase decrease (decrement) the count value. In this way, the event counter 3300 can "count up" or "count down." In some embodiments, when the event counter 3300 is configured to count down, the event counter 3300 outputs a true signal when the count value is a predetermined number (e.g., one). When the EN signal is false (i.e., when the counted event has not occurred), the counter 3305 does not increment or otherwise affect the count value. In some embodiments, the event counter 3300 also receives a clock signal Clk. On either the rising edge, falling edge, or either edge of the clock signal, the counter 3305 increments when the EN signal is true.

The event counter 3300 outputs an event signal. In some embodiments, this signal is output once for every time the event counter 3300 receives an EN signal as input (e.g., once every user cycle). In some embodiments, the event signal is the most significant bit of the count value stored by the counter 3305. This bit is zero (thus yielding a false event signal) until the count value reaches a terminal value, depending on the number of bits of the counter 3305. In some embodiments, upon reaching the terminal value, the most significant bit of the count value switches from zero to one (thus yielding a true event signal). Thus, in some embodiments, the terminal value for an n-bit counter is $2^{n-1}/2$.

For instance, if the counter 3305 is a 16-bit counter (i.e., the count value is a 16-bit value), the terminal value is 32,768. Between the values of zero and 32,767, inclusive, the most significant bit is zero (and thus the event signal is false). Once the count value reaches the terminal value (i.e., 32,768), the most significant bit is one (thus yielding a true event signal).

The number of times a counted event must occur in order for the event signal to be true can be customized through the initial count value. For instance, if the number of times is 1,000, the initial count value of a 16-bit counter 3305 (which has a terminal value of 32,768) may be set to 31,768. In some embodiments, this number is loaded into the counter 3305 before counting (e.g., during configuration of the IC). Since 31,768 is 1,000 away from the terminal value (i.e., 32,768), the event signal will be true after the counted event occurs 1,000 times. The event counter 3300 may also be configured to output a true event signal after a single occurrence of an event by loading a value one less than its terminal value (i.e., 31,767 for a 16-bit counter) into the initial count value register 3310. As discussed above, this value may be loaded into the counter 3305 from the initial count value register 3310.

The event counter 3300 is able to operate in two modes: "continuous" and "overall." In continuous mode, the event counter 3300 counts continuous, consecutive occurrences of the counted event. In overall mode, the event counter 3300 counts all occurrences of the counted event, including non-consecutive occurrences. This dual-mode operation is made possible through the use of an initial count value register 3310, a count mode selector 3315, and an inverter 3320. In some embodiments, the count mode selector 3315 is a configurable logic circuit that indicates, based on configuration data, whether the event counter 3300 is set to continuous mode or to overall mode. When the event counter 3300 is set to overall mode, the count mode selector 3315 outputs only a true output to the inverter 3320. Thus, the output of the inverter 3320 is false. The output of the inverter 3320 is a "load" signal that indicates whether to load the initial count value stored by the initial count value register 3310 into the counter 3305. Because the load signal is always false during operation of overall mode, the initial count value is not loaded while the event counter 3300 is counting, and the counter 3305 counts an overall count value.

In some embodiments, the initial count value is loaded into the counter 3305 while the event counter 3300 is not operating. For instance, as mentioned above, the initial count value is loaded into the counter 3305 before the event counter 3300 begins operation (i.e., before the event counter 3300 receives EN signals) in some embodiments. In some embodiments, the initial count value is loaded into the counter 3305 before the trigger fires.

When the event counter 3300 operates in continuous mode, the count mode selector 3315 passes through the EN signal, so that the output of the inverter 3320 is the logical compliment of the EN signal. For instance, when the EN signal is true (i.e., the counted event has occurred), the output of the inverter 3320 (i.e., the load signal) is false. However, when the EN signal is false (i.e., the counted event has not occurred), the output of the inverter 3320 (i.e., the load signal) is true. When the load signal is true, the initial count value stored in the initial count value register 3310 is loaded into the counter 3305, thus "resetting" the count value to the initial count value. In this way, the event counter 3300 is able to count consecutive occurrences of a counted event.

In some embodiments, the counter 3305 and the initial count value register 3310 are accessible via the secondary circuit structure. In other words, the values stored by the counter 3305 and/or the initial count value register 3310 may be read from or written to over the secondary circuit structure over a set of lines of the secondary circuit structure. In some embodiments, the event counter is able to pass through the EN signal on its output, rather than an event signal. In such embodiments, a multiplexer is located at the output of the event counter 3300. The multiplexer receives the EN signal and the event signal as input. In some embodiments, the multiplexer receives configuration data on its select line in order to determine whether to pass through the EN signal or the event signal. In some embodiments, the counter 3305 is able to be configured so that it does not increment, even when receiving a true EN signal.

In some embodiments, the count value of one or more event counters is readable by the secondary circuit structure. In some embodiments, these count values are stored in storage elements of the event counter that are "hardwired" through dedicated lines to the controller of the secondary circuit structure. Through these dedicated lines, the count values are continuously provided to the controller. Through the controller's interface (e.g., JTAG or some other type of interface) with external software, the count value can be read by the external software and presented to a user. Because these event counters include dedicated lines to the controller, the reading of these count values by the controller does not interfere with the operation of either the primary circuit structure (i.e., the user logic) or the secondary circuit structure (i.e., the generating and sending of packets).

Figure 34:
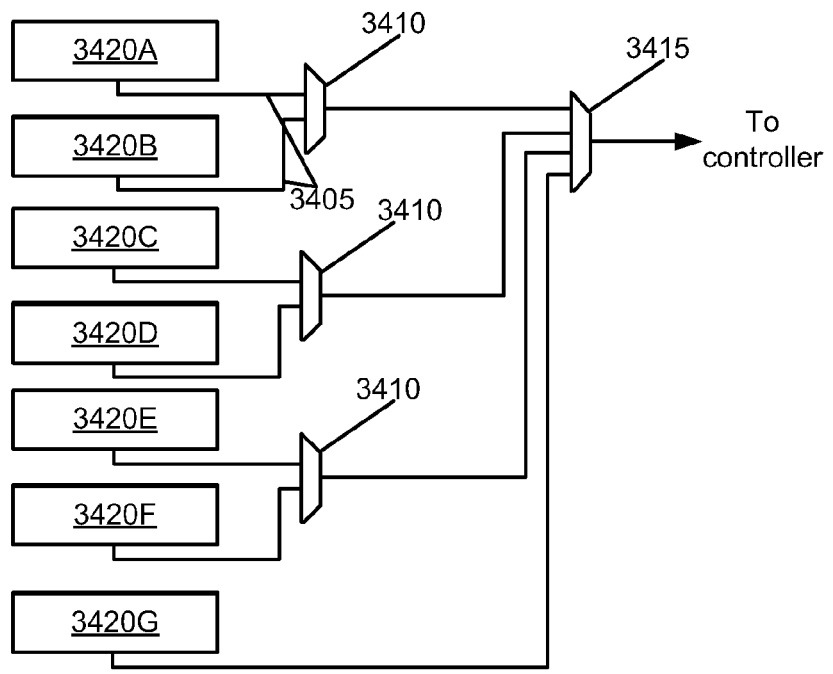
FIG. 34 illustrates an embodiment of reading of an event count value of some embodiments.

FIG. 34 conceptually illustrates seven event counters 3420A-G of a trigger circuit with readable count values. The secondary circuit structure includes sets of lines 3405 that access the count value stored by the event counters 3420A-G. While, in some embodiments, these lines 3405 are hardwired to the configuration controller, FIG. 34 illustrates some embodiments where configurable multiplexers select which of the event counters provide their count value to the controller. This figure includes three multiplexers 3410 that each receive the count values of two different event counters 3420 and out selectively output one count value of one event counter 3420. In some embodiments, this receiving of the count value is independent of the event counter's 3420 other operations (e.g., receiving an EN signal and outputting an event signal).

The multiplexers 3410 supply their output to another multiplexer 3415, which outputs the count value stored by one of the seven event counters 3420A-G. As shown by the figure, this other multiplexer 3415 may directly receive the count value from one of the event counters 3420G in some embodiments. In other words, the event counters 3420G does not supply its count value to a multiplexer 3410 when outputting the count value to the secondary circuit structure. In some embodiments, one or more of the multiplexers 3410 and 3415 perform the abovementioned selecting based on one or more configuration data set.

In some embodiments, each of the event counters 3420A-G continuously outputs its count value to the secondary circuit structure. In some embodiments, the 6 event counters 3420A-F are the 6 event counters 2980 shown in the trigger circuit 2910 of FIG. 29. In some embodiments, the other event counter 3420G is the event counter at the output of the trigger circuit 2910 illustrated by FIG. 29. The multiplexers 3410 and 3415 and the lines 3405 that connect these multiplexers to the event counters 3420A-G are not shown in FIG. 29. However, in some embodiments, the trigger circuit 2910 includes these multiplexers 3410 and 3415 and lines 3405. As mentioned above, a count value may be the either (1) the number of times the event has occurred consecutively, or (2) the overall number of times the event has occurred, including non-consecutive occurrences.

While the process has been described in the context of using a single event counter in order to fire a trigger, other event counters may operate concurrently with, and/or in conjunction with, such an event counter. For instance, a second event counter may count the number of occurrences of a different event while the process uses a first event counter in determining whether to fire a trigger. In this way, not only can the first event counter be used to define a trigger, the second event counter can be used to collect other data (e.g., data that bears a logical relationship to the event that forms the trigger).

For instance, a first event counter may be preprogrammed with a count value of 1,024, and be configured to decrement (i.e., reduce the count value by 1) each time a counted event (e.g., a rising edge of a user signal) occurs. The trigger may be configured to fire once the first event counter has a count value of 0. While the first counter continuously (e.g., once every user cycle) receives values indicating whether the rising edge of the user signal has occurred, the second event counter receives a signal that indicates whether a different counted event (e.g., a user-defined "error" event) occurs. After the trigger fires (based on the first event counter), the second event counter can be read through the secondary circuit structure to indicate the number of user-defined "errors" that occurred during the 1,024 user cycles (i.e., the 1,024 occurrences of the rising edge of the user clock).

vi. Trigger Output

The LUT 2990 supports sequential trigger functionality using the storage elements 2995. For example, a sequential trigger that specifies two sequential conditions that must be satisfied before firing of the trigger requires that the result of the first state be stored in the storage elements 2995. Then when the second state is computed using the above defined circuitry, the result of the first state stored in the storage elements 2995 may be used in evaluating the result of the second state in order to determine if the triggering event is satisfied. Accordingly, the storage elements 2995 track the state of one or more sequential triggers and the LUT 2990 evaluates the results to determine whether to continue to the next state, reset the sequential trigger, or fire the trigger.

III. Overlay Applications of the Secondary Circuit Structure

A. Overview

The configurable resources of the secondary circuit structure allow the functionality of the secondary circuit structure to extend beyond traditional configuration and debug purposes. In some embodiments, the secondary circuit structure additionally provides customized overlay applications for the primary circuit structure of the IC. Some such overlay applications include using the secondary circuit structure to (1) monitor the primary circuit structure in real-time, (2) monitor raw data in the primary circuit structure to analyze performance of the primary circuit structure and to report performance results generated from the raw data, (3) to monitor raw data in the primary circuit structure to analyze behavior occurring within the primary circuit and identify behavioral conditions determined from the raw data, (4) monitor the primary circuit structure with the secondary circuit structure and modify the primary circuit structure using the secondary circuit structure, (5) monitor the primary circuit structure with the secondary circuit structure and modify the secondary circuit structure based on the monitoring, and (6) various other self-modifying functionality.

In this manner, the secondary circuit structure better diagnoses issues undetectable by traditional debug circuit structures and allows for an IC design already deployed within the field to be updated to adapt or adjust to ever changing environments. Moreover, the IC includes all such functionality within a single on-chip solution such that the configuration functionality, debugging functionality, and overlay applications can be used at any time without the need of external logical analyzers or other such hardware. In some embodiments, the single on-chip solution includes: (1) both the primary circuit structure and the secondary circuit structure on a single wafer of semiconducting substrate (e.g., SoC), and (2) the primary circuit structure on a separate wafer than the secondary circuit structure but includes both circuit structures within a SiP.

It should be apparent to one of ordinary skill in the art that the above enumerated overlay applications provides an exemplary set of such overlay applications and is not intended to constitute a comprehensive set of such overlay applications. Any such configuration or other configuration may be programmed into the secondary circuit structure through the external interface or fabric port to the secondary circuit structure of the IC. Moreover, the modifications to either the primary or secondary circuit structures may be performed for ICs of some embodiments already deployed into the field. These updates may occur via "firmware-like" updates. Several specific overlay application implementations will now be presented in the context of the secondary circuit structure circuitry described above.

B. Monitoring and Reporting

In some embodiments, the secondary circuit structure is configured to monitor raw data passing between circuits of the primary circuit structure. Such raw data includes inputs and outputs that collectively produce one or more desired results as specified in the user design. The monitored data is then analyzed according to one or more user specified conditions (e.g., triggers, events, etc.) such that only desired data is recorded and presented for analysis. The secondary circuit structure filters and discards irrelevant or undesired raw data. Accordingly, the output produced by the secondary circuit structure is a function of the events occurring within the primary circuit structure, whereas the primary circuit structure produces outputs based on user data.

In this manner, the secondary circuit structure produces statistics that provide some level of analysis over the raw data. These statistics include counts of one or more user specified events, performance measurements, behavioral analysis, alarms, and assertions that are derived from the analysis of raw data. Moreover, the secondary circuit structure in analyzing the raw data is further able to detect line conditions, anomalous behavior, error conditions, as well as perform various operational logic functions based on the monitored user specified event occurring within one or more resources of the primary circuit structure.

In some embodiments, the secondary circuit structure monitors the user specified events occurring within the primary circuit structure in real-time. In some such embodiments, real-time monitoring includes monitoring the signals of one or more circuit of the primary circuit structure without impeding or delaying operations performed by those or other circuits in the primary circuit structure. In other words, the secondary circuit structure operates non-invasively to the primary circuit structure such that the throughput for these and other circuits in the primary circuit structure remains unchanged irrespective of the operations (e.g., monitoring, analyzing, and reporting) performed by the secondary circuit structure. In some embodiments, the secondary circuit structure monitors the primary circuit structure in real-time where the real-time monitoring occurs within a bounded latency or is commensurate with the performance of the primary circuit structure operations. In some embodiments, the bounded latency is on some order N user clock cycles where the maximum latency is known or a predictable value that is not arbitrary. In some embodiments, the bounded latency is determined by the size of the IC or more specifically the size of the primary circuit structure.

a. Performance Measurements

Some embodiments of the secondary circuit structure provide performance monitoring for various tiles or configurable circuits of the primary circuit structure. In some such embodiments, performance monitoring includes measuring bandwidths at one or more tiles, circuits, memories, interfaces, etc. of the primary circuit structure.

1. Bandwidth Measurements

Figure 35:
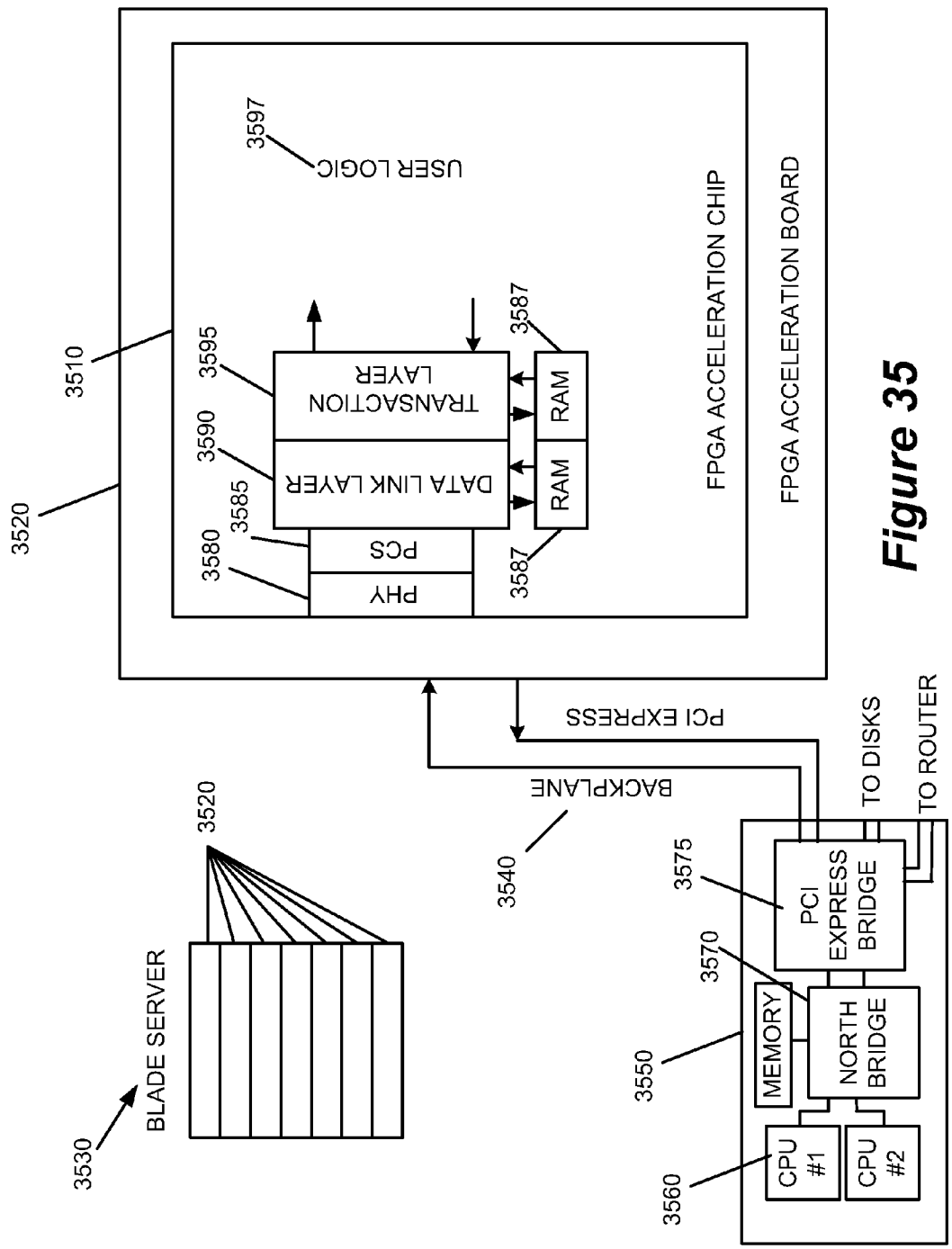
FIG. 35 conceptually illustrates using the secondary circuit structure of an IC of some embodiments to measure the bandwidth for a primary circuit structure of the IC implementing user logic.

FIG. 35 conceptually illustrates using the secondary circuit structure of an IC of some embodiments to measure the bandwidth for a primary circuit structure of the IC implementing user logic. As shown, the IC of some embodiments is implemented as a blade 3520 of a blade server 3530 that is connected via a PCI-Express backplane 3540 to a PCI-Express Bridge 3575, Northbridge 3570, and one or more processors 3560.

In this figure, a primary circuit structure for the IC 3510 functions as an FPGA accelerator chip. The functional components of the accelerator chip that are implemented by circuits of the primary circuit structure include: (1) serialization/de-serialization (SerDes) physical (PHY) interfaces 3580, (2) Physical Coding Sublayer (PCS) interfaces 3585, (3) functional layers of a protocol stack that includes a data link layer 3590 and a transaction layer 3595, (4) random access memory (RAM) 3587, and (5) other customer specific logic 3597.

Each blade 3520 that hosts a chip 3510 communicates through a Peripheral Component Interconnect (PCI) Express backplane 3540 of the blade server 3530. The PCI-Express backplane 3540 facilitates communications with other devices of system 3550. The backplane 3540 provides a certain amount of bandwidth that is particular to or shared by each of the blades 3520 in the server 3530 based on the standard interface (i.e., PCI-Express). Accordingly, the chip 3510 is expected to provide a certain level of performance based on the data that flows over the backplane 3540 into the chip 3510.

In some embodiments, a lesser than expected amount of data passing over the backplane 3540 is indicative of a performance problem within the chip 3510 or within the system interacting with the chip 3510. Assuming there is no direct way to probe the chip 3510 because of a lack of space between the blades 3520 in the server 3530 cabinet or the user design implemented by the chip 3510 has used all of the available logic in the primary logic, some embodiments still permit users the ability to measure the bandwidth and identify the bottlenecks affecting the performance of the chip 3510 through the secondary circuit structure of the IC. In this manner, the secondary circuit structure enables users the ability to isolate the performance issues to different functional layers/entities within the primary circuit structure of the IC or to external system components interaction with the IC.

As noted above, the secondary circuit structure is configurable to probe and measure any or all data points of the primary circuit structure. Therefore, should the IC perform at a lesser than expected rate, the secondary circuit structure may be configured to determine the bandwidth between: (1) the SerDes PHY 3580 and the PCS 3585 interfaces, (2) the PCS 3585 and the data link layer 3590, (3) the data link layer 3590 and the transaction layer 3595, and (4) between the transaction layer 3595 and the user specific logic 3597. In this manner, users can determine where there is sufficient bandwidth and where one or more bottlenecks occur should they exist within the primary circuit structure.

In some embodiments, once the bottleneck is initially isolated to a particular functional module of the primary circuit structure, the secondary circuit structure can be reconfigured to further probe the internals of the particular isolated module. In this manner, users are able to receive a customized and granular view of the bandwidth occurring within the IC 3510. In other words, the secondary circuit structure of some embodiments is configurable to provide bandwidth measurements at the interface between major functional blocks of the IC 3510 and within the blocks themselves where individual logic operations/circuits may be isolated as the root of the problem. Such scalable and configurable on-chip performance monitoring provides powerful and fast identification of the issues hindering performance of a chip that is otherwise unavailable through on-chip debug circuit structures of other ICs.

Additionally, even if the secondary circuit structure does not identify a bottleneck within the primary circuit structure of the IC, then it is likely that the secondary circuit structure has indirectly identified a bottleneck that occurs elsewhere within the system 3550. For instance, in the system 3550 of FIG. 35, the secondary circuit structure may indirectly identify the bottleneck to occur between the CPU 3560 and Northbridge chip 3570 or the PCI Express Bridge chip 3575.

Figure 36:
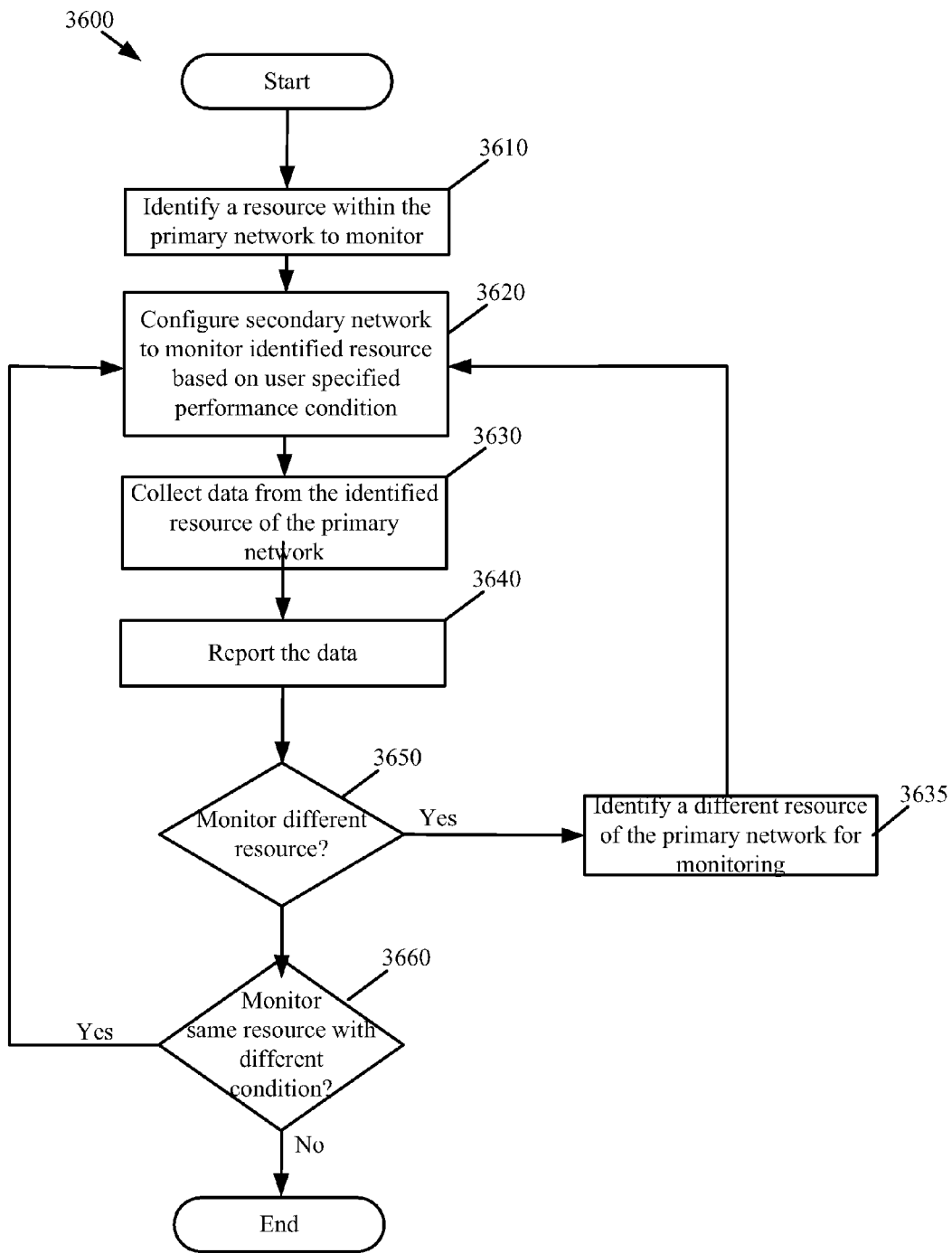
FIG. 36 presents a process for performing the bandwidth measurements at various resources of a primary circuit structure of an IC using a secondary circuit structure of the IC.

FIG. 36 presents a process 3600 for performing the bandwidth measurements at various resources of a primary circuit structure of an IC using a secondary circuit structure of the IC. The process 3600 begins by identifying (at 3610) one or more resources of the primary circuit structure for monitoring. The resources may include one or more tiles, circuits, functions, UDS elements, interfaces, or combination of some or all such resources of the primary circuit structure from which to acquire the performance data.

Figure 37:
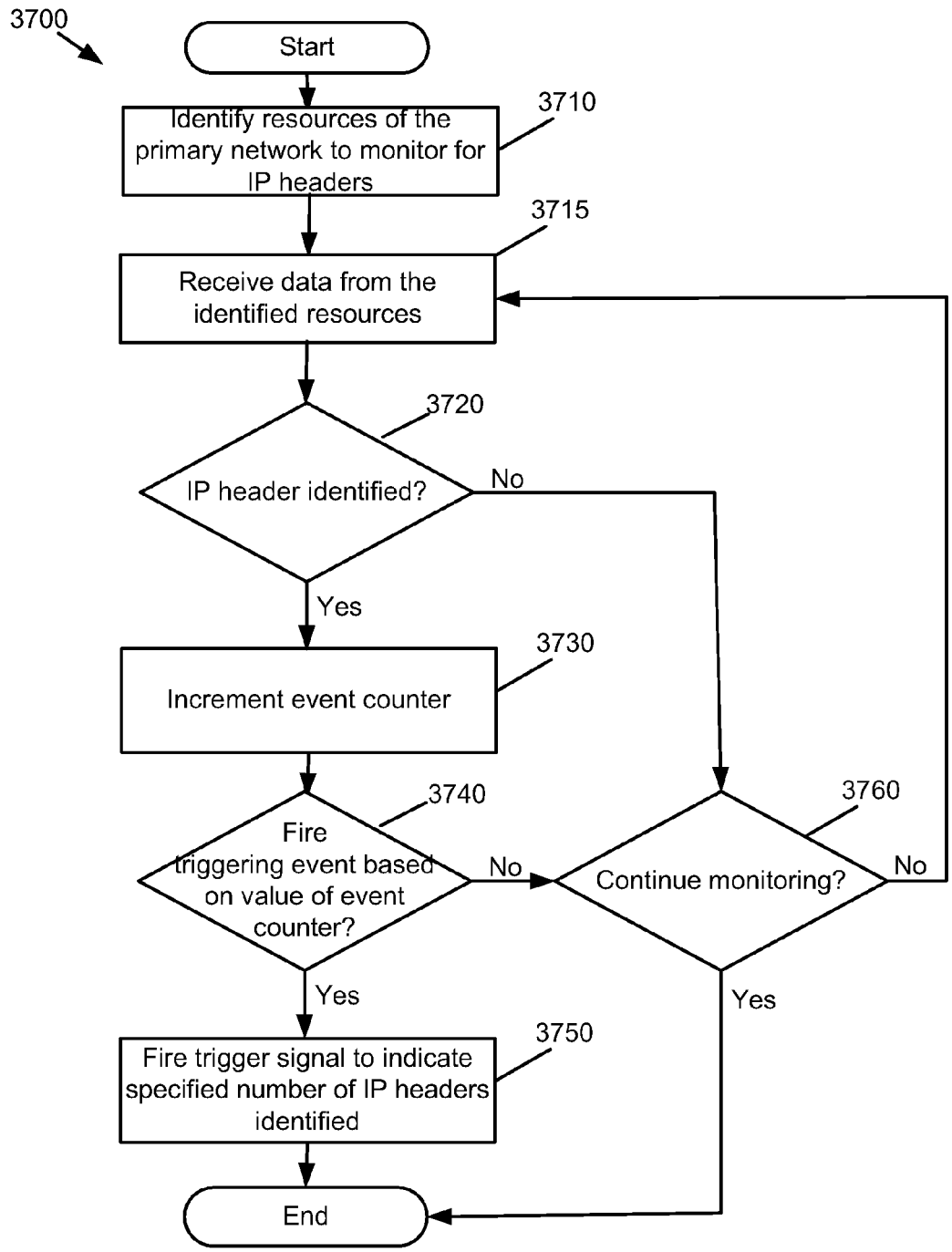
FIG. 37 presents a process implemented by the trigger circuit of the secondary circuit structure to perform a bandwidth measurement for examples provided in FIGS. 35 and 36.

The process then configures (at 3620) the secondary circuit structure of the IC to monitor the identified resource based on one or more user specified bandwidth or performance conditions. Accordingly, the user is able to adjust and tune performance levels to be monitored. This allows the secondary circuit structure to determine peak performance, mean performance, etc. For instance, the secondary circuit structure may be first configured to determine how often the primary circuit structure reaches 90% of an expected performance bandwidth. Then, the secondary circuit structure may be configured to determine how often the primary circuit structure reaches 65% of the expected performance bandwidth. From these results, users are able to deduce if performance issues are random occurring events or reoccurring events that continually affect performance in all scenarios. Accordingly, several different performance results may be extracted from a single point of monitoring using the overlay functionality provided by the secondary circuit structure of some embodiments. FIG. 37 below provides a configuration for the circuits of the secondary circuit structure to implement one such performance measurement.

Once configured, the IC begins operations. The process collects (at 3630) data from the identified resources of the primary circuit structure using one or more triggering events used to define the performance/bandwidth conditions. For example, the trigger circuit may be configured to monitor and report on specific types of traffic (e.g., IP, TCP, UDP, etc.) flowing into and out of certain circuits or tiles of the primary circuit structure. The collected data is recorded within the trace buffer of the secondary circuit structure or within the event counters of the trigger circuit based on the user specified bandwidth/performance condition. The data is then reported (at 3640) by either streaming the data off chip (via the external interface) or by using internal processing circuits of the IC to retrieve and further process the data.

As described in the sections below, the IC can be a self-modifying circuit. The self-modifying circuit contains logic that analyzes the collected data in order to produce a modified configuration bitstream to reconfigure a section of the primary or secondary circuit structure to perform a different set of operations.

The process determines (at 3650) whether to monitor a different resource of the primary circuit structure or monitor (at 3660) the same resource with different conditions. When no additional monitoring is desired, the process ends. This may also be the case when a specified triggering condition is met during the monitoring of the data. Otherwise, a different resource of the IC may be selected for monitoring. In such cases, the process identifies (at 3635) the new resource to monitor and reconfigures (at 3620) the secondary circuit structure to monitor, collect (at 3630), and analyze (at 3640) the newly selected resource as described above. Also, when the same resource is identified to be monitored with different performance or bandwidth conditions, the user specifies the new performance or bandwidth conditions at 3620 and the process repeats steps 3630-3660.

In some embodiments, the secondary circuit structure retrieves performance data for the primary circuit structure in real-time through the bitlines passing through tiles of the primary circuit structure. In some embodiments, the secondary circuit structure conveys the performance measurements in real-time to a user monitoring the performance of the IC through an external interface.

FIG. 37 presents a process 3700 implemented by the trigger circuit of the secondary circuit structure (illustrated above with reference to FIG. 29) to perform a bandwidth measurement (i.e., performance measurement) for examples provided in FIGS. 35 and 36. Specifically, process 3700 is described with reference to performing a bandwidth measurement that measures a number of incoming IP packets through tiles or configurable circuits of the primary circuit structure. However, it should be apparent to one of ordinary skill in the art that the process is adaptable to perform bandwidth measurements of any arbitrary data packet (e.g., Media Access Control (MAC) packets, Transmission Control Protocol (TCP) packets, Asynchronous Transfer Mode (ATM) packets, proprietary packet structures, etc.).

The process 3700 begins by identifying (at 3710) certain resources of the primary circuit structure that receive or process incoming IP packets and other data from an external source. For example, these resources may include I/O circuits or memory buffers at the physical link layer of the primary circuit structure.

Once configured, the process begins receiving (at 3715) sets of data. Next, the process analyzes (at 3720) the data to identify IP headers within the received data stream. Specifically, to analyze the received sets of data, some embodiments configure the IC such that data that is received at the identified resources of the primary circuit structure are simultaneously streamed to a trigger circuit of the secondary circuit structure. As part of the analysis, the process will have configured ALUs of the trigger circuit with a triggering event that identifies IP headers in the received data stream. The configuration of the ALUs is described in detail with reference to FIG. 38 below. Briefly, the ALUs will be configured to perform an arithmetic comparison operation that compares packet headers of the incoming data stream to constant values that represent the binary encoding of an IP header packet as one example.

When the process determines (at 3720) that the received data does not contain any IP headers, the process next determines (at 3760) whether to continue monitoring. The process may then cease operations or revert to step 3715 to receive additional data.

When the process determines (at 3720) that an IP header is identified within the received data, the process increments (at 3730) an event counter of the trigger circuit. The process can then continue until a specified number of identified IP packets is reached, where the specified number represents an expected number of IP packets passing over an interface per a particular interval of time (e.g., 1 Gb/Sec). When the event counter reaches (at 3740) the specified number, the trigger circuit can fire (at 3750). If the trigger does not fire on or before the particular interval of time then the bandwidth is lower than expected and a bottleneck occurs somewhere in the monitored circuitry or other circuitry connecting to the monitored circuitry. Instead of the firing of the trigger signal, some embodiments may terminate (at 3760) the process 3700 after some specified duration to allow a user to manually compare the event counter at the end of the process 3700 to an expected number of packets in order to determine the bandwidth over the duration.

Figure 38:
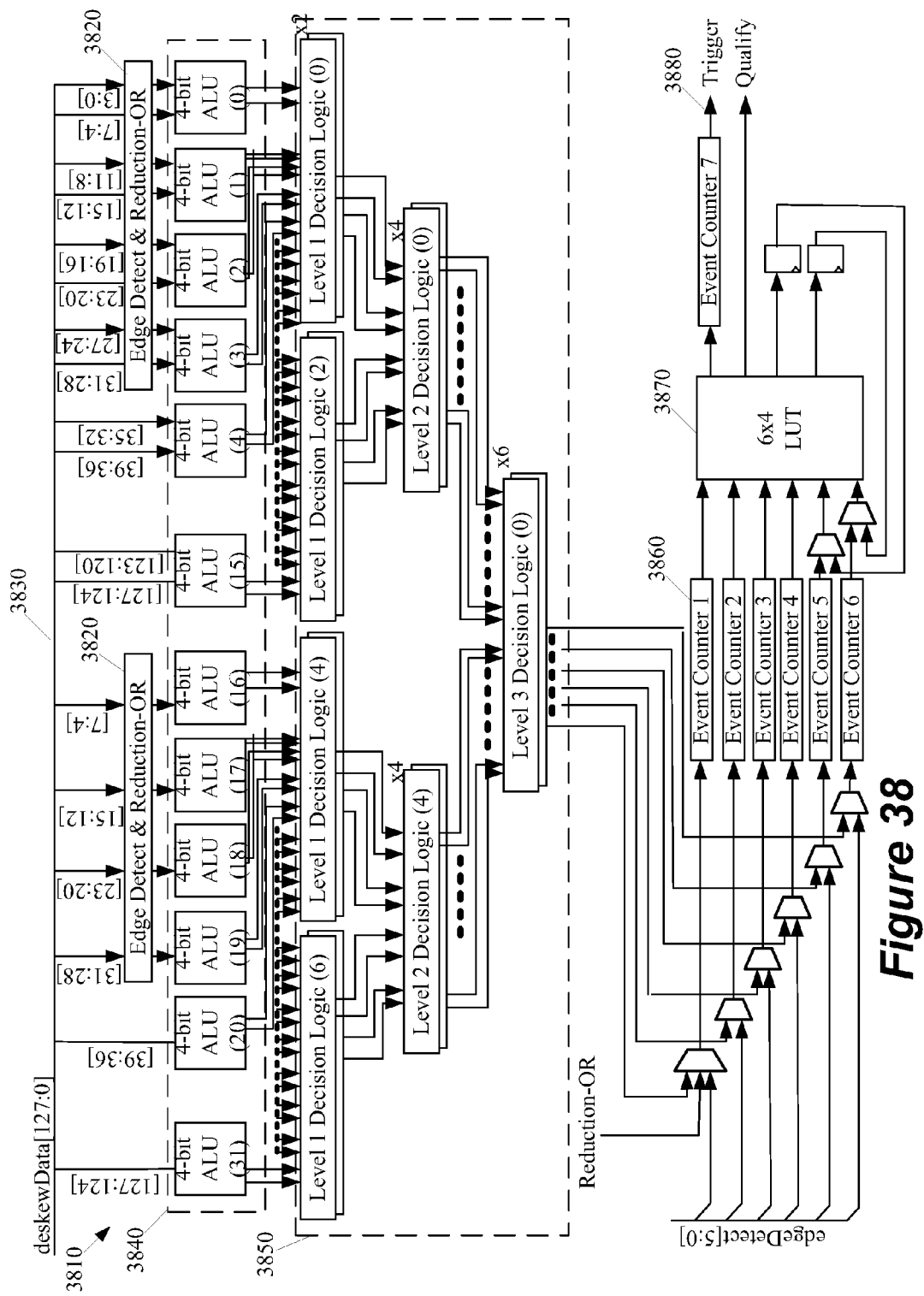
FIG. 38 presents a configuration for the trigger circuit of some embodiments to implement the performance monitoring process of FIG. 37.

FIG. 38 presents a configuration for the trigger circuit 3810 of some embodiments to implement the performance monitoring process of FIG. 37. Such a configuration of the trigger circuit 3810 occurs by disabling the edge-detection circuits 3820 to pass through the incoming bitlines 3830 and by configuring a set of the ALUs 3840 to monitor for the incoming IP packets based on the binary encoding of an IP header. Specifically, the data values streaming into the ALUs 3840 constitute a first operand of the ALUs and a configured constant value represents the binary encoding of an IP header as the second operand input of the ALUs 3840.

The ALUs 3840 are configured to perform an equivalence comparison. Should the equivalence comparison be true, then an IP header has been identified and event counter 3860 is configured to increment.

The trigger circuit 3810 continually performs the monitoring over a duration at the end of which the count in the event counter 3860 is retrieved and analyzed. In some such embodiments, the duration is specified using a second event counter of the trigger circuit 3810 that is configured with an initial count that decrements at each clock cycle. Then when the second event counter reaches 0, the LUT 3870 fires the trigger signal 3880 indicating the end of the user specified interval. It should be apparent that the event counter may alternatively increment from an initial value (e.g., 0) to reach a specified "firing" value where the firing value represents a user specified interval in terms of user clock cycles (i.e., X user clocks equals 1 second). Therefore, by running the circuit for a given duration (e.g., 1 second) and analyzing the detected count of IP headers, the user is able to determine if the performance bandwidth is sufficient for that interval.

2. Resource States

Some embodiments configure the secondary circuit structure to determine the states of various resources within the primary circuit structure. For example, by monitoring buffers, memories, or queues of the primary circuit structure, some embodiments are able to detect data overflows, data overwrites, or data corruption occurring within the primary circuit structure. For instance, users can determine when a specified value is written to a specific memory address, detect when a state machine enters some given state, or detects when a memory or first in first out (FIFO) circuit becomes nearly full or empty.

Figure 39:
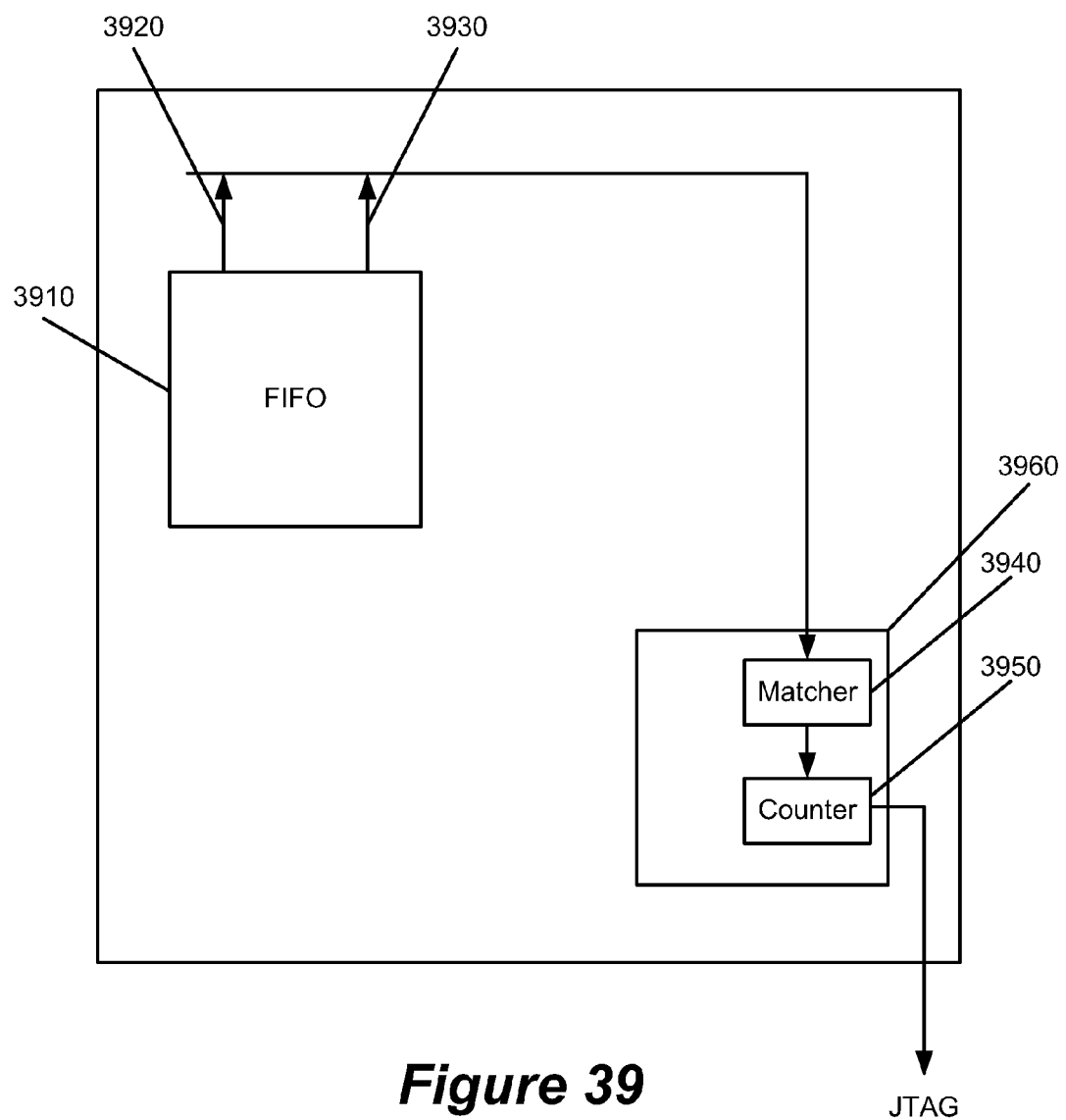
FIG. 39 conceptually illustrates using the secondary circuit structure of an IC of some embodiments to monitor the state of one or more first in first out (FIFO) circuits within the primary circuit structure of the IC.

FIG. 39 conceptually illustrates using the secondary circuit structure of an IC of some embodiments to monitor the state of one or more first in first out (FIFO) circuits within the primary circuit structure of the IC. In this figure, the FIFO 3910 of the primary circuit structure passes run-time signals 3920 and 3930 to at least one matcher 3940 and counter 3950 of the secondary circuit structure 3960. The matcher 3940 collects the signals in real-time, as they occur, and analyzes the signals.

In some embodiments, the matcher 3940 is configurable to perform different types of analysis over the collected signals. For instance, the matcher 3940 may be configured to determine how often the FIFO 3910 overflows, or comes close to overflowing by analyzing a write enable signal of FIFO 3910 that corresponds to a "near full" memory address of the FIFO 3910. Specifically, in some embodiments the signals 3920 and 3930 may correspond to values from address registers or overflow signals of the FIFO 3910. In such instances, the matcher 3940 receives the signals from the FIFO 3910 of the primary circuit structure.

From these signals, the matcher 3940 determines when to cause the counter 3950 to increment. As noted above, the matcher 3940 may be programmed to cause the counter 3950 to increment when the received address value 3920 is close to a specified maximum value. The maximum value may represent an address value 3920 at a particular storage location within the FIFO 3910 that indicates insufficient free remaining storage locations within the FIFO's 3910 memory. The matcher 3940 can also be programmed to cause the counter 3950 to increment when the received overflow signal 3930 specifies that an overflow has occurred within the FIFO 3910.

Accordingly, the counter 3950 tracks the occurrence of various conditions occurring within the FIFO 3910 such as overflows or near overflows. The current value of the counter 3950 can be queried at any time, without affecting operation of the system, through an external interface. It should be apparent to one of ordinary skill in the art that even though FIG. 39 is illustrated with a single FIFO 3910, that the secondary circuit structure of some embodiments monitors and analyzes several such FIFOs simultaneously or alternatively. Additionally, in some embodiments, the secondary circuit structure monitors and analyzes one or more such FIFOs and one or more other circuits of the primary circuit structure.

Figure 40:
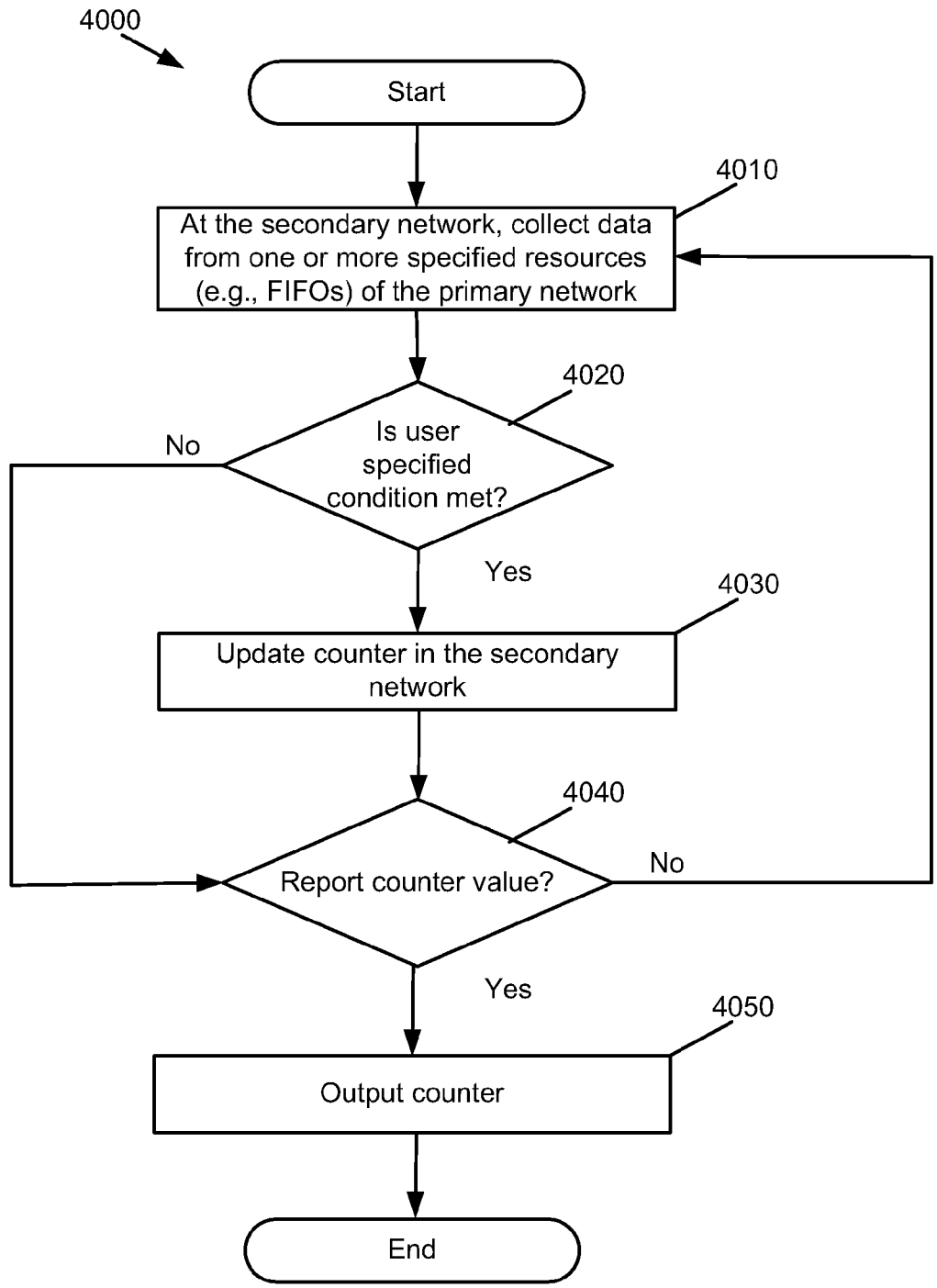
FIG. 40 presents a process performed by some embodiments for monitoring a resource of a primary circuit structure such as a FIFO using a secondary circuit structure of an IC.

FIG. 40 presents a process 4000 performed by some embodiments for monitoring a resource of a primary circuit structure, such as a FIFO, using a secondary circuit structure of an IC. The process 4000 begins by the secondary circuit structure collecting (at 4010) statistics from at least one resource (e.g., FIFO) of the primary circuit structure.

As the statistics are collected, the process performed by the secondary circuit structure determines (at 4020) whether the queue is nearly full or if it has overflowed depending on a user specified comparison condition (e.g., 50% full, 85% full, etc.). It should be apparent that in some embodiments the statistics are collected in real-time such that the signals arrive to the monitored circuit in the primary circuit structure synchronously with the monitoring circuits of the secondary circuit structure. Moreover, it should be apparent to one of ordinary skill in the art that at the time of configuration or some subsequent time one or more specified conditions may be specified for the secondary circuit structure to monitor and that the monitoring is performed by a processor or other logic circuit within the secondary circuit structure.

When the user condition is met, the process updates (at 4030) a counter of the secondary circuit structure. The process then determines (at 4040) whether to output the counter of the secondary circuit structure. If so, the values are output (at 4050) to the trace buffer of the secondary circuit structure where they may be read out at any time using one or more external interfaces into the secondary circuit structure. In this manner, the values may be read out in real-time to update an external monitor viewable by a user. Otherwise, the process proceeds back to step 4010 which was described above.

Figure 41:
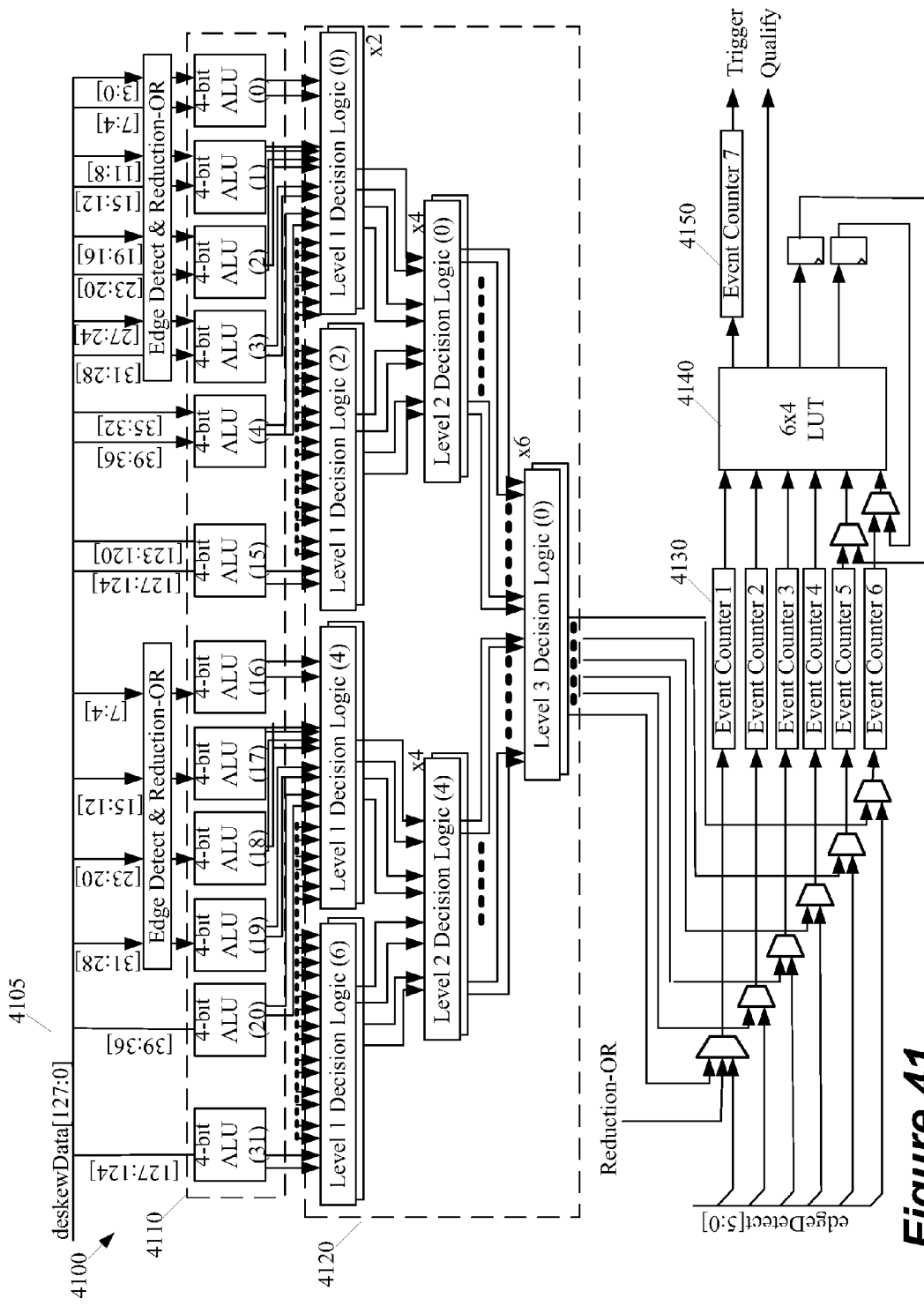
FIG. 41 presents a configuration for the trigger circuit of some embodiments to implement the FIFO overflow monitoring process of FIG. 40.
Figure 42:
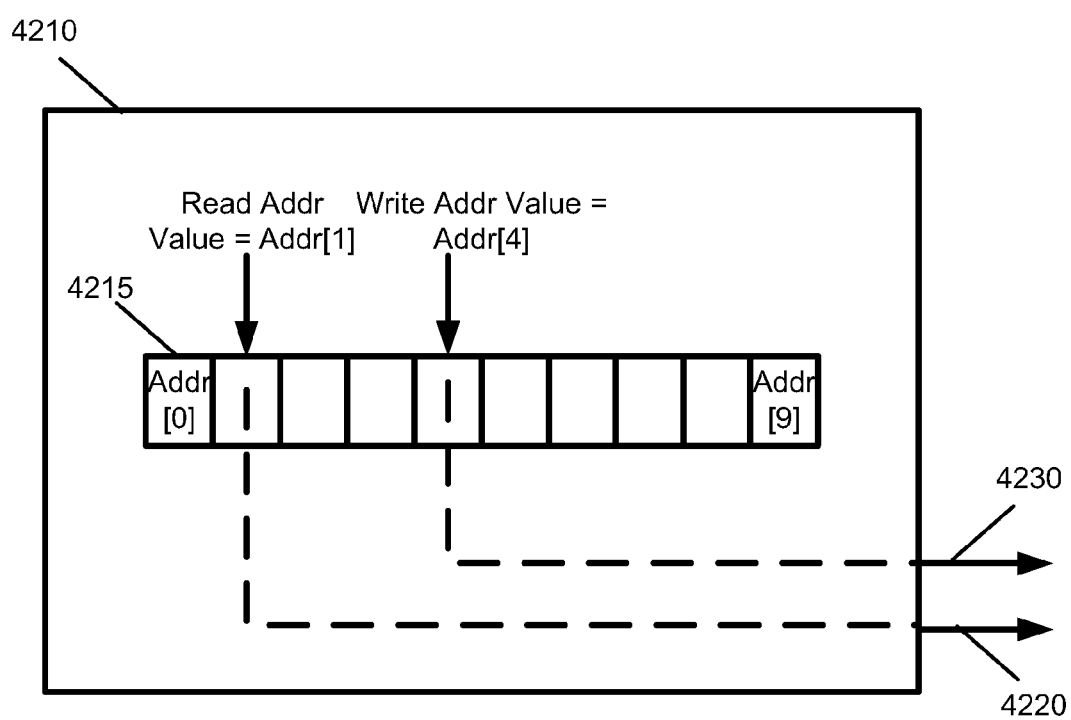
FIG. 42 conceptually illustrates a FIFO.

FIG. 41 presents a configuration for the trigger circuit 4100 of some embodiments to implement the FIFO overflow monitoring process of FIG. 40. The process is described in context of FIG. 42 conceptually representing a FIFO 4210.

As shown the FIFO 4210 includes a set of memory address locations 4215, a read address register signal 4220 to represent a current memory address location within the FIFO 4210 being read, and a write address register signal 4230 to represent a current memory address location within the FIFO 4210 being written to. From these signals, the trigger circuit of some embodiments is able to determine how full the FIFO 4210 is at any given instance.

For instance, initially the read signal 4220 and write signal 4230 will have the same initial address value to indicate the FIFO 4210 is empty. For every write, the write signal 4230 value is incremented and for every read, the read signal 4220 value is incremented. Therefore, the FIFO 4210 is empty when the read signal 4220 value reaches the write signal 4230. Similarly, the fullness of the FIFO 4210 may be determined by how close the write signal 4230 value is to reaching the read signal 4220 value assuming the FIFO 4210 is a circular queue. When the write signal 4230 value reaches the read signal 4220 value, then the FIFO 4210 is full. Accordingly, by monitoring transitions within the read signal 4220 and the write signal 4230, the trigger circuit of some embodiments is able to determine how full a FIFO is at any given instance (e.g., user clock cycle).

To monitor and report on the status of the FIFO 4210 using the trigger circuit 4100, some embodiments configure the trigger circuit 4100 to receive the values of the read signal 4220 and the write signal 4230 over the deskewed data lines 4105. The ALUs 4110 are then configured to perform one or more comparison operations based on the value of the read signal 4220 and the value of the write signal 4230. The results of the ALU comparisons are then passed to the decision logic 4120. The decision logic 4120 is configured to determine based on the ALU outputs whether or not the FIFO is full or nearly full.

To determine a FIFO full state, the ALUs 4110 need only perform a comparison operation on the read signal 4220 value and the write signal 4230 value. The comparison, when true (e.g., "1"), determines that the write signal 4230 is overwriting a memory address that was previously written but has yet to be read. Such a condition indicates the FIFO is full.

Some embodiments determine a near full FIFO by receiving a user specified definition for the near full FIFO state. For example, assume that the FIFO is considered nearly full when the write address value is one memory address lower than the read address value. This example is further illustrated by assuming the addresses are represented as four bit binary values (e.g., four read signal bits, R[3.0], and four write signal bits, W[3.0]).

The ALUs 4110 would then compare each of the four bits of the read signal 4220 value to the corresponding bit of the write signal 4230 value. Specifically, the arithmetic operation performed by the ALUs 4110 involves both a less than operation and an equivalence operation (e.g., if R[3]>W[3] then "1" or if R[3]=W[3] then "1"). The result of each of the two four-bit comparisons are passed to the decision logic 4120.

If the comparison R[3]>W[3] is "1" and any of the equivalence results for lesser significant bits also has a value of "1" (e.g., if R[2]=W[2] is "1", if R[1]=W[1] is "1", or if R[0]=W[0] is "1"), then it is assured that the read signal 4220 value is at least two memory addresses ahead of the write signal 4230 value. Accordingly, the FIFO is not nearly full based on the user specified definition of a near full FIFO having the write signal 4230 be one address lower than the address of the read signal 4220.

If the comparison R[3]=W[3] is "1" then the bit values are equivalent then the next most significant bit will have to be analyzed to try and determine the result. If all bit values in the four bit address are equivalent or if only the least significant bit R[0]>W[0], then the FIFO near full condition is met and the event counter 4130 or the event counter 4150 increments or the LUT 4140 fires the trigger signal.

However, if the comparison R[3]>W[3] is "0" and the value of the R[3]=W[3] operation is also "0" then the write signal 4230 address is ahead of the read signal 4220 address (e.g., W>R) which represents that the user overflow condition is not met in this simplified example. It should be apparent that to one of ordinary skill in the art that additional conditions would have to address the situation when the write address is at a final address of a circular FIFO and the read address is at a beginning address of the FIFO, however for the sake of simplicity this discussion will be omitted.

3. Detailed Custom Reporting

While the above configurations provide insight as to the performance of the monitored FIFO (i.e., number of overflows), some users may desire additional information to better diagnose the cause of the overflow. Therefore, in some embodiments, the secondary circuit structure is configured to capture (i.e., count) not only the number of instances when the monitored FIFO overflows or is near overflowing, but also the data within the FIFO that causes the performance issues to arise.

As noted above with reference to FIGS. 24 and 25, the trigger circuit and trace buffer of the secondary circuit structure is configurable with a pre-triggering mode and a post-triggering mode. The pre-triggering mode captures a user specified number of values before the performance issue arises thus allowing a user to analyze the data that came before the occurrence of the triggering event. The post-triggering mode captures a user specified number of values after the performance issue arises thus allowing a user to analyze the remaining bottleneck.

Due to the configurable nature of both the primary and secondary circuit structures, the monitoring of the secondary circuit structure may be adjusted to further isolate the problem once the problem is detected at a first location. Specifically, the secondary circuit structure can be reconfigured to probe the internals of the first location to gain further insight into the problem. Additionally, the configurable nature of the primary circuit structure allows the secondary circuit structure to reconfigure and correct the performance issues. Accordingly, the configurable IC of some embodiments is able to better avoid obsolescence by updating the IC to new or unexpected behavioral conditions as they occur or to customize the IC for custom tailored performance in different environments.

Figure 43:
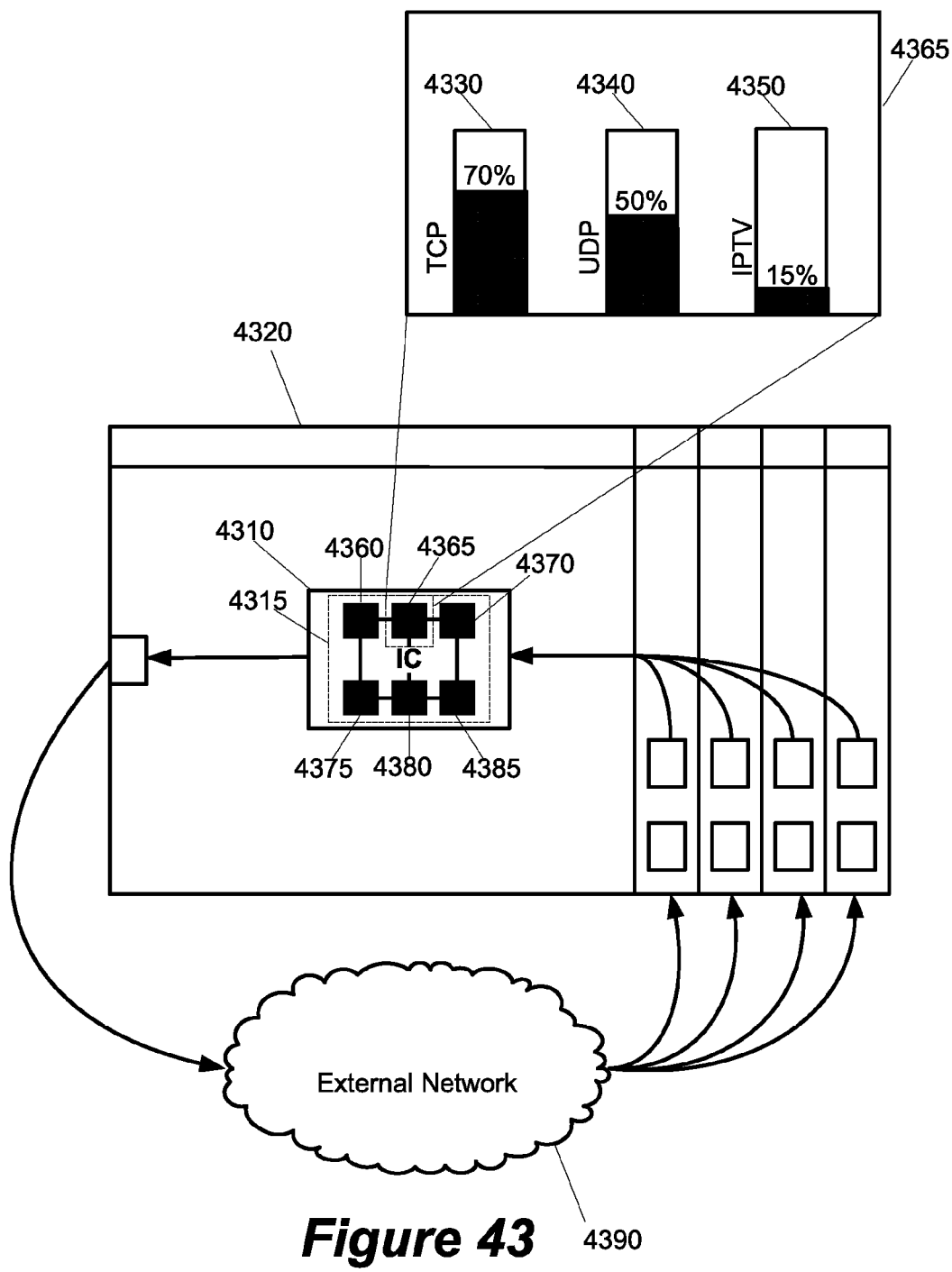
FIG. 43 illustrates the IC of some embodiments as a component of a circuit structure router that has been deployed in the field at a first time interval.
Figure 44:
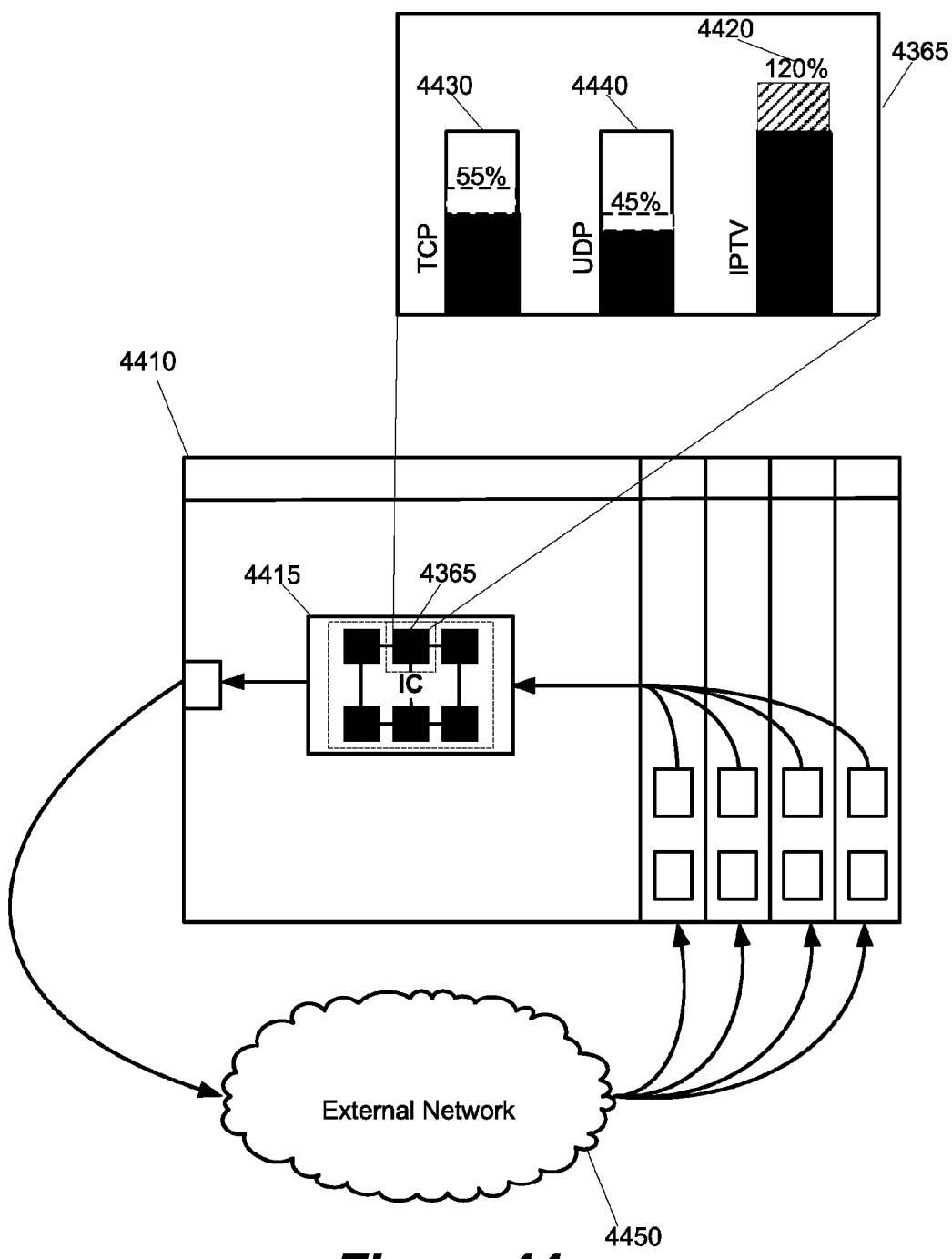
FIG. 44 illustrates the circuit structure router at a second time interval after the first interval during which the traffic patterns experienced by the circuit structure router have changed.

FIGS. 43 and 44 conceptually illustrate using the secondary circuit structure of an IC 4310 of some embodiments to monitor for performance issues that occur in a user specified set of monitored resources within the primary circuit structure of the IC and to report data that can be used to further diagnose the cause of the performance issues. FIG. 43 conceptually illustrates the IC 4310 of some embodiments as a component of a circuit structure router 4320 that has been deployed in the field at a first time interval.

The IC 4310 includes a primary circuit structure with sets of configurable resources 4360-4385 configured to collectively perform the router functionality and a secondary circuit structure 4315 that is able to monitor any such resource 4360-4385. As shown, the secondary circuit structure is configured to monitor resource 4365 which in the exploded conceptual view is shown as to implement a set of memory queues 4330-4350 (FIFOs) for the incoming circuit structure traffic.

At the time of deployment, the IC 4310 is optimized for the routing of TCP and UDP packets. During the first time interval, the circuit structure router 4320 experiences expected TCP traffic (as shown in memory queue 4330) and expected UDP traffic (as shown in memory queue 4340) with little to no IPTV traffic (as shown in memory queue 4350) from the external circuit structure 4390 (e.g., Internet). The IPTV traffic requires much higher bandwidth processing by the configurable resources 4360-4385 of the IC 4310 and a higher level of quality of service than the other protocols (e.g., TCP and UDP). However, due to the greater distribution of TCP and UDP traffic with little IPTV traffic, the IC 4310 is able to process the incoming packets with no packet loss during the first time interval.

FIG. 44 conceptually illustrates the circuit structure router 4310, now illustrated as 4410, at a second time interval after the first interval during which the traffic patterns experienced by the circuit structure router 4410 from the external circuit structure 4450 have changed. During the second interval, the circuit structure router 4410 experiences much higher amounts of IPTV traffic (as shown in FIFO 4420 which is the exploded conceptual view of monitored resource 4365 at the second time interval). As a result, the circuit structure router 4410 begins to drop packets and throttle bandwidth for the other protocols (as shown in the FIFOs 4430 and 4440). Identifying the root of this problem is problematic using simple counters as the counters will reveal that the incoming traffic is being throttled, but an explanation as to why may be unclear through such basic counters.

Through the primary circuit structure resource monitoring provided by the secondary circuit structure, some embodiments are able to monitor the various memories and queues processing the incoming traffic. From this low-level resource view, users are able to see that the IPTV traffic in FIFO 4420 overwhelms the physical resources of the circuit structure router 4410 causing the circuit structure router 4410 to throttle the other traffic and lose packets. Once diagnosed, designers can then ameliorate the performance issues by reconfiguring the primary circuit structure to adjust for the increased IPTV traffic. For example, designers can specify a higher Quality of Service (QoS) to the more important traffic or allot a larger queue to allow a larger response time for the processing of the IPTV packets. In some embodiments, such solutions require reconfiguring the primary circuit structure of the IC.

Figure 45:
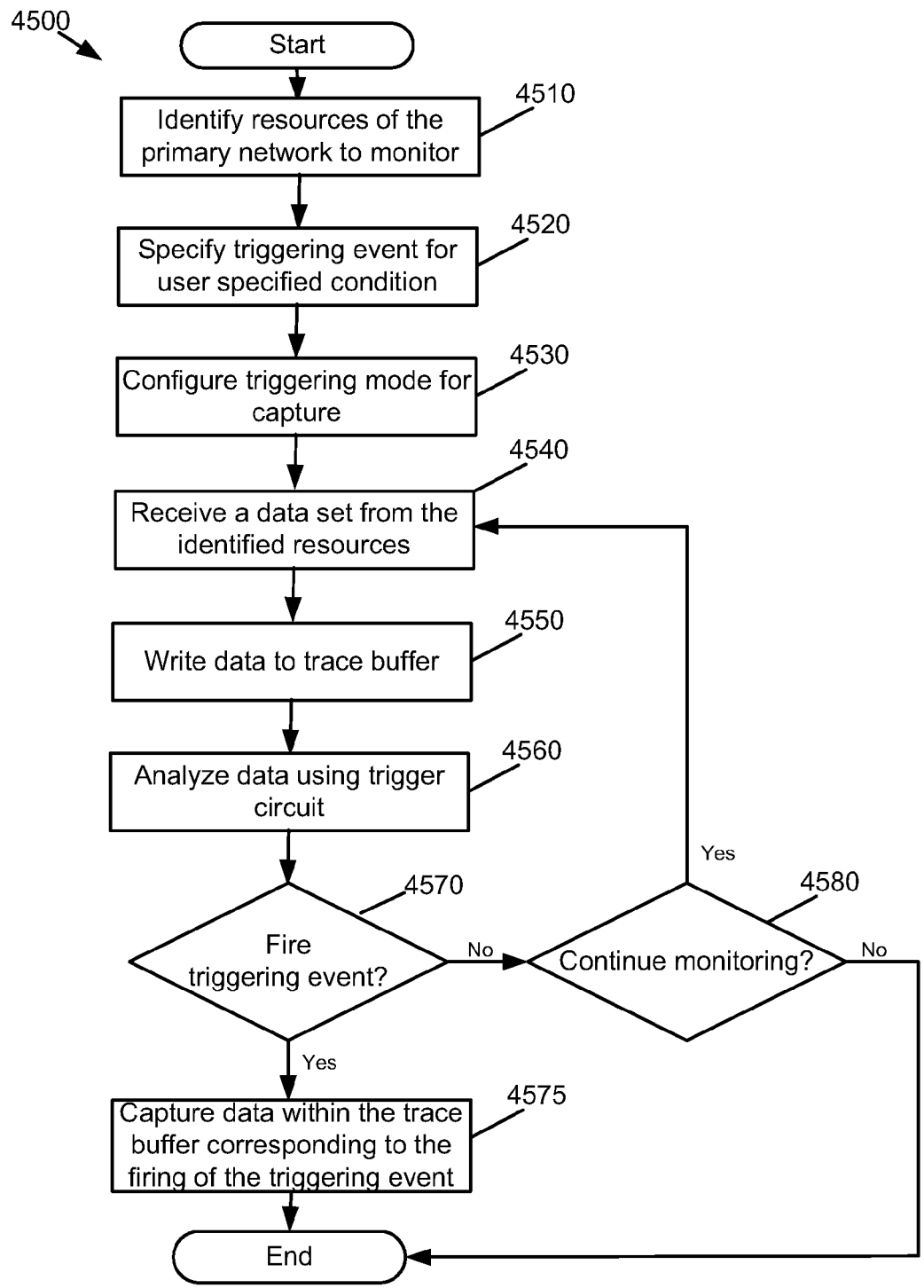
FIG. 45 presents a process performed by the trigger circuit and trace buffer in the secondary circuit structure of some embodiments to monitor performance issues in a specified set of resources of the primary circuit structure and to provide meaningful data to diagnose the root cause of the performance issues once the issues have been detected.

FIG. 45 presents a process 4500 performed by the trigger circuit and trace buffer in the secondary circuit structure of some embodiments to monitor performance issues in a specified set of resources of the primary circuit structure and to provide data to diagnose the root cause of the performance issues once the issues have been detected. The process 4500 begins by identifying (at 4510) the user specified resource within the primary circuit structure to monitor. For the examples of FIGS. 43 and 44, the user will configure the trigger circuit to monitor the FIFO of the primary circuit structure receiving the streaming circuit structure traffic.

The process then specifies (at 4520) the triggering event that defines the performance issue the user desires to isolate. For example, the user may specify a triggering event that fires when the monitored FIFO reaches 90% capacity. Additionally, the process configures (at 4530) the triggering mode (e.g., pre-triggering, post-triggering, or multiple capture) to capture the data of interest once the triggering event fires. Steps 4510-4530 configure the trigger circuit and trace buffer. Once configured, the process begins monitoring.

During monitoring, the process receives (at 4540) sets of data from the identified resource at each user clock cycle. As described in FIGS. 41 and 42 above, the sets of data may include the read address signal values and write address signal values. Additionally, the sets of data will include one or more of the entries in the FIFO. The data that is passed and written (at 4550) to the trace buffer will include the actual content of the one or more entries of the FIFO. If the trace buffer is already full, the writes occur in a circular manner such that the oldest written data is overwritten with the newest incoming data.

The received data is synchronously passed to and analyzed by (at 4560) the trigger circuit to determine (at 4570) whether the specified triggering event should fire. In some embodiments, the trigger circuit is configured in a manner as described above with reference to FIG. 41.

When the triggering event does not fire, the process determines (at 4580) whether to continue monitoring data or to end. When the process continues, the process returns to step 4540. Otherwise the process ends.

When the triggering event does fire, the process captures (at 4575) the data within the trace buffer thus preventing the data in the trace buffer from being further overwritten. Specifically, the trigger signal for the trigger circuit will be set. The trace buffer will receive this trigger signal causing the capture to occur. The captured data includes data that was previously written into the trace buffer when the process is configured in pre-triggering mode. Alternatively, the captured data includes data that streams into the trace buffer after the firing of the triggering event when the process is configured in post-triggering mode. This data can then be retrieved and viewed by the user to diagnose the issue.

In some embodiments, the captured data is merged with identifying data that identifies the firing of the trigger. In this manner, the captured data includes an indicator that indicates that a specified condition occurred as in FIGS. 39-40, but also relevant data pertaining to the condition itself. For instance, the trace buffer will store the entire contents of all FIFOs 4420-4440, just FIFO 4420, the condition causing IPTV packet, or the IPTV packet headers.

The process then determines (at 4580) whether to continue monitoring data or to end. For instance, if the process is configured to operate in multiple capture mode, then the process may continue to monitor for additional triggering events.

In some embodiments, the process 4500 configured in pre-triggering mode allows users to identify and isolate the performance issues described above with reference to FIGS. 43 and 44. Specifically, the pre-triggering mode would reveal that when the FIFO receives a disproportionate number of IPTV packets, the processing components of the primary circuit structure of the IC will have a performance hit which causes the FIFO to fill up past the user specified threshold.

b. Behavioral Monitoring

Some embodiments of the secondary circuit structure provide behavioral monitoring of the resources of the primary circuit structure. In some such embodiments, behavioral monitoring includes monitoring that is based on the content of the data passing through the primary circuit structure. In this manner, the secondary circuit structure of some embodiments secures the functionality of the primary circuit structure by intercepting anomalous behavior that could otherwise cause the primary circuit structure to malfunction and thus halt or hinder operation of the IC.

1. Assertions

In some such embodiments, the secondary circuit structure works in conjunction with the primary circuit structure to trigger an assertion upon detecting the anomalous behavior within the primary circuit structure. The raised assertion alert can then be used by a user, an external component of the system in which the primary circuit structure operates, or internal circuitry within the primary circuit structure to avoid processing the anomalous behavior in a potentially hazardous manner.

Accordingly, the behavioral monitoring overlay application of the secondary circuit structure provides an adaptable monitoring mechanism by which users can protect their configurations from new and emerging threats. Many such threats only occur within an environment in which the IC is deployed and in most instances cannot be protected against during IC design as such threats may never materialize in a controlled testing and debugging environment.

In some embodiments, anomalous behavior includes design flaws that are not discovered at design time but that carry over to an IC that has been deployed in the field, unexpected behavior experienced by the IC once deployed, or expected behavior that is monitored for and responded to in a specified fashion. Some examples of anomalous behavior that the secondary circuit structure of some embodiments is able to monitor and thus prevent include circuit structure viruses, worms, TCP SYN attacks, multi-cast storms, or other denial-of-service attacks.

Figure 46:
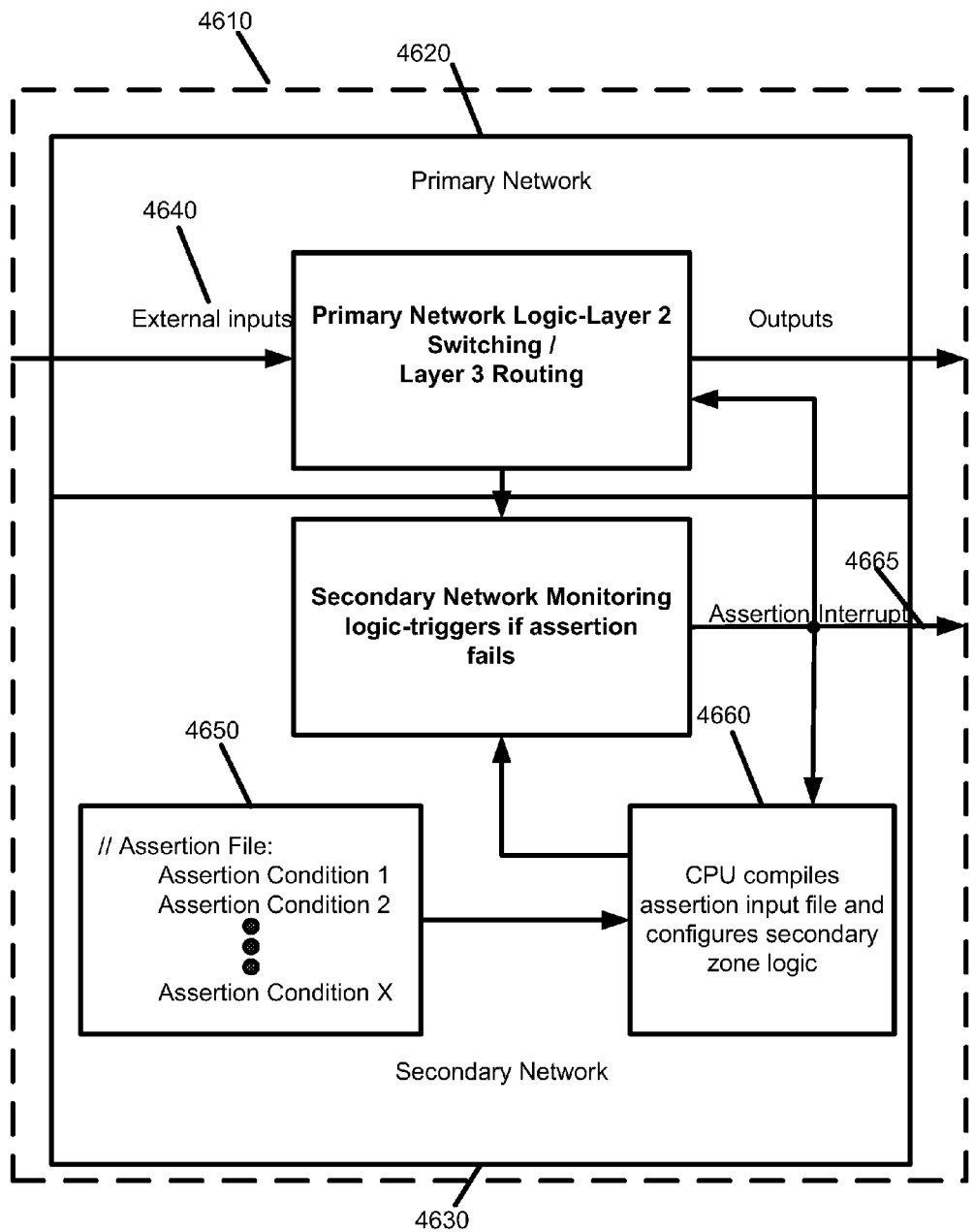
FIG. 46 conceptually illustrates an IC with a primary circuit structure configured to perform layer 2 switching, layer 3 routing and forwarding, TCP hardware offload, or any other deep-packet inspection functionality.

FIG. 46 conceptually illustrates an IC 4610 with a primary circuit structure 4620 and a secondary circuit structure 4630 for raising assertions upon detecting anomalous behavior within the primary circuit structure 4610. As shown, the IC 4610 includes the primary circuit structure 4620, the secondary circuit structure 4630, an assertion file 4650, and an onboard CPU 4660.

The primary circuit structure 4620 is configured to perform packet routing functionality (e.g., layer 2 switching, layer 3 routing and forwarding, TCP hardware offload, or any other deep-packet inspection functionality). The secondary circuit structure 4630 is configured to monitor for and trigger an assertion-based alert upon detection of an anomalous event passing through the primary circuit structure 4620.

The secondary circuit structure 4630 receives the streaming data inputs 4640 simultaneously (i.e., real-time) with the primary circuit structure 4620. Therefore, as the primary circuit structure 4620 is performing the various data routing functionality, the secondary circuit structure 4630 is continually monitoring the traffic entering the IC 4610. When the external inputs 4640 contain unsafe data for which an assertion alert should be raised, the secondary circuit structure 4630 detects the unsafe data and issues the assertion alert. The assertion alert can then be sent off-chip via an external interface. In some embodiments, the external interface communicates with a component of a system that operates in conjunction with the primary circuit structure 4620. Such a component can receive the assertion and alter the performance of the IC 4610 or system in order to prevent the anomalous behavior from affecting the functionality of the system.

In the case where the anomalous behavior is a TCP SYN attack, the secondary circuit structure 4630 monitors the external input 4640 packets to the primary circuit structure and determines whether a TCP SYN packet is continually being sent from the same IP or MAC address over a particular duration of time. If conditions for the TCP SYN attack are met, then the secondary circuit structure 4630 issues an assertion containing the IP or MAC address of the offending party such that action may be taken to prevent the identified attacker from degrading the performance of the primary circuit structure 4620, IC 4610, or system operating in conjunction with the IC 4610. In some embodiments, the IP or MAC address is stored within the trace buffer using either a pre-triggering or post-triggering capture. In some embodiments, the secondary circuit structure 4630 issues the assertion in real-time as the anomalous behavior is detected as opposed to prior art implementations of a logic analyzer that capture the assertions for subsequent analysis.

As shown in FIG. 46, an assertion file 4650 defining the various conditions that are to be monitored by the secondary circuit structure may be compiled locally on the secondary circuit structure 4630 by an onboard CPU 4660 of the secondary circuit structure 4630. Alternatively, FIG. 47 conceptually illustrates the assertion file being compiled externally by a CPU 4670 that is not a component of the secondary circuit structure 4630. However, the secondary circuit structure 4630 receives the compiled file and configures accordingly in order to operate as described above with reference to FIG. 46 (to identify assertion conditions defined within the assertion file).

Figure 47:
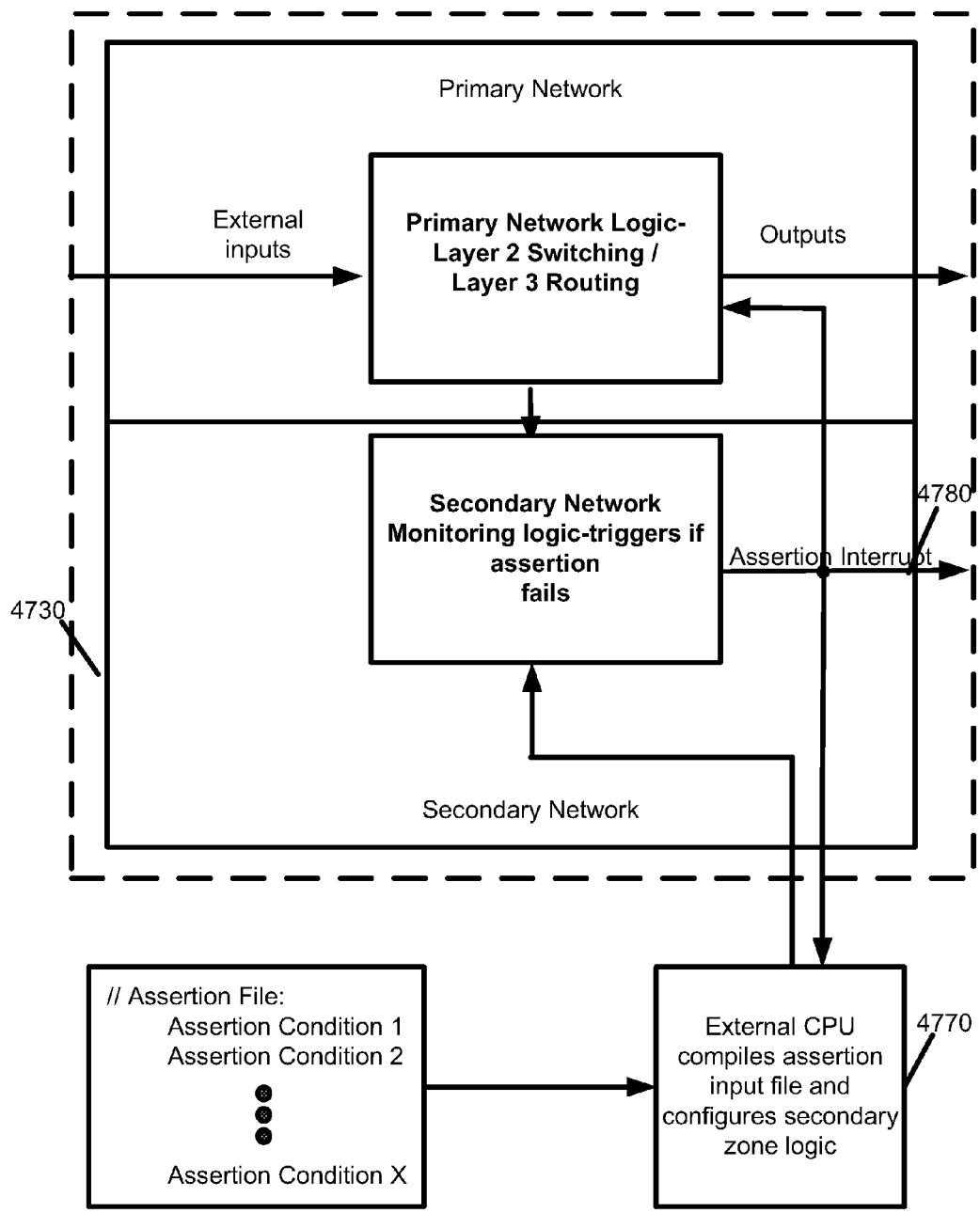
FIG. 47 conceptually illustrates the assertion file being compiled externally by a CPU that is not a component of the secondary circuit structure.

Using either implementation of FIG. 46 or FIG. 47, some embodiments are able to grow and adapt to new emerging threats without having to change the core logic performed by the primary circuit structure. For instance, in addition to or instead of monitoring for TCP SYN attacks, the secondary circuit structure may be configured at design time or some later time to raise assertions upon detection of a Denial of Service attack, software viruses, data corruption (e.g., output of a FIFO is the same as when it was input), full utilization of resources, congestion issues, resource issues, etc.

By updating the assertions and monitored conditions of the secondary circuit structure, some embodiments provide hardware functionality that is similar to upgrading anti-virus software virus definitions without the need to restart the target device or software application. Designers now have the flexibility to perform assertion based control within the actual chip implementation whereas prior art implementations performed such functionality within simulators during the verification phase of the design.

Moreover, since the assertion based checking occurs using dedicated hardware of the IC, the amount of checking and the speed with which the check is performed is superior to software based implementations that perform the assertion based checking in serial prior to performing other operations. In some embodiments, the secondary circuit structure allows for the parallel operation of the assertion based checking with other operations of the primary circuit structure.

Figure 48:
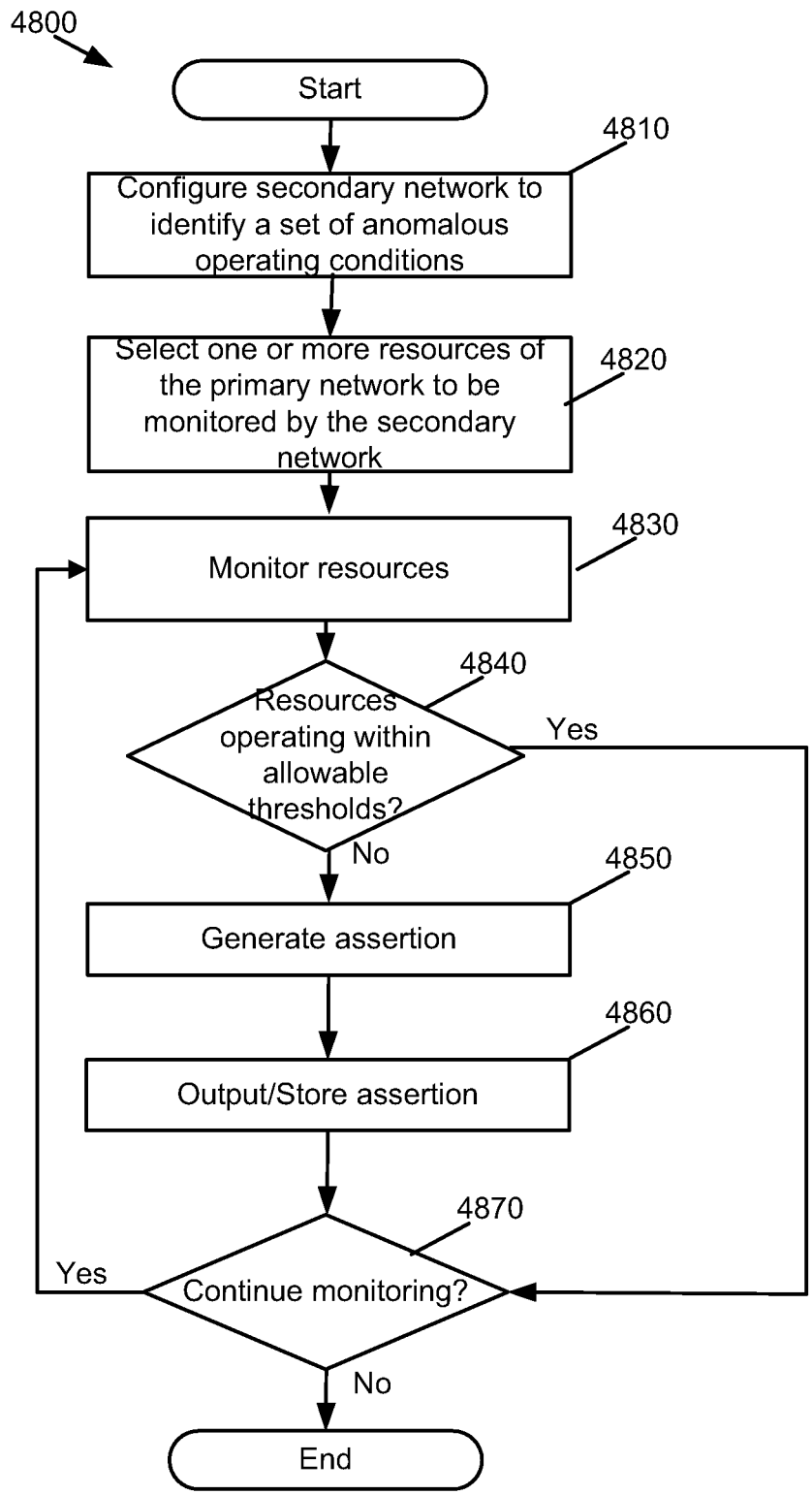
FIG. 48 presents a process performed by the secondary circuit structure of some embodiments to monitor for anomalous conditions in the primary circuit structure and to raise assertions when such conditions are detected.

FIG. 48 presents a process 4800 performed by the secondary circuit structure of some embodiments to monitor for anomalous conditions in the primary circuit structure and to raise assertions when such conditions are detected. The process 4800 begins by configuring (at 4810) the secondary circuit structure to identify a set of anomalous conditions. The process then selects (at 4820) one or more resources of the primary circuit structure to be monitored by the secondary circuit structure and the secondary circuit structure monitors (at 4830) the resources during runtime operation of the primary circuit structure.

As the resources receive (1) inputs from components external to the IC, (2) inputs from other internal circuits of the IC, or (3) configuration bits, the process determines (at 4840) whether the resources operate within allowable thresholds defined at step 4810. If no anomalous behavior is detected by the secondary circuit structure, then the secondary circuit structure determines (at 4870) to either continue monitoring the resources of the primary circuit structure or end. For instance, the secondary circuit structure may subsequently be reconfigured to monitor other resources of the primary circuit structure when the selected resource (at 4820) is determined to be operating properly.

However, if anomalous behavior is detected by the secondary circuit structure, then the process generates (at 4850) an assertion. The assertion may include a general assertion which contains a condition code specifying an error or a more detailed assertion that includes additional data regarding the assertion, such as the IP address of an offending party. The assertion is then output (at 4860) through an external interface (i.e., interrupt line) to a user monitor or other component of a system in which the secondary circuit structure of the IC operates. Alternatively, some embodiments of the secondary circuit structure store the assertion such that the assertions may be block read at specified intervals. The process then determines (at 4870) to either continue monitoring the resources of the primary circuit structure or end.

In some embodiments, the trigger circuit is configurable to detect if, and how often, anomalous conditions occur in the primary circuit structure. For example, some conditions or assertions can be configured as particular triggering events that are monitored for using the trigger circuit and that increment event counters when the triggering event is satisfied. Users can then read these event counters from time to time to see if the anomaly of interest has occurred during actual execution. The ability to run assertions in hardware during actual execution makes assertions far more effective because they can be used for much longer execution runs and with actual data, both of which are typically not possible with a simulator.

In some embodiments, the trigger circuit can be automatically configured to handle assertions during synthesis flow when the user design is mapped to the primary circuit structure. In some such embodiments, the user design is specified in Hardware Description Language (HDL) code. One or more assertions are inserted into the HDL code where in some embodiments the assertion is specified via (1) a condition, and (2) code that describes what should be done should the condition become true during a simulation run. In some instances, the code includes writing a message to a log file.

During the general synthesis flow, the synthesis process is augmented to include code to detect assertions in the user's HDL code. These assertions would be extracted from the user's HDL code and passed to an "assertion" compiler capable of converting the assertion code into a trigger configuration for the secondary circuit structure. The trigger circuit is then configured with the trigger configuration that detects the condition spelled out by the assertion.

Modern HDLs support standard assertion syntax such as PSL, Sugar, System Verilog, etc. In some embodiments, the assertion compiler supports the syntax of one or more of these assertion languages and would be capable of converting the assertion into a trigger configuration for the secondary circuit structure.

Figure 49:
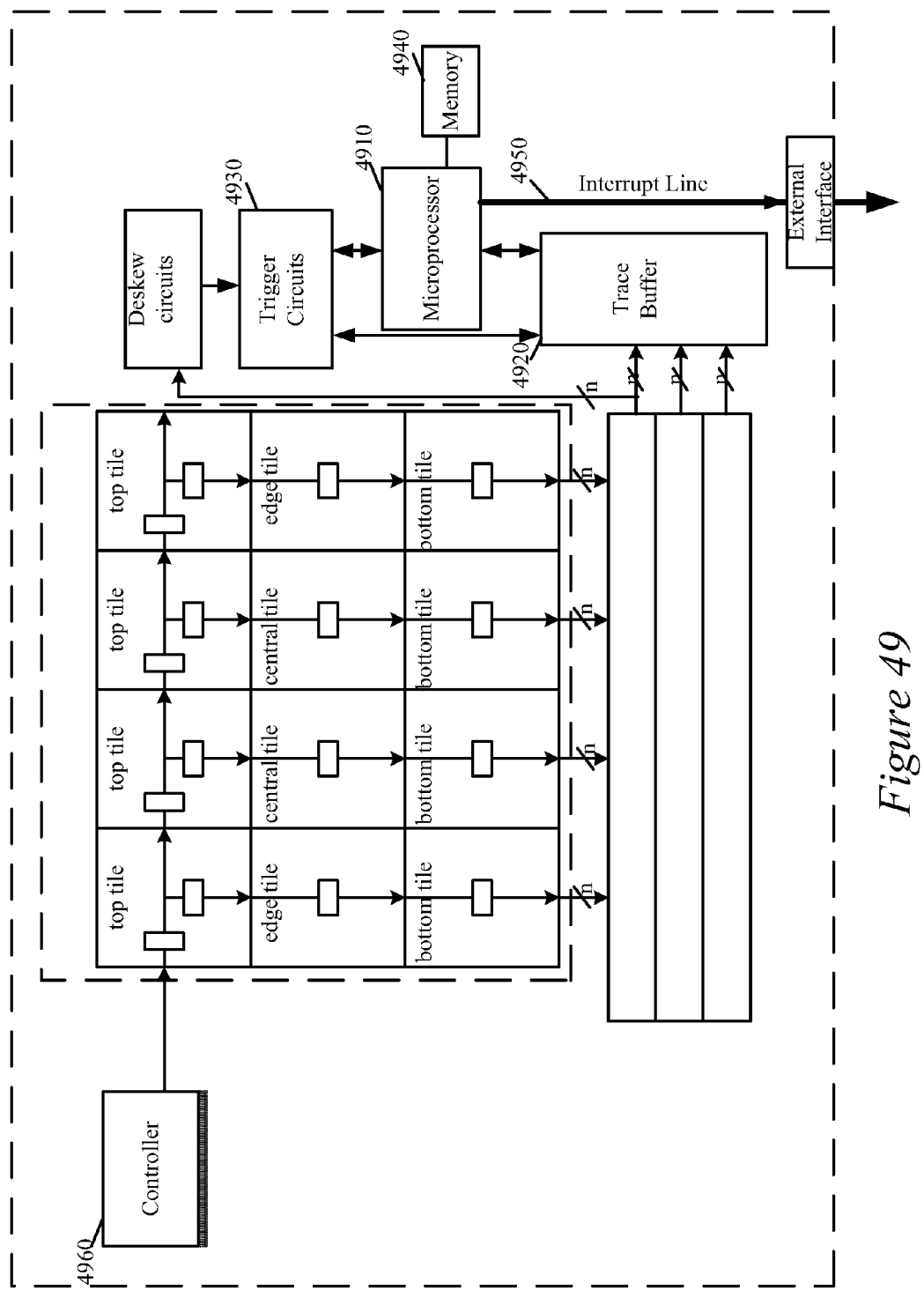
FIG. 49 presents a modified architecture of the secondary circuit structure for facilitating assertion monitoring in accordance with some embodiments of the invention.

FIG. 49 presents a modified architecture of the secondary circuit structure for facilitating assertion monitoring in accordance with some embodiments of the invention. In this figure, the secondary circuit structure contains the same components as FIG. 9 above. However, the secondary circuit structure now includes a microprocessor 4910 to detect assertion conditions, a memory 4940 used in conjunction with the microprocessor to store the monitored for assertion conditions, and an interrupt line 4950 to signal the detection of an assertion to other components internal to the IC's primary or secondary circuit structures or some other external component.

In some embodiments, the microprocessor 4910 directly checks the contents of the trace buffer 4920 in order to detect the anomalous conditions. In other embodiments, the microprocessor 4910 indirectly checks the contents of the trace buffer 4920 when the trigger circuit 4930 notifies the microprocessor 4910 of an anomalous condition. In some such instances, the microprocessor 4910 receives the triggering event from the trigger circuit 4930 and the microprocessor 4910 then analyzes the trace buffer 4920 in order to determine additional information regarding the anomalous condition. For instance, the trigger circuit 4930 may specify a trigger when a Denial of Service attack is detected.

In some embodiments, the trigger circuit may be configured to monitor for the attacks by counting occurrences of a source IP address over a given interval. For example, if the same source IP address sends a TCP SYN packet X number of time over a duration N, then the trigger circuit may fire. These comparisons may be accomplished using the ALUs to perform an equivalence operation to detect TCP SYN packet headers and also perform an equivalence comparison between source IP addresses to determine if the same party is repeatedly sending the TCP SYN packet. In other embodiments, the primary circuit structure includes user logic to perform the assertion checking and then raises a flag to the trigger circuit of the secondary circuit structure that then fires to capture the offending party data in the trace buffer.

The microprocessor 4910 then identifies the offending parties (i.e., the IP or MAC addresses) by analyzing the trace buffer 4920. The microprocessor 4910 then generates an assertion that is passed through the interrupt line 4950 to a component external to the IC in which the primary and secondary circuit structures operate. The external component may include another processor with software to automatically correct the operation of the system to avoid performance degradation as a result of the anomalous condition. Additionally, the microprocessor 4910 may generate an interrupt to an internal component via the configuration controller 4960.

In some embodiments, the assertion generated by the microprocessor 4910 contains information such that the external processor can identify the condition and automatically resolve the issue. For the Denial of Service scenario, the assertion would include IP address of the offending party and the type of packets being sent as part of the attack. The external component may then block packets from that IP address from being processed by the system, reset some or all of the system, reset some or all portions of the primary circuit structure, or raise an alarm. Such functionality may be accomplished by reconfiguring either the primary or secondary circuit structures based on the detected conditions. The modifying of the primary and secondary circuit structures in response to a monitored event in the primary circuit structure is described in the section below.

C. Self-Modifying Circuitry a. Overview

In some embodiments, the monitoring and reporting functionality of the secondary circuit structure is expanded to allow adjustments to be made on-chip in response to the monitored results. In some such embodiments, the secondary circuit structure monitors the primary circuit structure and modifies functionality of the primary circuit structure in response to the monitored results. In other embodiments, the secondary circuit structure monitors the primary circuit structure and modifies functionality within the secondary circuit structure in response to the monitored results. In this manner, some embodiments provide a self-modifying chip.

Some embodiments implement the monitoring and modifying functionality differently. FIGS. 50-53 illustrate some different implementations in accordance with some embodiments of the invention. It should be apparent to one of ordinary skill in the art that each of the implementations of FIGS. 50-53 present a single chip or on-chip solution by which to perform the monitoring and modifying functionality.

Figure 50:
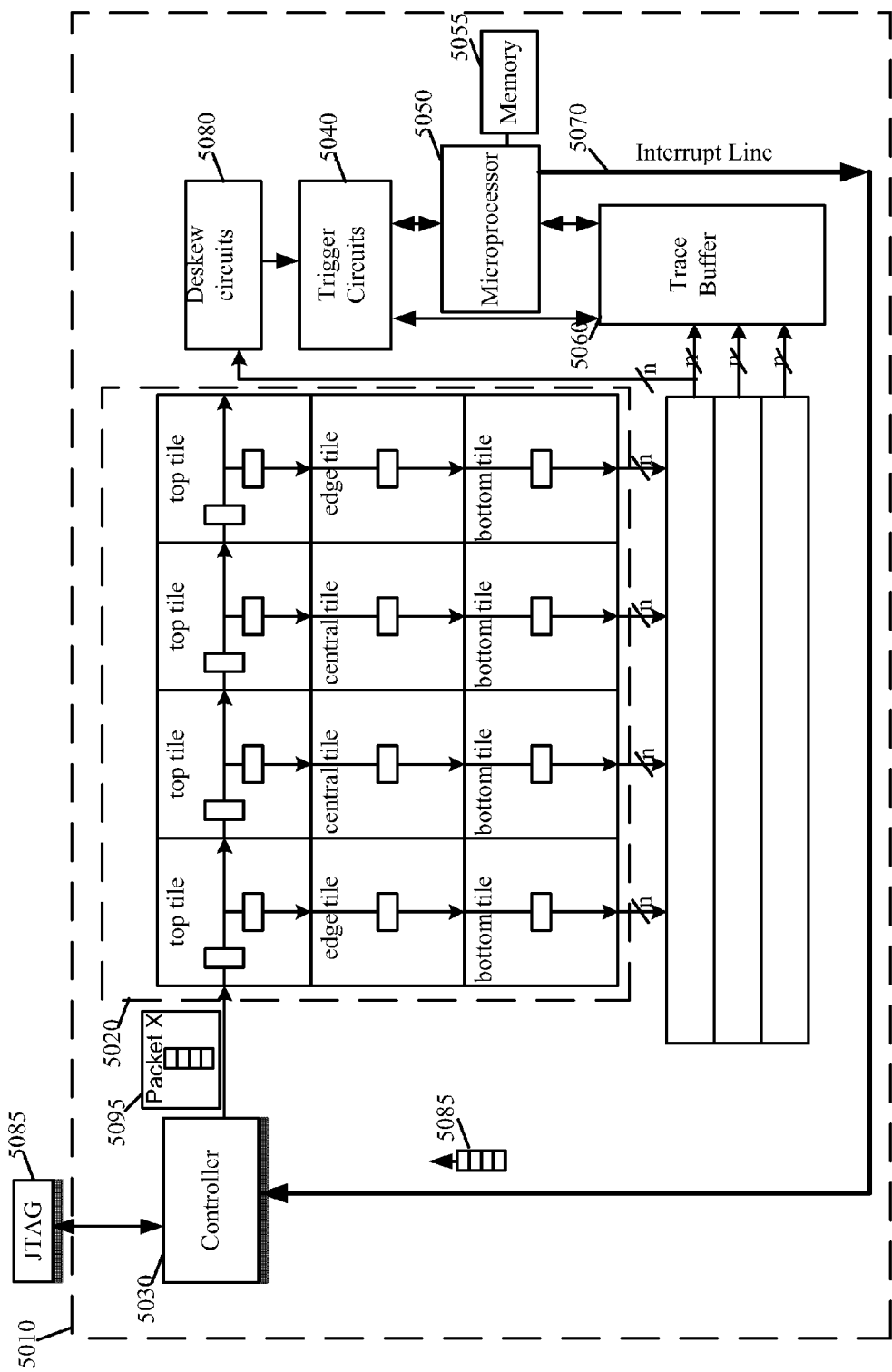
FIGS. 50-53 presents modified architectures of an IC for facilitating monitoring of the primary circuit structure using the secondary circuit structure and modifying either the primary or secondary circuit structures through the secondary circuit structure in accordance with some embodiments.

FIG. 50 presents a modified architecture of an IC 5000 for facilitating monitoring of the primary circuit structure using the secondary circuit structure and modifying either the primary or secondary circuit structures through the secondary circuit structure. As shown, the IC 5000 includes the configurable logic of the primary circuit structure 5020 (actual logic circuits and their interconnects are not shown for simplicity) and secondary circuit structure circuitry that includes a configuration controller 5030, one or more trigger circuits 5040, a microprocessor 5050, a microprocessor memory 5055, a trace buffer 5060, and deskew circuits 5080.

In this architecture, the monitoring of the primary circuit structure 5020 by the secondary circuit structure remains unchanged from the above description. As shown, JTAG 5085 is used to initially configure the secondary circuit structure and specify one or more resources of the primary circuit structure to monitor. In this figure, JTAG 5085 can also be used to configure programmable logic within the controller 5030 that allows the controller 5030 to perform a user specified set of operations in response to the firing of a triggering event. In some embodiments, the controller 5030 generates modified configuration data 5095 to send to the primary circuit structure 5020 based on signals on the interrupt line 5070 received from the microprocessor 5050.

For the assertion example of FIGS. 46-49, the assertions raised by the microprocessor 5050 may now be corrected internally (i.e., on-chip). For instance, the assertion interrupt 5070 raised by the microprocessor 5050 includes identification information for a party that is responsible for transmitting anomalous behavior into the IC. Using the added logic within the controller 5030, the controller 5030 is now able to generate the packet 5095 with configuration data to alter the behavior of circuits in the primary circuit structure 5020 that receive or perform operations on the anomalous behavior. For instance, instead of processing all incoming packets, the controller 5030 can modify the behavior of the circuits such that packets from the offending party are automatically discarded without further processing.

In some embodiments, the microprocessor 5050 contains the logic to determine the modifications to the primary circuit structure in response to events monitored in the primary circuit structure 5020. As before, the monitored events are stored in the trace buffer 5060 and the trigger circuits 5040 identify when an event occurs such that the microprocessor 5050 understands the data that it is analyzing from the trace buffer 5060. In some embodiments, the microprocessor is also able to access event counters and trigger signals from the trigger circuits 5040 in addition to the content stored within the trace buffer 5060.

The microprocessor 5050 then determines the changes to the configuration data that are needed to correct the detected condition. In some embodiments, the memory 5055 stores the set of instructions performed by the microprocessor 5050 or stores values such that the microprocessor 5050 is able to perform complex operations. The microprocessor then generates the modified configuration data 5085 that is transmitted to the configuration controller 5030 over the interrupt line 5070. The configuration controller 5030 then encapsulates the modified configuration data 5085 into the packet frame 5095 that is routed through the pipelined packet circuit structure to the appropriate destination within the primary circuit structure 5020.

The above description illustrates modifications that are made to the primary circuit structure, however it should be apparent that such circuitry can be used to also facilitate modifications to the secondary circuit structure. In some embodiments, the controller 5030 or the microprocessor 5050 contains the logic to determine the modifications to the secondary circuit structure in response to events monitored in the primary circuit structure 5020. For example, the microprocessor 5050 modifies the triggering event configured within the trigger circuits 5040 after a first triggering event is detected by the trigger circuits 5040. The microprocessor 5050 reconfigures the trigger circuit 5050 by modifying the functionality of the edge-detection circuits, ALUs, event counters, LUT, etc. of the trigger circuit 5050.

Figure 51:
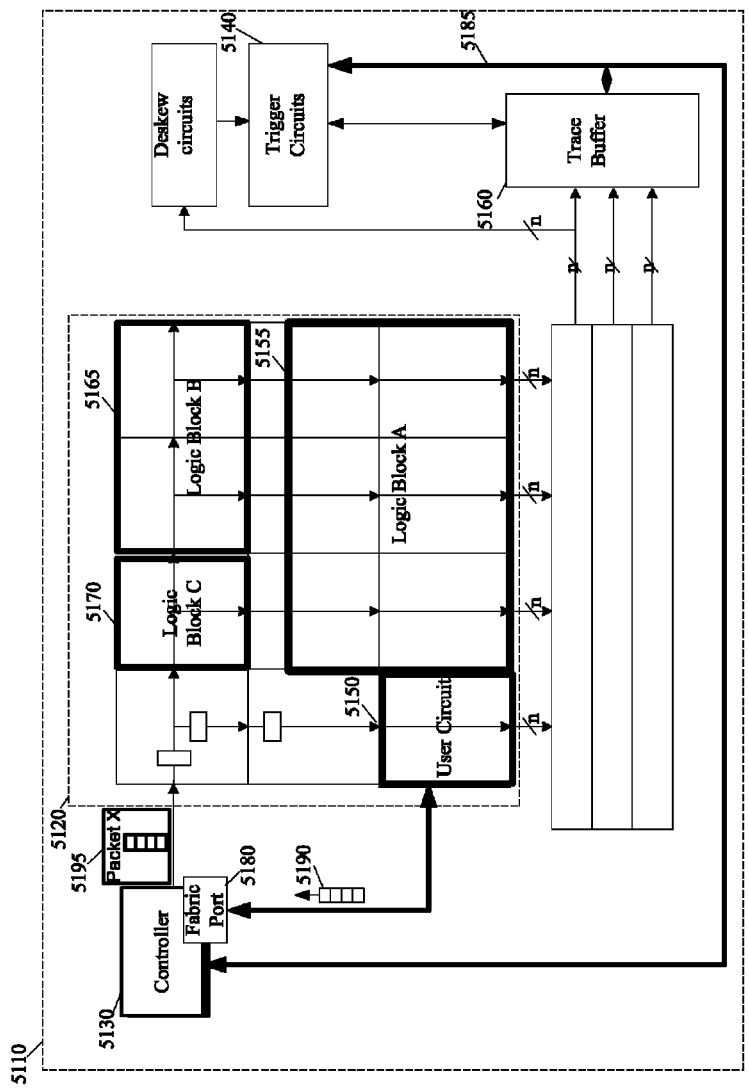

FIG. 51 presents another modified architecture of an IC 5100 for facilitating the monitoring and modifying functionality through the secondary circuit structure. In this figure, the controller 5130 is able to directly access the contents of the trace buffer 5160 and receive triggering signals from the trigger circuit 5140. In some embodiments, the communication between these circuits of the secondary circuit is facilitated through the fabric port 5180. As described above with reference to FIG. 21, the fabric port provides an internal interface through which the primary circuit structure accesses the secondary circuit structure and through which some circuits within the secondary circuit structure communicate with one another. In some embodiments, the fabric port is a FIFO that temporarily queues data accesses received from circuits of the primary circuit structure.

Additionally, the logic for determining the modifications to the primary or secondary circuit structure is implemented within the user circuit 5150 of the primary circuit structure 5120. The user circuit 5150 can alter the behavior of logic block A 5155, logic block B 5165, logic block C 5170, or other resources of the primary circuit structure by transmitting modified configuration data for these circuits to the configuration controller 5130 as described below. In some embodiments, the user circuit 5150 is a set of configurable circuits configured to act as a soft computational unit. In some embodiments, the soft computational unit performs as a soft-microprocessor that is wholly implemented through logic synthesis. In some embodiments, the user circuit 5150 is a soft computational unit. In some embodiments, the user circuit 5150 is dedicated circuitry that operates in conjunction with sets of configurable circuits that collectively form the primary circuit structure 5120.

The user logic 5120 has access to the monitored events within the secondary circuit structure (e.g., the trace buffer 5160) through the fabric port 5180. In some embodiments, the fabric port 5180 is at a fixed location within the IC 5110. Through a proper configuration of RMUXs within the primary circuit structure, any circuit of the primary circuit structure can be provided access to the fabric port 5180. As such, a soft microprocessor or other logic may be configured anywhere within the primary circuit structure 5120 while still having access to the fabric port 5180.

Each of the controller 5130, trigger circuits 5140, and trace buffer 5160 is accessed through the fabric port 5180. This allows the user circuit 5150 to monitor all signals passed over the communication bitlines 5185. Additionally, this allows the user circuit 5150 to directly communicate with the controller 5130. Through the communications with the controller 5130, the user circuit 5150 is able to pass modified configuration data 5190 that the controller 5130 then encapsulates within the packet 5195 that is routed through the primary circuit structure 5120.

Accordingly, the user circuit 5150 is able to retrieve data from any monitored resource of the primary circuit structure 5120 through the trace buffer 5160 of the secondary circuit structure. The user circuit 5150 may then analyze the data and generate modified configuration data that it can send into the primary circuit structure 5120 through the fabric port 5180. Specifically, the user circuit 5150 passes the modified configuration data to the configuration controller 5130 through the fabric port 5180. The controller 5130 then encapsulates the received data into a packet that is then routed to the appropriate destination tile or circuit in the primary circuit structure through the packet switched pipelined bitlines of the secondary circuit structure. Once received at the intended destination within the primary circuit structure, the configuration data within the packet is then extracted and used to reconfigure one or more circuits at the destination.

Moreover, the user circuit is also able to modify one or more circuits of the secondary circuit structure (e.g., trigger circuits 5140) through the fabric port 5180. For instance, after a user specified triggering event fires from the trigger circuits 5140, the user circuit 5150 may poll for the fired trigger signal through the fabric port 5180 or may poll the contents of the trace buffer 5160 to determine if a flag has been set. In some embodiments, the flag may be set by the trigger circuits 5140 after a triggering event is detected.

From this data, the user circuit 5150 may then supply modified configuration data for circuits of the secondary circuit structure to the configuration controller 5130. The configuration controller 5130 then properly routes the modified configuration data to the appropriate circuit within the secondary circuit structure to cause the circuit to reconfigure. For instance, the modified configuration data may cause the trigger circuits 5140 to reconfigure with a different triggering event to detect.

Figure 56:
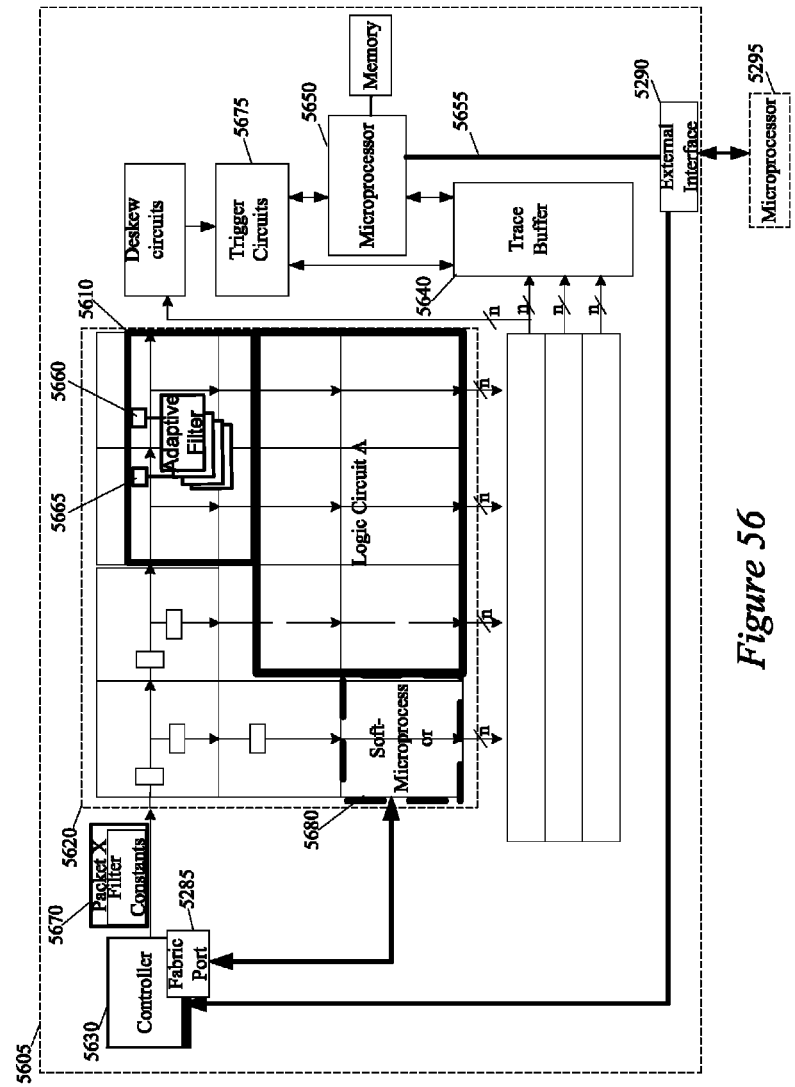
FIG. 56 conceptually illustrates using the overlay functionality of the secondary circuit structure to monitor and modify operations of an adaptive filter implemented in a primary circuit structure of an IC.
Figure 57:
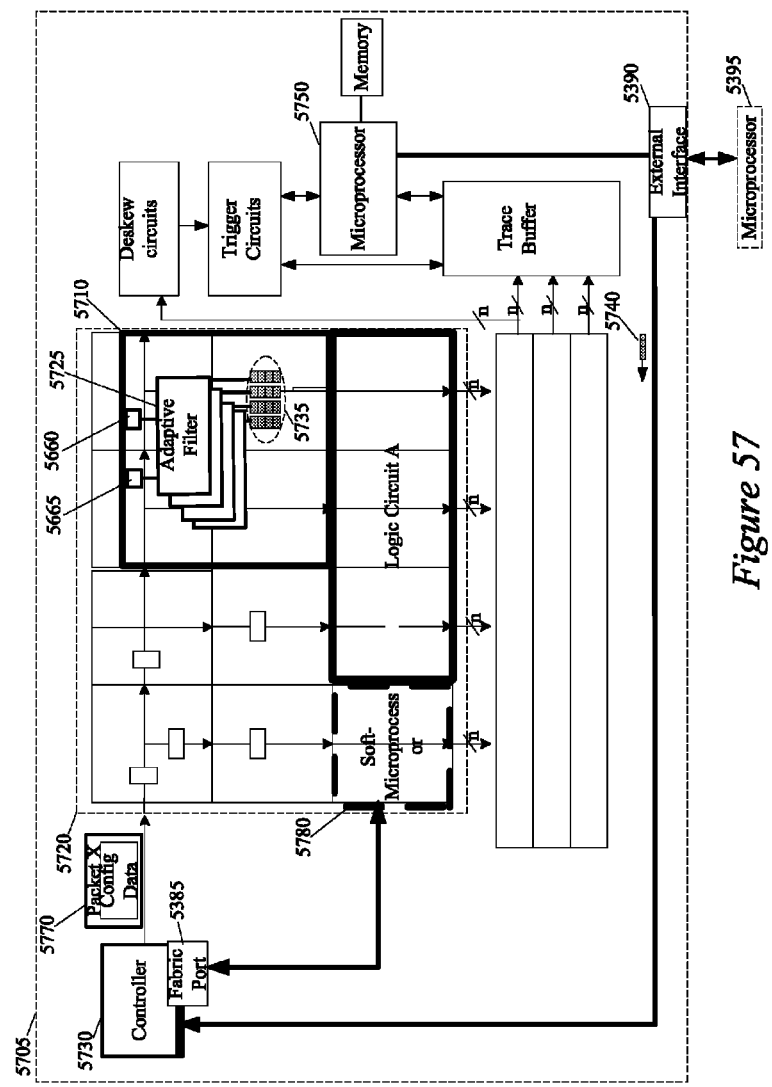
FIG. 57 conceptually illustrates modifying the operation of an adaptive filter by changing the configuration bits that define the operations performed by LUTs of the adaptive filter.
Figure 59:
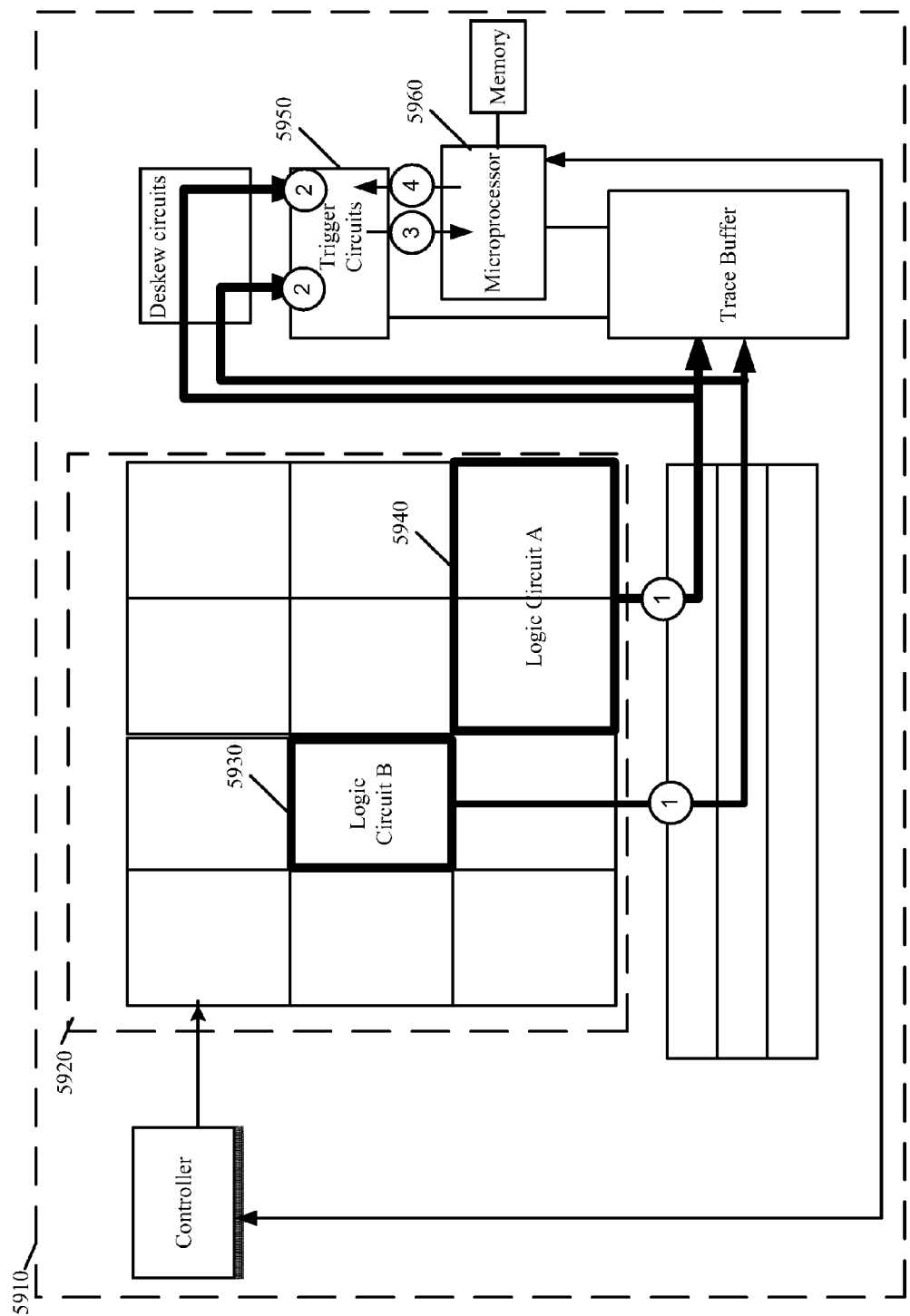
FIG. 59 illustrates a data flow within an IC of some embodiments that illustrates the monitoring of the primary circuit structure using the secondary circuit structure and the modifying of the secondary circuit structure as a result.

It should be apparent to one of ordinary skill in the art that even though the user circuit 5150 and the logic blocks 5155, 5165, and 5170 are illustrated as continuous sets of circuits within the primary circuit structure 5120 that implement a common function, the individual circuits or sets of circuits may be disbursed throughout the primary circuit structure 5120. For example, the user circuit 5150 that implements a soft computational unit may be formed by a set of non-neighboring logic circuits with inputs and outputs that are interconnected through a set of configurable interconnect circuits. However, the user circuit 5150 and the logic blocks 5155, 5165, and 5170 are each pictorially represented as a single functional unit for purposes of simplicity. FIGS. 56, 57, 59, and other preceding and subsequent figures, similarly illustrate user circuits and logic blocks using this simplified representation.

Figure 52:
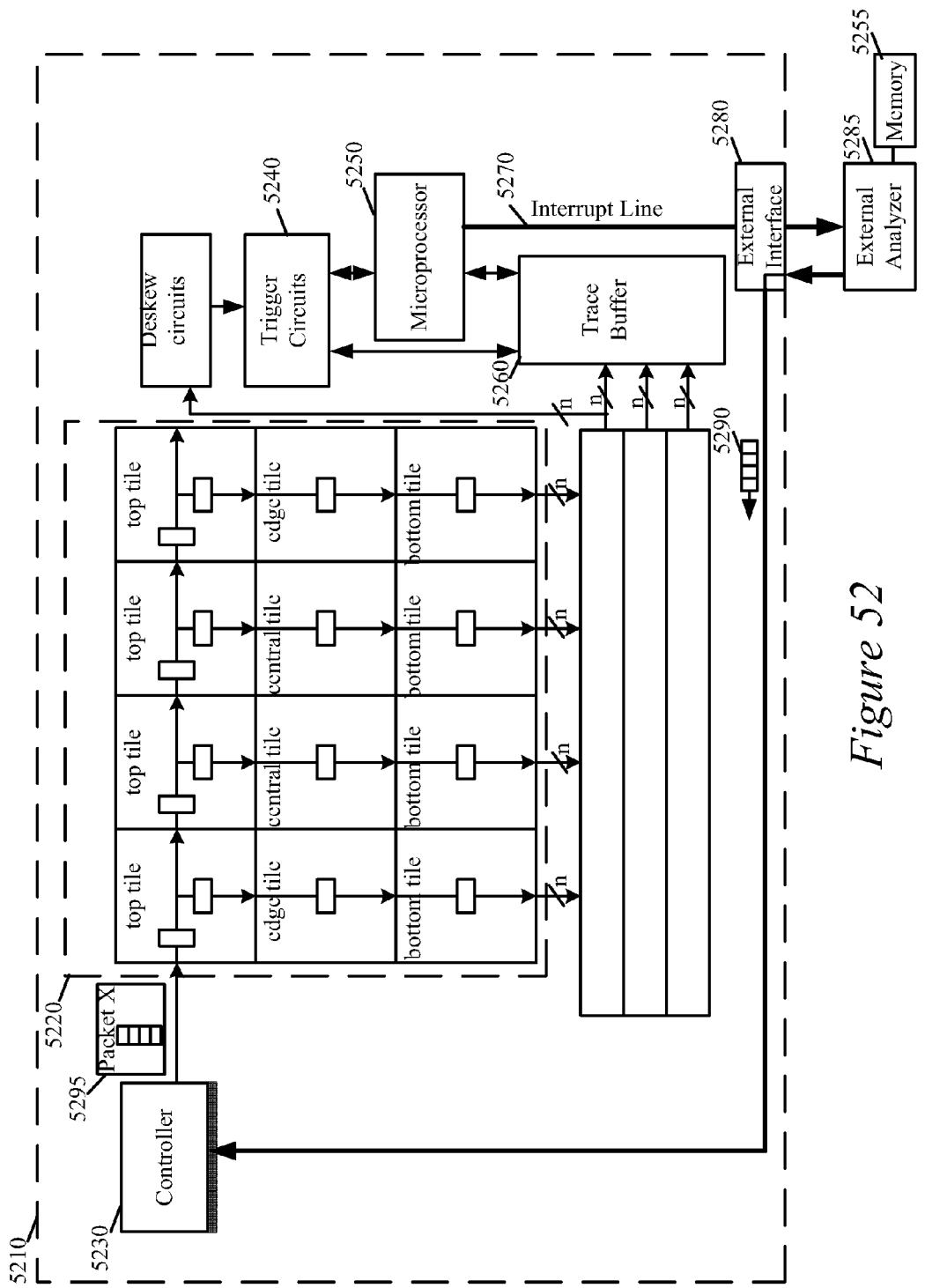

FIG. 52 presents another modified architecture of an IC 5200 for facilitating the monitoring and modifying functionality through the secondary circuit structure. In this figure, an external interface 5280 (e.g., JTAG) is provided into the secondary circuit structure. The external interface 5280 allows the external analyzer 5285 to receive an interrupt raised by the microprocessor 5250 along the interrupt line 5270. The interrupt may include contents of the trace buffer 5260, event counters of the trigger circuits 5240, a trigger signal of the trigger circuits 5240, or other assertion conditions from which the external analyzer determines modifications that should be made to the primary or secondary circuit structures.

The modifications 5290 are then sent through the external interface 5280 to the controller 5230. The controller 5230 encapsulates the modifications into a packet containing new configuration data 5295. The packet is the passed from the controller 5230 into the primary circuit structure 5220 in order to reach and reconfigure the appropriate tile(s) or circuit(s) of the primary circuit structure 5220.

Figure 53:
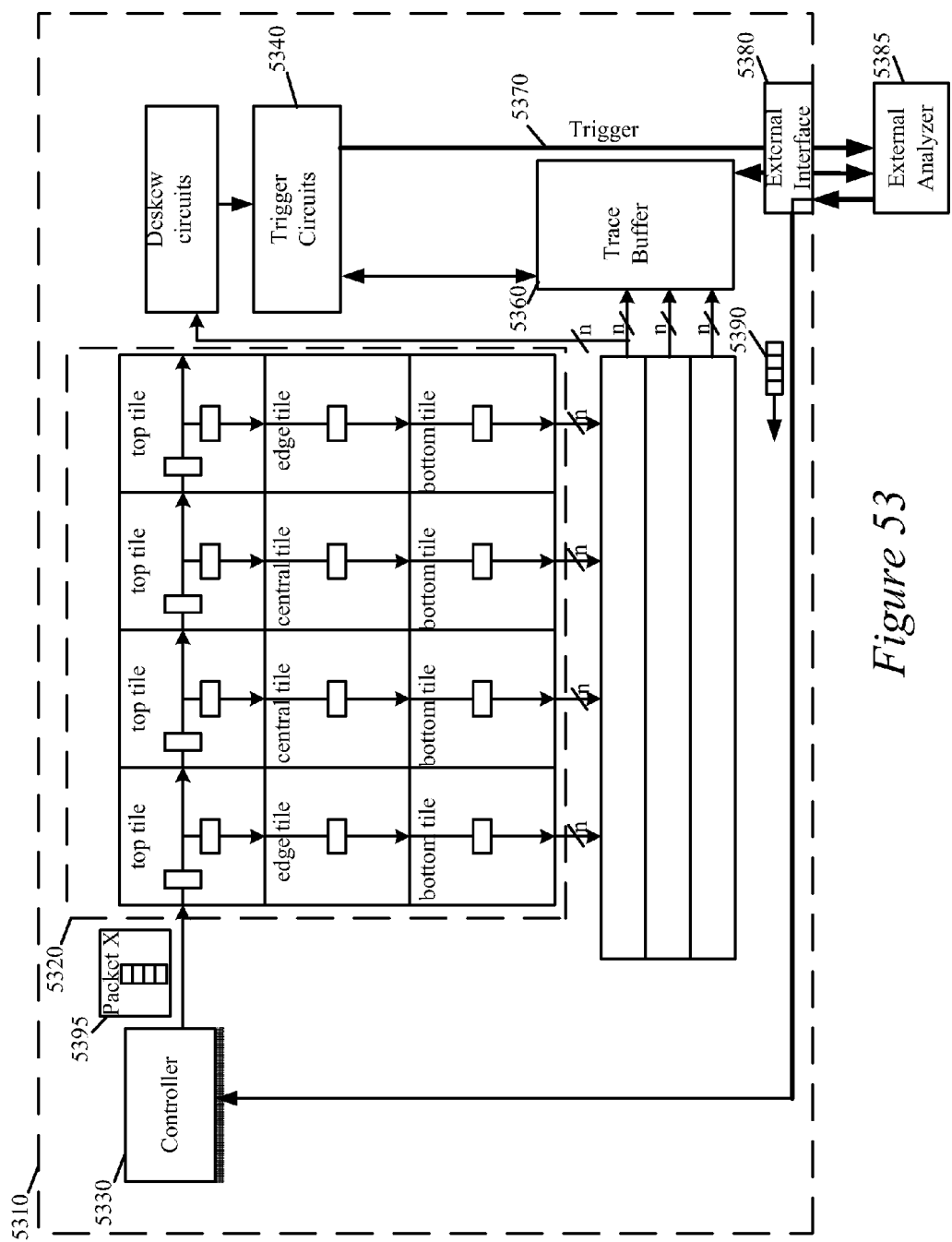

FIG. 53 presents yet another modified architecture of an IC 5300 for facilitating the monitoring and modifying functionality through the secondary circuit structure. In this figure, an external interface 5380 (e.g., JTAG) is provided into the secondary circuit structure. The external interface 5380 allows the external analyzer 5385 to receive a triggering event from the trigger circuits 5340 along the trigger signal 5370. Additionally, the external analyzer 5385 may directly access the trace buffer 5360. As in FIG. 52, the external interface 5380 allows the external analyzer H85 to modify either the primary or secondary circuit structures by passing messages 5390 to the controller 5330.

It should be apparent to one of ordinary skill in the art that even though FIGS. 52 and 53 illustrate the external analyzers 5285 and 5385 as external to the ICs 5210 and 5310, the external analyzers 5285 and 5385 may include components of a single chip (i.e., on-chip) solution whereby the external analyzers 5285 and 5385 are situated within the same physical package as the IC 5210 or 5310. In other words, the external analyzer 5285 may be located in the same System-On-Chip (SoC) or System-In-Package (SiP) solution as the IC 5210. In all such instances, the monitoring is performed by the secondary circuit structure. Similarly, the modification of the primary or secondary circuit structures in response to the monitored events is performed using components of the secondary circuit structure. Both SoC and SiP solutions are further in accordance with some embodiments are described below with reference to FIGS. 70-73.

The subsections below illustrate some real-world applications of the monitoring and modifying overlay functionality of the secondary circuit structure of some embodiments. It should be apparent to one of ordinary skill in the art that the following applications are not comprehensive, but are meant to provide some specific examples of particular usage examples.

b. Monitoring and Modifying Primary circuit structures Usage Example

Some embodiments configure the secondary circuit structure to monitor and adjust values in the primary circuit structure. As noted above, the secondary circuit structure is able to read and write values into any UDS element of the primary circuit structure including time-vias, conduits, or memories (e.g., register files, block memories, etc.). Accordingly, the secondary circuit structure is able to modify the performance of configurable elements within the primary circuit structure and also none configurable elements that depend on one or more UDS elements for inputs or parameters, where the UDS elements are writable. Such overlay functionality is best suited for logical elements that are able to tolerate latencies resulting from the writing of values from the secondary circuit structure to the primary circuit structure.

1. Adaptive Filter

A first example is given to illustrate how some embodiments of the secondary circuit structure monitor and adjust coefficients that control the operating response of one or more logical adaptive filters operating within physical circuits of the primary circuit structure. In some such embodiments, filter coefficients include constant values that are stored in registers.

By modifying these coefficients while the filter in the primary circuit structure is operating, the secondary circuit structure is able to achieve a desired response that tunes the filter in response to actual operating conditions (e.g., eliminate echoes or to achieve a higher signal to noise ratio). A second example is given to illustrate how some embodiments of the secondary circuit structure monitor and adjust the operations of an adaptive filter by modifying the configuration bits that define the filter operations.

An example of an adaptive filter implemented using resources of the primary circuit structure is a finite impulse response (FIR) filter. A FIR filter produces an output, Y, that is the weighted sum of the current and past values of an input, X. The value for the nth sample of Y can be expressed by the following equation (A):

$$Y_n = b_0 X_n + b_1 X_{n-1} + b_2 X_{n-2} + \ldots + b_j X_{n-j} = \sum_{i=0}^{j} b_i X_{n-i} \quad (A)$$

Figure 54:
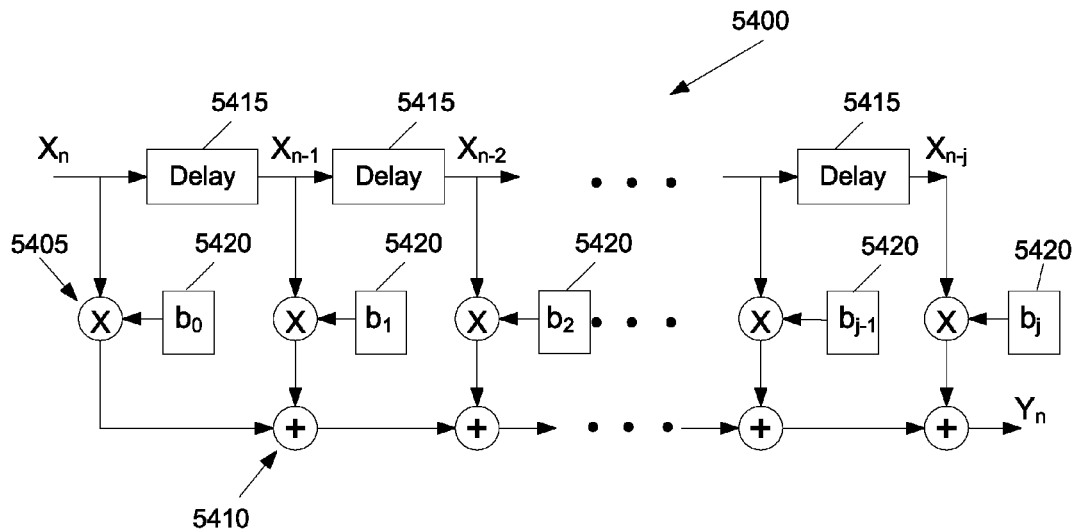
FIG. 54 illustrates the logical structure of a FIR filter

FIG. 54 illustrates the logical structure of a FIR filter 5400 implementing expression (A) above. As shown, the output function $Y_n$ is implemented by utilizing a set of multipliers 5405, a set of adders 5410, a set of UDS elements 5415 storing delays, and a set of UDS elements 5420 storing coefficients of the filter (e.g., the b values in the expression (A) above).

Figure 55:
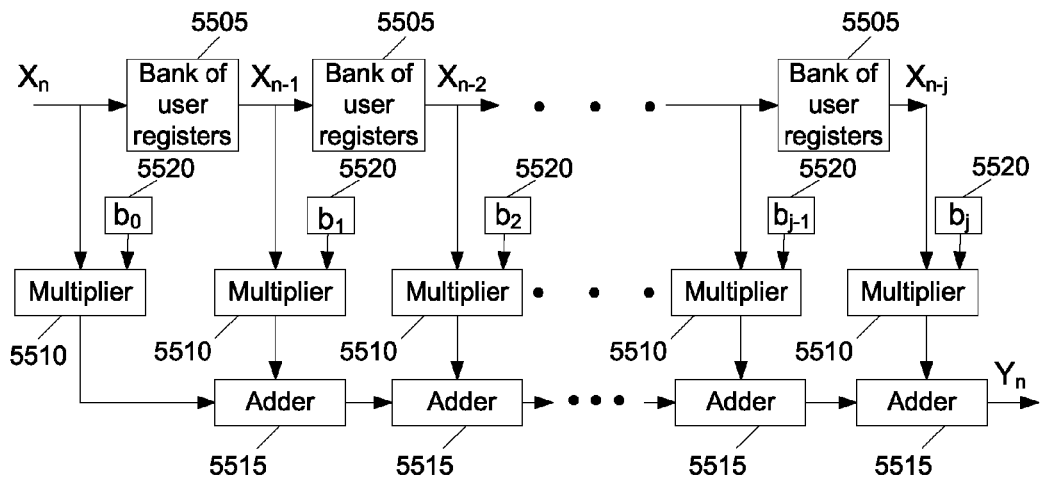
FIG. 55 conceptually illustrates how some embodiments implement the FIR filter of FIG. 54.

FIG. 55 conceptually illustrates how some embodiments implement the FIR filter 5400. As illustrated in FIG. 55, the coefficients for the filter are stored in a set of registers 5520. Additionally, each bank of user registers 5505 holds the value of the input for a period of time to be used in a subsequent calculation. The output $Y_n$ of the FIR filter at a time n is the summation of all delayed samples $(X_{n-j})$ multiplied by the appropriate coefficients $(b_j)$. Note that, if the user design cycle is divided into multiple sub-cycles and the multiplication and additions are not performed in one user design cycle, banks of user registers may be distributed throughout this pipeline to hold the results of operations for the next design cycle.

In some embodiments, the adjustable coefficients change slowly within the primary circuit structure. This allows the secondary circuit structure of some embodiments to monitor and modify the adaptive filter during operation of the primary circuit structure without usurping resources of the primary circuit structure.

In some such embodiments, the secondary circuit structure is configured to read out values associated with the filter. These values may include input values, output values, and current values of the constant coefficients used by the filter. Then, by leveraging the architecture shown in FIG. 50 above, the microprocessor of the secondary circuit structure monitors the performance or operations of the FIR filter. When the microprocessor determines, based on its internal logic, that modifications need to be made to the coefficient constants of the filter, the microprocessor generates new or modified coefficient values to be transmitted over the secondary circuit structure to the filter. The microprocessor passes the coefficient values to the configuration controller. The configuration controller encapsulates the data within a packet that is routed to the UDS elements that store the constants of the filter. The packet causes some or all the constants to be overwritten with the new constant values. This in turn alters the performance of the filter. It should be apparent to one of ordinary skill in the art that similar modifications may be made using the other alternative architectures of FIGS. 51-53 for modifying the primary circuit structure using the secondary circuit structure.

FIG. 56 conceptually illustrates using the overlay functionality of the secondary circuit structure to monitor and modify operations of an adaptive filter 5610 implemented in a primary circuit structure 5620 of an IC 5605. As shown, the IC 5605 includes (1) the primary circuit structure 5620 that implements the adaptive filter 5610 with two UDS elements 5660 and 5665 that store coefficient values for the filter 5610 and (2) the secondary circuit structure with a controller 5630, trace buffer 5640, microprocessor 5650, trigger circuits 5675 that collectively monitor the filter 5610 and modify its behavior by changing the coefficient values stored in the UDS elements 5660 and 5665.

In this figure, the adaptive filter 5610 includes circuitry that filters noise within a given noise range from a signal. A static filter eliminates those portions of the signal falling within the noise range uniformly. However, in some instances, the signal contains pertinent data that also falls within the noise range. Therefore, the adaptive filter 5610 is used to monitor the changes in the signal to determine if a portion of the signal that falls within the noise range should or should not be eliminated. The secondary circuit structure is configured to perform this monitoring.

Specifically, the secondary circuit structure is configured so that the coefficients in the UDS elements 5660 and 5665 and inputs and outputs of the filter 5610 are transmitted and stored in the trace buffer 5640. The secondary circuit structure then utilizes the microprocessor 5650 to analyze performance of the filter 5610. To do so, the microprocessor retrieves data from the trace buffer 5640 to ensure that the filter 5610 is properly adapting to the changes in the signal and thus eliminating only noise from the signal.

When the microprocessor 5650 determines that the adaptive filter 5610 is improperly filtering the signal based on current coefficient values, the microprocessor 5650 updates the coefficient values. To perform the update, the microprocessor 5650 first generates updated values to be used by the filter 5610. These values are then transmitted to the controller 5630 over the bitline 5655. The controller 5630 encapsulates the values within a packet 5670 that is routed through the secondary circuit structure (e.g., the shared bitlines passing through the tiles of the primary circuit structure 5620) to the UDS elements 5660 and 5665. Once received at the UDS elements 5660 and 5665, the updated values within the packet 5670 are written into the UDS elements thus changing subsequent operations performed by the filter 5610.

FIG. 56 also illustrates alternative means by which the writes to the primary may occur. For instance, in some embodiments, the functionality of the microprocessor 5650 is implemented within the user logic of the primary circuit structure as a soft-microprocessor 5680. As described above with reference to FIG. 51, the soft-microprocessor 5680 accesses the secondary circuit structure and transmits to the secondary circuit structure through the fabric port 5685. Alternatively, in some embodiments, the functionality of the microprocessor 5650 is implemented outside the IC 5605 using an external microprocessor 5690 that access the secondary circuit structure and transmits to the secondary circuit structure through the external port 5695 as described above with reference to FIGS. 52 and 53.

Some embodiments provide alternative means by which the secondary circuit structure modifies the operation of the adaptive filter. In some such embodiments, the secondary circuit structure modifies the configuration bits that define the filter. In an FPGA, the adaptive filter may be formed using sets of configurable logic circuits and configurable interconnects that collectively perform the filter functions. The operation of each such logic circuit and interconnect is controlled by one or more configuration bits. Therefore, the secondary circuit structure is able to alternatively modify the behavior and performance of the filter by modifying the configuration bits of the filter.

FIG. 57 conceptually illustrates modifying the operation of an adaptive filter by changing the configuration bits that define the operations performed by the configurable circuits of the filter. In this figure, the adaptive filter 5710 is implemented using several configurable resources 5725 (e.g., configurable logic circuits, interconnects, registers, etc.) of the primary circuit structure 5720. Specifically, the configuration data storage elements 5735 of the resources 5725 are initially configured with configuration data bits that collectively cause the resources 5725 to perform the operations for the filter 5710. Therefore, to modify the functionality of the adaptive filter 5710, some embodiments allow adjustments to be made directly to the configuration bits 5735.

The microprocessor 5750 of the secondary circuit structure generates the modified configuration bits 5740 to send to the configuration controller 5730. The configuration controller 5730 encapsulates the configuration data bits 5740 within one or more configuration frames 5770. The generated frames 5770 then update one or more of the configuration data bits 5735 of the adaptive filter 5710 causing the behavior of the filter to change 5710.

It should be apparent to one of ordinary skill in the art that the modifications may be made using a soft-microprocessor 5780 also implemented in the primary circuit structure through the fabric port 5785 or a SiP or SoC microprocessor 5790 that accesses the secondary circuit structure through the external interface 5795.

c. Monitoring Primary Circuit Structure and Modifying Secondary Circuit Structure 1. Overview In some embodiments, the secondary circuit structure is used to monitor one or more resources of the primary circuit structure and modify configuration or parameters of the secondary circuit structure based on the monitoring of the primary circuit structure. In some embodiments, a modification to the secondary circuit structure includes (1) modifying the configuration of the trigger circuit (e.g., configure with new triggering event), (2) modifying the triggering mode of the trace buffer (e.g., pre-triggering, post-triggering, etc.), (3) modifying values generated within the secondary circuit structure that do not directly modify functionality or configuration of circuits in the primary circuit structure.

Figure 58:
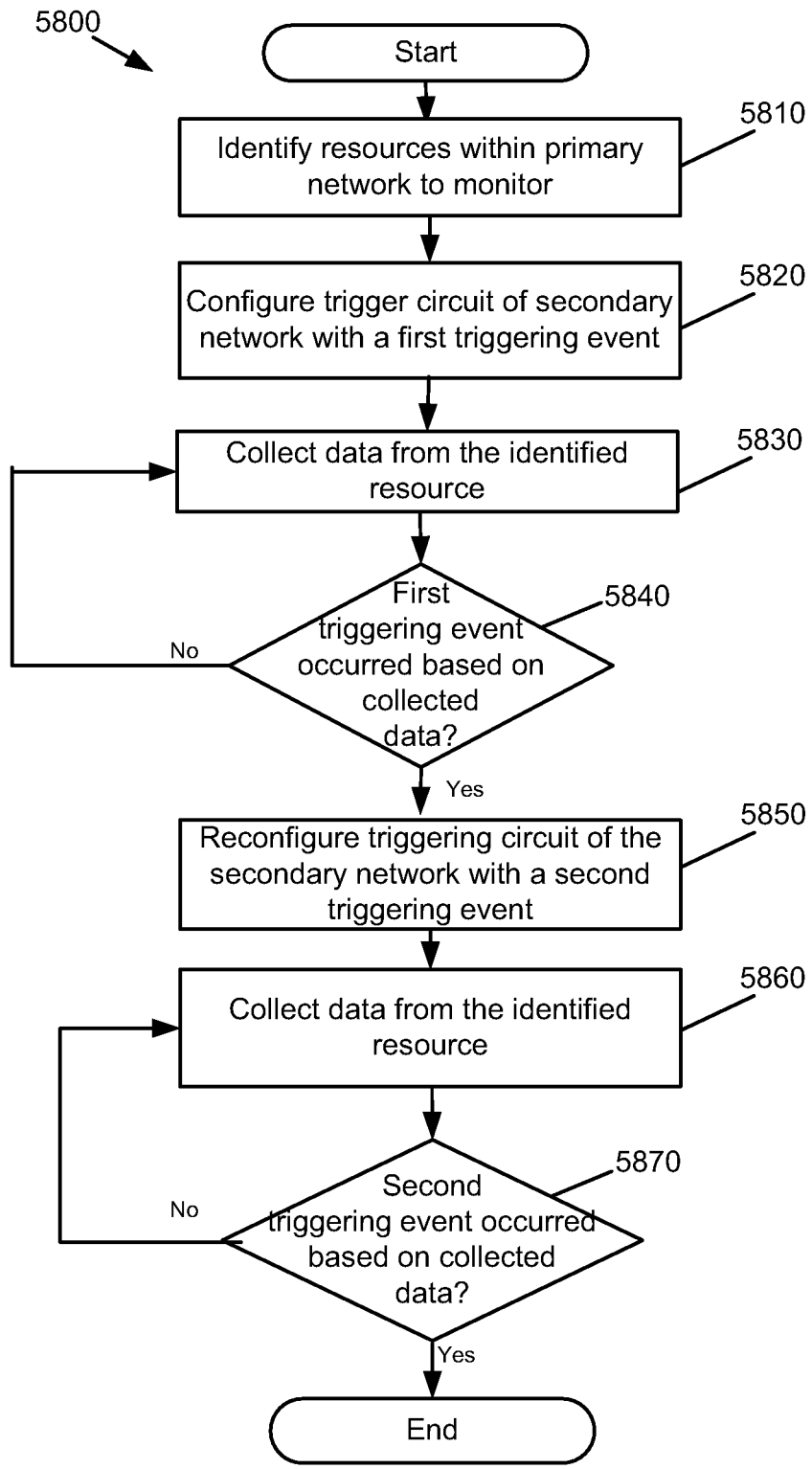
FIG. 58 presents a process performed by the secondary circuit structure for monitoring the primary circuit structure and modifying the secondary circuit structure based on the monitored results.

FIG. 58 presents a process 5800 performed by the secondary circuit structure for monitoring the primary circuit structure and modifying the secondary circuit structure based on the monitored results. Specifically, process 5800 is for modifying a trigger circuit in the secondary circuit structure based on monitoring of the primary circuit structure.

The process 5800 begins by configuring (at 5810) the secondary circuit structure to monitor one or more resources of the primary circuit structure. The process also configures (at 5820) the trigger circuit of the secondary circuit structure with a first triggering event.

Upon operation of the IC, the process collects (at 5830) data from the monitored resource. The process analyzes the collected data and the process determines (at 5840) if the configured triggering event has occurred. When the triggering event has occurred, the process reconfigures (at 5850) the trigger circuit with a second triggering event. The process then continues to collect (at 5860) data until the second triggering event is satisfied (at 5870). When the triggering event has not occurred, the process returns to step 5830 to collect more data in order to determine if the first triggering event is satisfied.

FIG. 59 illustrates a data flow within an IC 5910 of some embodiments that illustrates the monitoring of the primary circuit structure 5920 using the secondary circuit structure and the modifying of the secondary circuit structure as a result. The different stages of the data flow are represented using numerical values within enclosed circles. In this figure, the data flows are conceptually shown. It should be apparent to one of ordinary skill in the art that the data flowing from the logic circuits 5930 and 5940 of the primary circuit structure 5920 to the secondary circuit structure occurs using the pipelined and packet switched methodologies described above in the context of the secondary circuit structure.

The data flow commences data from one or more monitored resources 5930 and 5940 of the primary circuit structure 5920 are transmitted over to the secondary circuit structure. At the second stage, the trigger circuits 5950 analyze the transmitted data and fire the trigger signal to indicate that a triggering event within the trigger circuits 5950 has been satisfied. The microprocessor 5960 receives the firing of the trigger signal and in response reconfigures one or more of the trigger circuits 5950 with a new triggering event.

In some embodiments, modifying of the secondary circuit structure is useful for automated test functionality. In some such embodiments, the secondary circuit structure may test and monitor a circuit or logic block of the primary circuit structure that is under test and adjust the test parameters based on the monitoring. For example, the secondary circuit structure is configured to provide a first set of test parameters to a monitored resource of the primary circuit structure.

The test parameters are passed using the configuration controller over the secondary circuit structure to the appropriate location within the primary circuit structure where the logic block is implemented. The parameters are written into UDS elements that provide inputs to the logic block. As the logic block performs operations based on the delivered set of inputs, the secondary circuit structure (e.g., trigger circuit, trace buffer, microprocessor, etc.) monitor the logic block to see if the test parameters are passing. If they are passing, the secondary circuit structure continues to provide inputs values from the first set of parameters. However if an error is detected, then the secondary circuit structure may reconfigure to provide a second set of parameters as inputs to the logic block.

2. Automatic Test Functionality

Figure 60:
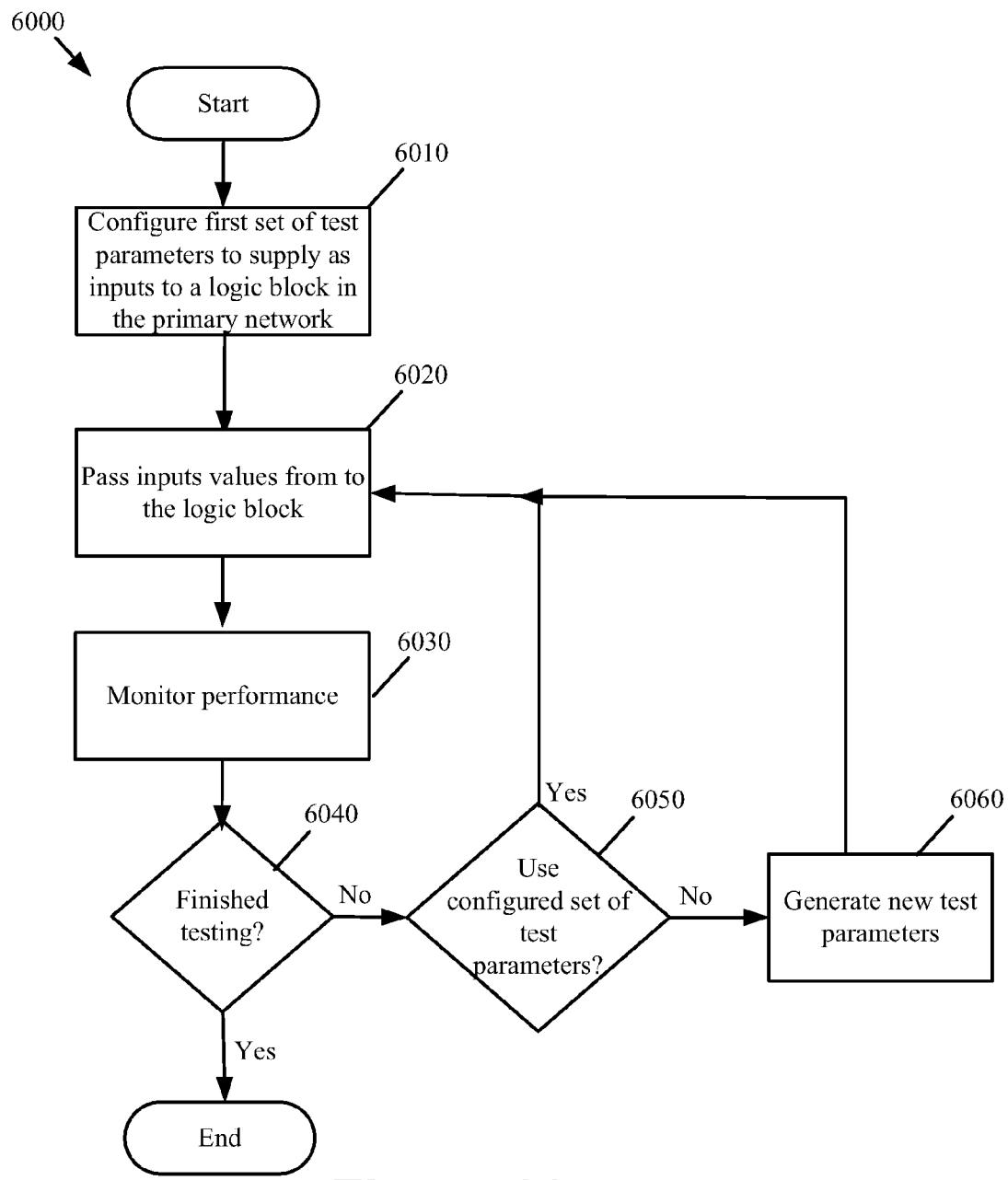
FIG. 60 presents a process performed by the secondary circuit structure to facilitate automatic testing of the primary circuit structure.

FIG. 60 presents a process 6000 performed by the secondary circuit structure to facilitate automatic testing of the primary circuit structure. The process 6000 begins by configuring (at 6010) input parameters as test vectors to supply to a particular logic block in the primary circuit structure. The process then passes a first set of input parameters (at 6020) to the logic block. The process monitors (at 6030) the results and determines (at 6040) whether to continue testing the logic block.

When the test is complete, the process ends. Otherwise, the process determines (at 6050) whether to continue using the configured test parameters based on the output results. When no changes are to be made, the process proceeds to step 6020 and selects the next set of configured test parameters to supply to the inputs of the monitored logic block. Otherwise, the process generates (at 6060) new test parameters to supply as inputs at 6020.

It should be apparent to one of ordinary skill in the art that the process 6000 may be implemented using a trigger circuit, trace buffer, configuration controller, and microprocessor of the secondary circuit structure. Additionally, it should be apparent that other modified architectures of the secondary circuit structure could be used to perform the process 6000. For example, the microprocessor that determines whether to generate new test parameters and that generates the new test parameters is a soft-microprocessor or microprocessor implemented within the primary circuit structure or is an external analyzer.

D. Extending Resources Through Re-Configurability

Some embodiments directly complement the functionality of the primary circuit structure by allowing user logic to extend beyond resources of the primary circuit structure and seamlessly integrate with the resources of the secondary circuit structure. In some embodiments, the secondary circuit structure includes processing units, memory, and standard cells that can be allocated to extend the functionality of the primary circuit structure when such resources within the primary circuit structure have been fully utilized.

In some such embodiments, the secondary circuit structure further includes a configurable routing fabric and retiming circuitry. The retiming circuitry is essential to make operations performed using the secondary circuit structure circuitry synchronous with the one or more clock domains of the primary circuit structure. As the secondary circuit structure is high latency, such overlay functionality is limited to functionality that does not need to continually communicate with other resources in the primary circuit structure and that can tolerate the high latency.

Accordingly, the secondary circuit structure may offload primary circuit structure functionality or introduce functionality to augment the primary circuit structure. Moreover, any requalification of the design only has to be done with on the secondary circuit structure as the primary circuit structure will remain unchanged and will have undergone extensive regression analysis.

In some embodiments, the secondary circuit structure extends the functionality of the primary circuit structure by reconfiguring sections of the primary circuit structure in a modular fashion during the operation of the IC without interfering with the operations of the IC. FIGS. 61-65 illustrate the modular reconfiguration of the primary circuit structure by use of the secondary circuit structure in accordance with some embodiments of the invention.

Figure 61:
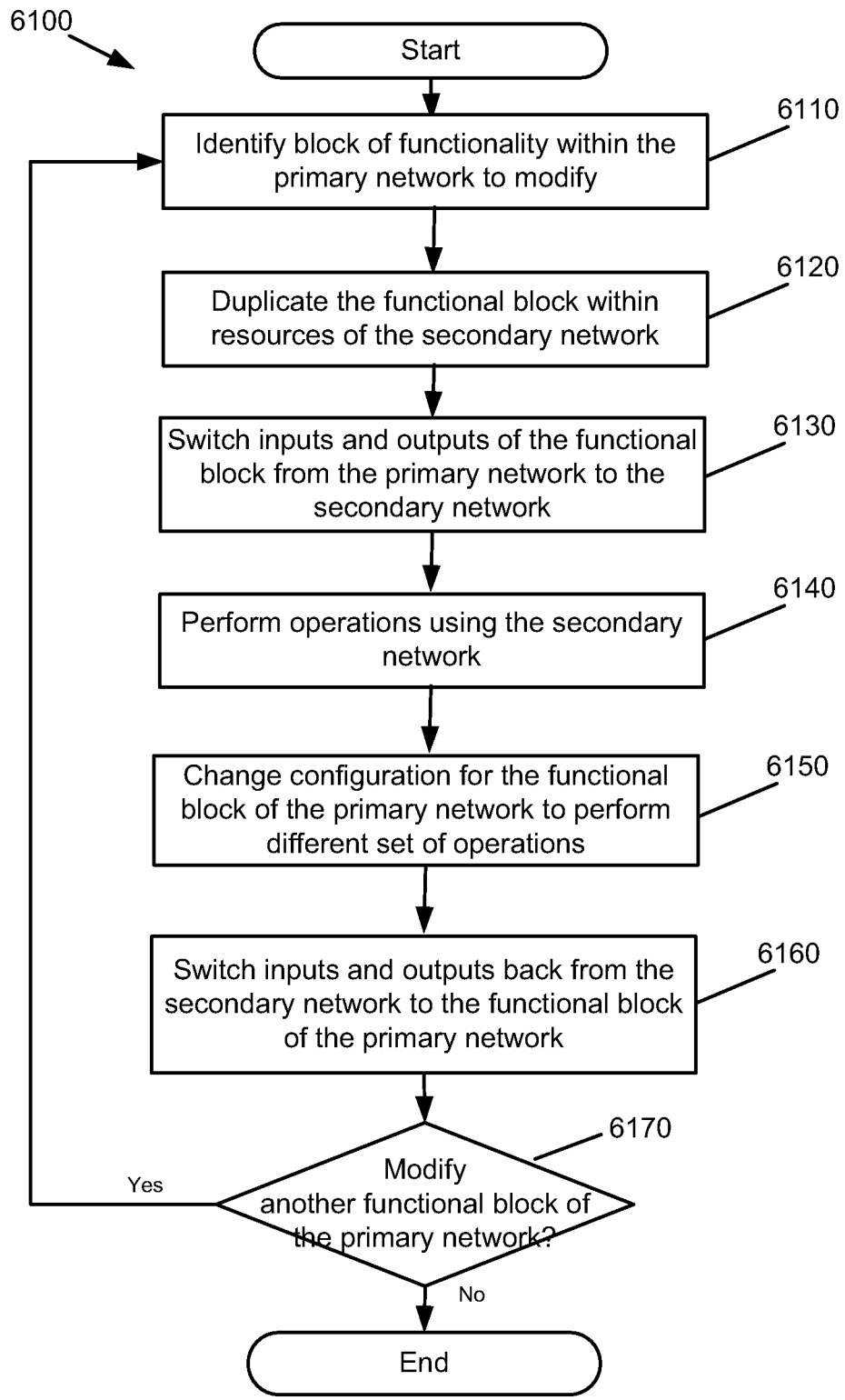
FIG. 61 presents a process for modularly reconfiguring sections of the primary circuit structure.

FIG. 61 presents a process 6100 for modularly reconfiguring sections of the primary circuit structure. Specifically, modular reconfiguring allows the primary circuit structure to reconfigure without halting operations of a system or portions of the system. The process 6100 begins by identifying (at 6110) a block of functionality within the primary circuit structure to modify. The process then duplicates (at 6120) the functionality of the identified block onto resources of the secondary circuit structure. The inputs and outputs to the functional block are switched (at 6130) from the primary circuit structure to the secondary circuit structure. In some embodiments, switching the inputs involves streaming the inputs to both the primary circuit structure and the secondary circuit structure for some interval. When the circuits of the secondary structure are operating as desired, the outputs are then switched so that the secondary circuit structure now transmits its outputs values into the primary circuit structure.

Once switched, the secondary circuit structure performs (at 6140) the operations while the functional block of the primary circuit structure is reconfigured (at 6150) to perform a different set of operations. In this manner, the functional block of the primary circuit structure is able to seamlessly reconfigure without having to halt the operation of the block. Instead, the logic is performed by the secondary circuit structure.

Once reconfigured, the process reverts (at 6160) the inputs and outputs back to the functional block of the primary circuit structure. The functional block then resumes operations with the modified configuration. The secondary circuit structure then determines (at 6170) whether to modify additional functional blocks of the primary circuit structure or to end. In this manner, the secondary circuit structure is able to update portions of the primary circuit structure while only dedicating a minimal set of resources to the secondary circuit structure. Moreover, as the secondary circuit structure traverses the entire primary circuit structure, the secondary circuit structure is able to selectively choose the portions or functional blocks to modify. Such functionality provides an efficient use of limited resources.

It should be apparent to one of ordinary skill in the art that in some embodiments, the secondary circuit structure is limited to updating functional blocks of the primary circuit structure where state changes and thus inputs or outputs change infrequently. Similarly, the secondary circuit structure of some embodiments is limited to modularly reconfiguring sections of the primary circuit structure that perform stateless operations that need not be synchronized with the primary circuit structure.

Figure 62:
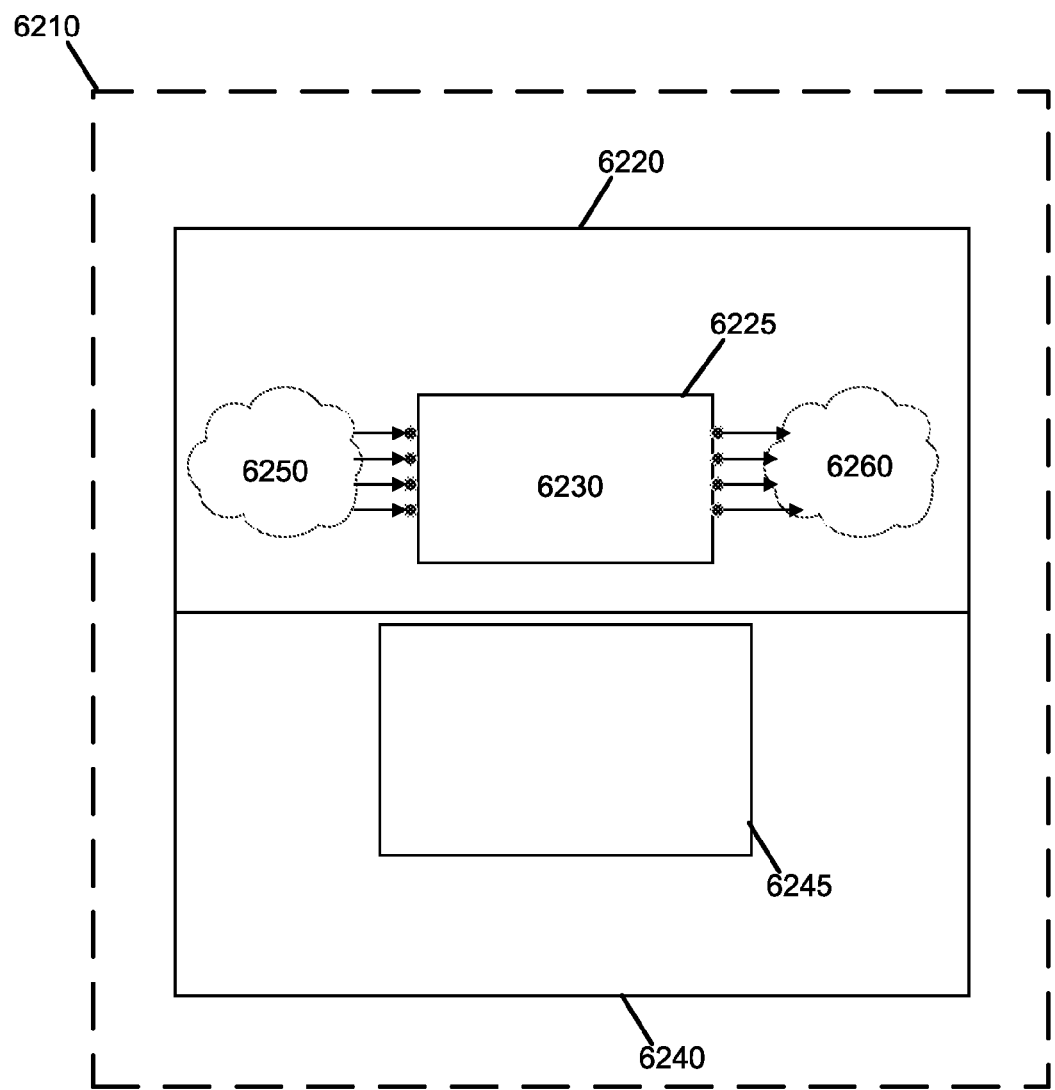
FIG. 62 conceptually illustrates an IC with a primary circuit structure with a functional block that performs a first configuration and a secondary circuit structure that operates in conjunction with or independent of the primary circuit structure.

FIGS. 62-65 conceptually illustrate the modular reconfiguring of sections in accordance with some embodiments. FIG. 62 conceptually illustrates an IC 6210 with a primary circuit structure 6220 with a functional block 6225 that performs a first set of operations based on a first configuration 6230 and a secondary circuit structure 6240 with a set of configurable circuits 6245. In some embodiments, the functional block 6225 includes sets of configurable logic circuits and configurable interconnects that collectively perform the first set of operations based on the first configuration 6230 to produce the first set of outputs 6260.

Figure 63:
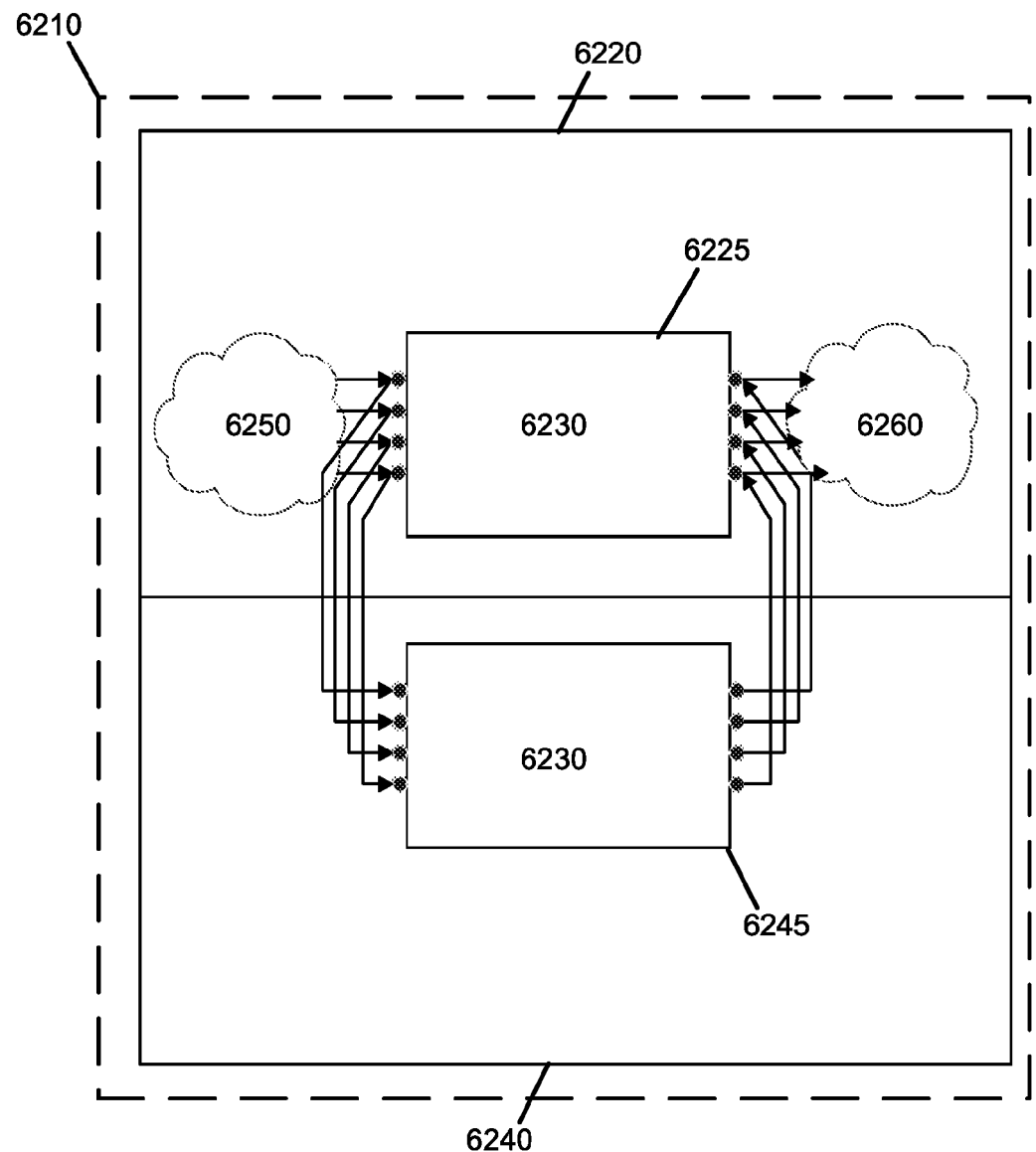
FIG. 63 conceptually illustrates the IC with the secondary circuit structure duplicating the configuration of the functional block of the primary circuit structure.
Figure 64:
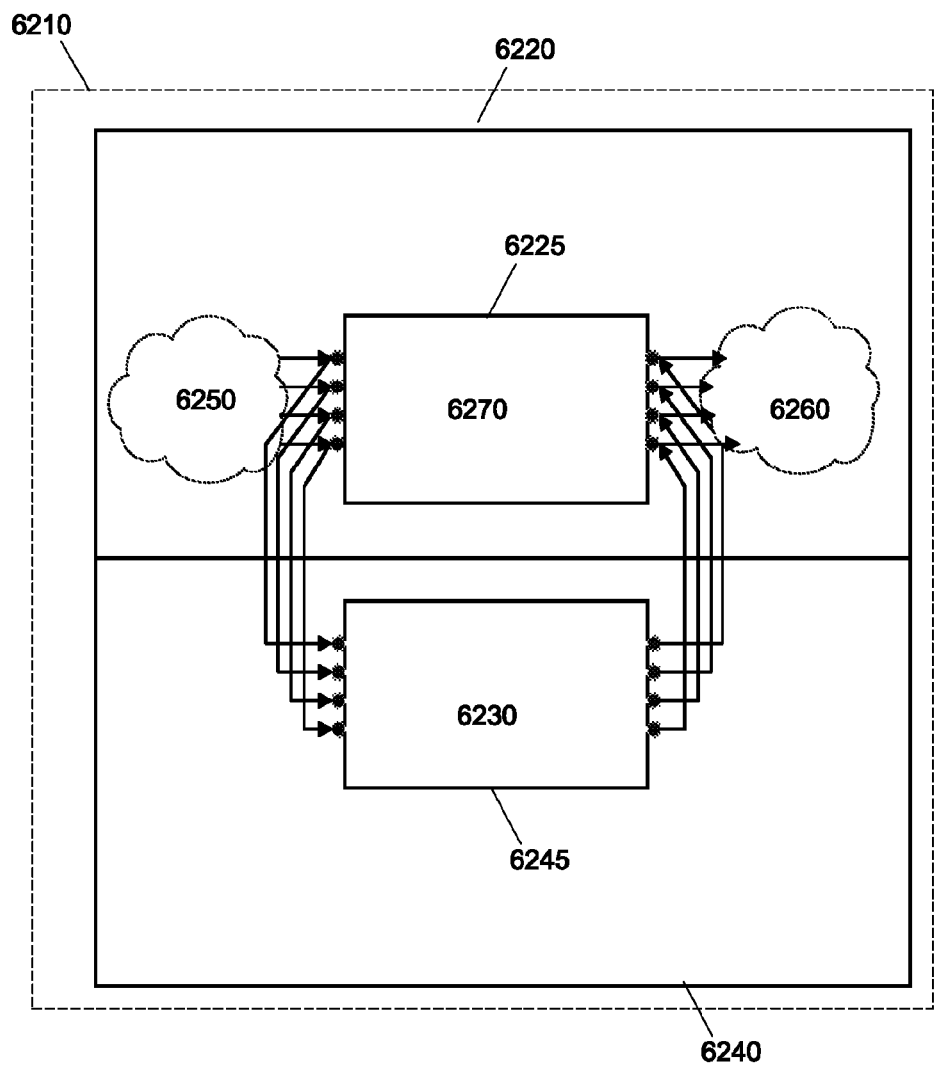
FIG. 64 conceptually illustrates the IC after the secondary circuit structure duplicates the first configuration of the primary circuit structure.

FIG. 63 conceptually illustrates the IC 6210 with the set of configurable circuits 6245 of the secondary circuit structure 6240 duplicating the functionality of the functional block primary circuit structure. 6220. FIG. 64 conceptually illustrates the IC 6210 after the secondary circuit structure 6240 duplicates the first configuration 6230 of the primary circuit structure. The secondary circuit structure 6240 now receives the inputs 6250 and performs the first set of operations based on the first configuration 6230 of the circuits 6245 to produce the first set of outputs 6260 while the functional block 6225 of the primary circuit structure 6220 reconfigures with a second configuration 6270 to perform a second set of operations.

Figure 65:
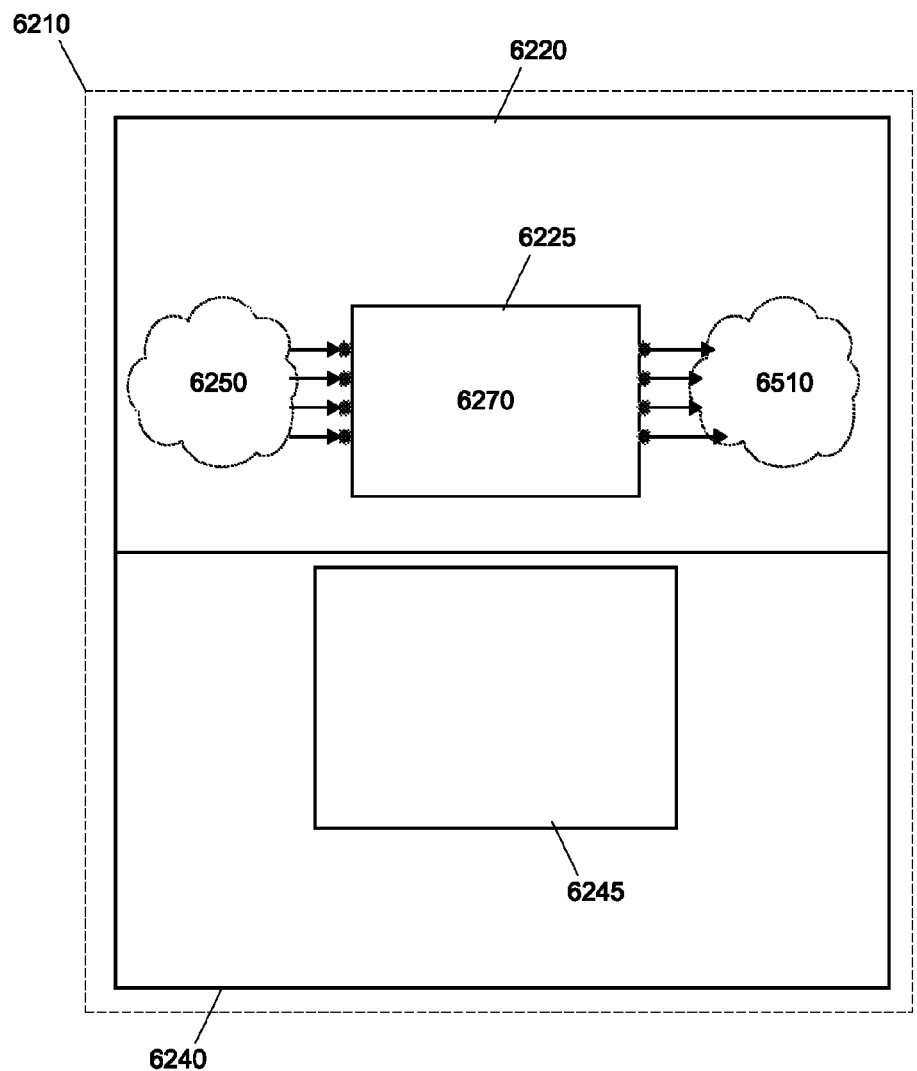
FIG. 65 conceptually illustrates the IC after the functional block of the primary circuit structure is reconfigured with the second configuration.

FIG. 65 conceptually illustrates the IC 6210 after the functional block of the primary circuit structure is reconfigured with the second configuration 6270. The functional block of the primary circuit structure now resumes operations by receiving the inputs 6250 and performing a second set of operations on the inputs 6250 as determined by the second configuration 6270 to produce a new set of outputs 6510. The modular reconfiguration shown in FIGS. 62-65 are seamless and do not interrupt the operation of the chip or system. It should be apparent to one of ordinary skill in the art that the secondary circuit structure may be used to temporarily suspend the operations of other circuit structures (e.g., a third circuit structure) while the other circuit structure reconfigures to perform newer modified operations.

Such functionality of the secondary circuit structure is useful when even minimal downtime to a portion of the IC can lead to data loss. For example, when the logic to be reconfigured is within a packet processing path. Specifically, if the packet processing path includes Voice over IP, Video on Demand, IPTV, or other higher quality of services.

In some embodiments, the secondary circuit structure is utilized to extend resources of a first set of configurable circuits in a primary circuit structure to a second set of configurable circuits in the primary circuit structure. In some such embodiments, the secondary circuit structure operates to configure the second set of configurable circuits and perform a switch of inputs, outputs, or both from the first set of configurable circuits to the second set of configurable circuits such that the functionality in the primary circuit structure is extended.

Figure 66:
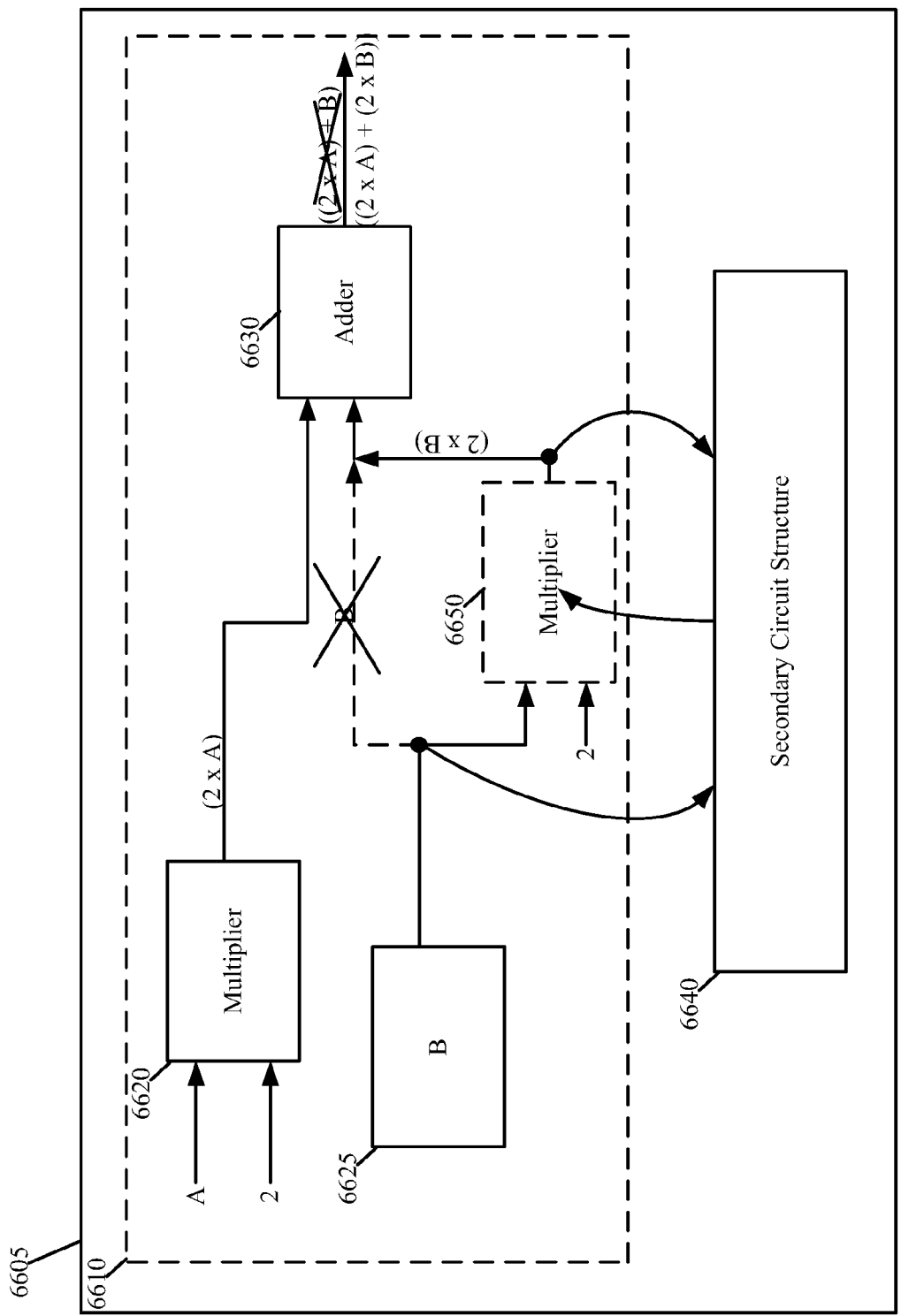
FIG. 66 conceptually illustrates extending functionality from a first set of circuits in the primary circuit structure to a second set of circuits in the primary circuit structure using the secondary circuit structure.

FIG. 66 conceptually illustrates extending functionality from a first set of circuits in the primary circuit structure to a second set of circuits in the primary circuit structure using the secondary circuit structure. As shown, an IC 6605 includes a primary circuit structure 6610 with sets of circuits 6620, 6625, and 6630 that are initially configured to collectively implement a user design for performing the operation "(2×A)+B". Specifically, the set of circuits 6620 implement the "2×A" operation, the set of circuits 6625 provide the B operand, and the set of circuits 6630 receives the outputs of the set of circuits 6620 (i.e., 2×A) as a first input and outputs of the set of circuits 6625 (i.e., the B operand) as a second operand to produce a final output for the "(2×A)+B" operation where the set of circuits 6630 performs an addition operation.

The IC 6605 also includes the secondary circuit structure which is shown as 6640 for purposes of simplicity. However, it should be apparent to one of ordinary skill in the art that any of the above referenced circuit structures in FIGS. 50-53 may be used for the secondary circuit structure 6640. The secondary circuit structure 6640 is used to extend the resources of the primary circuit structure 6610. Specifically, in this figure, the secondary circuit structure 6640 extends the primary circuit structure 6610 by extending the "(2×A)+B" operation performed by the first 6620, second 6625, and third 6630 sets of circuit to instead perform a "(2×A)+(2×B)" operation. The extended operation is performed by using additional configurable logic of the primary circuit structure 6610. Moreover, such extending of the resources occurs without halting operations of the primary circuit structure 6610 or the IC 6605. In this manner, the IC 6605 can thus continue its operations unimpeded until the extended functionality is available. Once the extended functionality is configured (i.e., made available), the secondary circuit structure 6640 need only reroute inputs and outputs such that the extended or modified operation is performed.

To do so, the secondary circuit structure 6610 configures an additional set of circuits 6650 in the primary circuit structure 6640 to complement the functionality of the first 6620, second 6625, and third 6630 sets of circuits. The set of circuits 6650 are thus configured to perform a multiplication operation by receiving the output of the second set of circuits 6625 (i.e., the B operand) as an input and multiplying the input with a constant 2 in order to implement the "2×B" operation.

In many instances, a user design does not consume all available resources of the primary circuit structure 6605. Accordingly, by making use of the unused circuits in the primary circuit structure 6610, the extended functionality may be provided at a later time even after the IC has been deployed or the user design has already been implemented.

Once the secondary circuit structure 6640 has completed the configuration of the circuits 6650, the secondary circuit structure reroutes the outputs of the second set of circuits 6625 to the newly configured set of circuits 6650. The secondary circuit structure 6640 thus modifies one or more RMUXs in the primary circuit structure 6610 to reroute the signals to the new destination.

In some embodiments, the secondary circuit 6640 does not completely switch inputs and/or outputs until the operation of the new set of circuits is verified. Accordingly, for some duration of time, the output signals from the set of circuits 6625 are simultaneously streamed to both the set of circuits 6630 and the set of circuits 6650. During this interval, the sets of circuits 6620-6630 continue to perform the "(2×A)+B" operation while the secondary circuit structure 6640 monitors and analyzes outputs produced by the set of circuits 6650 to ensure that the proper operations are being performed. In some embodiments, the inputs to and outputs from the set of circuits 6650 are transmitted in real-time over the pipelined bitlines to the secondary circuit structure 6650. A trigger circuit or microprocessor may then analyze the signals to determine if the proper operations are being performed.

When the monitoring and analysis is complete, the secondary circuit structure 6640 then performs a final switch of the outputs from the set of circuits 6625 to the set of circuits 6650. The outputs of circuits 6625 will no longer be routed to the circuits 6630. The secondary circuit structure also reconfigures various interconnects in the primary circuit structure 6610 such that outputs of the circuits 6650 are instead routed as the inputs to the circuit 6630. Once the switch is complete, the collective set of circuits 6620, 6625, 6630, and 6650 now perform the modified and extended "(2×A)+(2×B)" operation. As noted above, such transition of operations and addition of circuits to the overall function is performed without halting or impeding the operation of the IC 6605 or other used circuits of the primary circuit structure 6610.

Figure 67:
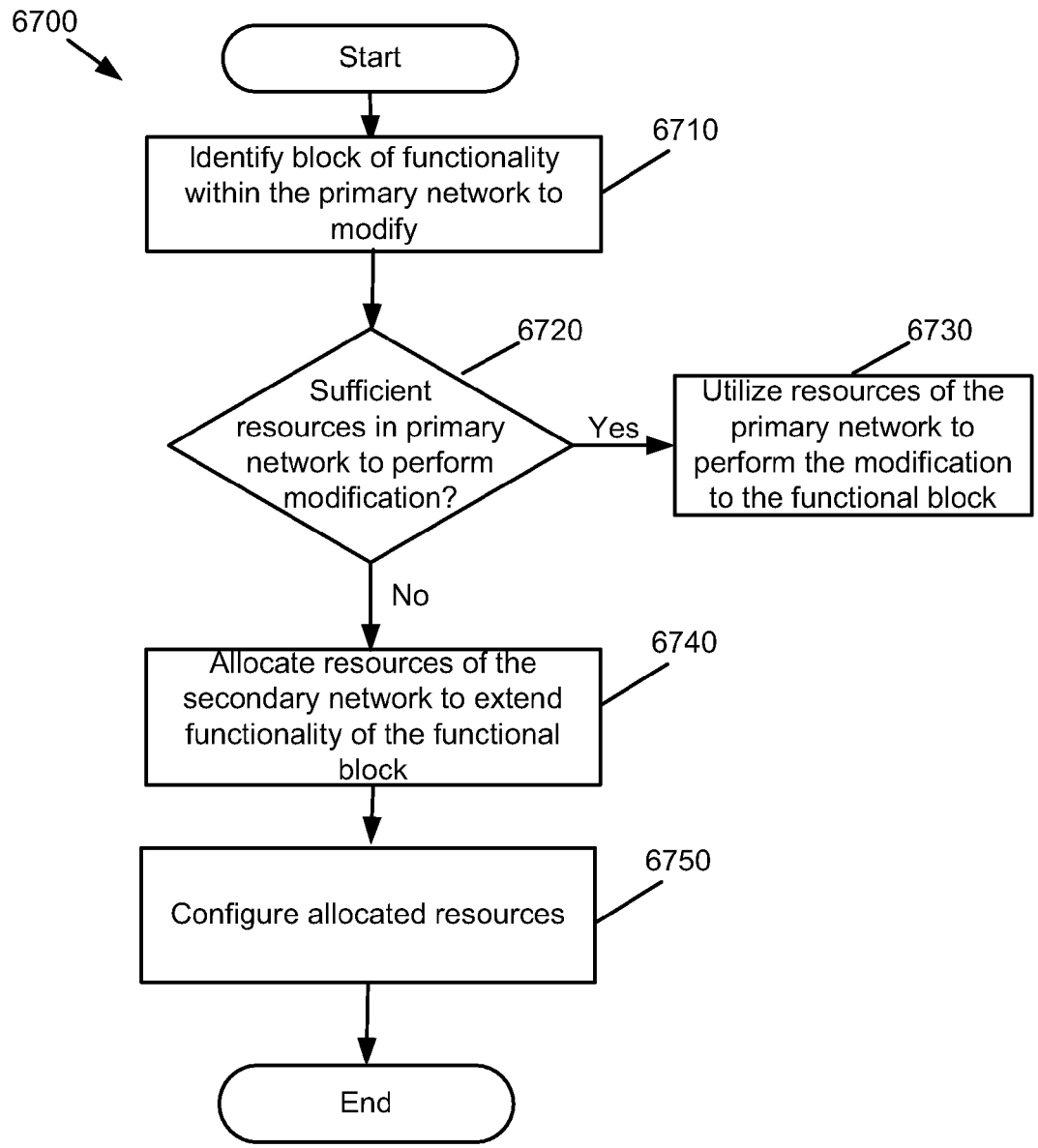
FIG. 67 presents a process performed by the secondary circuit structure of some embodiments to extend the functionality provided by the primary circuit structure.

In some embodiments, the extending resource functionality provided by the secondary circuit structure may also be used to leverage configurable circuits of the secondary circuit structure when the primary circuit structure is fully utilized. FIG. 67 presents a process 6700 performed by the secondary circuit structure of some embodiments to extend the functionality provided by the primary circuit structure.

The process 6700 begins by identifying (at 6710) a modification to a functional block of the primary circuit structure. The process determines (at 6720) whether the modification can be made using available resources of the primary circuit structure. In some embodiments, the determination at 6720 is based on whether there are sufficient available resources. In other embodiments the determination at 6720 is based on whether the modification would significantly impact the existing configuration in the primary circuit structure. For example, even though sufficient available resources exist, performing the modification may require altering the routing and thus timing of the other unrelated functional blocks of the primary circuit structure.

Therefore, if the process determines that the modification can be made using available resources of the primary circuit structure, then the modifications are made (at 6730) without invoking the secondary circuit structure. Such modification are made as described above with reference to FIG. 66. However, if the process determines that the modification cannot be made using the available resources of the primary circuit structure, then the process allocates (6740) resources of the secondary circuit structure to extend the functionality of the functional block of the primary circuit structure. The secondary circuit structure resources are then configured (at 6750) to operate in conjunction with the functional block of the primary circuit structure. In some embodiments, this configuration includes routing outputs from the functional block to the secondary circuit structure where the additional processing of the outputs occurs. Once configured, the modifications are complete and the process terminates. As noted above, in some embodiments, such functionality is available when extending the functionality for stateless functional blocks of the primary circuit structure or for functional blocks where state changes occur in an asynchronous manner It should be apparent to one of ordinary skill in the art that the process 6700 may be used to perform different variations of the above described extending of primary circuit structure resources. For instance, the secondary circuit structure may be used to temporarily map a logic function from a first set of circuits in the primary circuit structure to a second set of circuits in the primary circuit structure to allow the first set of circuits to reconfigure to perform a different set of operations. Such functionality is conceptually illustrated in FIGS. 68 and 69. Moreover, it should be apparent to one of ordinary skill in the art that such functionality is implemented in conjunction with the functionality described in FIGS. 50-53 above.

Figure 68:
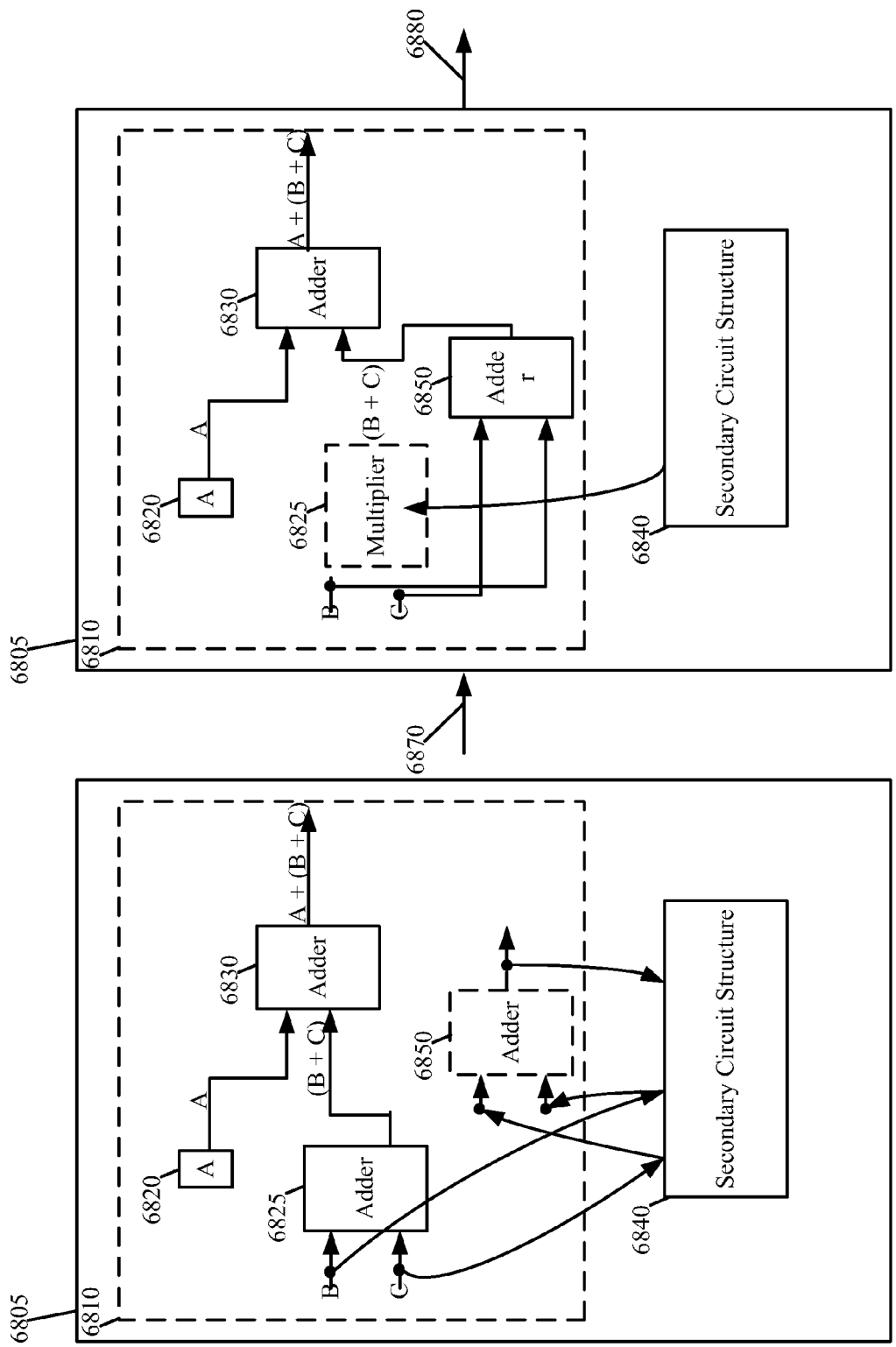
FIGS. 68 and 69 conceptually illustrate the secondary circuit structure temporarily mapping a logic function from a first set of circuits in the primary circuit structure to a second set of circuits in the primary circuit structure to allow the first set of circuits to reconfigure to perform a different set of operations.

FIG. 68 illustrates a first configuration of an IC 6805. The 6805 includes a primary circuit structure 6810 that is configured to perform the operation "A+(B+C)" using a first set of circuits 6820 configured to provide the A operand, a second set of circuits 6825 configured to perform the "(B+C)" functionality, and a third set of circuits 6830 configured to produce the final result by adding the outputs of the first 6820 and 6825 second sets of circuits.

In this configuration, a user may desire to modify the operation or configuration of the primary circuit structure 6805. To simplify the discussion, it is assumed that the user desires to modify the "A+(B+C)" operation to instead perform "A+(B×C)" without impeding a current operation of the IC 6805. Therefore, the secondary circuit structure 6840 monitors the inputs and configuration of the set of circuits 6825 in order to replicate the functionality (e.g., addition) at an unused set of circuits 6850 of the primary circuit structure 6810.

The secondary circuit structure 6840 then monitors the newly configured set of circuits 6850 to verify that the functionality is correctly performed. As noted above, such verification may be made based on comparisons of the monitored outputs of the set of circuits 6850 and the monitored outputs of the set of circuits 6825. When desired, the secondary circuit structure 6840 may then switch the operation performed by the set of circuits 6825 to the set of circuits 6850. In some embodiments, such switching involves the reconfiguring of various RMUXs that provide the inputs and outputs. As shown at the reconfiguration step 6870 which shows the transition from a first configuration of the primary circuit structure to a second configuration, the switched configuration continues to perform the "A+(B+C)" operation while the secondary circuit structure 6840 reconfigures the set of circuits 6825 to perform the new functionality (e.g., multiplication).

Figure 69:
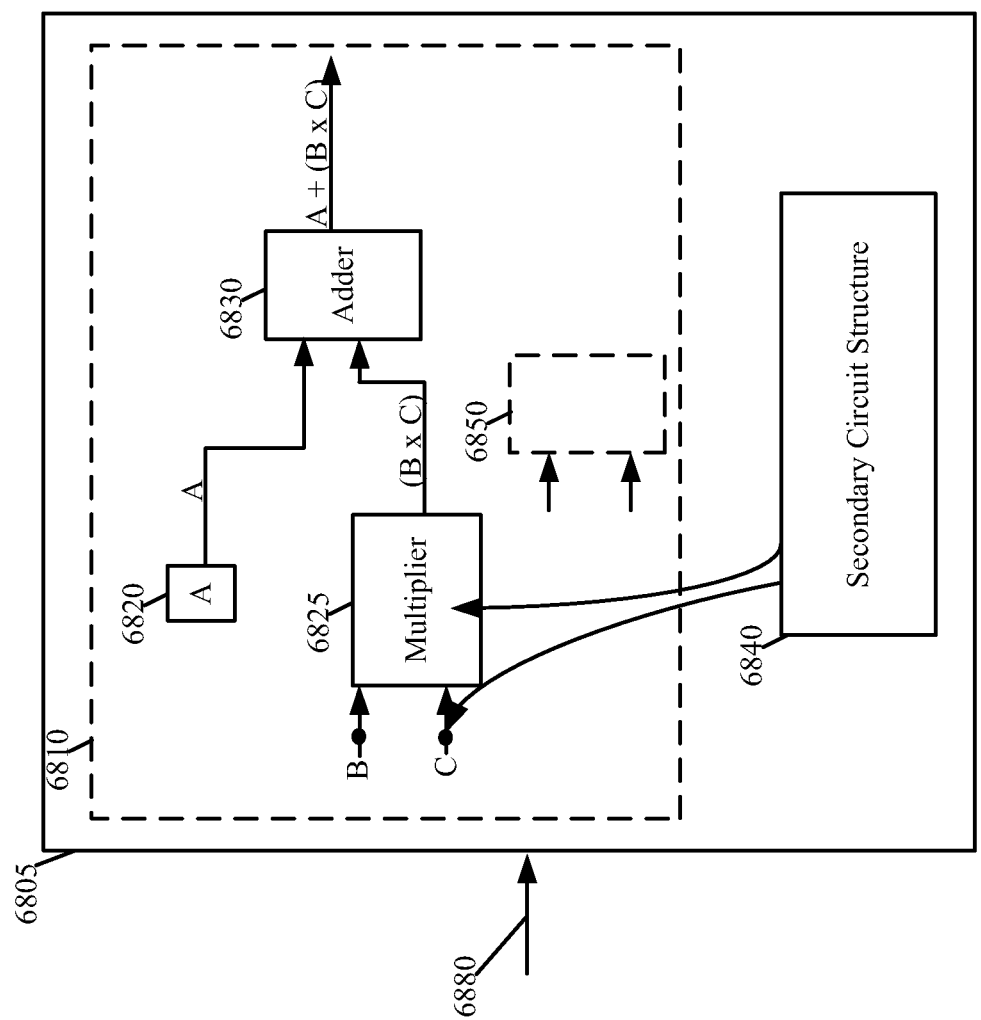

Once the set of circuits 6825 have been reconfigured and the outputs verified, the secondary circuit structure 6840 may then remap the inputs and outputs from the set of circuits 6850 back to the reconfigured set of circuits 6825 such that the new desired functionality is performed. This reconfiguration step is shown as the transition 6880 to the configuration presented in FIG. 69. As shown in FIG. 69, the set of circuits 6820, 6825, and 6830 now collectively perform the "A+(B×C)" operation without having to halt or impede the operation of the IC while such reconfiguration occurs (e.g., transitions 6870 and 6880).

IV. Configurable IC and System

Figure 70:
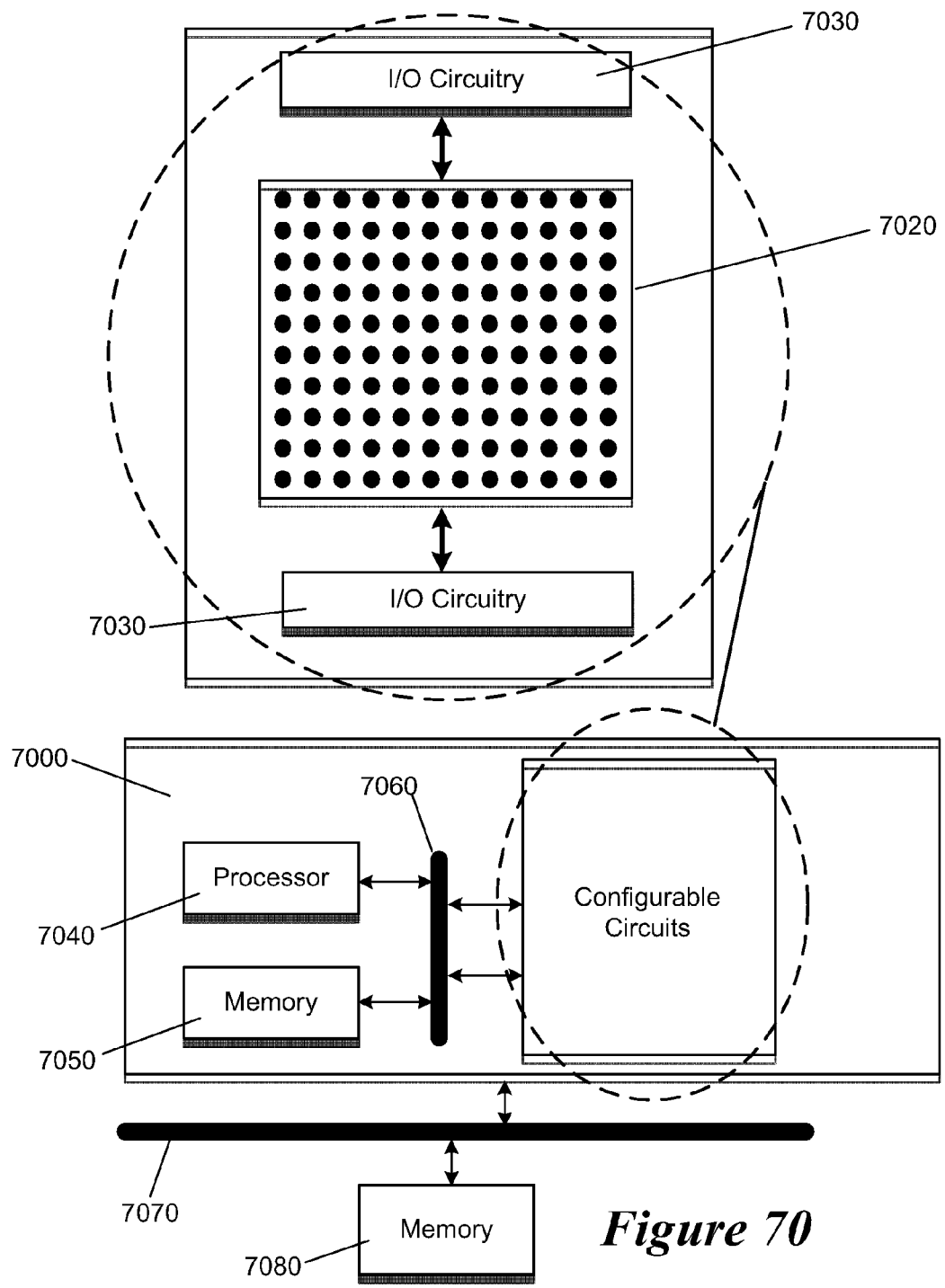
FIG. 70 illustrates a system on a chip IC of some embodiments.

Some embodiments described above are implemented in electronic devices with one or more configurable ICs that can compute configurable combinational digital logic functions on signals that are presented on the inputs of the configurable ICs. A configurable IC of the invention can also include circuits other than a configurable circuit arrangement and I/O circuitry. For instance, FIG. 70 illustrates a system on chip (SOC) embodiment of a configurable IC 7000. This IC has a configurable block 7010, which includes a configurable circuit arrangement 7020 and I/O circuitry 7030 for this arrangement. It also includes a processor 7040 outside of the configurable circuit arrangement, a memory 7050, and a bus 7060, which conceptually represents all conductive paths between the processor 7040, memory 7050, and the configurable block 7010. As shown in FIG. 70, the IC 7000 couples to a bus 7070, which communicatively couples the IC to other circuits, such as an off-chip memory 7080. Bus 7070 conceptually represents all conductive paths between the system components.

This processor 7040 can read and write instructions and/or data from an on-chip memory 7050 or an offchip memory 7080. The offchip memory 7080 can be non-volatile (e.g., flash memory) that stores the configuration data, which is then loaded onto the IC at power up. The on-chip memory 7050 can also be non-volatile to store the configuration data to load onto the IC at power up. The processor 7040 can also communicate with the configurable block 7010 through memory 7050 and/or 7070 through buses 7010 and/or 7030. Similarly, the configurable block can retrieve data from and supply data to memories 7020 and 7025 through buses 7010 and 7070.

Figure 71:
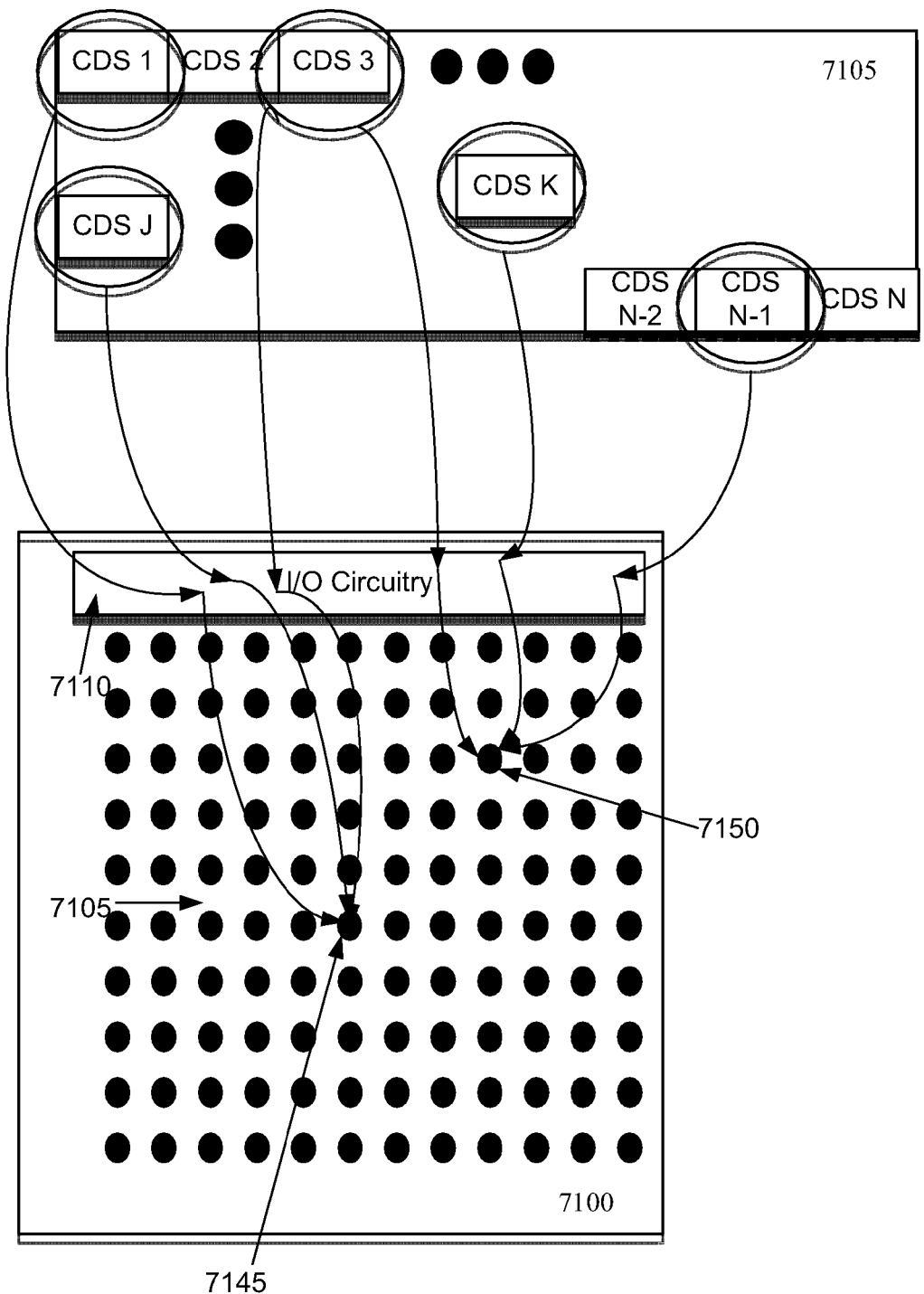
FIG. 71 illustrates the transfer of configuration data from the data pool to the configurable circuits of the IC of some embodiments.

The data also includes in some embodiments configuration data that configure the nodes to perform particular operations. FIG. 71 illustrates a more detailed example of this. Specifically, this figure illustrates a configuration data pool 7105 for the configurable IC 7000. This pool includes N configuration data sets (CDS). As shown in FIG. 71, the input/output circuitry 7010 of the configurable IC 7000 routes different configuration data sets to different configurable nodes of the IC 7000. For instance, FIG. 71 illustrates configurable node 7145 receiving configuration data sets 1, 3, and J through the I/O circuitry, while configurable node 7150 receives configuration data sets 3, K, and N-1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 72:
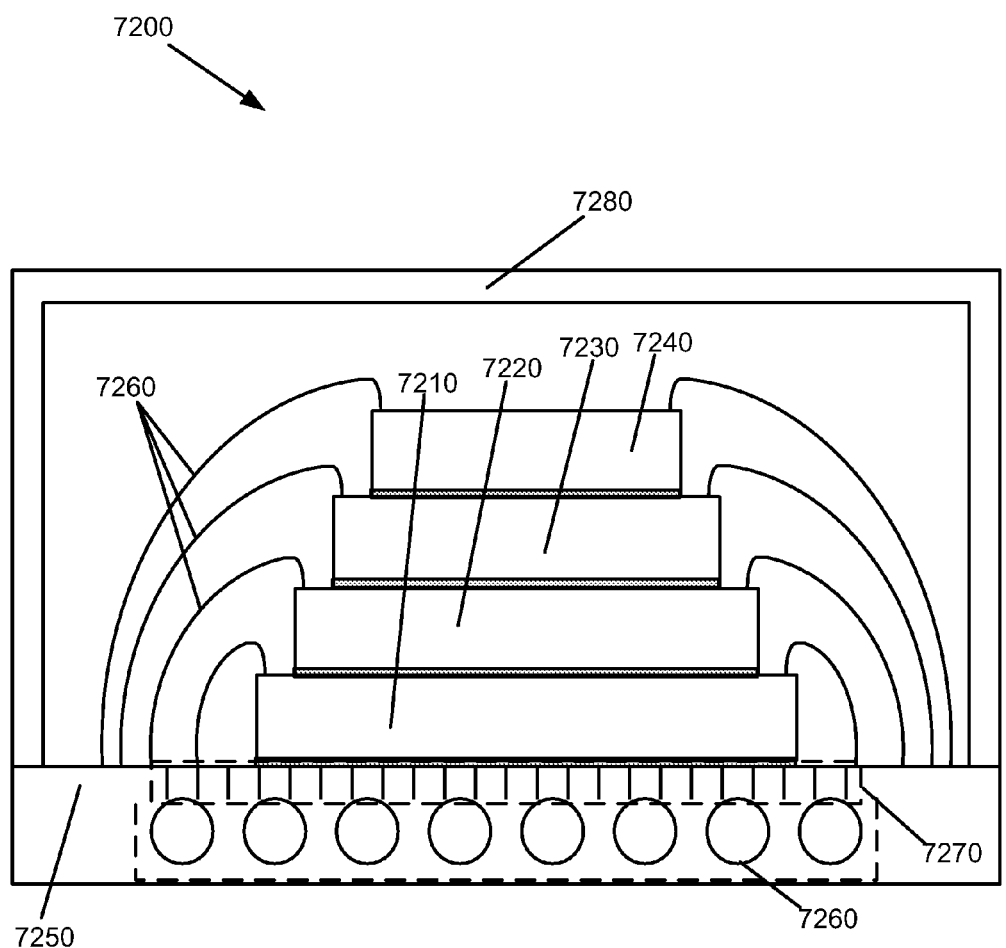
FIG. 72 illustrates a system in a package IC of some embodiments.

Instead of, or in conjunction with, the SOC embodiment for a configurable IC, some embodiments might employ a system in package (SIP) embodiment for a configurable IC. FIG. 72 illustrates one such SIP 7200. As shown in this figure, SIP 7200 includes four ICs 7210, 7220, 7230, and 7240 that are stacked on top of each other on a substrate 7250. At least one of these ICs is a configurable IC that includes a configurable block, such as the configurable block 7010 of FIG. 71. Other ICs might be other circuits, such as processors, memory, etc.

As shown in FIG. 72, the IC communicatively connects to the substrate 7250 (e.g., through wire bondings 7260). These wire bondings allow the ICs 7210-7240 to communicate with each other without having to go outside of the SIP 7200. In some embodiments, the ICs 7210-7240 might be directly wire-bonded to each other in order to facilitate communication between these ICs. Instead of, or in conjunction with the wire bondings, some embodiments might use other mechanisms to communicatively couple the ICs 7210-7240 to each other.

As further shown in FIG. 72, the SIP includes a ball grid array ("BGA") 7260 and a set of vias 7270. The BGA 7260 is a set of solder balls that allows the SIP 7200 to be attached to a printed circuit board ("PCB"). Each via connects a solder ball in the BGA 7260 on the bottom of the substrate 7250, to a conductor on the top of the substrate.

The conductors on the top of the substrate 7250 are electrically coupled to the ICs 7210-7240 through the wire bondings. Accordingly, the ICs 7210-7240 can send and receive signals to and from circuits outside of the SIP 7200 through the wire bondings, the conductors on the top of the substrate 7250, the set of vias 7270, and the BGA 7260. Instead of a BGA, other embodiments might employ other structures (e.g., a pin grid array) to connect a SIP to circuits outside of the SIP. As shown in FIG. 72, a housing 7280 encapsulates the substrate 7250, the BGA 7260, the set of vias 7270, the ICs 7210-7240, the wire bondings to form the SIP 7200. This and other SIP structures are further described in U.S. patent application Ser. No. 11/081,820 entitled "Method For Manufacturing A Programmable System In Package", now issued as U.S. Pat. No. 7,530,044.

It should be apparent to one of ordinary skill in the art that the IC of some embodiments is not limited to a primary circuit structure or a secondary circuit structure of only configurable circuits. The secondary circuit structure of some embodiments may be used as a single chip solution with any primary circuit structure of a single IC. Accordingly, the primary circuit structure of some embodiments includes a Field Programmable Gate Arrays ("FPGAs"), any ASIC, fixed microprocessor, or other such circuit implementation. Moreover, it should be apparent that the primary circuit structure may include sets of configurable circuits in conjunction with other dedicated circuitry (e.g., microprocessor).

Many of the above-described components implement some or all the above described functionality through software processes that are specified as a set of instructions recorded on a machine readable medium (also referred to as computer readable medium). When these instructions are executed by one or more computational element(s) (such as processors or other computational elements like application specific ICs (ASICs) and field programmable gate arrays (FPGAs)), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 73:
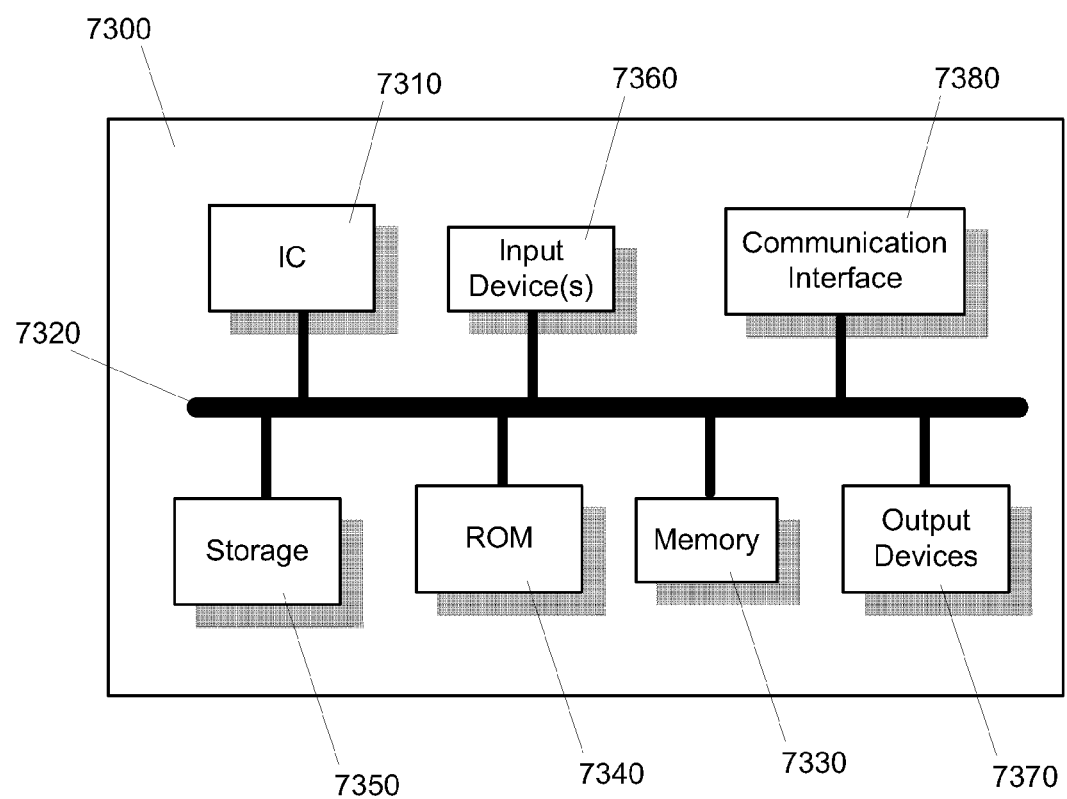
FIG. 73 illustrates a computer system of some embodiments.

FIG. 73 illustrates a computer system with which some embodiments of the invention are implemented. Such a computer system includes various types of computer readable mediums and interfaces for various other types of computer readable mediums. Computer system 7300 includes a bus 7305, a processor 7310, a system memory 7315, a read-only memory 7320, a permanent storage device 7325, input devices 7330, and output devices 7335.

The bus 7305 collectively represents all system, peripheral, and chipset buses that communicatively connect the numerous internal devices of the computer system 7300. For instance, the bus 7305 communicatively connects the processor 7310 with the read-only memory 7320, the system memory 7315, and the permanent storage device 7325. From these various memory units, the processor 7310 retrieves instructions to execute and data to process in order to execute the processes of the invention.

The read-only-memory (ROM) 7320 stores static data and instructions that are needed by the processor 7310 and other modules of the computer system. The permanent storage device 7325, on the other hand, is a read-and-write memory device. This device is a non-volatile memory unit that stores instructions and data even when the computer system 7300 is off. Some embodiments of the invention use a mass-storage device (such as a magnetic or optical disk and its corresponding disk drive) as the permanent storage device 7325.

Other embodiments use a removable storage device (such as a floppy disk, flash drive, or ZIP® disk, and its corresponding disk drive) as the permanent storage device. Like the permanent storage device 7325, the system memory 7315 is a read-and-write memory device. However, unlike storage device 7325, the system memory is a volatile read-and-write memory, such a random access memory (RAM). The system memory stores some of the instructions and data that the processor needs at runtime. In some embodiments, the invention's processes are stored in the system memory 7315, the permanent storage device 7325, and/or the read-only memory 7320.

The bus 7305 also connects to the input and output devices 7330 and 7335. The input devices enable the user to communicate information and select commands to the computer system. The input devices 7330 include alphanumeric keyboards and pointing devices (also called "cursor control devices"). The input devices 7330 also include audio input devices (e.g., microphones, MIDI musical instruments, etc.). The output devices 7335 display images generated by the computer system. For instance, these devices display a GUI. The output devices include printers and display devices, such as cathode ray tubes (CRT) or liquid crystal displays (LCD).

Finally, as shown in FIG. 73, bus 7305 also couples computer 7300 to a circuit structure 7365 through a circuit structure adapter (not shown). In this manner, the computer can be a part of a circuit structure of computers (such as a local area circuit structure ("LAN"), a wide area circuit structure ("WAN"), or an Intranet, or a circuit structure of circuit structures, such as the interne. For example, the computer 7300 may be coupled to a web server (circuit structure 7365) so that a web browser executing on the computer 7300 can interact with the web server as a user interacts with a GUI that operates in the web browser.

As mentioned above, the computer system 7300 may include one or more of a variety of different computer-readable media. Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ZIP® disks, read-only and recordable blu-ray discs, any other optical or magnetic media, and floppy disks.

It should be recognized by one of ordinary skill in the art that any or all of the components of computer system 7300 may be used in conjunction with the invention. Moreover, one of ordinary skill in the art will appreciate that any other system configuration may also be used in conjunction with the invention or components of the invention.

V. Tracking Data Dynamically

In some embodiments, the IC is provided with two or more tools, one for configuring the operations of the primary circuit structure and one for configuring the operations of the secondary circuit structure. In some embodiments, one or more of these tools are implemented as software. One of these tools is a synthesis tool that performs synthesis (e.g., electronic design automation, or "EDA") of a user design. In some embodiments, synthesis includes "compiling" code that specifies the user design of the IC. In some embodiments, the user specifies the user design in HDL. This compiling of a user design includes a mapping of logical user circuits (i.e., logical circuits such as AND gates, OR gates, etc. from the user design to physical circuits of the IC (i.e., configurable logic circuits, configurable interconnects, etc.) that are physically present on the IC).

The other of these two tools is a user interface tool that defines the monitoring functionality performed by the secondary circuit structure. In some embodiments, the user interface tool includes one or more windows that graphically represent monitored signals within the primary circuit structure. In some embodiments, these signals include inputs, outputs, stored values of memories, etc.

In some embodiments, the monitoring tool operates differently from and independently of the synthesis tool. In other words, the synthesis tool compiles a user design and generates a configuration bit stream to configure the circuits of the IC to implement the user design. In contrast, the monitoring tool provides a user interface by which to select graphical representations of various signals and circuits of the primary circuit structure. In some embodiments, the monitoring tool does not perform a synthesis operation to compile the user design.

Once the user design has been compiled by the synthesis tool and a configuration bit-stream generated, the resulting mapping of user design circuits to physical circuits is stored in a mapping database. The mapping database contains all of the information necessary for the debugging tool to debug the user circuit, including data that links user names (i.e., names of circuits of the user design that are represented as code, such as RTL) of user circuits to physical sites on the IC. The monitoring tool accesses this mapping database in order to correctly display signals (e.g., waveform signals, as further discussed below) corresponding to a selected set of user circuits. Once displayed, these signals may be analyzed (e.g., visual interpretation by a user, statistics collection/analysis by another software tool, etc.).

In some embodiments, the monitoring tool displays the selected signals in a display area that displays a waveform representation of the selected signals (e.g., a waveform viewer that is similar to Verdi nWave® by Novas Software). In some embodiments, selection of a set of user circuits to monitor includes a drag-and-drop operation. Specifically, in some embodiments, this drag-and-drop operation includes dragging a name representation of the set of user circuits from a display area that lists name representations of one or more sets of user circuits to the display area that displays the waveform representation of signals.

In some embodiments, this selection is performed while the IC runs (i.e., different sets of circuits can be selected and/or deselected for monitoring while the IC runs). In some embodiments, the monitoring tool interacts with a controller (e.g., controller 915 as shown above in FIG. 9) of the secondary circuit structure in order to monitor the various selected sets of circuits through the secondary circuit structure. In some embodiments, once a set of circuits is selected for monitoring through the secondary circuit structure, these circuits are displayed in the waveform viewer within a short amount of time (e.g., less than an hour, less than a minute, less than ten seconds, less than one hundred milliseconds, etc.).

Figure 74:
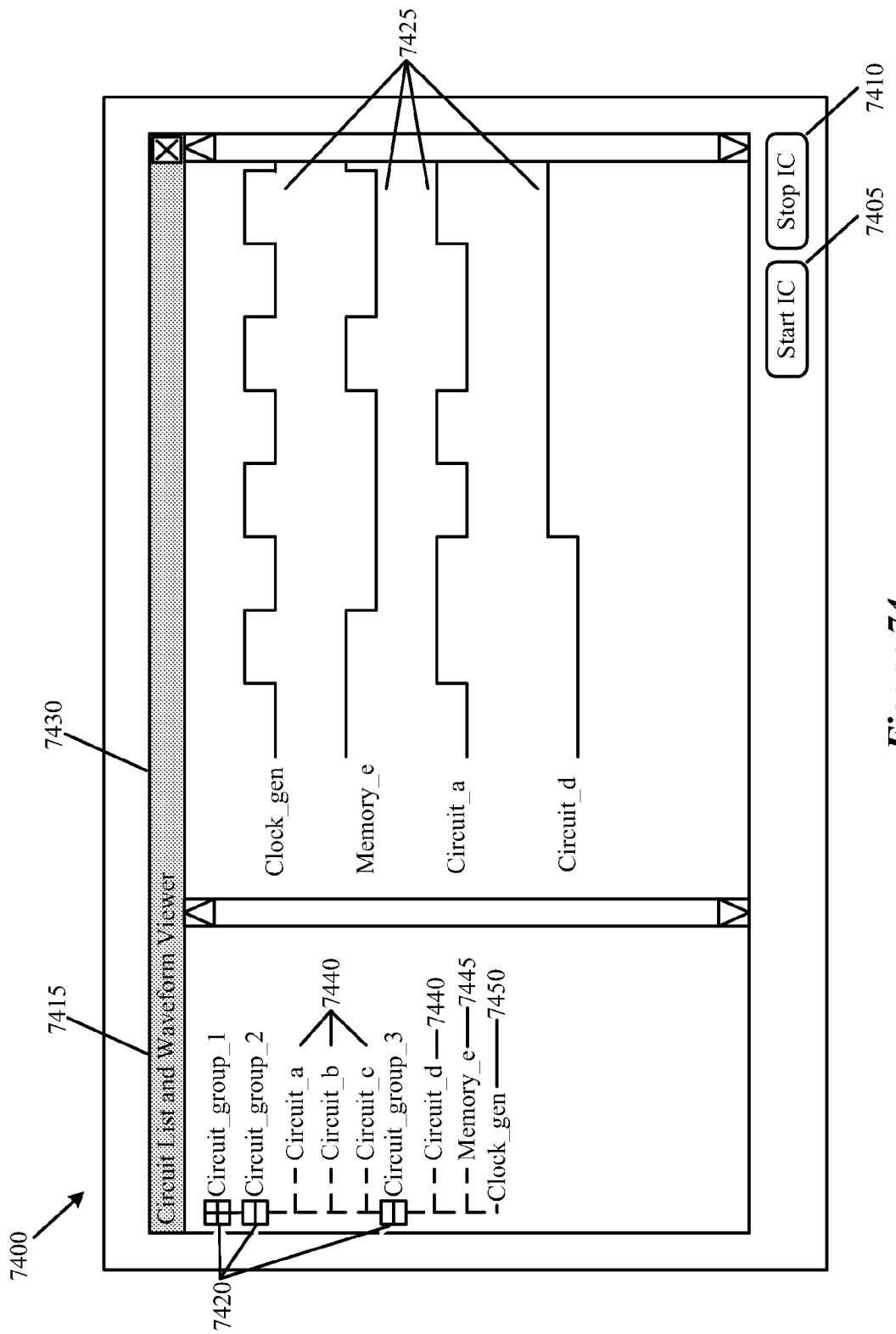
FIG. 74 illustrates a GUI of a monitoring tool of some embodiments.

FIG. 74 illustrates a GUI 7400 of some embodiments of the monitoring tool that enables real-time monitoring of the primary circuit structure through the secondary circuit structure. The GUI contains a first display area for displaying a user circuit list 7415, a second display area for displaying waveform viewer 7430, start button 7405, and stop button 7410. In some embodiments, the start button 7405 is used to begin operation of the IC. In some embodiments, the stop button 7410 is used to halt operation of the IC. In some embodiments, in addition to, or in lieu of the buttons 7405 and 7410, other controls (e.g., a menu item, keyboard command, etc., not shown) are used to start and/or halt operation of the IC. Some embodiments provide controls (e.g., menu items, keyboard commands, etc., not shown) for starting and/or halting the monitoring of some or all of the circuits of the IC.

In some embodiments, the GUI 7400 is customizable. For instance, a user may define additional display areas for displaying other data (e.g., files on a computer system, an additional waveform viewer for displaying archived signals that were previously recorded, etc.). The GUI 7400 may also be customized to represent data in different ways (e.g., sinusoids, oscilloscopes, analog waveforms, etc.). A user may also customize the size of display areas (e.g., increase or decrease the size of the circuit list 7415). These customizations are stored for later use by the same or a different user. In some embodiments, multiple different customizations of the GUI 7400 can be saved and loaded at a later time.

In some embodiments, the circuit list 7415 is a nested list of user design circuits 7440 and groups of user-design circuits 7420. The circuits listed in the circuit list 7415 can be user circuits (e.g., conceptual AND gates, conceptual OR gates, etc.), user memories (e.g., Memory_e 7445), sets of user circuits (e.g., multiple AND gates, etc.), or any other type of circuit or group of circuits. In some embodiments, user circuits 7440 or user circuit sets 7420 having subcomponents can be expanded or condensed by using controls (e.g., plus and minus symbols) that correspond to the user circuit 7440 or user circuit group 7420. In other embodiments, the circuit list 7415 is a flat list as opposed to a nested list. The circuit list 7415 also lists a clock circuit 7450 that generates clock signals within the IC. In some embodiments, the IC has more than one clock circuit. In some embodiments, the circuit list 7415 lists some other combination of circuits (e.g., more or less circuits than those displayed in the figure).

The waveform viewer 7430 displays waveform representations 7425 of signals output by selected user circuits of the IC. In some embodiments, the waveform viewer 7430 may be, or include, a commercially available viewer, such as Verdi nWave® by Novas Software, Inc. In FIG. 74, several user circuits (i.e., Clock_gen 7450, Memory_e 7445, Circuit_a, and Circuit d) have been selected for monitoring. A waveform 7425 for each is displayed in waveform viewer 7430. In some embodiments, the displayed waveform 7425 is displayed in real time. In other words, the waveform 7425 is updated once every minute, once every second, or even more frequently. In some embodiments, there is some latency between the values being actually present in the IC and the values being displayed in the waveform viewer 7430. In some embodiments, this latency is a fixed, known latency. In some embodiments, this latency is bounded, where the bound is dependent on the size of the IC (i.e., a larger IC would have a larger bound for the latency). In some embodiments, the latency is a small amount of time (e.g., several seconds, less than one hundred milliseconds, etc.) between the activity of a circuit of the IC and the display of that activity in the waveform viewer 7430.

In some embodiments, one or more signals displayed in the waveform viewer 7430 are saved to a log file for later review in some embodiments. Saved signals can be "replayed" in a waveform viewer in real time (i.e., the signals can be played back at the original speed at which they occurred). During replay, saved signals can also be sped up or slowed down. In some embodiments, such "replay" is performed by loading a previously saved set of monitored signals. In some embodiments, this previously saved set of monitored signals includes signals that correspond to a set of user circuits as well as timing information.

In some embodiments, the circuit list 7405 and the waveform viewer 7415 and 7420 are viewed in the same window. However, some embodiments provide the circuit list 7415 and waveform viewer 7430 in separate and independent windows of a GUI. In such cases, they may still be referred to collectively as "a GUI," even though they are in separate windows. The circuit list 7415 may be displayed at the same time as the waveform viewer 7430, the circuit list 7415 may be displayed while the waveform viewer 7430 is not displayed, or the waveform viewer 7430 may be displayed while the circuit list 7415 is not displayed in some embodiments. In some embodiments, any other number of GUIs (e.g., GUIs of other computer applications), related or unrelated, may be displayed simultaneously on a computer screen with the circuit list 7415 and/or the waveform viewer 7430.

In addition to monitoring, the monitoring tool can be used for configuration in some embodiments. Using the monitoring tool, a user can configure one or more circuits of the primary circuit structure of the IC through the secondary circuit structure by specifying configuration data for configuring the one or more circuits of the primary circuit structure. In some embodiments, the monitoring tool can be used for reconfiguration (i.e., providing configuration data of the circuits of the primary circuit structure through the secondary circuit structure).

What is claimed is:

1. An integrated circuit ("IC") comprising:
a primary circuit structure for performing a set of operations that implement a user design, the primary circuit structure comprising a set of configurable circuits and a first interconnect network; and
a secondary monitoring structure for monitoring a plurality of operations in said set of operations, said secondary monitoring structure comprising a second interconnect network that is separate from the first interconnect network, the second interconnect network communicatively coupled to a plurality of configurable circuits in the set of configurable circuits of the primary circuit structure and a set of analysis circuits for (i) analyzing the monitored operations and (ii) generating a set of data that describes the monitored operations, wherein the generated set of data is for indicating an occurrence of a trigger event, wherein said secondary monitoring structure is for modifying configurations of at least one configurable circuit of the set of configurable circuits of the primary circuit structure upon the occurrence of the trigger event.

2. The IC of claim 1, wherein the IC is on a single substrate.

3. The IC of claim 1, wherein said monitored operations are user identified operations.

4. The IC of claim 1, wherein said monitoring occurs while the primary circuit structure performs the operations that implement the user design, wherein the performing of the operations that implement the user design is not impeded by said monitoring.

5. An integrated circuit ("IC") comprising:
a primary circuit structure for performing a set of operations that implement a user design, the primary circuit structure comprising a set of circuits and a first interconnect network; and
a secondary monitoring structure for monitoring a plurality of operations in said set of operations, said secondary monitoring structure comprising a second interconnect network that is separate from the first interconnect network, the second interconnect network communicatively coupled to a plurality of circuits in the set of circuits of the primary circuit structure,
said secondary monitoring structure for monitoring bandwidth through a subset of the set of circuits of the primary circuit structure and reporting the bandwidth, wherein the plurality of circuits comprise a plurality of configurable circuits.

6. The IC of claim 5, wherein the subset of the set of circuits is user identified.

7. The IC of claim 6, wherein the user identified circuits comprise input/output (I/O) circuits of the primary circuit structure.

8. The IC of claim 6, wherein the user identified circuits comprise memories of the primary circuit structure, wherein the secondary monitoring structure is further for reporting memory overflows at the user identified circuits.

9. The IC of claim 6, wherein the secondary monitoring structure is further for reporting a filtered subset of the monitored operations based on a user specified condition.

10. The IC of claim 9, wherein an occurrence of the user specified condition initiates a modification of the configuration of the circuits of the secondary monitoring structure.

11. The IC of claim 9, wherein the filtered subset reporting comprises reporting of anomalous behavior occurring within the user identified circuits, the anomalous behavior defined through the user specified condition.

12. The IC of claim 9, wherein the filtered subset includes operations occurring after the user specified condition.

13. The IC of claim 9, wherein the filtered subset includes operations occurring before the user specified condition.

14. A method for monitoring an integrated circuit ("IC") comprising a primary circuit structure for performing a set of operations that implement a user design, the primary circuit structure comprising a set of configurable circuits and a first interconnect network, and a secondary monitoring structure for monitoring a plurality of operations in said set of operations, said secondary monitoring structure comprising a second interconnect network that is separate from the first interconnect network, the second interconnect network communicatively coupled to a plurality of configurable circuits in the set of configurable circuits of the primary circuit structure, the method comprising:

monitoring a set of resources in the primary circuit structure by passing signals from the set of resources to the secondary monitoring structure;

reporting a subset of the signals by filtering the signals based on a condition; and automatically generating on said IC a configuration packet to reconfigure at least one configurable circuit of said integrated circuit in response to said reporting.

15. The method of claim 14, wherein said set of resources are user selected.

16. The method of claim 14, wherein the signals passed include user signals that are generated within the IC and control signals.

17. The method of claim 14, wherein the signals passed comprise signals passing through a routing fabric of the primary circuit structure.

18. A method for monitoring an integrated circuit ("IC") comprising a primary circuit structure for performing a plurality of operations that implement a user design, the primary circuit structure comprising a plurality of configurable circuits and a first interconnect network, and a secondary monitoring structure for monitoring a plurality of operations in said set of operations, said secondary monitoring structure comprising a second interconnect network that is separate from the first interconnect network, the second interconnect network communicatively coupled to the plurality of configurable circuits of the primary circuit structure, the method comprising:

identifying a set of resources in the primary circuit structure to monitor through the secondary monitoring structure;

providing the secondary monitoring structure with at least one user specified condition for reporting a filtered subset of data received from the identified set of resources based on the user specified condition; and automatically modifying a configuration of at least one configurable circuit in response to an occurrence of the user specified condition.

19. The method of claim 18, wherein the modified configuration is a configuration of a configurable circuit in the primary circuit structure.

20. The method of claim 18, wherein the modified configuration is a configuration of a configurable circuit in the secondary monitoring structure.

21. The method of claim 14, wherein said subset of the signals comprises a signal identifying an anomalous behavior of the IC, and wherein the configuration packet reconfigures at least one configurable circuit of the primary circuit structure to automatically discard data from a source of data that generated the anomalous behavior.

22. The method of claim 14, wherein the set of configurable circuits is a first set of configurable circuits, said secondary monitoring structure comprises a second set of configurable circuits, and the configuration packet reconfigures at least one configurable circuit of the second set of configurable circuits in response to a triggering event generated in said primary circuit structure and detected by trigger circuits of the secondary network.

23. The method of claim 22, wherein the trigger circuits of the secondary network are included in said second set of configurable circuits and wherein a condition for detecting a later triggering event is modified by reconfiguring said second set of configurable circuits after the triggering event is detected by the trigger circuits.

24. The IC of claim 1, wherein the secondary monitoring structure does not use circuits that would otherwise be used to implement the user design.

25. The IC of claim 1, wherein the secondary monitoring network is not configurable to implement the user design.

26. The IC of claim 1, wherein the second interconnect network is a pipelined packet switched network formed by bitlines that are separate from the first interconnect network.

* * * * *